(12) United States Patent
Lin et al.

(10) Patent No.: US 8,304,766 B2
(45) Date of Patent: *Nov. 6, 2012

(54) SEMICONDUCTOR CHIP WITH A BONDING PAD HAVING CONTACT AND TEST AREAS

(75) Inventors: Mou-Shiung Lin, Hsin-Chu (TW); Huei-Mei Yen, Taoyuan (TW); Hsin-Jung Lo, Taipei (TW); Chiu-Ming Chou, Kao-Hsiung (TW); Ke-Hung Chen, Kao-Hsiung (TW)

(73) Assignee: Megica Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/094,780

(22) Filed: Apr. 26, 2011

(65) Prior Publication Data

US 2011/0198589 A1     Aug. 18, 2011

Related U.S. Application Data

(63) Continuation of application No. 11/567,182, filed on Dec. 5, 2006, now Pat. No. 7,947,978.

(60) Provisional application No. 60/597,493, filed on Dec. 5, 2005.

(51) Int. Cl.
*H01L 23/58* (2006.01)
*H01L 21/00* (2006.01)

(52) U.S. Cl. .......... 257/48; 257/700; 257/759; 257/774; 438/11; 438/623; 438/637

(58) Field of Classification Search .................. None
See application file for complete search history.

(56) References Cited

U.S. PATENT DOCUMENTS

| 4,051,508 A | 9/1977 | Sato |
| 4,685,998 A | 8/1987 | Quinn |
| 5,083,187 A | 1/1992 | Lamson |

(Continued)

FOREIGN PATENT DOCUMENTS

TW     489346     6/2002

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Alonzo Chambliss
(74) *Attorney, Agent, or Firm* — McDermott Will & Emery LLP

(57) ABSTRACT

A semiconductor chip comprises a metal pad exposed by an opening in a passivation layer, wherein the metal pad has a testing area and a bond area. During a step of testing, a testing probe contacts with the testing area for electrical testing. After the step of testing, a polymer layer is formed on the testing area with a probe mark created by the testing probe. Alternatively, a semiconductor chip comprises a testing pad and a bond pad respectively exposed by two openings in a passivation layer, wherein the testing pad is connected to the bond pad. During a step of testing, a testing probe contacts with the testing pad for electrical testing. After the step of testing, a polymer layer is formed on the testing pad with a probe mark created by the testing probe.

21 Claims, 112 Drawing Sheets

U.S. PATENT DOCUMENTS

| | | | |
|---|---|---|---|
| 5,162,240 A * | 11/1992 | Saitou et al. ............... 427/8 |
| 5,226,232 A | 7/1993 | Boyd |
| 5,384,488 A | 1/1995 | Golshan |
| 5,468,984 A | 11/1995 | Efland |
| 5,506,499 A | 4/1996 | Puar |
| 5,532,512 A | 7/1996 | Fillion |
| 5,646,439 A | 7/1997 | Kitayama |
| 5,659,201 A | 8/1997 | Wollesen |
| 5,691,248 A | 11/1997 | Cronin |
| 5,792,594 A | 8/1998 | Brown |
| 5,834,844 A | 11/1998 | Akagawa |
| 5,854,513 A | 12/1998 | Kim |
| 5,883,435 A | 3/1999 | Geffken |
| 5,969,424 A | 10/1999 | Matsuki |
| 6,022,792 A | 2/2000 | Ishii |
| 6,066,877 A | 5/2000 | Williams |
| 6,077,726 A | 6/2000 | Mistry |
| 6,144,100 A | 11/2000 | Shen |
| 6,184,143 B1 | 2/2001 | Ohashi |
| 6,187,680 B1 | 2/2001 | Costrini |
| 6,229,221 B1 | 5/2001 | Kloen |
| 6,300,234 B1 | 10/2001 | Flynn |
| 6,359,328 B1 | 3/2002 | Dubin |
| 6,362,087 B1 | 3/2002 | Wang |
| 6,410,435 B1 | 6/2002 | Ryan |
| 6,429,120 B1 | 8/2002 | Ahn |
| 6,472,745 B1 | 10/2002 | Iizuka |
| 6,511,901 B1 | 1/2003 | Lam |
| 6,590,295 B1 | 7/2003 | Liao |
| 6,593,222 B2 | 7/2003 | Smoak |
| 6,614,091 B1 | 9/2003 | Downey |
| 6,639,299 B2 | 10/2003 | Aoki |
| 6,646,347 B2 | 11/2003 | Mercado |
| 6,683,380 B2 | 1/2004 | Efland |
| 6,707,124 B2 | 3/2004 | Wachtler |
| 6,780,748 B2 | 8/2004 | Yamaguchi |
| 6,798,050 B1 | 9/2004 | Homma |
| 6,800,555 B2 | 10/2004 | Test |
| 6,864,562 B1 | 3/2005 | Toyosawa |
| 6,943,440 B2 | 9/2005 | Kim |
| 6,963,136 B2 | 11/2005 | Shinozaki |
| 6,979,647 B2 | 12/2005 | Bojkov |
| 7,239,028 B2 | 7/2007 | Anzai |
| 7,301,231 B2 * | 11/2007 | Antol et al. ............... 257/700 |
| 7,319,277 B2 | 1/2008 | Lin |
| 7,391,114 B2 * | 6/2008 | Mimura et al. ............... 257/758 |
| 7,394,161 B2 | 7/2008 | Kuo |
| 7,452,803 B2 * | 11/2008 | Lin et al. ............... 438/624 |
| 7,462,558 B2 * | 12/2008 | Lin et al. ............... 438/624 |
| 7,470,997 B2 | 12/2008 | Lin et al. |
| 7,855,461 B2 * | 12/2010 | Kuo et al. ............... 257/780 |
| 7,947,978 B2 * | 5/2011 | Lin et al. ............... 257/48 |
| 2001/0035452 A1 | 11/2001 | Test |
| 2001/0051426 A1 | 12/2001 | Pozder |
| 2002/0000671 A1 | 1/2002 | Zuniga |
| 2002/0043723 A1 | 4/2002 | Shimizu |
| 2002/0158334 A1 | 10/2002 | Vu |
| 2002/0175411 A1* | 11/2002 | Harun et al. ............... 257/747 |
| 2003/0173667 A1* | 9/2003 | Yong et al. ............... 257/748 |
| 2003/0197289 A1 | 10/2003 | Lin |
| 2003/0218246 A1 | 11/2003 | Abe |
| 2004/0023450 A1 | 2/2004 | Katagiri |
| 2004/0036170 A1 | 2/2004 | Lee |
| 2004/0069988 A1* | 4/2004 | Lin et al. ............... 257/48 |
| 2004/0159944 A1* | 8/2004 | Datta et al. ............... 257/737 |
| 2005/0017355 A1 | 1/2005 | Chou et al. |
| 2005/0121804 A1 | 6/2005 | Kuo et al. |
| 2006/0027933 A1 | 2/2006 | Chen et al. |
| 2006/0065969 A1* | 3/2006 | Antol et al. ............... 257/700 |
| 2006/0076159 A1* | 4/2006 | Daubenspeck et al. ........ 174/261 |
| 2008/0012132 A1 | 1/2008 | Lin |
| 2008/0206979 A1 | 8/2008 | Fogel et al. |
| 2008/0251924 A1 | 10/2008 | Lin et al. |
| 2009/0072396 A1* | 3/2009 | Wang ............... 257/737 |
| 2009/0108453 A1 | 4/2009 | Lin et al. |

FOREIGN PATENT DOCUMENTS

| | | |
|---|---|---|
| TW | I225288 | 12/2004 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Foreign Office Action and Search Report for Taiwan Patent Application No. 095145100 dated Jun. 29, 2010 with English Translated Summary.

* cited by examiner

SEMICONDUCTOR CHIP WITH A BONDING PAD HAVING CONTACT AND TEST AREAS

This application is a continuation application of U.S. application Ser. No. 11/567,182, filed on Dec. 5, 2006, now U.S. Pat. No. 7,947,978, which claims priority to U.S. provisional application No. 60/597,493, filed on Dec. 5, 2005, which are herein incorporated by reference in their entirety.

BACKGROUND OF THE INVENTION

1. Field of the Invention

The present invention relates to a semiconductor chip, particularly to a semiconductor chip, wherein a polymer layer is used to cover a probe mark.

2. Brief Description of the Related Art

In formation products are playing important roles in today's competitive society. With the evolution of the information products and the introduction of the concept of integrating various circuit designs, the latest single chip, generally, provides more functions than the former one. After integration, the dimension of the circuits is reduced and the majority of the signals are being transmitted within a single chip. As a result, paths for transmitting signals are reduced and the performance of the chip is improved.

Moreover, in the flip-chip technology, multiple bumps can be formed on the chip for connecting the chip to a substrate. Because the bumps can be formed on all area of the active surface of the chip, the chip can provide more layouts to connect with external circuitry than those suited only for a wire-bonding process. Compared to the connection of merely using wire-bonding process to electrically connect a chip with a substrate, the connection of using bumps to electrically connect a chip with a substrate is advantageous in that it transmits signals in a shorter and wider path. Therefore, the electrical performance of the package using a flip-chip technology is considered a high-quality one.

After the bumps are formed on the chip, a testing step proceeds. Testing probes are used to contact the bumps and then the chip can be tested. Moreover, the testing probes may contact the bumps repeatedly during the testing step. As a result, the bumps are subjected to be traumatized by the testing probes. In a serious consequence, some damaged bumps will not provide the reliable bond between the chip and the substrate, often calling in extra work of reworking, if the problem is still revocable.

SUMMARY OF THE INVENTION

One objective of the present invention is to provide a semiconductor chip, wherein a metal pad, which is exposed by an opening in a passivation layer, has a testing area and a bond area; during a step of testing, a testing probe contacts with the testing area for electrical testing; after the step of testing, a polymer layer formed on the testing area with a probe mark created by the testing probe.

Another objective of the present invention is to provide a semiconductor chip, wherein two openings in a passivation layer expose a testing pad and a bond pad, respectively; during a step of testing, a testing probe contacts with the testing pad for electrical testing; after the step of testing, a polymer layer is formed on the testing pad with a probe mark created by the testing probe.

In order to reach the above objectives, the present invention provides a semiconductor chip comprising: a semiconductor substrate; a pad over said semiconductor substrate, wherein said pad comprises a testing area and a bond area, said testing area is used to be in contact with a testing probe; a polymer layer on said testing area; and a metal layer on said bond area.

In order to reach the above objectives, the present invention provides a semiconductor chip comprising: a semiconductor substrate; a testing pad over said semiconductor substrate, wherein said testing pad is used to be in contact with a testing probe; a bond pad over said semiconductor substrate, wherein said bond pad is connected to said testing pad; a polymer layer on said testing pad; and a metal layer on said bond pad.

To enable the objectives, technical contents, characteristics and accomplishments of the present invention, the embodiments of the present invention are to be described in detail in cooperation with the attached drawings below.

DETAILED DESCRIPTION OF THE INVENTION

The present invention pertains to a semiconductor chip having a testing region and a bond region. During a step of testing, a testing probe contacts with the testing region for electrical testing. After the step of testing, a polymer layer is formed on the testing region with a probe mark created by the testing probe. An opening in the polymer layer exposes the bond region and a metal layer formed on the bond region. The metal layer can be used in a wire-bonding process, a TAB (tape automated bonding) process, COF (Chip-on-Film) process or COG (Chip-on-Glass) process.

Each of the structures disclosed by the present invention is constructed on a passivation layer of a semiconductor wafer. After the structures of the present invention have been constructed, the semiconductor wafer is diced into a plurality of semiconductor chips. Below the abovementioned passivation layer, there is a semiconductor substrate. A plurality of circuit structures and a plurality of dielectric layers are interposed between the passivation layer and the semiconductor substrate. One opening in the passivation layer may expose both the testing region and the bond region. Alternatively, two openings in the passivation layer may expose the testing region and the bond region, respectively. Firstly, the structures of the semiconductor substrate, the circuit structures, the dielectric layers and the passivation layer, together with the methods for fabricating the structures, are to be described below. Then, the description of the embodiments of the present invention follows.

Figure 1:
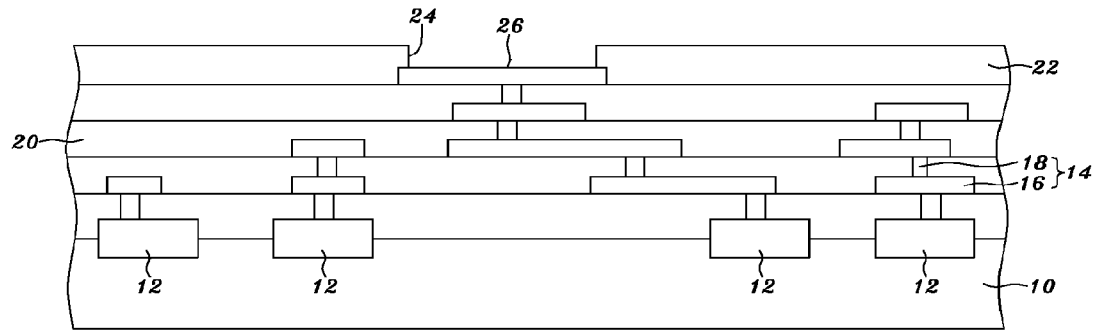
FIG. 1 is a sectional view schematically showing a wafer according to the present invention.

Refer to FIG. 1. The semiconductor substrate 10 may be a silicon substrate, a GaAs substrate, or a SiGe substrate. A plurality of semiconductor devices 12 is formed in or on the semiconductor substrate 10. The semiconductor device 12 may be a resistor, a capacitor, an inductor, a diffusion area, an ESD (Electro Static Discharge) protection element, or a MOS (Metal Oxide Semiconductor) device. The MOS device may be a p-channel MOS device, an n-channel MOS device, a CMOS (Complementary Metal Oxide Semiconductor), a BJT (Bipolar Junction Transistor) or a BiCMOS (Bipolar CMOS) device.

Next, a circuit structure 14 is formed over the substrate 10. The circuit structure 14 comprises a plurality of metal layers 16 having a thickness of less than 3 μm and a plurality of metal plugs 18. The metal layer 16 and the metal plug 18 are made of copper. Alternatively, the metal layer 16 is made of aluminum, and the metal plug 18 is made of tungsten. The metal layer 16 may be fabricated with a damascene process, an electroplating process or a sputtering process. For example, a copper layer can be formed to function as the metal layer 16 with a damascene process, an electroplating process or a sputtering process. Alternatively, an aluminum layer can be formed to function as the metal layer 16 with a sputtering process. A plurality of dielectric layers 20 having a thickness of less than 3 micrometers (μm) is located over the substrate 10 and respectively interposed between the metal layers 16, and the neighboring metal layers are interconnected by the metal plugs 18 inside the dielectric layer 20. The dielectric layer 20 is commonly fabricated with a chemical vapor deposition (CVD) process. The material of the dielectric layer 20 may be silicon oxide, TEOS (Tetraethoxysilane), a compound containing silicon, carbon, oxygen and hydrogen (such as SiwCxOyHz), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), a polyarylene ether, PBO (Polybenzoxazole), or another material having a permittivity K of between 1.5 and 3.

Next, a passivation layer 22 is formed over the circuit structure 14 and the dielectric layers 20. The passivation layer 22 can protect the semiconductor devices 12 and the circuit structure 14 against the damage induced by moisture and foreign ion contamination. In other words, the passivation layer 22 can prevent mobile ions (such as sodium ion), transition metals (such as gold, silver and copper) and impurities from penetrating into the semiconductor devices 12, such as transistors, polysilicon resistor elements and polysilicon-polysilicon capacitor elements, and the circuit structure 14 below the passivation layer 22. The passivation layer 22 is commonly made of silicon oxide (such as $SiO_2$), PSG (phosphosilicate glass), silicon nitride (such as $Si_3N_4$), or silicon oxynitride. The passivation layer 22 commonly has a thickness of more than 0.35 μm. In a preferred case, the silicon-nitride layer has a thickness of more than 0.3 μm. At present, there are about ten methods for fabricating the passivation layer 22, and they are described below.

In a first method for fabricating the passivation layer 22, a silicon oxide layer having a thickness of between 0.2 and 1.2 μm is firstly formed with a CVD method; then, a silicon nitride layer having a thickness of 0.2 and 1.2 μm is formed over the silicon oxide layer with a CVD method.

In a second method for fabricating the passivation layer 22, a silicon oxide layer having a thickness of between 0.2 and 1.2 μm is firstly formed with a CVD method; next, a silicon oxynitride layer having a thickness of between 0.05 and 0.15 μm is formed over the silicon oxide layer with a Plasma Enhanced CVD (PECVD) method; then, a silicon nitride layer having a thickness of between 0.2 and 0.12 µm is formed over the silicon oxynitride layer with a CVD method.

In a third method for fabricating the passivation layer 22, a silicon oxynitride layer having a thickness of between 0.05 and 0.15 µm is firstly formed with a CVD method; next, a silicon oxide layer having a thickness of between 0.2 and 1.2 µm is formed over the silicon oxynitride layer with a CVD method; then, a silicon nitride layer having a thickness of between 0.2 and 0.12 µm is formed over the silicon oxide layer with a CVD method.

In a fourth method for fabricating the passivation layer 22, a first silicon oxide layer having a thickness of between 0.2 and 0.5 µm is firstly formed with a CVD method; next, a second silicon oxide layer having a thickness of between 0.5 and 1 µm is formed over the first silicon oxide layer with a spin-coating method; next, a third silicon oxide layer having a thickness of between 0.2 and 0.5 µm is formed over the second silicon oxide layer with a CVD method; then, a silicon nitride layer having a thickness of 0.2 and 1.2 µm is formed over the third silicon oxide with a CVD method.

In a fifth method for fabricating the passivation layer 22, a silicon oxide layer having a thickness of between 0.5 and 2 µm is firstly formed with a High Density Plasma CVD (HDP-CVD) method; then, a silicon nitride layer having a thickness of 0.2 and 1.2 µm is formed over the silicon oxide layer with a CVD method.

In a sixth method for fabricating the passivation layer 22, an Undoped Silicate Glass (USG) layer having a thickness of between 0.2 and 3 µm is firstly formed; next, an insulating layer having a thickness of between 0.5 and 3 µm is formed over the USG layer, wherein the insulating layer is made of TEOS, PSG or BPSG (borophosphosilicate glass); then, a silicon nitride layer having a thickness of 0.2 and 1.2 µm is formed over the insulating layer with a CVD method.

In a seventh method for fabricating the passivation layer 22, a first silicon oxynitride layer having a thickness of between 0.05 and 0.15 µm is firstly formed with a CVD method optionally; next, a silicon oxide layer having a thickness of between 0.2 and 1.2 µm is formed over the first silicon oxynitride layer with a CVD method; next, a second silicon oxynitride layer having a thickness of between 0.05 and 0.15 µm is optionally formed over the silicon oxide layer with a CVD method; next, a silicon nitride layer having a thickness of between 0.2 and 1.2 µm is formed over the second silicon oxynitride layer or the silicon oxide with a CVD method; next, a silicon oxide layer having a thickness of between 0.2 and 1.2 µm is formed over the first silicon oxynitride layer with a CVD method; next, a third silicon oxynitride layer having a thickness of between 0.05 and 0.15 µm is optionally formed over the silicon nitride layer with a CVD method; then, a silicon oxide layer having a thickness of between 0.2 and 1.2 µm is formed over the third silicon oxynitride layer or the silicon nitride layer with a CVD method.

In a eighth method for fabricating the passivation layer 22, a first silicon oxide layer having a thickness of between 0.2 and 0.5 µm is firstly formed with a CVD method; a second silicon oxide layer having a thickness of between 0.5 and 1 µm is formed over the first silicon oxide layer with a spin-coating method; next, a third silicon oxide layer having a thickness of between 0.2 and 1.2 µm is formed over the second silicon oxide layer with a CVD method; next, a silicon nitride layer having a thickness of between 0.2 and 1.2 µm is formed over the third silicon oxide layer with a CVD method; then, a fourth silicon oxide layer having a thickness of between 0.2 and 1.2 µm is formed over the silicon over nitride layer with a CVD method.

In a ninth method for fabricating the passivation layer 22, a first silicon oxide layer having a thickness of between 0.5 and 2 µm is firstly formed with a HDP-CVD method; next, a silicon nitride layer having a thickness of between 0.2 and 1.2 µm is formed over the first silicon oxide layer with a CVD method; then, a second silicon oxide layer having a thickness of between 0.5 and 2 µm is formed over the silicon nitride with a HDP-CVD method.

In a tenth method for fabricating the passivation layer 22, a first silicon nitride layer having a thickness of between 0.2 and 1.2 µm is firstly formed with a CVD method; next, a silicon oxide layer having a thickness of between 0.2 and 1.2 µm is formed over the first silicon nitride layer with a CVD method; then, a second silicon nitride layer having a thickness of between 0.2 and 1.2 µm is formed over the silicon oxide layer with a CVD method.

Refer to FIG. 1. An opening 24 in the passivation layer 22 exposes a pad 26. The opening 24 has the maximum transverse dimension of between 10 and 40 µm or between 40 and 300 µm. The shape of the opening 24 may be a circle, a square or a polygon, and the abovementioned maximum transverse dimension is thus the diameter of a circle, the length of one side of a square or the length of the greatest diagonal of a polygon. The shape of the opening 24 may also be a rectangle, and the rectangle has a length of between 80 and 200 µm and a width of between 40 and 110 µm. Further, the semiconductor device 12 may be optionally disposed below the pad 26 exposed by the opening 24. Alternatively, there may be no semiconductor device 12 under the pad 26 exposed by the opening 24.

A metal cap (not shown in the drawing) may be optionally formed on the pad 26 exposed by the opening 24 to prevent the pad 26 from oxidation. The metal cap may be an aluminum layer, a gold layer, a titanium layer, a titanium-tungsten alloy layer, a tantalum layer, a tantalum nitride layer or a nickel layer. For example, when the pad 26 is a copper pad, the metal cap is used to protect the copper pad from oxidation. Alternatively, when the metal cap is an aluminum layer, a barrier layer is interposed between the aluminum layer and the pad 26. The barrier layer may be made of titanium, titanium nitride, titanium-tungsten alloy, tantalum, tantalum nitride, chromium or nickel. If there is a metal cap over the pad 26, the metal cap has a testing area and a bond area. During a step of testing, a testing probe contacts with the testing area for electrical testing; after the step of testing, the testing probe is removed, and a probe mark is left on the testing area of the metal cap. Such a structure with the metal cap may be applied to the following first through twelfth embodiments. Below, only the cases without the metal cap are discussed.

So far, the description of the semiconductor substrate 10, the circuit structure 14 and the passivation layer 22 has completed. Below, the embodiments of the present invention are to be introduced.

EMBODIMENT I

Figure 2A:
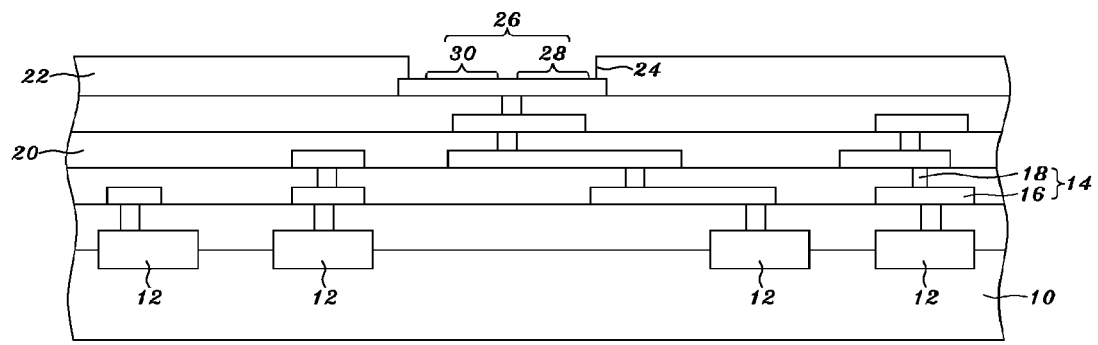
FIG. 2A is a sectional view schematically showing a wafer according to one embodiment of the present invention.
Figure 2B:
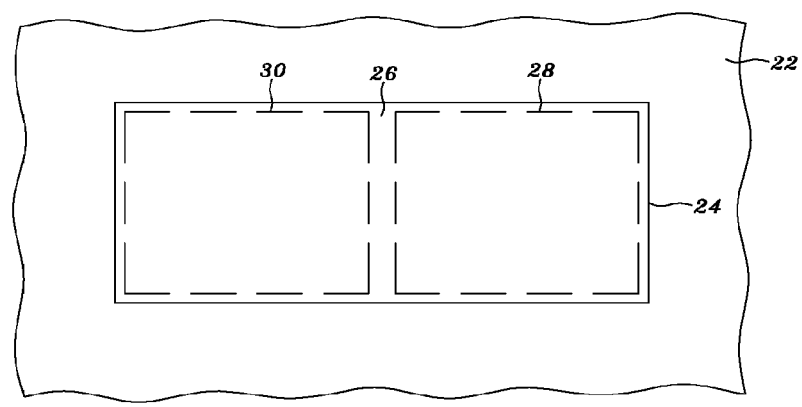
FIG. 2B is a partial top view schematically showing a wafer according to one embodiment of the present invention.

Refer to FIG. 2A and FIG. 2B respectively a sectional view and a partial top view schematically showing a wafer. As shown in FIG. 2A and FIG. 2B, the pad 26 has a testing area 28 for electrical testing and a bond area 30 to be electrically connected to an external system, such as a printed circuit board, a ball grid array (BGA) substrate, a mother board, a glass substrate, a ceramic substrate, a flexible circuit film, a TAB carrier, a semiconductor wafer, or a semiconductor chip. The examples for the external system in this embodiment may be employed to any below-mentioned external system depicted in other embodiments.

Figure 2C:
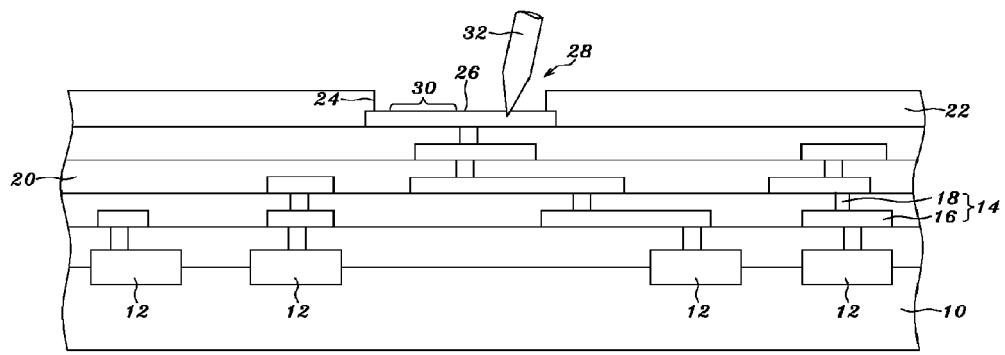
FIG. 2C to FIG. 2N are sectional views schematically showing the fabrication process according to one embodiment of the present invention.
Figure 2D:
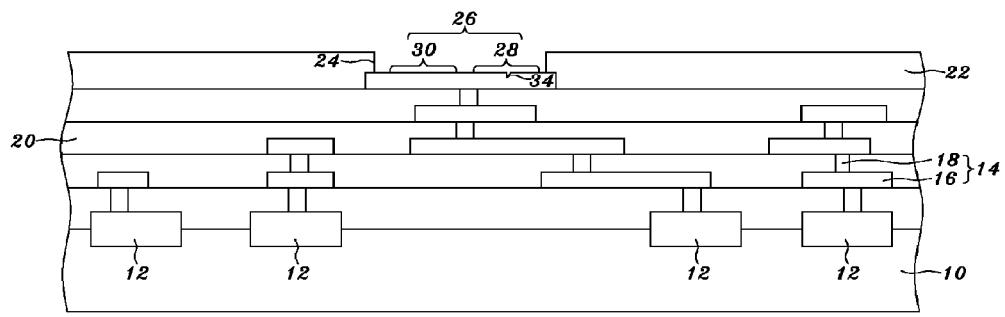
Figure 2E:
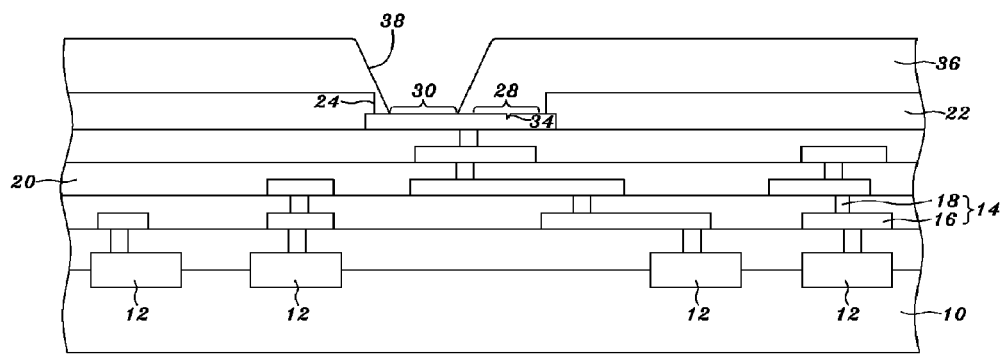

Refer to FIG. 2C. During a step of testing, a testing probe 32 contacts with the testing area 28 of a pad 26 for electrical testing. Refer to FIG. 2D. After the step of testing, the testing probe 32 is removed, and a probe mark 34 is left on the testing area 28. Refer to FIG. 2E. A patterned polymer layer 36 is formed over the passivation layer 22 and the testing area 28, and the probe mark 34 is thus covered. An opening 38 in the patterned polymer layer 36 exposes the bond area 30 of the pad 26. The material of the patterned polymer layer 36 may be PI (polyimide), BCB (benzo-cyclo-butene), polyurethane, epoxy, a parylene-based polymer, a solder-mask material, an elastomer, or a porous dielectric material. The patterned polymer layer 36 can be fabricated by spin-coating, heat-pressing a dry film, or screen-printing. Further, the patterned polymer layer 36 has a thickness of between 1 and 30 µm. In a preferred case, the patterned polymer layer 36 has a thickness of between 5 and 20 µm.

Figure 2F:
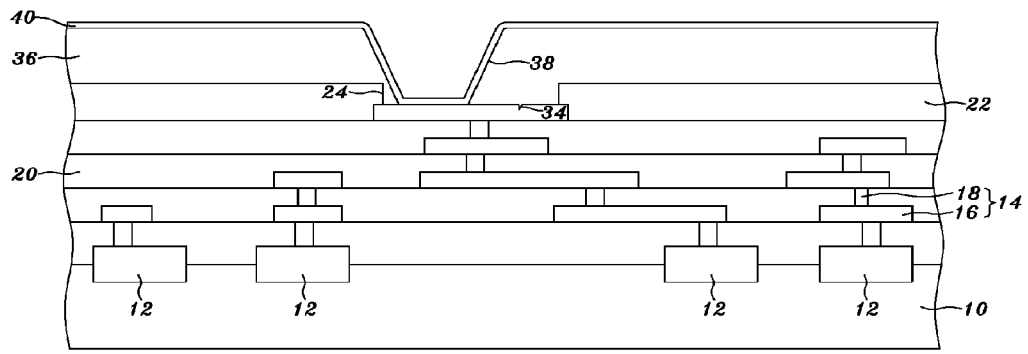

Refer to FIG. 2F. Next, an adhesion/barrier layer 40 having a thickness of 0.02 and 2 µm is formed over the patterned polymer layer 36 and the bond area 30 exposed by the polymer-layer opening 38. The material of the adhesion/barrier layer 40 may be titanium, tungsten, cobalt, nickel, titanium nitride, a titanium-tungsten alloy, chromium, copper, gold, protactinium, platinum, palladium, ruthenium, rhodium, silver, or a composite of the abovementioned materials. The adhesion/barrier layer 40 may be fabricated with a sputtering method or a vapor deposition method.

Figure 2G:
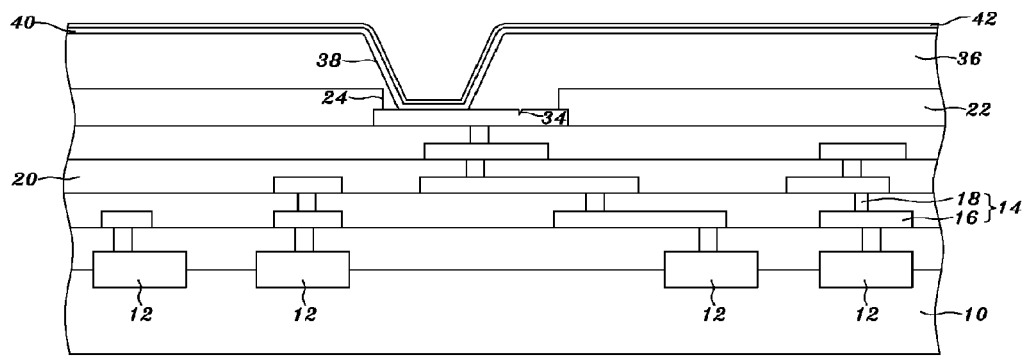

Refer to FIG. 2G. Next, a seed layer 42 is formed over the adhesion/barrier layer 40 with a sputtering method, a vapor deposition method, or a PVD (Physical Vapor Deposition) method. The seed layer 42 is beneficial to electroplating a metal layer thereon. Thus, the material of the seed layer 42 varies with the material of the succeeding metal layer. When a copper metal layer is to be electroplated on the seed layer, copper is a preferable material to the seed layer. When a gold metal layer is to be electroplated on the seed layer, gold is a preferable material to the seed layer. When a palladium metal layer is to be electroplated on the seed layer, palladium is a preferable material to the seed layer. When a platinum metal layer is to be electroplated on the seed layer, platinum is a preferable material to the seed layer. When a rhodium metal layer is to be electroplated on the seed layer, rhodium is a preferable material to the seed layer. When a ruthenium metal layer is to be electroplated on the seed layer, ruthenium is a preferable material to the seed layer. When a rhenium metal layer is to be electroplated on the seed layer, rhenium is a preferable material to the seed layer. When a nickel metal layer is to be electroplated on the seed layer, nickel is a preferable material to the seed layer.

Figure 2H:
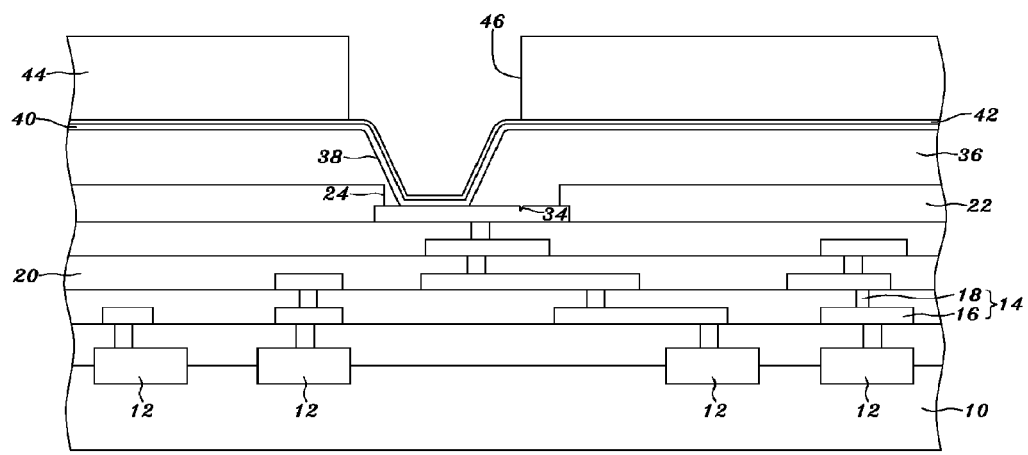
Figure 2I:
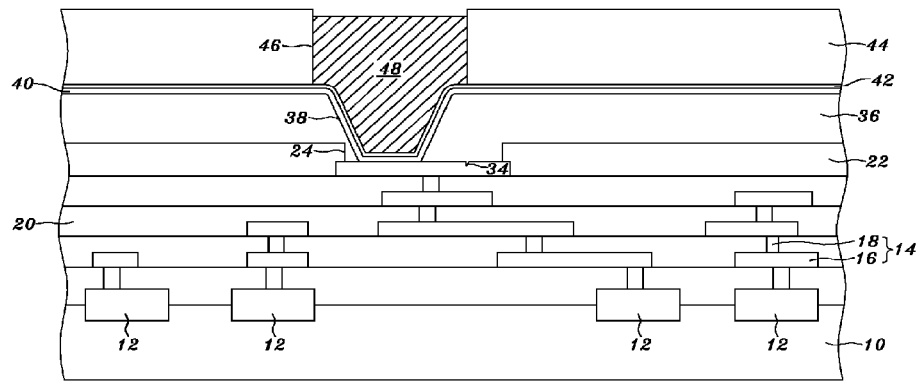

Refer to FIG. 2H. Next, a photoresist layer 44 is formed over the seed layer 42, and the photoresist layer 44 is patterned to form a photoresist-layer opening 46 to expose the seed layer 42 over the bond area 30 of the pad 26. Preferably, a 1× stepper or a 1× scanner is used to expose the photoresist layer 44. Refer to FIG. 2I. Next, a metal layer 48 is electroplated on the seed layer 42 exposed by the photoresist-layer opening 46. The metal layer 48 has a thickness of between 1 and 200 µm, for example, a thickness of between 20 and 120 µm. The metal layer 48 may be a single layer made of gold, copper, silver, palladium, platinum, rhodium, ruthenium, rhenium, or nickel. The metal layer 48 may also be a composite layer made of the abovementioned metals. The thickness of the metal layer 48 is preferred to be between 2 and 30 µm. For example, the metal layer 48 may include a gold layer with a thickness of between 10 and 30 µm, for forming a metal bump, or between 1 and 10 µm, for forming a metal trace. For example, the metal layer 48 may include a copper layer with a thickness of between 2 and 30 µm between 2 and 30 µm.

Figure 2J:
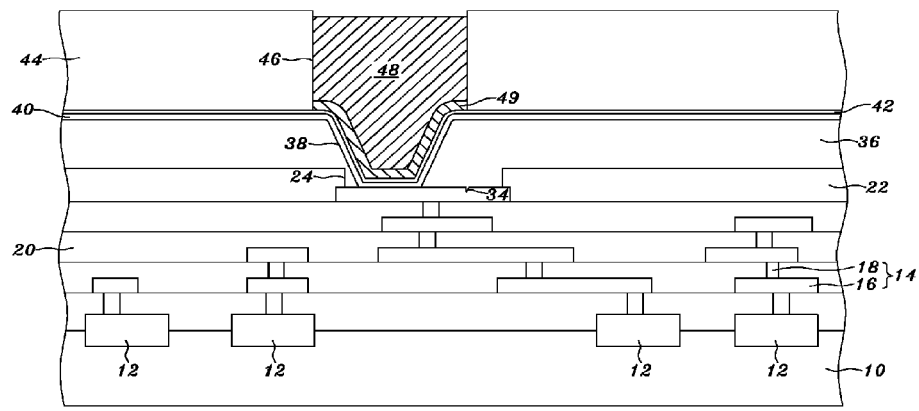

The metal layer 48 may also be made of a tin-containing material. The tin-containing material may be a tin-lead alloy, a tin-silver alloy, a tin-silver-copper alloy or a lead-free alloy. The tin-containing layer 48 has a thickness of between 3 and 150 µm. Refer to FIG. 2J. Before the tin-containing layer 48 is to be formed, a metal layer 49 may be firstly formed on the seed layer 42 exposed by the photoresist-layer opening 46. The metal layer 49 may be a copper layer having a thickness of between 1 and 10 µm. Alternatively, the metal layer 49 may be a composite layer of a nickel layer having a thickness of between 0.5 and 5 µm and a copper layer having a thickness of between 1 and 10 µm, and the nickel layer is on the copper layer.

Figure 2K:
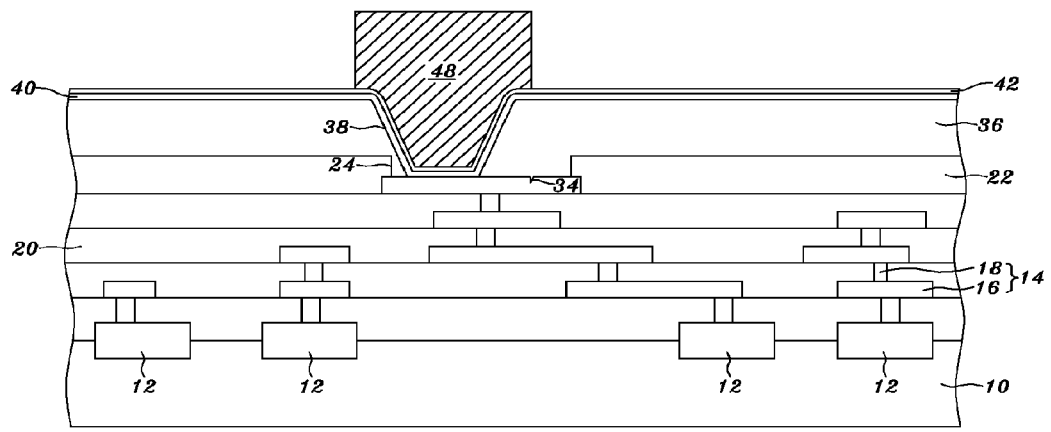
Figure 2L:
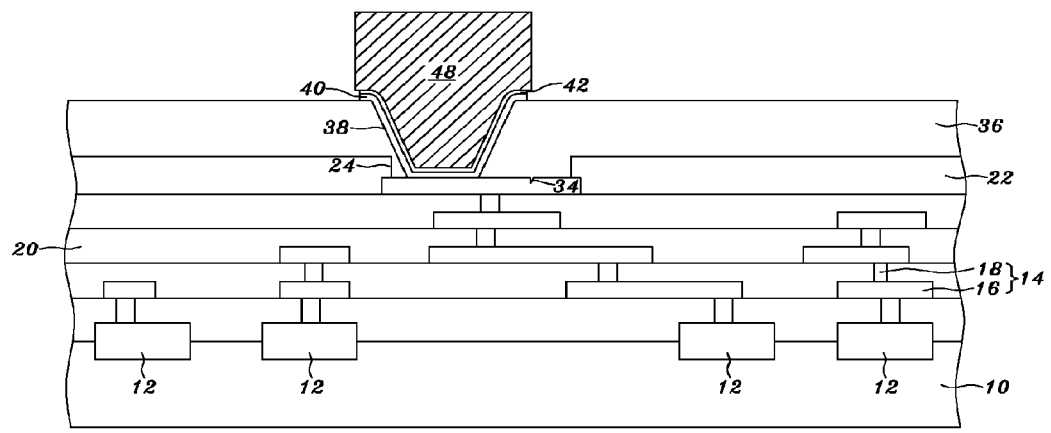

Refer to FIG. 2K. After the metal layer 48 is completed, the photoresist layer 44 is removed. Refer to FIG. 2L. Next, the seed layer 42 and the adhesion/barrier layer 40 not under the metal layer 48 are removed. The adhesion/barrier layer 40 can be removed with a dry-etching method or a wet-etching method. The dry-etching method may be implemented with an argon sputter process. When the adhesion/barrier layer 40 is made of a titanium-tungsten alloy, it can be removed with hydrogen peroxide. If the seed layer 42 is made of gold, it can be removed with an iodine-containing etchant, such as a potassium iodine solution.

Figure 2M:
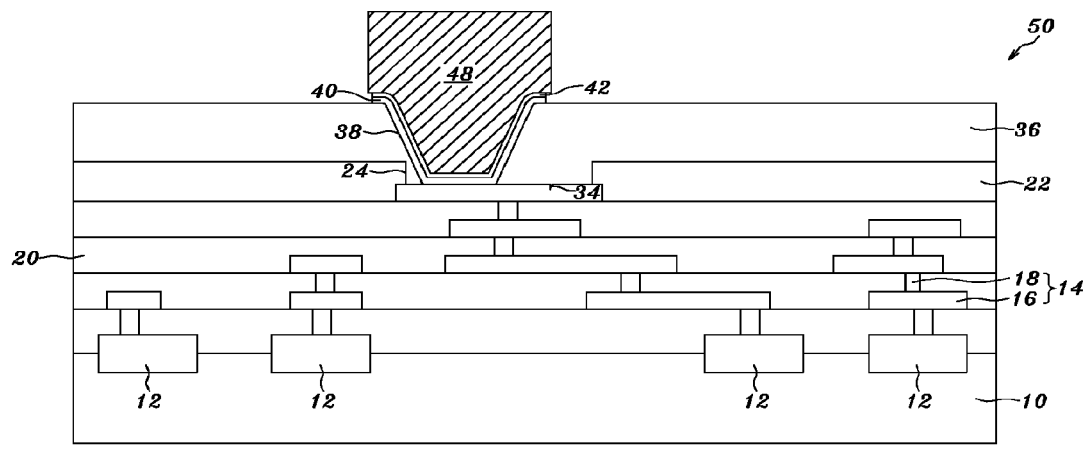
Figure 2N:
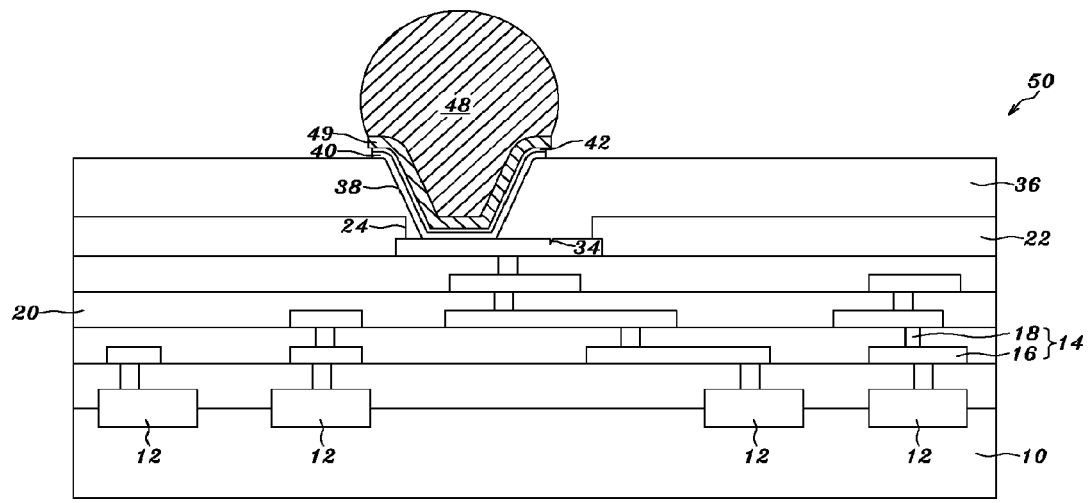

Refer to FIG. 2M. The semiconductor substrate 10 is diced into a plurality of semiconductor chips 50. Refer to FIG. 2N. If the metal layer 48 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 48 is heated to its melting point; thus, the liquid metal assumes a ball shape and then solidifies. Then, the semiconductor substrate 10 is also diced into a plurality of semiconductor chips 50.

In the present invention, the pad 26 has a testing area 28 for electrical testing and a bond area 30 to be electrically connected to an external system. In this embodiment, after the electrical testing is completed, the testing area 28 of the pad 26 is covered with a patterned polymer layer 36. In this embodiment, in addition to contacting the pad 26, the testing probe 32 may also contact the metal layer 48 for electrical testing.

EMBODIMENT II

Figure 3A:
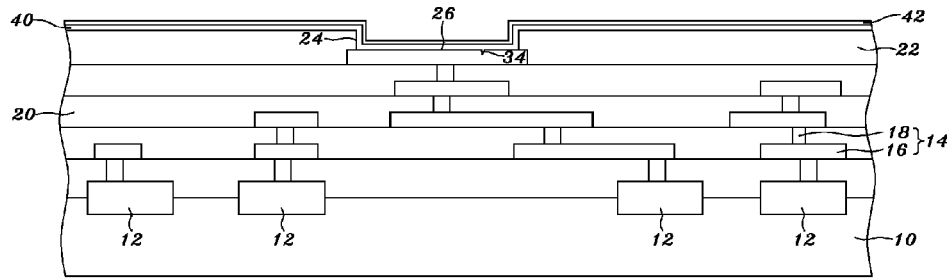
FIG. 3A to FIG. 3H are sectional views schematically showing the fabrication process according to one embodiment of the present invention.

Refer to FIG. 3A. After the progress shown in FIG. 2D, an adhesion/barrier layer 40 having a thickness of between 0.02 and 2 µm is formed over the pad 26 and the passivation layer 22. Next, a seed layer 42 is formed over the adhesion/barrier layer 40. Refer to Embodiment I for the detailed technical description of the adhesion/barrier layer 40 and the seed layer 42.

Figure 3B:
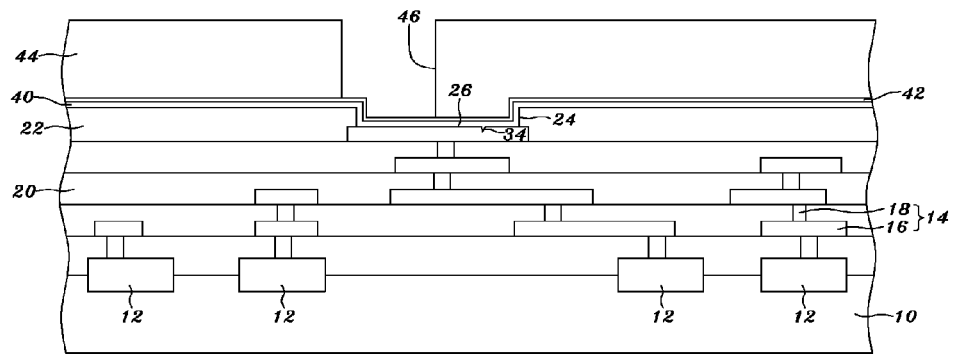
Figure 3C:
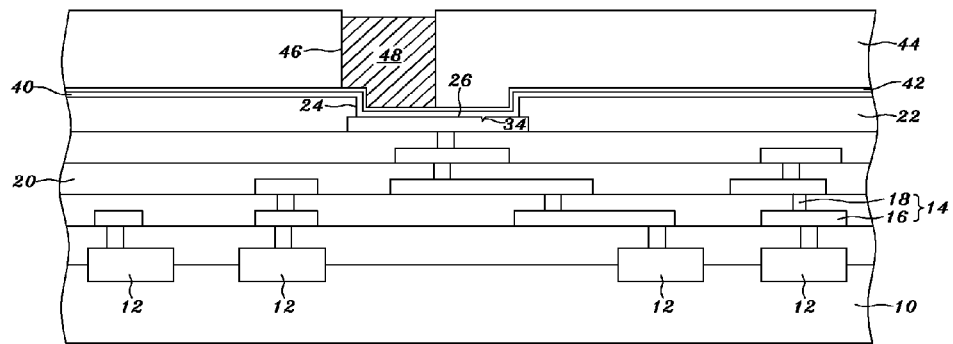

Refer to FIG. 3B. Next, a photoresist layer 44 is formed over the seed layer 42, and the photoresist layer 44 is patterned to form a photoresist-layer opening 46 to expose the seed layer 42 over the bond area 30 of the pad 26, wherein a 1× stepper or a 1× scanner is used to expose the photoresist layer 44 during forming the photoresist-layer opening 46. Refer to FIG. 3C. Next, a metal layer 48 having a thickness of between 1 and 200 µm (e.g. a thickness of between 20 and 120 µm) is formed over the seed layer 42 exposed by the photoresist-layer opening 46. Refer to Embodiment I for the detailed technical description of the metal layer 48.

Figure 3D:
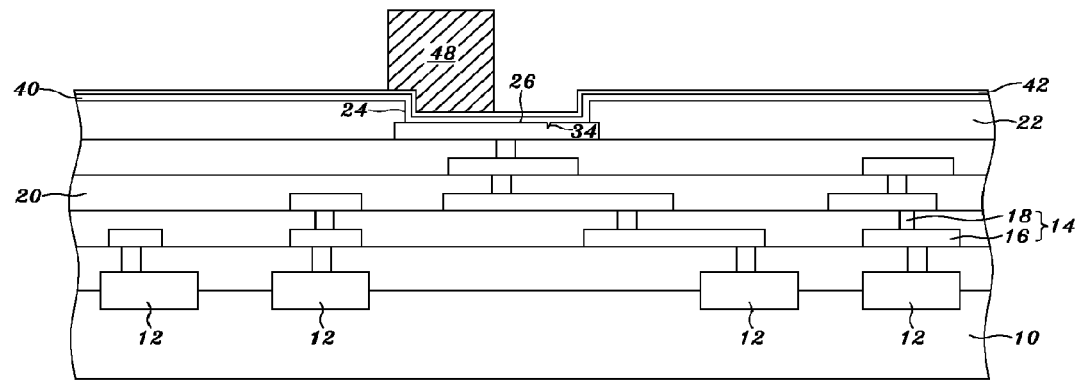
Figure 3E:
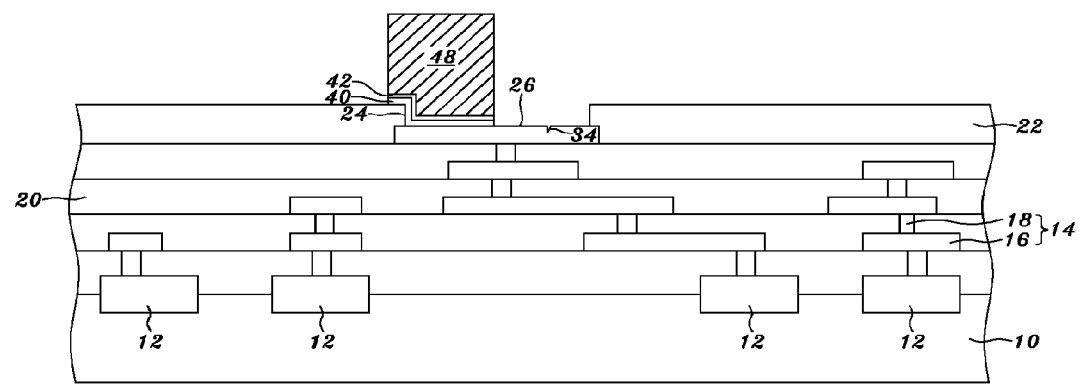
Figure 3F:
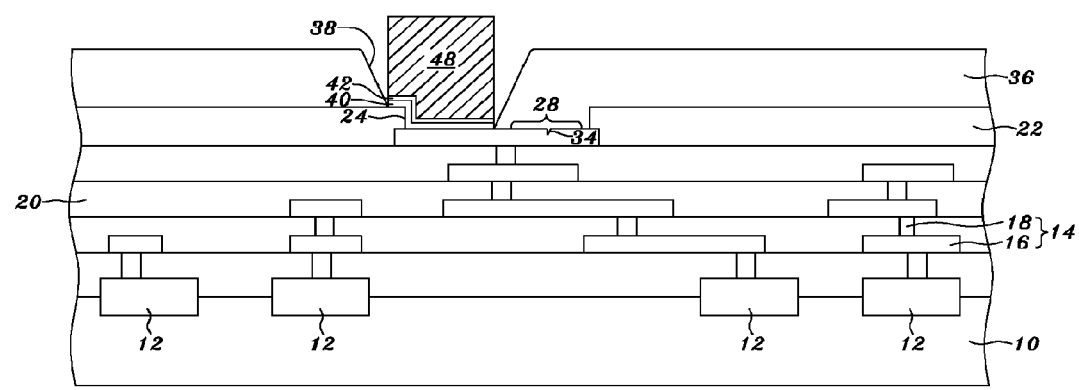

Refer to FIG. 3D. After the metal layer 48 is completed, the photoresist layer 44 is removed. Refer to FIG. 3E. Next, the seed layer 42 and the adhesion/barrier layer 40 are removed except those below the metal layer 48 with a dry-etching method, such as an argon sputter process. Refer to FIG. 3F. Next, a patterned polymer layer 36 is formed over the passivation layer 22 and the testing area 28 of the pad 26, and the probe mark 34 is thus covered. An opening 38 in the patterned polymer layer 36 exposes the metal layer 48. Refer to Embodiment I for the detailed technical description of the patterned polymer layer 36.

Figure 3G:
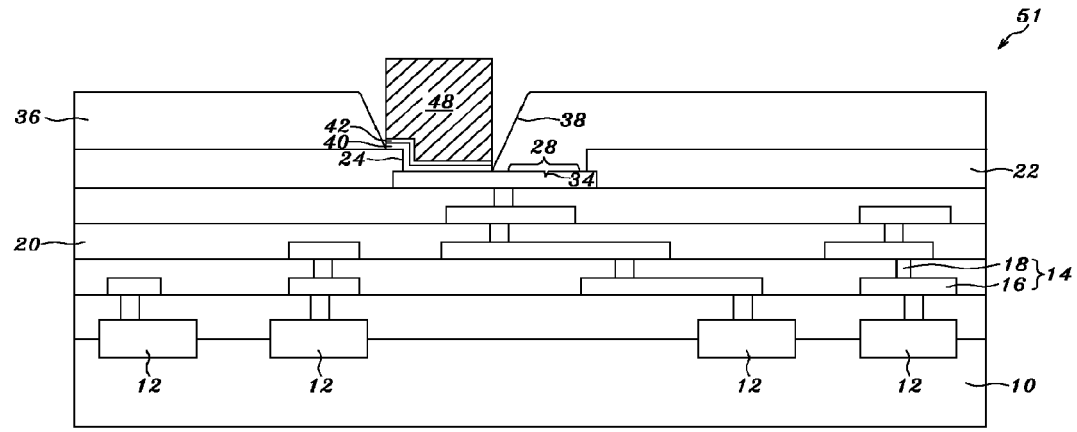
Figure 3H:
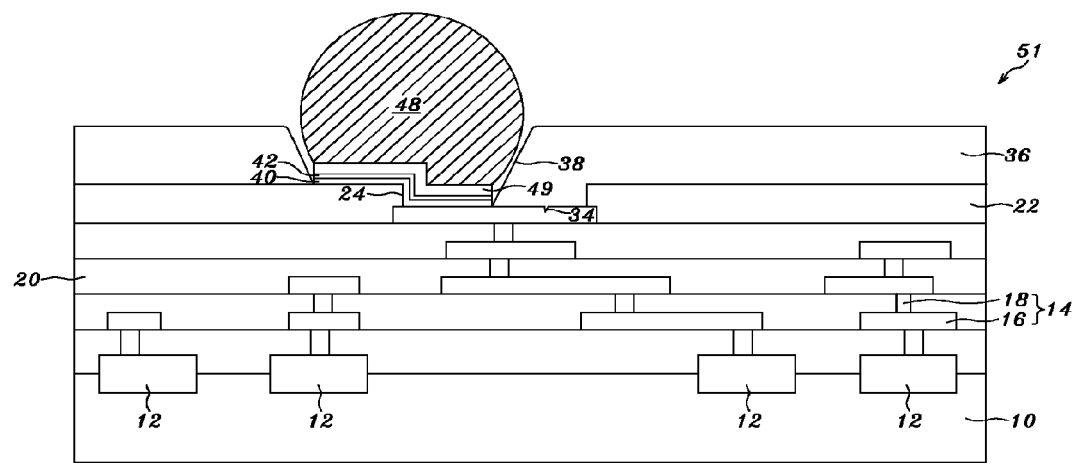

Refer to FIG. 3G. Then, the semiconductor substrate 10 is diced into a plurality of semiconductor chips 51. Refer to FIG. 3H. If the metal layer 48 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 48 is heated to its melting point; thus, the liquid metal assumes a ball shape and then solidifies. Then, the semiconductor substrate 10 is also diced into a plurality of semiconductor chips 51.

In this embodiment, in addition to contacting the pad 26, the testing probe 32 may also contact the metal layer 48 for electrical testing.

EMBODIMENT III

Figure 4A:
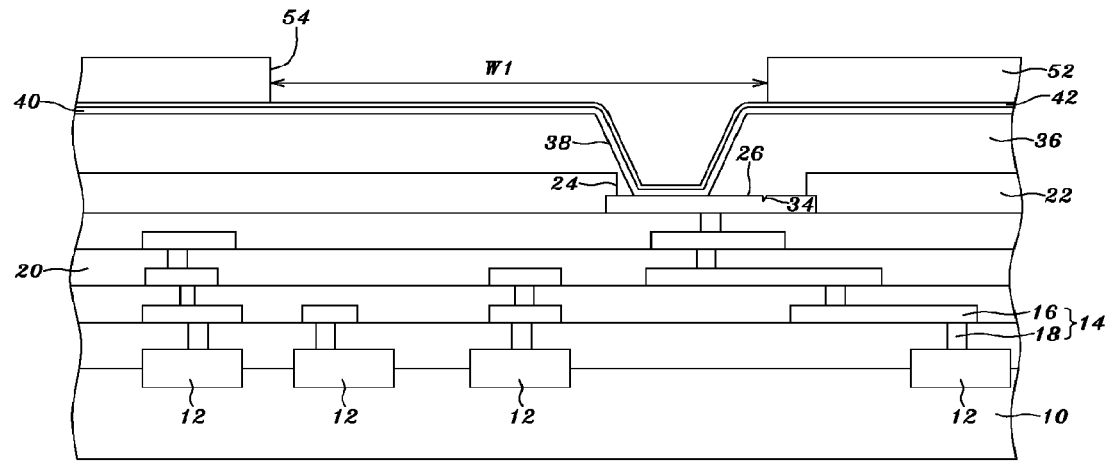
FIG. 4A, FIG. 4B and FIG. 4E to FIG. 4N are sectional views schematically showing the fabrication process according to one embodiment of the present invention.

This embodiment exemplifies the application of the present invention to a redistribution layer (RDL). Refer to FIG. 4A. After the progress shown in FIG. 2G, a first photoresist layer 52 is formed over the seed layer 42, and the first photoresist layer 52 is patterned to form a first-photoresist-layer opening 54 to expose the seed layer 42 over the bond area 30 of the pad 26 and expose the seed layer 42 over a portion of the patterned polymer layer 36 extending from the bond area 30, wherein a 1× stepper or a 1× scanner is used to expose the first photoresist layer 52 during forming the first-photoresist-layer opening 54. The first-photoresist-layer opening 54 has a dimension W1 of between 60 μm and 10 mm.

Figure 4B:
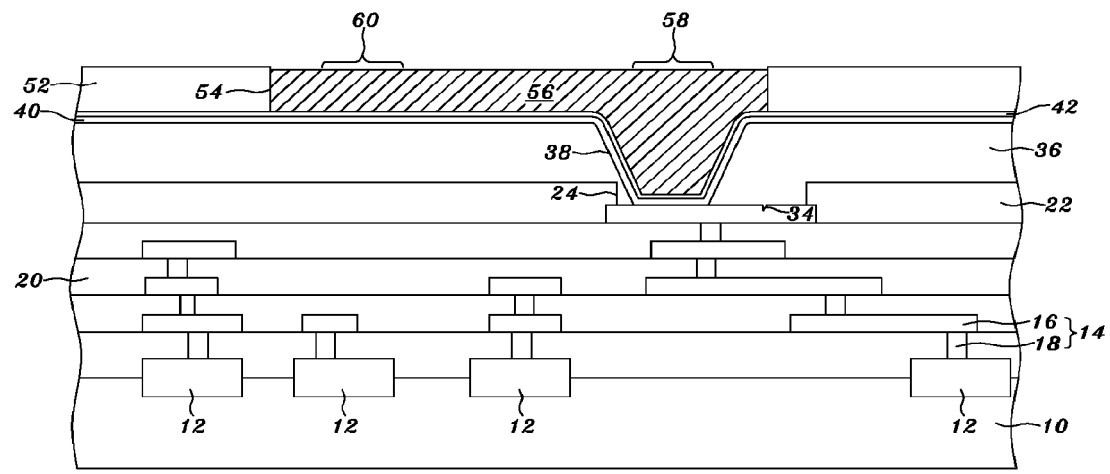
Figure 4C:
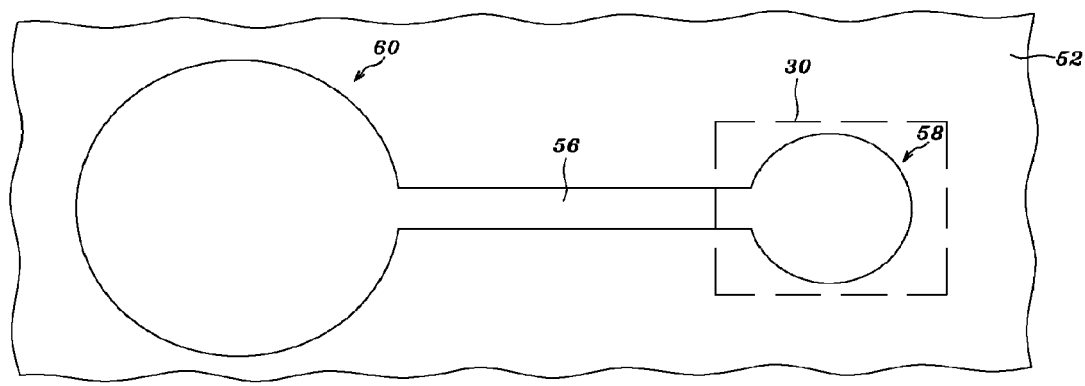
FIG. 4C is a partial top view schematically showing a wafer according to one embodiment of the present invention.
Figure 4D:
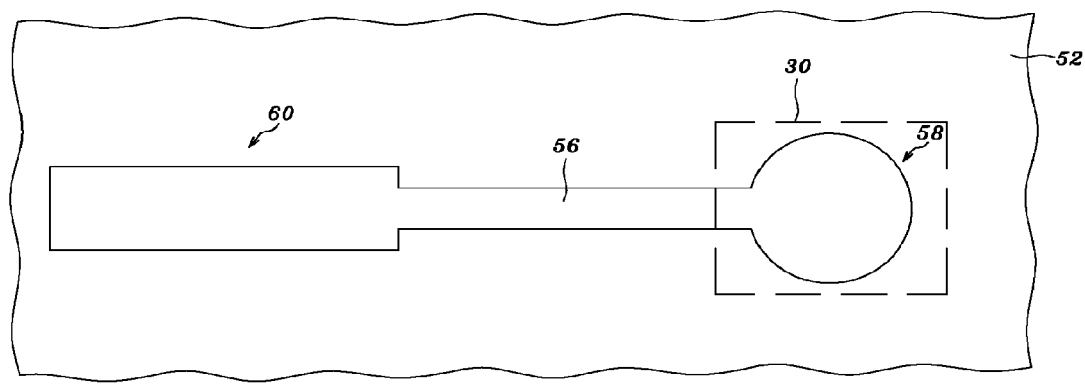
FIG. 4D is a partial top view schematically showing a wafer according to one embodiment of the present invention.

Refer to FIG. 4B. Next, a first metal layer 56 having a thickness of between 1 and 30 μm is electroplated on the seed layer 42 exposed by the first-photoresist-layer opening 54. The first metal layer 56 may be a single layer made of gold, copper, nickel, aluminum, silver, palladium, platinum, rhodium, ruthenium, a tin-lead alloy, or a tin-silver alloy. The first metal layer 56 may also be a composite layer made of the abovementioned metals, such as copper/nickel metallization or copper/nickel/gold metallization, in a bottom-up sequence. The thickness of the first metal layer 56 is preferred to be between 2 and 15 μm or between 4 and 15 μm. The first metal layer 56 also has a testing area 58 for electrical testing and a bond area 60 to be electrically connected to an external system. Refer to FIG. 4C and FIG. 4D. From a top view, the location of the bond area 60 is different from that of the bond area 30.

Figure 4E:
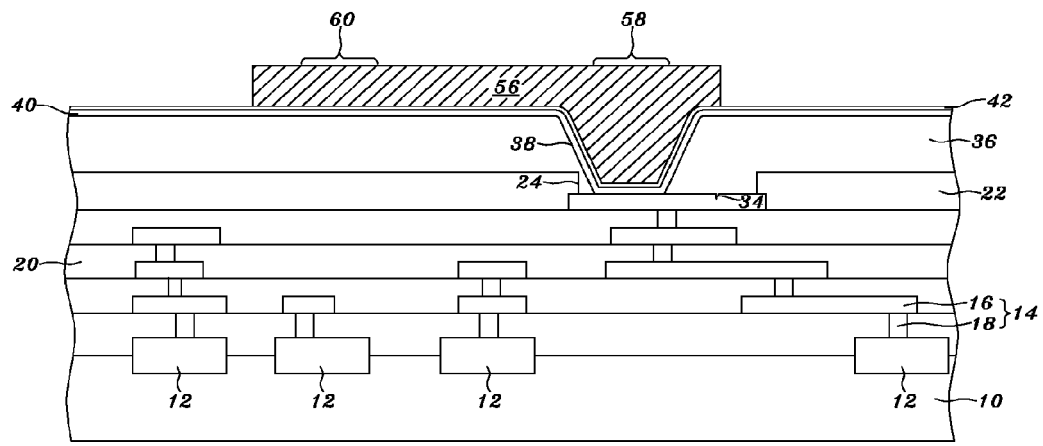
Figure 4F:
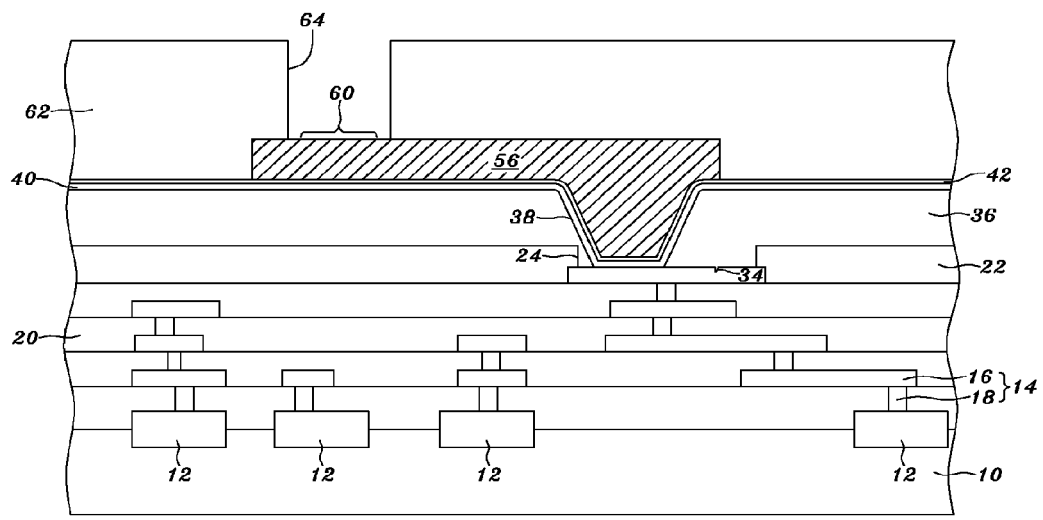

Refer to FIG. 4E. After the first metal layer 56 is completed, the first photoresist layer 52 is removed. Refer to FIG. 4F. Next, a second photoresist layer 62 is formed over the seed layer 42 and the first metal layer 56, and the second photoresist layer 62 is patterned to form a second-photoresist-layer opening 64 to expose the bond area 60 of the first metal layer 56, wherein a 1× stepper or a 1× scanner is used to expose the second photoresist layer 62 during forming the second-photoresist-layer opening 64.

Figure 4G:
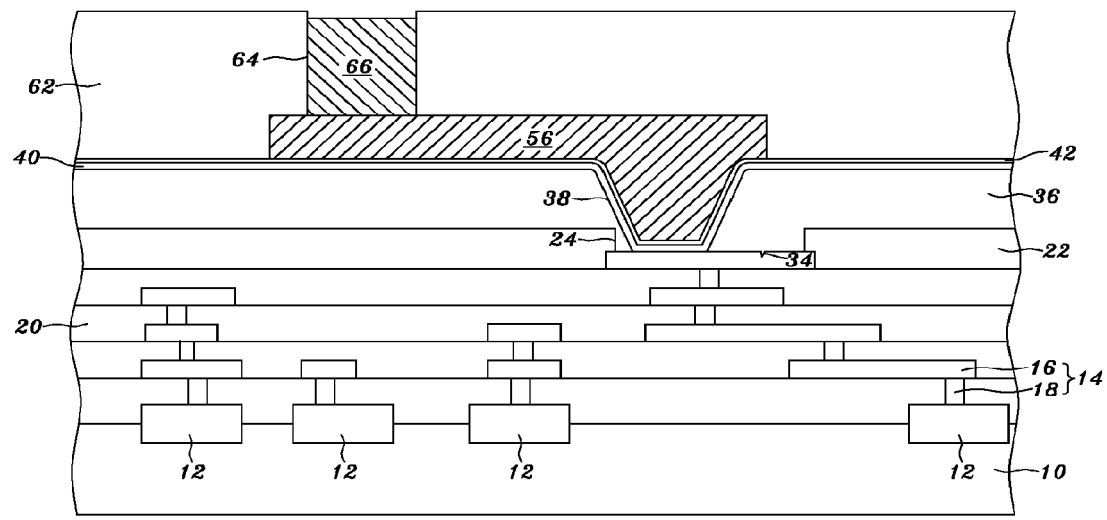

Refer to FIG. 4G. Next, a second metal layer 66 having a thickness of between 1 and 200 μm, e.g. between 20 and 120 μm, is electroplated on the bond area 60 exposed by the second-photoresist-layer opening 64. The second metal layer 66 may be a single layer made of gold, copper, silver, palladium, platinum, rhodium, ruthenium, rhenium, or nickel. The second metal layer 66 may also be a composite layer made of the abovementioned metals. The thickness of the second metal layer 66 is preferred to be between 2 and 30 μm. For example, the metal layer 48 may include a gold layer with a thickness of between 10 and 30 μm, for forming a metal bump, or between 1 and 10 μm, for forming a metal trace. For example, the metal layer 48 may include a copper layer with a thickness of between 2 and 30 μm.

Figure 4H:
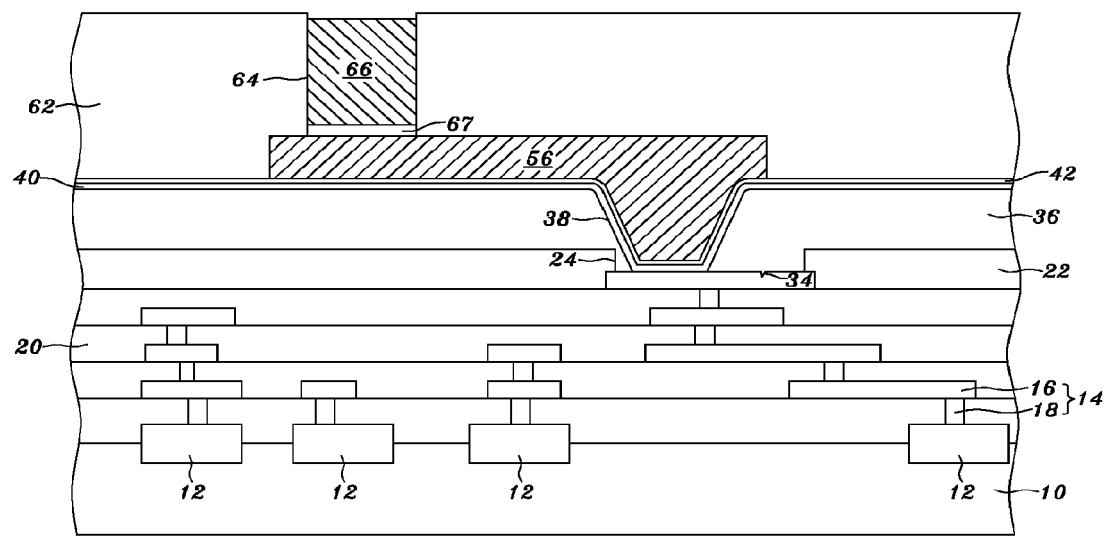

The second metal layer 66 may also be made of a tin-containing material. The tin-containing material may be a tin-lead alloy, a tin-silver alloy, a tin-silver-copper alloy or a lead-free alloy. The tin-containing layer 66 has a thickness of between 3 and 150 μm. Refer to FIG. 4H. Before the tin-containing layer 66 is to be formed, a metal layer 67 may be firstly formed on the bond area 60 exposed by the second-photoresist-layer opening 64. Next, the tin-containing layer 66 is formed over the metal layer 67. The metal layer 67 may be a copper layer having a thickness of between 1 and 10 μm. Alternatively, the metal layer 67 may be a composite layer of a nickel layer having a thickness of between 0.5 and 5 μm and a copper layer having a thickness of between 1 and 10 μm, and the nickel layer is on the copper layer.

Figure 4I:
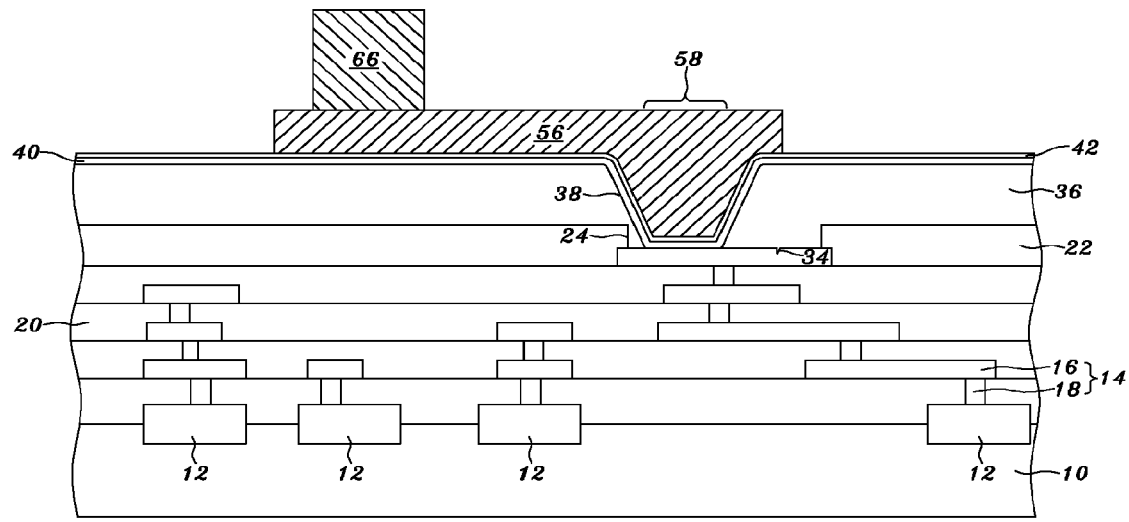
Figure 4J:
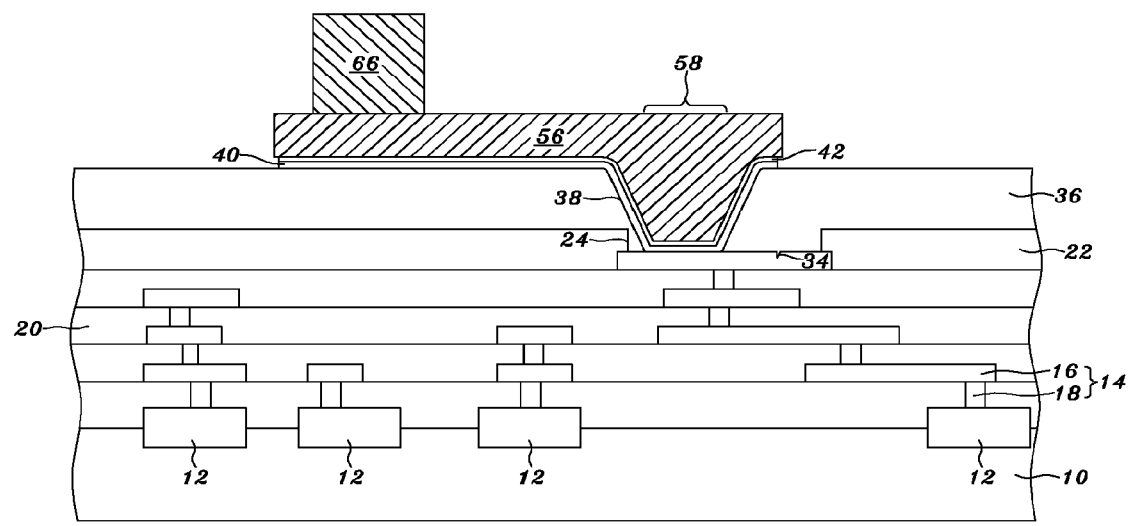

Refer to FIG. 4I. After the second metal layer 66 is completed, the second photoresist layer 62 is removed. Refer to FIG. 4J. Next, the seed layer 42 and the adhesion/barrier layer 40 are removed except those below the first metal layer 56. The adhesion/barrier layer 40 can be removed with a dry-etching method or a wet-etching method. The dry-etching method may be implemented with an argon sputter process. When the adhesion/barrier layer 40 is made of a titanium-tungsten alloy, it can be removed with hydrogen peroxide. If the seed layer 42 is made of gold, it can be removed with an iodine-containing etchant, such as a potassium iodine solution.

Figure 4K:
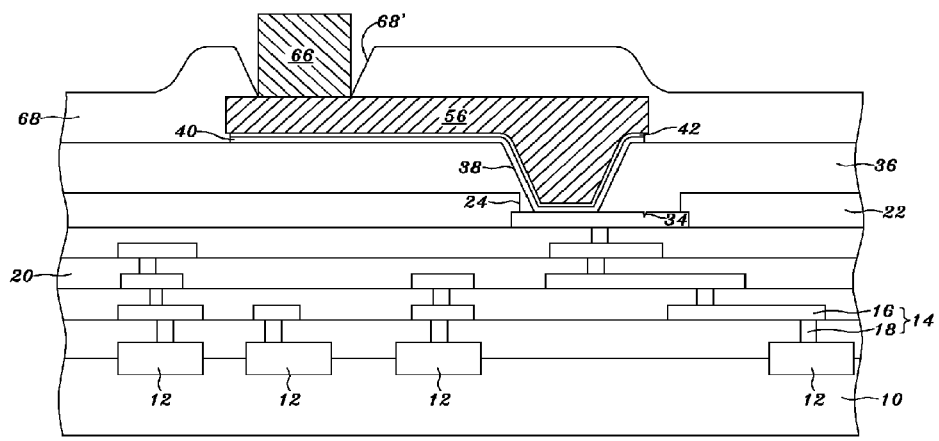

Refer to FIG. 4K. After the seed layer 42 and the adhesion/barrier layer 40 are removed except those below the first metal layer 56, a patterned polymer layer 68 may be optionally formed over the first metal layer 66 and the patterned polymer layer 36, and an opening 68' in the patterned polymer layer 68 exposes the second metal layer 66.

Figure 4L:
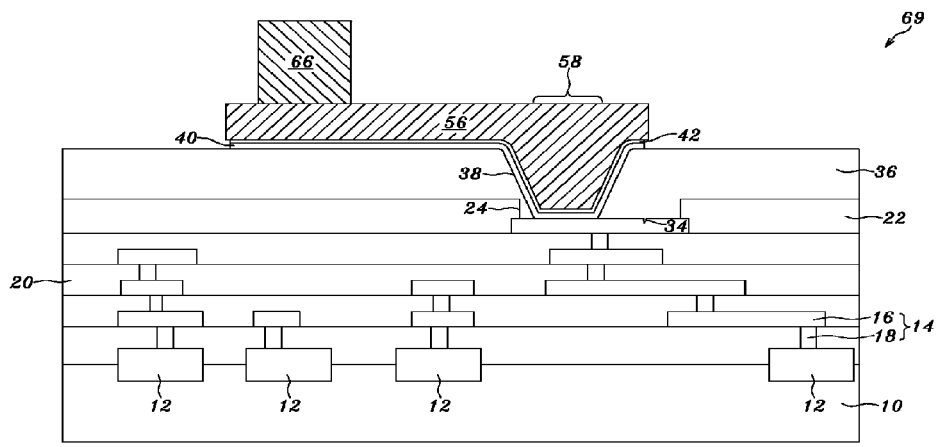
Figure 4M:
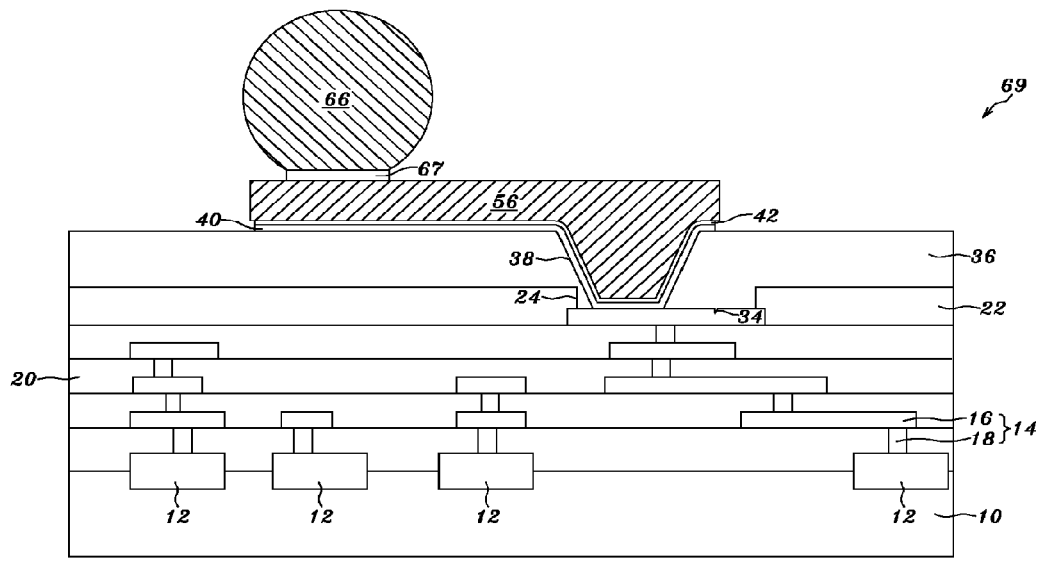

Refer to FIG. 4L. The semiconductor substrate 10 is diced into a plurality of semiconductor chips 69. Refer to FIG. 4M. If the second metal layer 66 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 66 is heated to its melting point; thus, the liquid metal assumes a ball shape and then solidifies. Then, the semiconductor substrate 10 is also diced into a plurality of semiconductor chips 69.

Figure 4N:
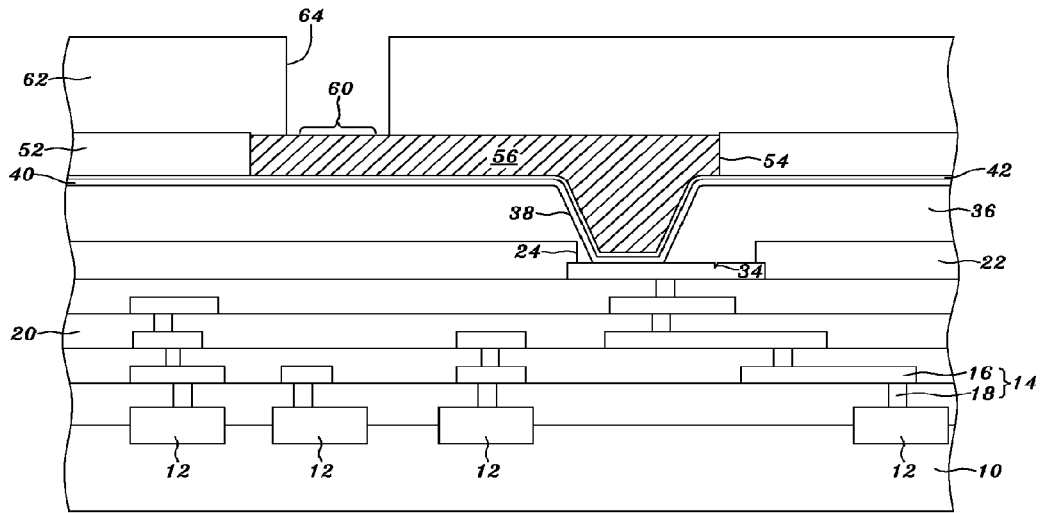

Refer to FIG. 4N. Alternatively, after the first metal layer 56 is completed, the first photoresist layer 56 is kept, and the second photoresist layer 62 is formed over the first photoresist layer 52 and the first metal layer 56, and the second-photoresist-layer opening 64 exposes the bond area 60 of the first metal layer 56. Next, the process shown in FIG. 4G is undertaken. After the second metal layer 66 is completed, the second photoresist layer 62 and the first photoresist layer 52 are removed to obtain the structure shown in FIG. 4I. Next, the seed layer 42 and the adhesion/barrier layer 40 are removed except those below the first metal layer 56 to obtain the structure shown in FIG. 4J. Then, the semiconductor substrate 10 is also diced into a plurality of semiconductor chips 69 shown in FIG. 4L or FIG. 4M.

In this embodiment, the combination of the remaining first metal layer 56, the seed layer 42 and the adhesion/barrier layer 40 forms a redistribution layer (RDL). The redistribution layer is not only formed over the polymer-layer opening 38 but also extends to over a portion of the patterned polymer layer 36. The redistribution layer will benefit the construction of the succeeding circuit structure. Further, in addition to contacting the pad 26, the testing probe 32 may also contact the first metal layer 56 or the second metal layer 66 for electrical testing.

EMBODIMENT IV

This embodiment also exemplifies the application of the present invention to a redistribution layer (RDL).

Figure 5A:
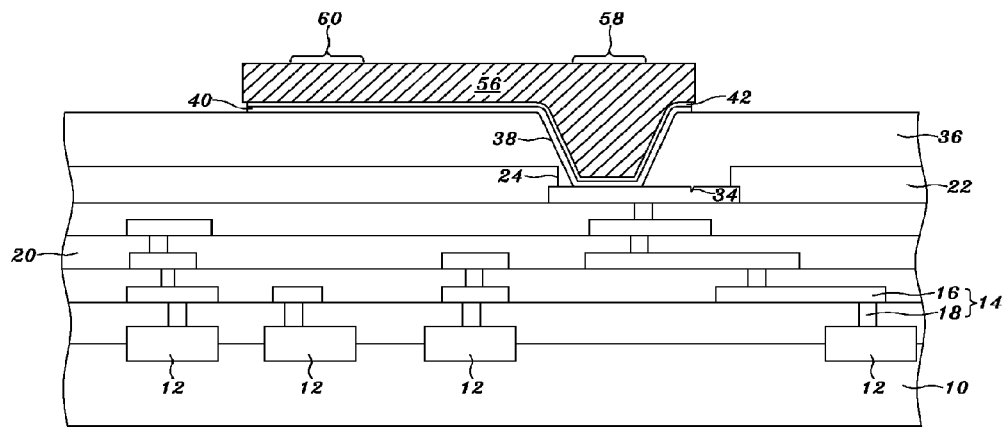
FIG. 5A to FIG. 5I are sectional views schematically showing the fabrication process according to one embodiment of the present invention.

Refer to FIG. 5A. After the progress shown in FIG. 4E, the seed layer 42 and the adhesion/barrier layer 40 are removed except those below the first metal layer 56. Refer to Embodiment III for the detailed technical description of removing the adhesion/barrier layer 40 and the seed layer 42.

Figure 5B:
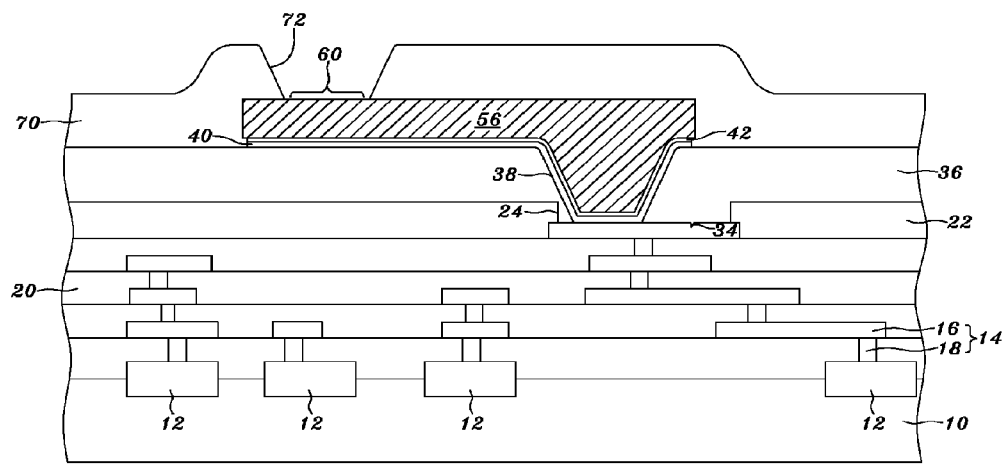

Refer to FIG. 5B. Next, a patterned polymer layer 70 is formed over the patterned polymer layer 36 and the first metal layer 56, and an opening 72 in the patterned polymer layer 70 exposes the bond area 60 of the first metal layer 56. For the detailed technical contents of the patterned polymer layer 70, such as the material, thickness and fabrication method thereof, refer to those of the patterned polymer layer 36 of Embodiment I.

Figure 5C:
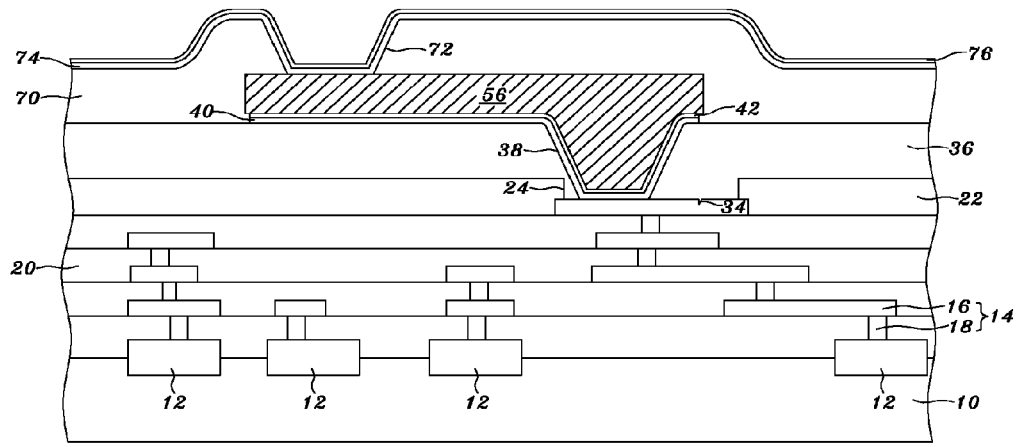

Refer to FIG. 5C. Next, an adhesion/barrier layer 74 having a thickness of 0.02 and 2 μm is formed over the patterned polymer layer 70 and the bond area 60 exposed by the polymer-layer opening 72. The material of the adhesion/barrier layer 74 may be titanium, tungsten, cobalt, nickel, titanium nitride, a titanium-tungsten alloy, chromium, copper, gold, protactinium, platinum, palladium, ruthenium, rhodium, silver, or a composite of the abovementioned materials. The adhesion/barrier layer 74 may be fabricated with a sputtering method or a vapor deposition method. Next, a seed layer 76 is formed over the adhesion/barrier layer 74. The seed layer 76 is beneficial to electroplating a metal layer thereon. Thus, the material of the seed layer 76 varies with the material of the succeeding metal layer. For the detailed technical description of the seed layer 76, refer to that of the seed layer 42 of Embodiment I.

Figure 5D:
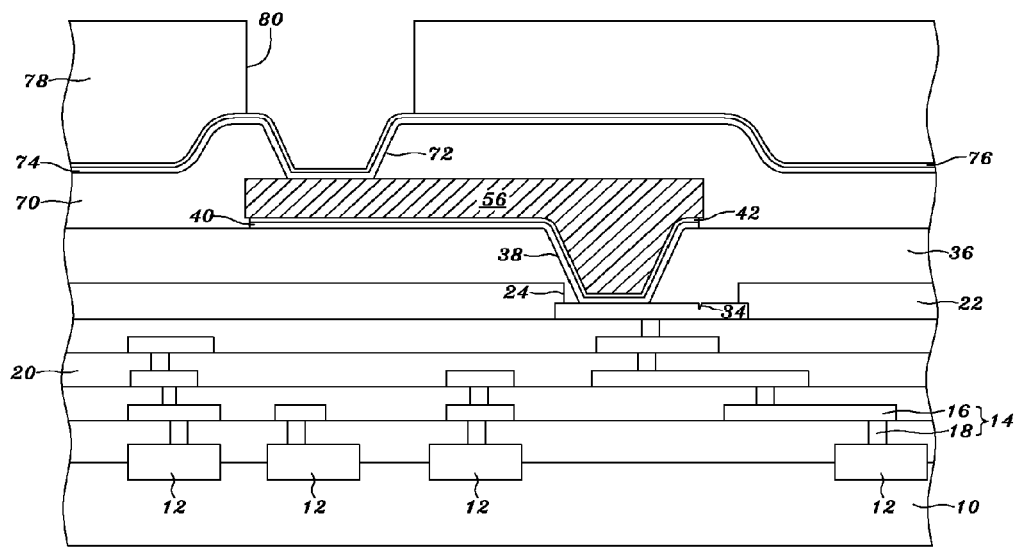
Figure 5E:
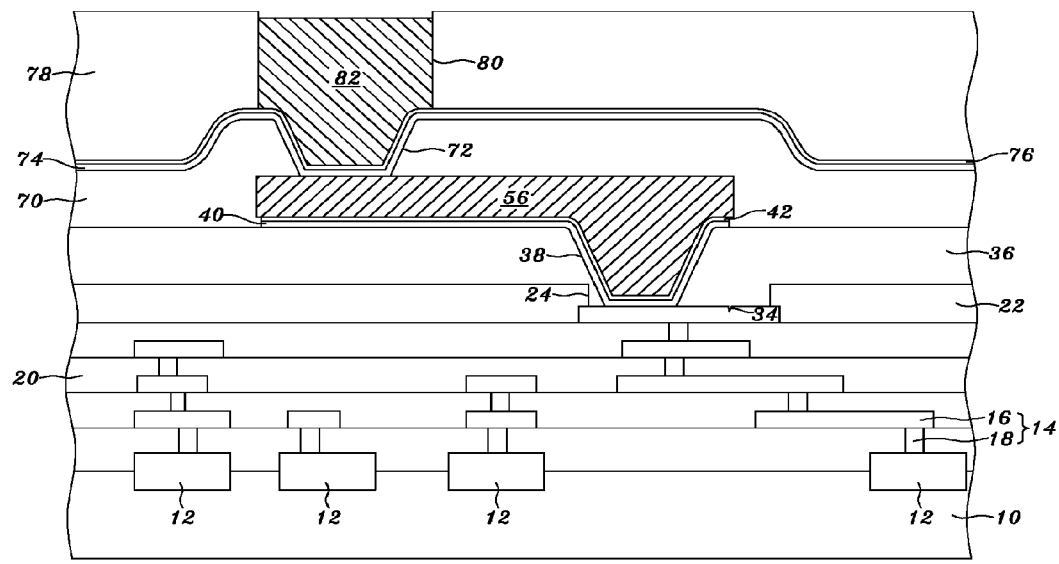

Refer to FIG. 5D. Next, a second photoresist layer 78 is formed over the seed layer 76, and the second photoresist layer 78 is patterned to form a second-photoresist-layer opening 80 to expose the seed layer 76 over the bond area 60 of the first metal layer 56, wherein a 1× stepper or a 1× scanner is used to expose the second photoresist layer 78 during forming the second-photoresist-layer opening 80. Refer to FIG. 5E. Next, a second metal layer 82 having a thickness of between 1 and 200 μm, e.g. between 20 and 120 μm, is electroplated on the seed layer 76 exposed by the second-photoresist-layer opening 80. For the detailed technical contents of the second metal layer 82, such as the material and preferred thickness thereof, refer to those of the second metal layer 66 of Embodiment III.

Figure 5F:
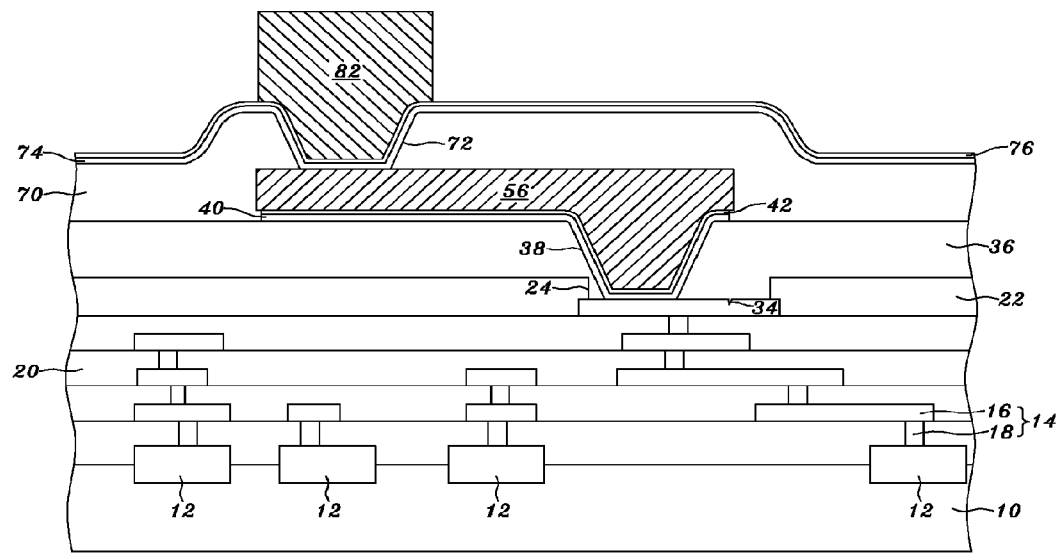
Figure 5G:
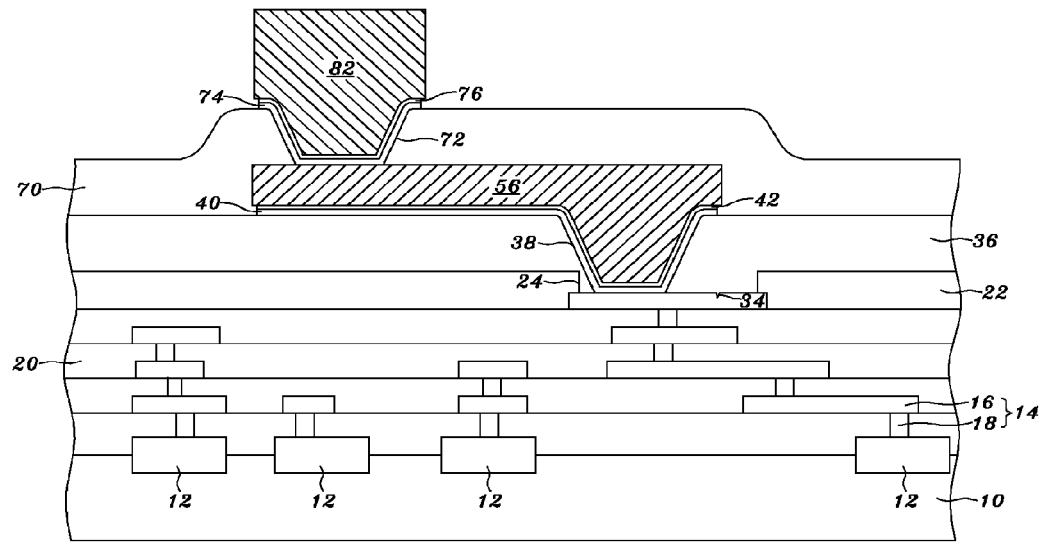

Refer to FIG. 5F. After the second metal layer 82 is completed, the second photoresist layer 78 is removed. Refer to FIG. 5G. Next, the seed layer 76 and the adhesion/barrier layer 74 are removed except those below the second metal layer 82. For the detailed technical description of removing the adhesion/barrier layer 74 and the seed layer 76, refer to that of removing the adhesion/barrier layer 40 and the seed layer 42 in the abovementioned embodiments.

Figure 5H:
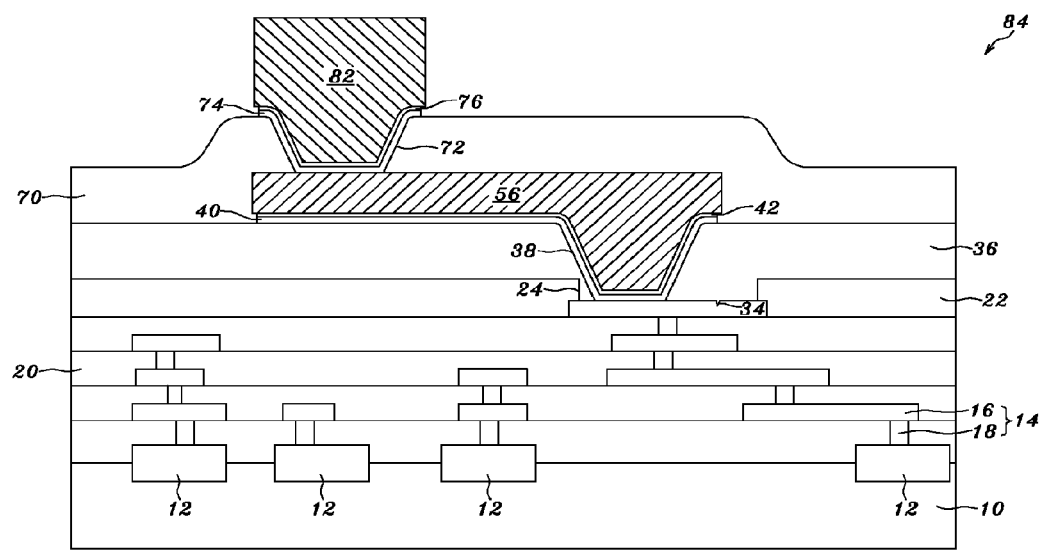
Figure 5I:
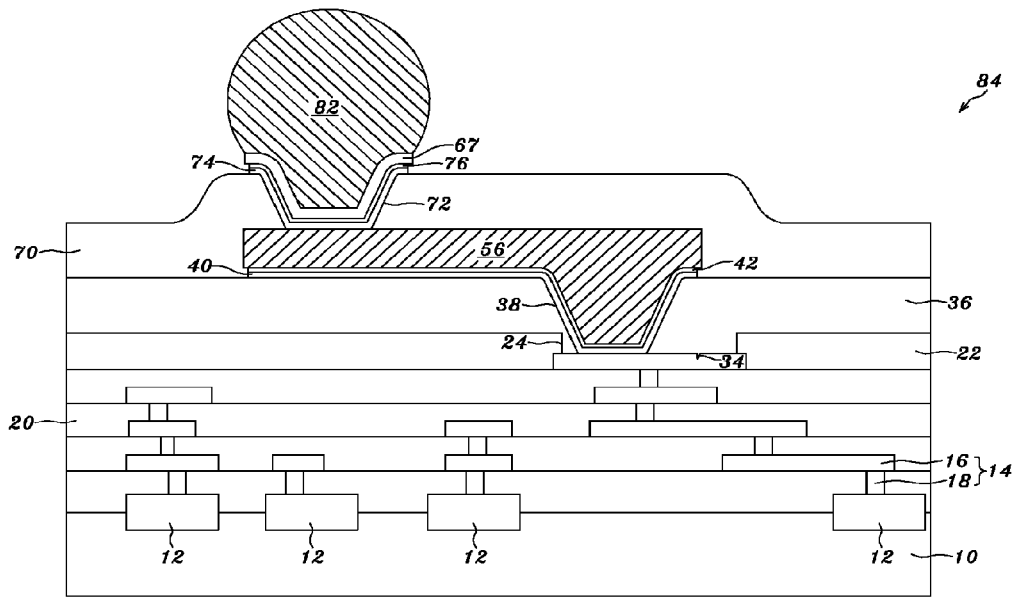

Refer to FIG. 5H. The semiconductor substrate 10 is diced into a plurality of semiconductor chips 84. Refer to FIG. 5I. If the second metal layer 82 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 82 is heated to its melting point; thus, the liquid metal assumes a ball shape and then solidifies. Then, the semiconductor substrate 10 is also diced into a plurality of semiconductor chips 84.

Further, in addition to contacting the pad 26, the testing probe 32 may also contact the first metal layer 56 or the second metal layer 82 for electrical testing.

EMBODIMENT V

This embodiment also exemplifies the application of the present invention to a redistribution layer (RDL).

Figure 6A:
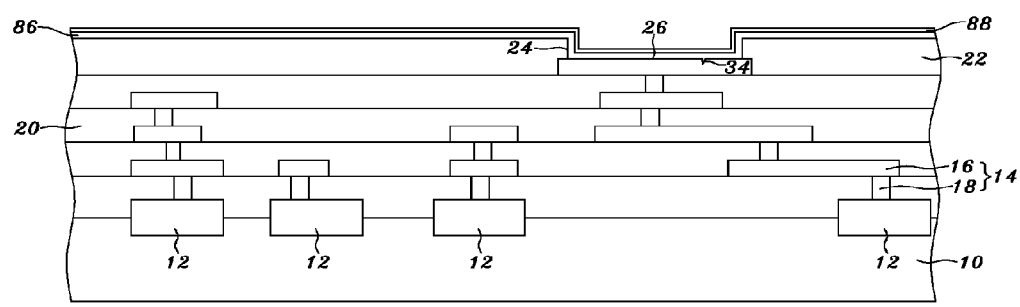
FIG. 6A to FIG. 6L are sectional views schematically showing the fabrication process according to one embodiment of the present invention.

Refer to FIG. 6A. After the progress shown in FIG. 2D, an adhesion/barrier layer 86 is formed over the pad 26 (including the testing area 28 and the bond area 30) and the passivation layer 22. Next, a seed layer 88 is formed over the adhesion/barrier layer 86. For the detailed technical description of the adhesion/barrier layer 86 and the seed layer 88, refer to that of the adhesion/barrier layer 40 and the seed layer 42 of Embodiment I.

Figure 6B:
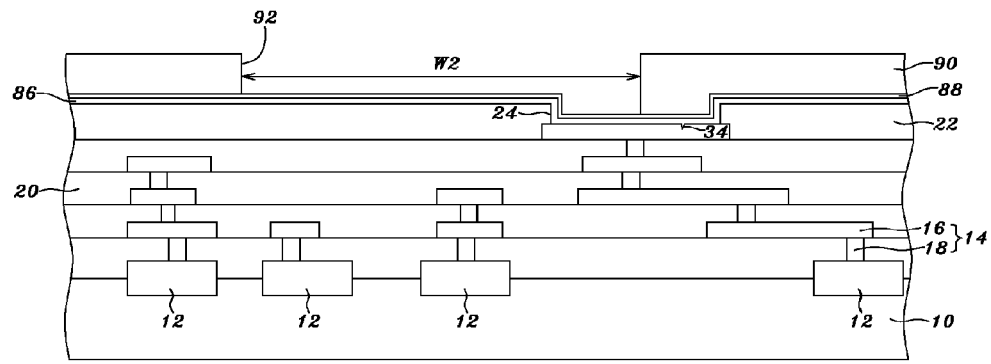

Refer to FIG. 6B. Next, a first photoresist layer 90 is formed over the seed layer 88, and the first photoresist layer 90 is patterned to form a first-photoresist-layer opening 92 to expose the seed layer 88 over the bond area 30 of the pad 26 and to expose the seed layer 88 over a portion of the passivation layer 22 extending from the bond area 30, wherein a 1× stepper or a 1× scanner is used to expose the first photoresist layer 90 during forming the first-photoresist-layer opening 92. The first-photoresist-layer opening 92 has a dimension W2 of between 60 μm and 10 mm.

Figure 6C:
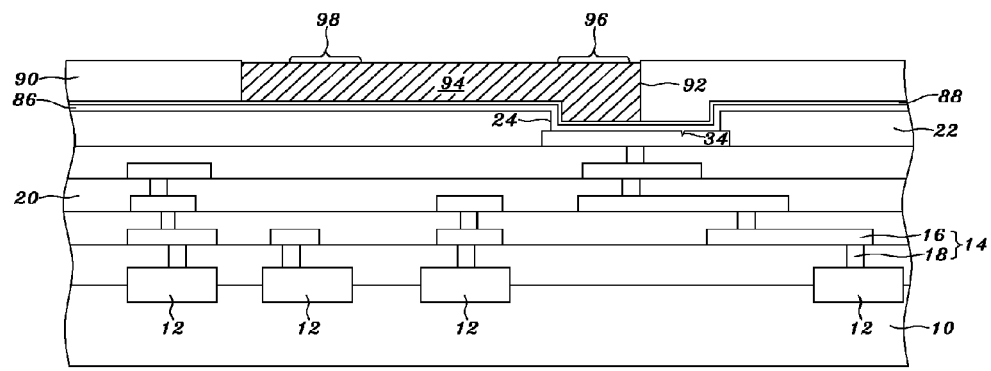

Refer to FIG. 6C. Next, a first metal layer 94 having a thickness of between 1 and 30 μm is electroplated on the seed layer 88 exposed by the first-photoresist-layer opening 92. For the detailed technical contents of the first metal layer 94, such as the material and preferred thickness thereof, refer to those of the first metal layer 56 of Embodiment III. The first metal layer 94 includes a testing area 96 for electrical testing and a bond area 98 to be electrically connected to an external system. Similar to that shown in FIG. 4C and FIG. 4D, the location of the bond area 98 is different from that of the bond area 30 from a top view.

Figure 6D:
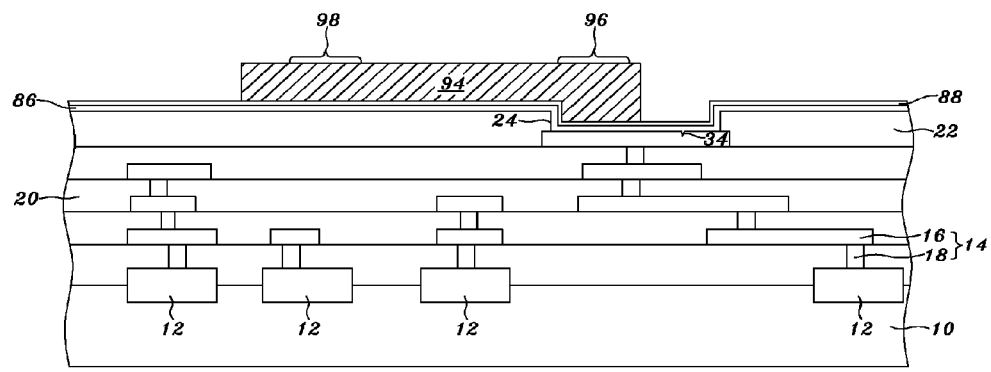
Figure 6E:
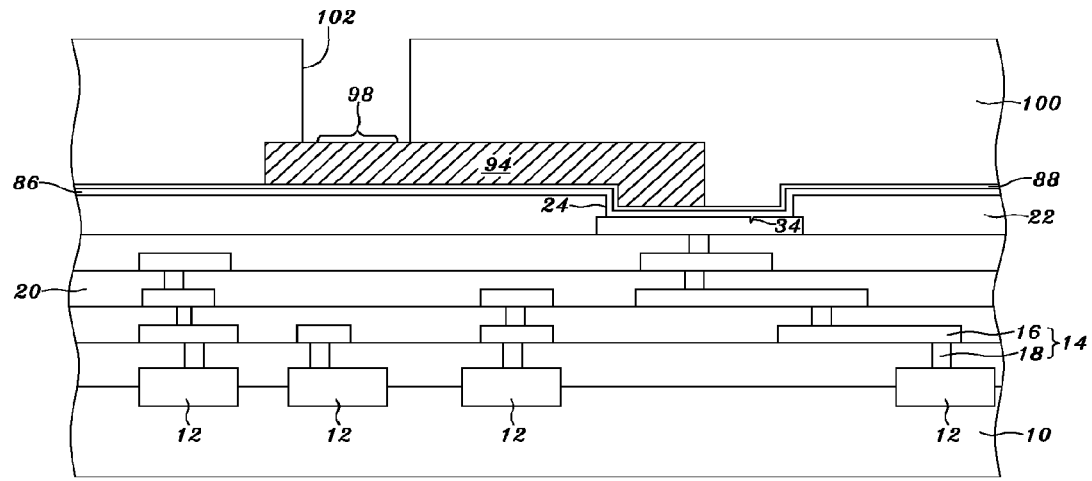

Refer to FIG. 6D. After the first metal layer 94 is completed, the first photoresist layer 90 is removed. Refer to FIG. 6E. Next, a second photoresist layer 100 is formed over the seed layer 88 and the first metal layer 94, and the second photoresist layer 100 is patterned to form a second-photoresist-layer opening 102 to expose the bond area 98 of the first metal layer 94, wherein a 1× stepper or a 1× scanner is used to expose the second photoresist layer 100 during forming the second-photoresist-layer opening 102.

Figure 6F:
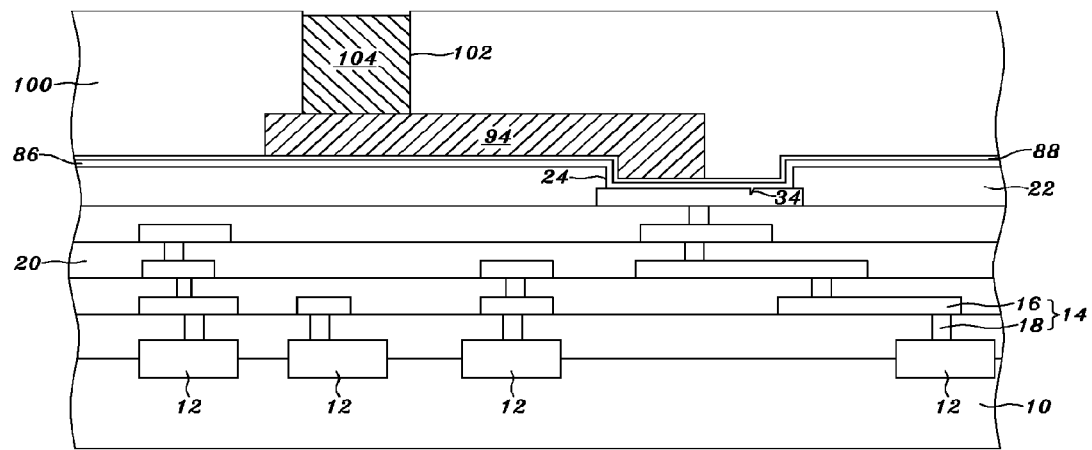

Refer to FIG. 6F. Next, a second metal layer 104 having a thickness of between 1 and 200 μm, e.g. between 20 and 120 μm, is electroplated on the bond area 98 exposed by the second-photoresist-layer opening 102. For the detailed technical contents of the second metal layer 104, such as the material and preferred thickness thereof, refer to those of the second metal layer 66 of Embodiment III.

Figure 6G:
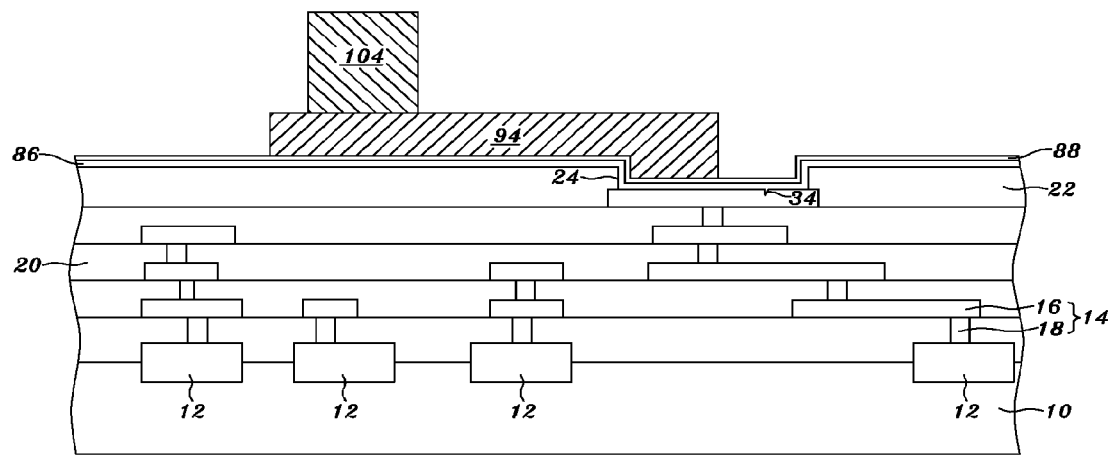
Figure 6H:
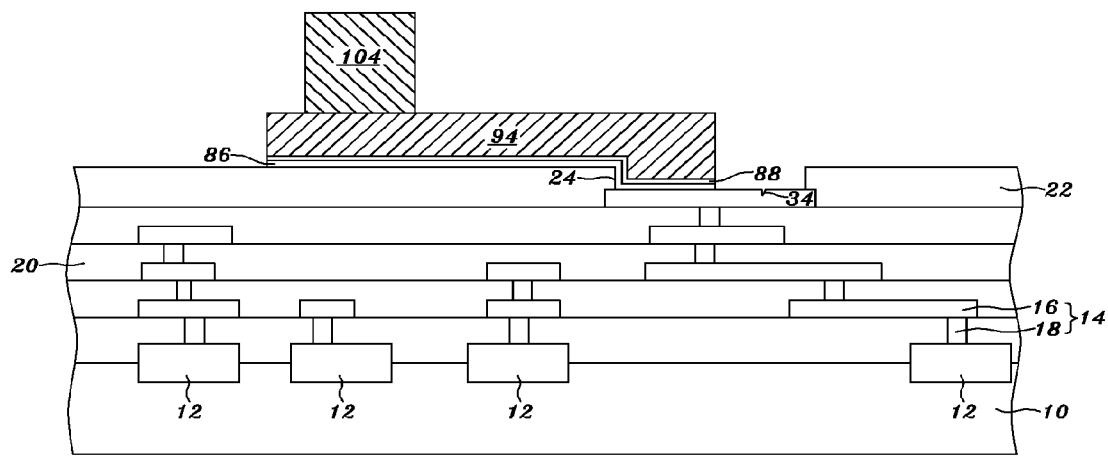

Refer to FIG. 6G. After the second metal layer 104 is completed, the second photoresist layer 100 is removed. Refer to FIG. 6H. Next, the seed layer 88 and the adhesion/barrier layer 86 are removed with a dry-etching method except those below the first metal layer 94, and the dry-etching method can be implemented with an argon sputter process.

Figure 6I:
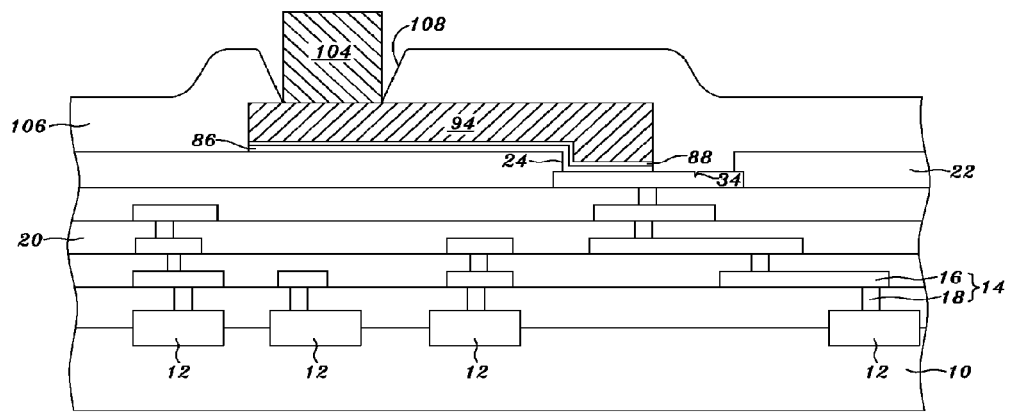

Refer to FIG. 6I. Next, a patterned polymer layer 106 is formed over the first metal layer 94, the passivation layer 22 and the testing area 28 of the pad 26, and the probe mark 34 is thus covered. An opening 108 in the patterned polymer layer 106 exposes the second metal layer 104.

Figure 6J:
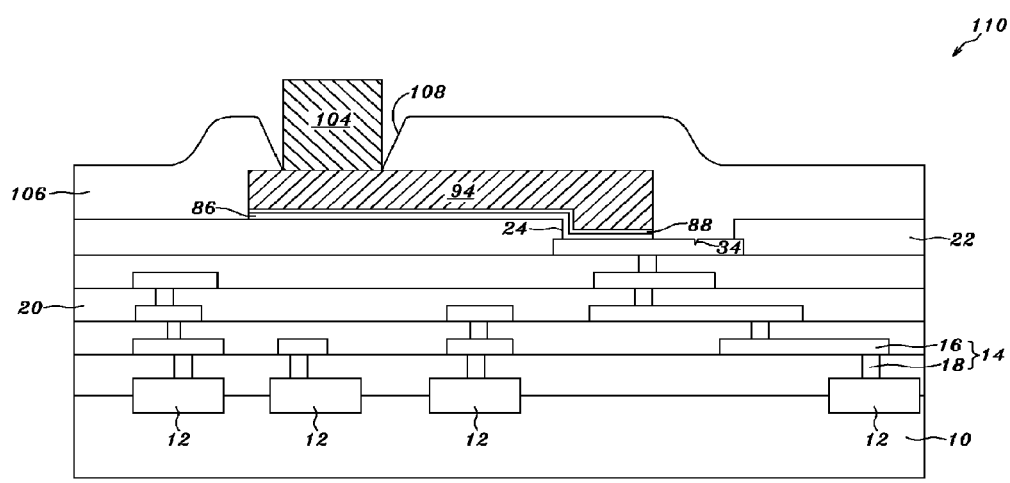
Figure 6K:
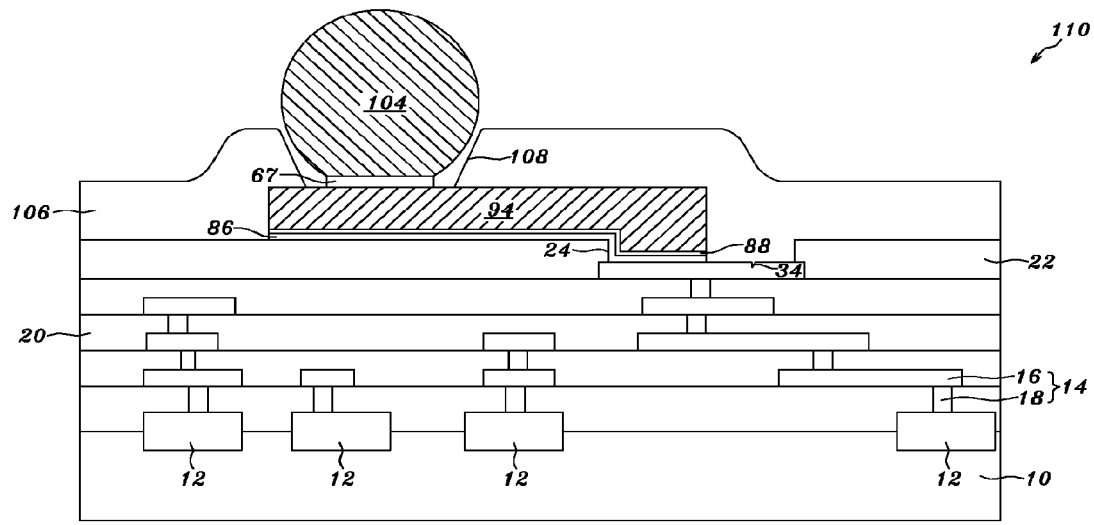

Refer to FIG. 6J. The semiconductor substrate 10 is diced into a plurality of semiconductor chips 110. Refer to FIG. 6K. If the second metal layer 104 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 104 is heated to its melting point; thus, the liquid metal assumes a ball shape and then solidifies. Then, the semiconductor substrate 10 is also diced into a plurality of semiconductor chips 110.

Figure 6L:
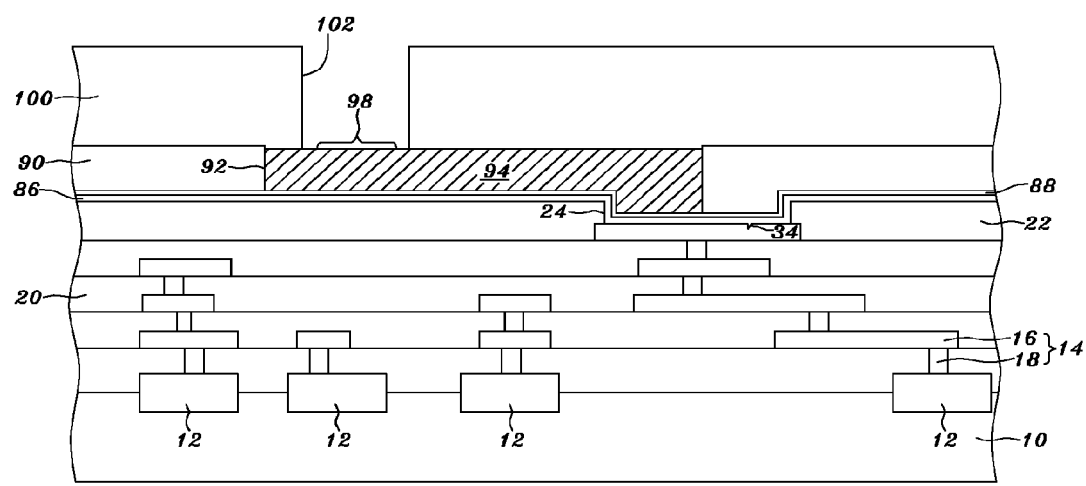

Refer to FIG. 6L. Alternatively, after the first metal layer 94 is completed, the first photoresist layer 90 is kept, and the second photoresist layer 100 is formed over the first photoresist layer 90 and the first metal layer 94, and the second-photoresist-layer opening 102 exposes the bond area 98 of the first metal layer 94. Next, the process shown in FIG. 6F is undertaken. After the second metal layer 104 is completed, the second photoresist layer 100 and the first photoresist layer 90 are removed to obtain the structure shown in FIG. 6G. Next, the seed layer 88 and the adhesion/barrier layer 86 are removed with a dry-etching method except those below the first metal layer 94 to obtain the structure shown in FIG. 6H. Next, as shown in FIG. 6I, a patterned polymer layer 106 is formed over the first metal layer 94, the passivation layer 22 and the testing area 28 of the pad 26, and an opening 108 in the patterned polymer layer 106 exposes the second metal layer 104. Then, the semiconductor substrate 10 is also diced into a plurality of semiconductor chips 110 shown in FIG. 6J or FIG. 6K.

Further, in addition to contacting the pad 26, the testing probe 32 may also contact the first metal layer 94 or the second metal layer 104 for electrical testing.

EMBODIMENT VI

This embodiment also exemplifies the application of the present invention to a redistribution layer (RDL).

Figure 7A:
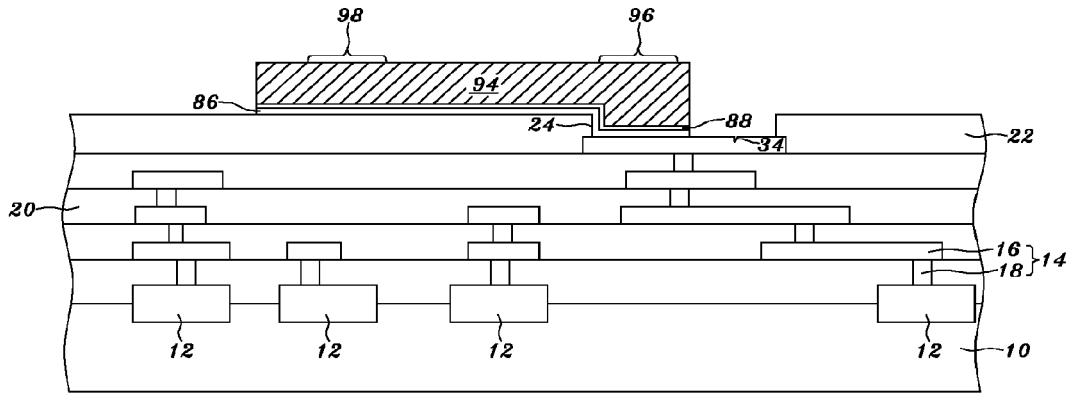
FIG. 7A to FIG. 7I are sectional views schematically showing the fabrication process according to one embodiment of the present invention.

Refer to FIG. 7A. After the process shown in FIG. 6D, the seed layer 88 and the adhesion/barrier layer 86 are removed with a dry-etching method except those below the first metal layer 94, wherein the dry-etching method can be implemented with an argon sputter process.

Figure 7B:
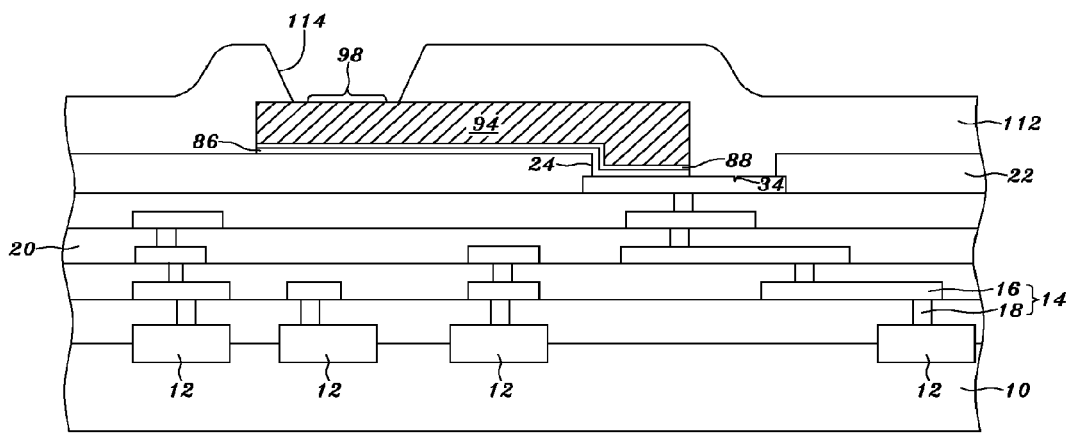

Refer to FIG. 7B. Next, a patterned polymer layer 112 is formed over the first metal layer 94, the passivation layer 22 and the testing area 28 of the pad 26, and the probe mark 34 is thus covered. An opening 114 in the patterned polymer layer 112 exposes the bond area 98 of the first metal layer 94.

Figure 7C:
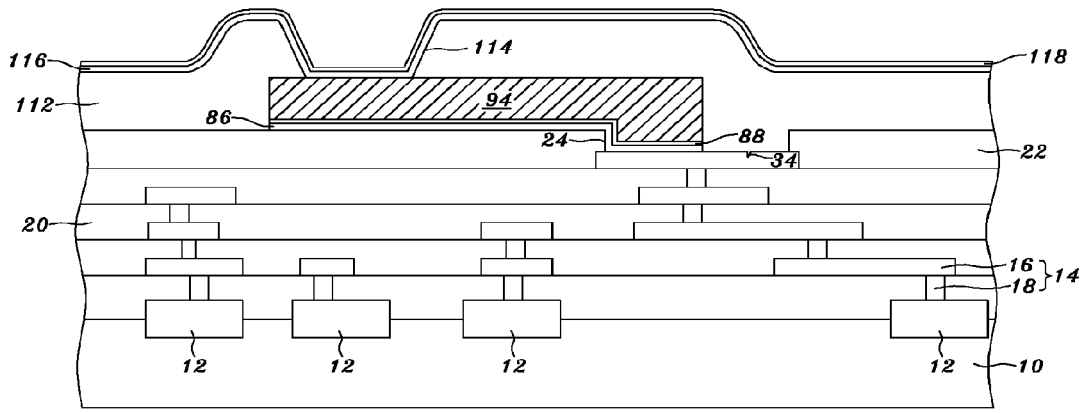

Refer to FIG. 7C. Next, an adhesion/barrier layer 116 is formed over the patterned polymer layer 112 and the bond area 98 exposed by the polymer-layer opening 114. Next, a seed layer 118 is formed over the adhesion/barrier layer 116. For the detailed technical description of the adhesion/barrier layer 116 and the seed layer 118, refer to that of the adhesion/barrier layer 40 and the seed layer 42 of Embodiment I.

Figure 7D:
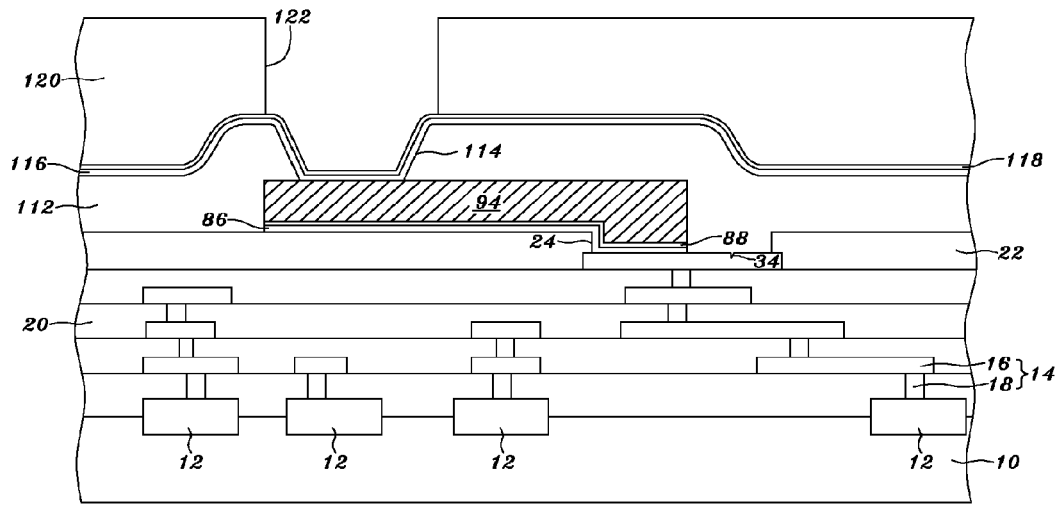

Refer to FIG. 7D. Next, a second photoresist layer 120 is formed over the seed layer 118, and the second photoresist layer 120 is patterned to form a second-photoresist-layer opening 122 to expose the seed layer 118 over the bond area 98 of the first metal layer 94, wherein a 1× stepper or a 1× scanner is used to expose the second photoresist layer 120 during forming the second-photoresist-layer opening 122.

Figure 7E:
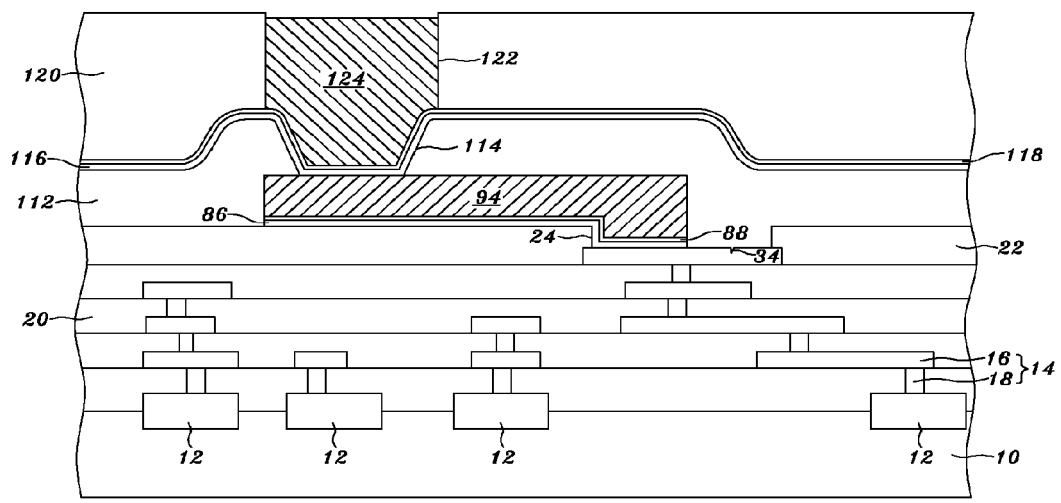

Refer to FIG. 7E. Next, a second metal layer 124 having a thickness of between 1 and 200 µm, e.g. between 20 and 120 µm, is electroplated on the seed layer 118 exposed by the second-photoresist-layer opening 122. For the detailed technical description of the second metal layer 124, refer to that of the second metal layer 66 of Embodiment III.

Figure 7F:
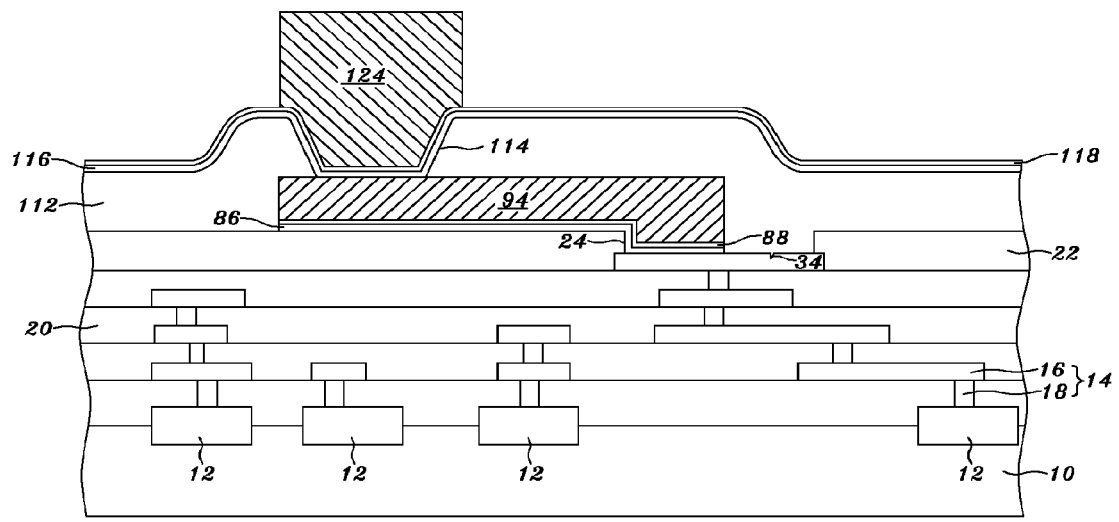
Figure 7G:
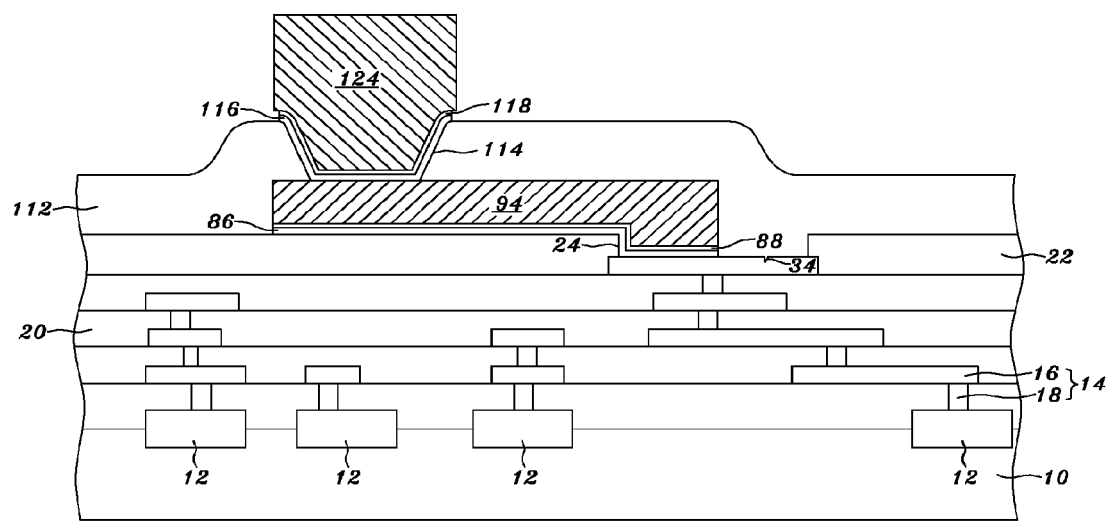

Refer to FIG. 7F. After the second metal layer 124 is completed, the second photoresist layer 120 is removed. Refer to FIG. 7G. Next, the seed layer 118 and the adhesion/barrier layer 116 are removed except those below the second metal layer 124.

For the detailed technical description of removing the adhesion/barrier layer 116 and the seed layer 118, refer to that of removing the adhesion/barrier layer 40 and the seed layer 42 of Embodiment III.

Figure 7H:
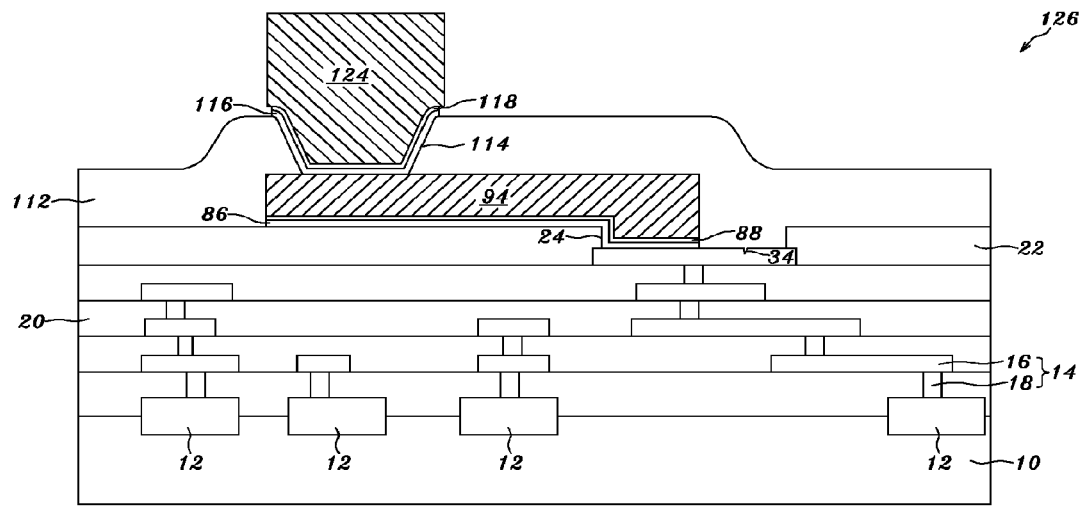
Figure 7I:
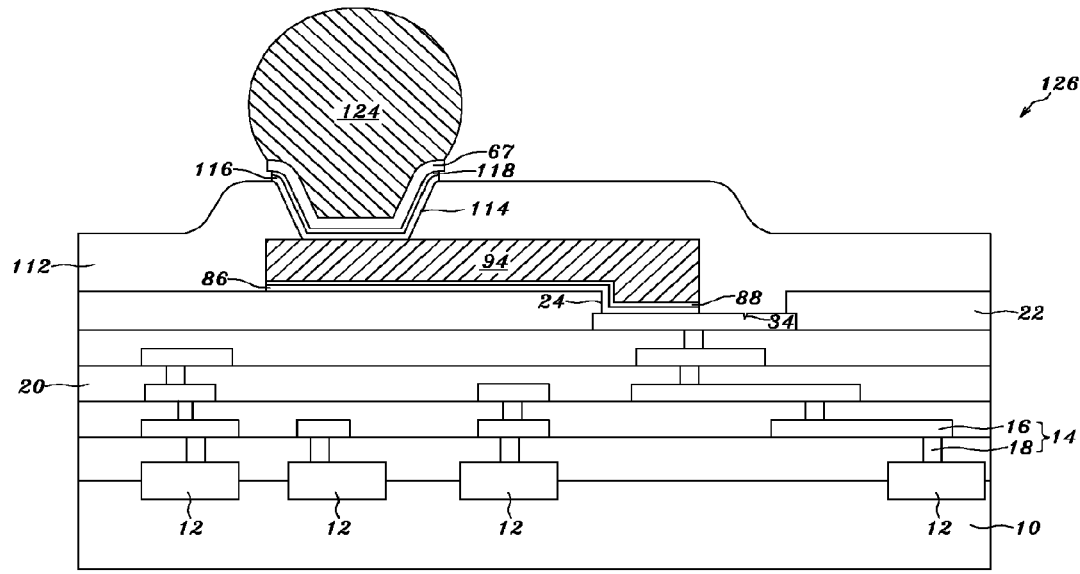

Refer to FIG. 7H. The semiconductor substrate 10 is diced into a plurality of semiconductor chips 126. Refer to FIG. 7I. If the second metal layer 124 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 124 is heated to its melting point; thus, the liquid metal assumes a ball shape and then solidifies. Then, the semiconductor substrate 10 is also diced into a plurality of semiconductor chips 126.

Further, in addition to contacting the pad 26, the testing probe 32 may also contact the first metal layer 94 or the second metal layer 124 for electrical testing.

EMBODIMENT VII

This embodiment exemplifies the application of the present invention to the connection between the pads respectively exposed by two openings of the passivation layer.

Figure 8A:
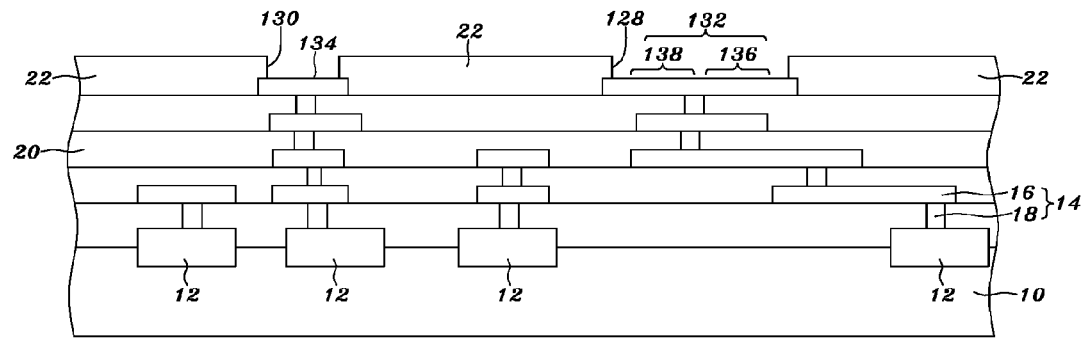
FIG. 8A to FIG. 8L are sectional views schematically showing the fabrication process according to one embodiment of the present invention.

Refer to FIG. 8A. A first opening 128 and a second opening 130 in the passivation layer 22 exposes a first pad 132 and a second pad 134, respectively. The first pad 132 has a testing area 136 for electrical testing and a bond area 134 to be electrically connected to an external system. The first pad 132 and the second pad 134 respectively connect with different semiconductor devices 12. The further description of the first opening 128 and the second opening 130 can be referred to that of the opening 24 shown in FIG. 1. For further description of the first pad 132 and the second pad 134, refer to that of the pad 26 shown in FIG. 1.

Figure 8B:
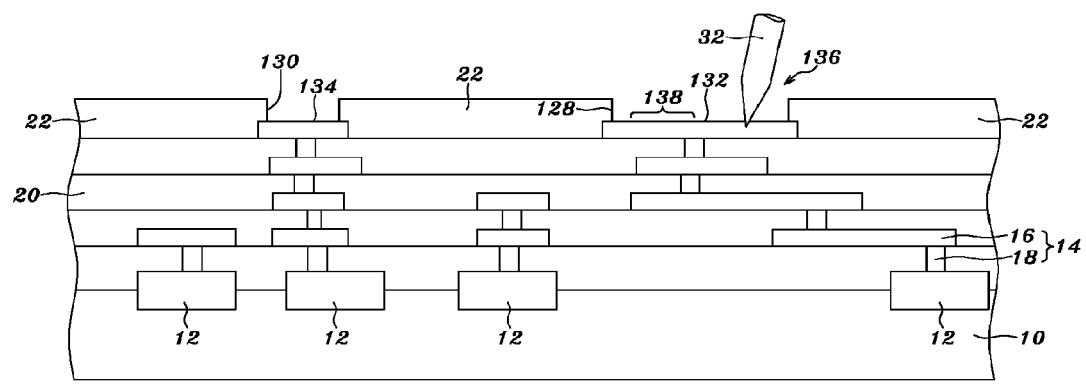
Figure 8C:
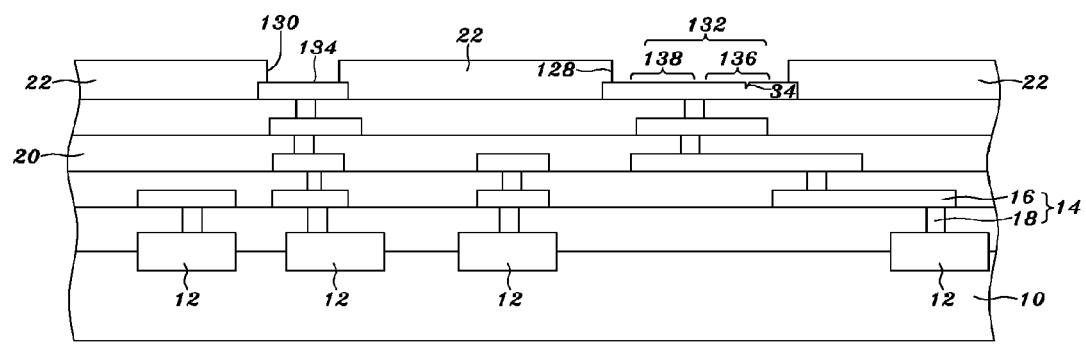

Refer to FIG. 8B. During a step of testing, a testing probe 32 contacts with the testing area 136 of the first pad 132 for electrical testing. Refer to FIG. 8C. After the step of testing, the testing probe 32 is removed, and a probe mark 34 is left on the testing area 136 of the first pad 132.

Figure 8D:
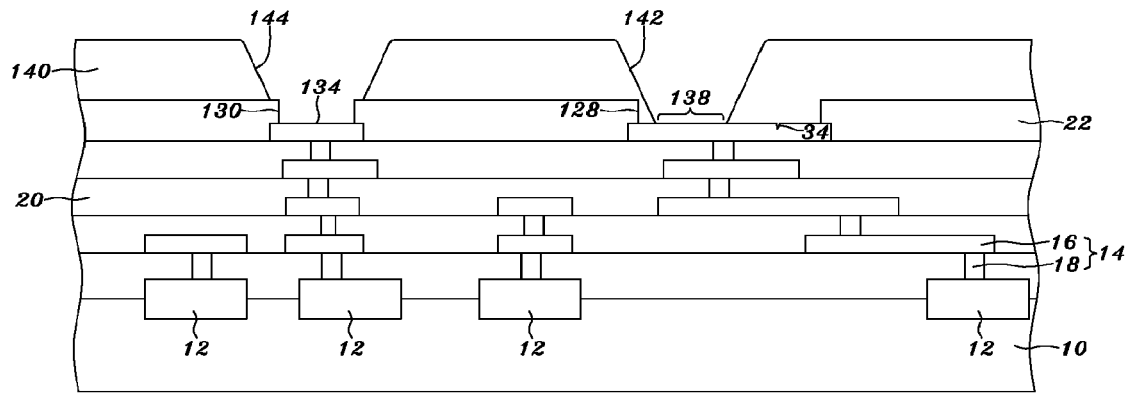

Refer to FIG. 8D. A patterned polymer layer 140 is formed over the passivation layer 22 and the testing area 136 of the first pad 132, and the probe mark 34 is thus covered. A first polymer-layer opening 142 and a second polymer-layer opening 144 in the patterned polymer layer 140 expose the bond area 138 of the first pad 132 and the second pad 134, respectively. For the detailed technical description of the patterned polymer layer 140, refer to that of the patterned polymer layer 36 of Embodiment I.

Figure 8E:
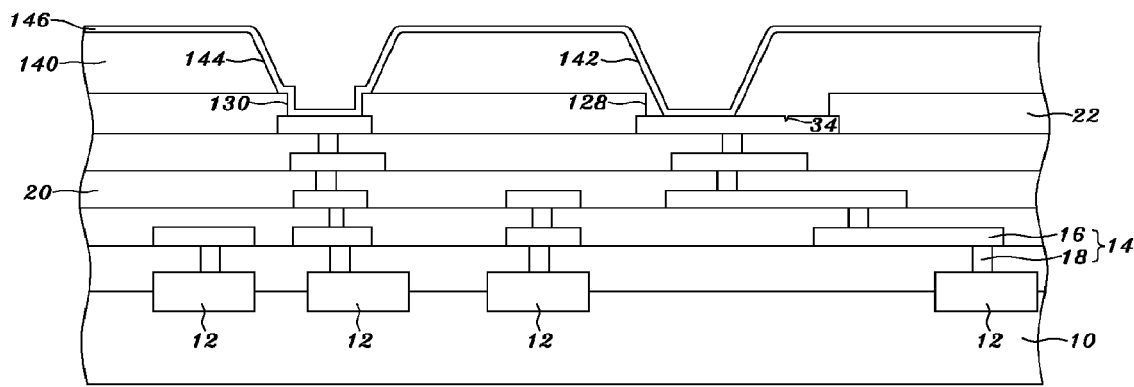
Figure 8F:
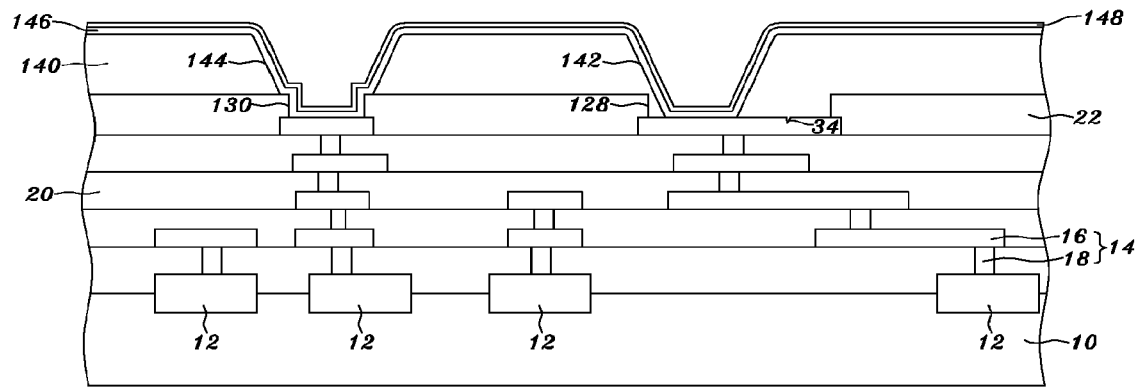

Refer to FIG. 8E. Next, an adhesion/barrier layer 146 having a thickness of between 0.02 and 2 μm is formed over the patterned polymer layer 140, the bond area 138 exposed by the first polymer-layer opening 142 and the second pad 134 exposed by the second polymer-layer opening 144. Refer to FIG. 8F. Next, a seed layer 148 is formed over the adhesion/barrier layer 146. For the detailed technical description of the adhesion/barrier layer 146 and the seed layer 148, refer to that of the adhesion/barrier layer 40 and the seed layer 42 of Embodiment I.

Figure 8G:
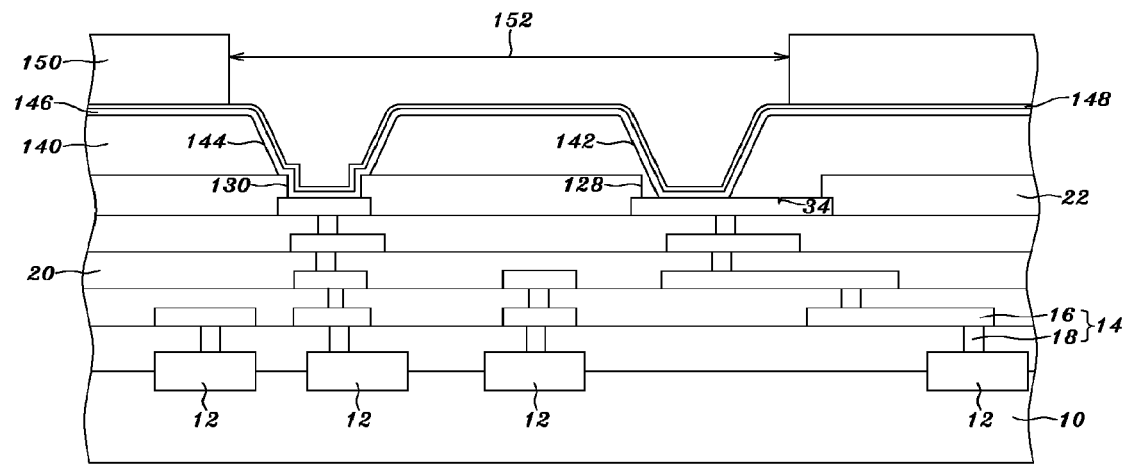
Figure 8H:
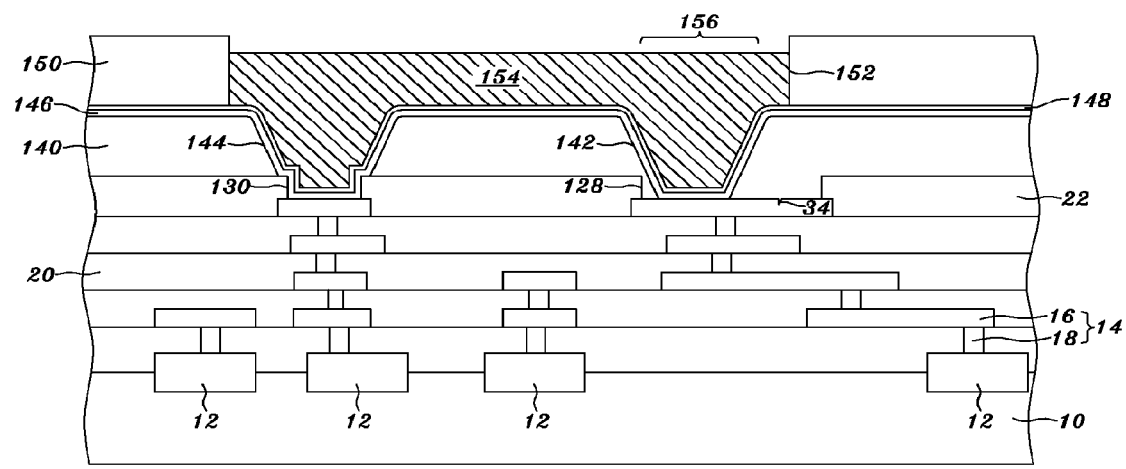

Refer to FIG. 8G. Next, a photoresist layer 150 is formed over the seed layer 148, and the photoresist layer 150 is patterned to form a photoresist-layer opening 152 to expose the seed layer 148 over the bond area 138 of the first pad 132, the second pad 134, and the polymer patterned layer 140 between the first pad 132 and the second pad 134. Refer to FIG. 8H. Next, a metal layer 154 is electroplated over the seed layer 148 exposed by the photoresist-layer opening 152. The metal layer 154 may be a single layer made of gold, copper, nickel, aluminum, silver, palladium, platinum, rhodium, ruthenium, a tin-lead alloy, or a tin-silver alloy. The metal layer 154 may also be a composite layer made of the above-mentioned metals, such as copper/nickel metallization or copper/nickel/gold metallization, in a bottom-up sequence. The thickness of the metal layer 154 is preferred to be between 2 and 15 μm or between 4 and 15 μm. The metal layer 154 also has a testing area 156 for electrical testing.

Figure 8I:
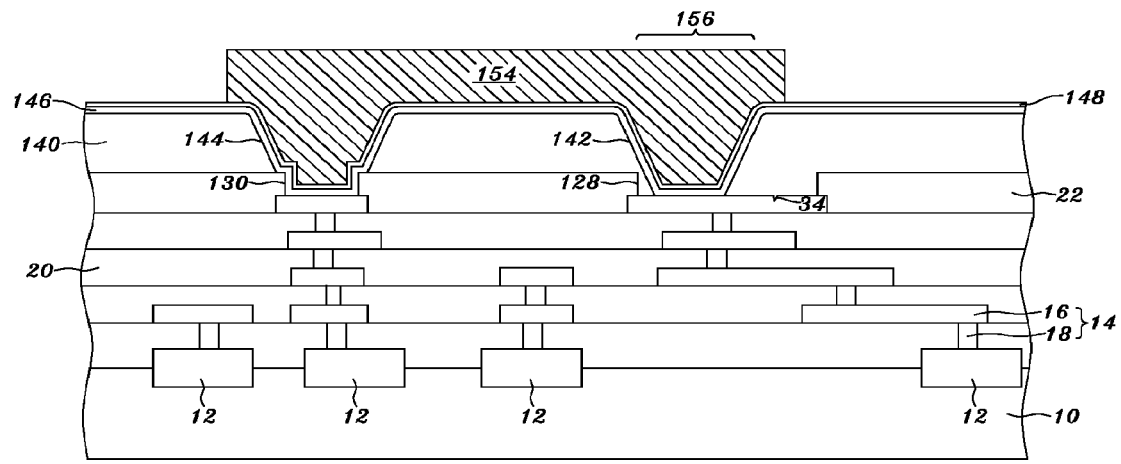
Figure 8J:
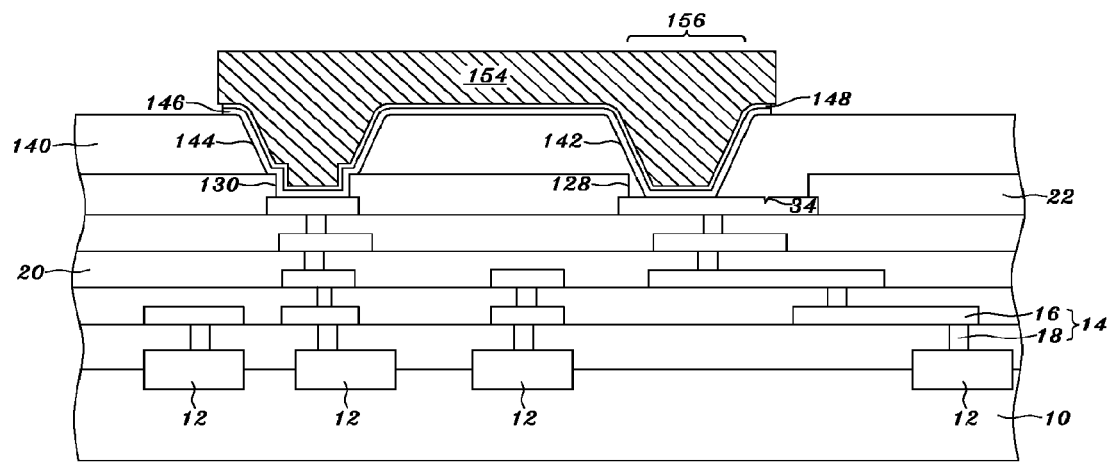
Figure 8K:
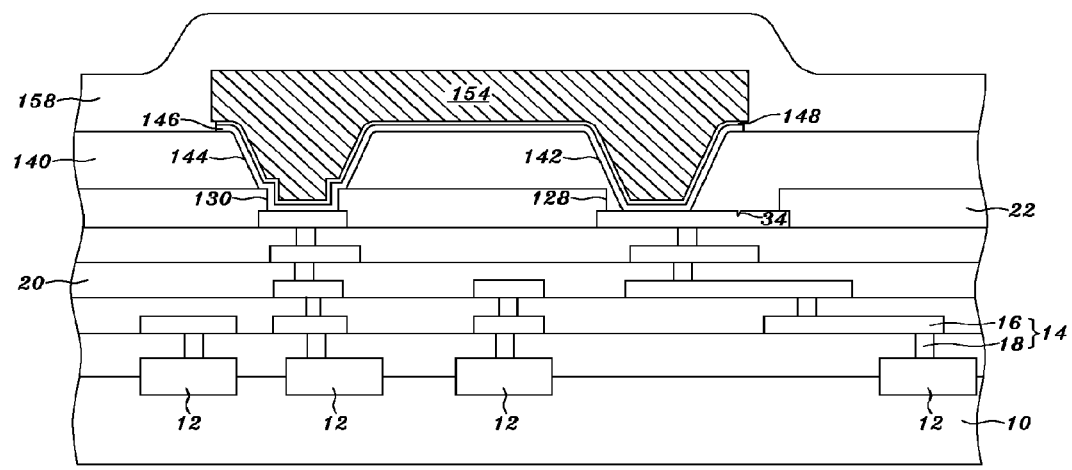
Figure 8L:
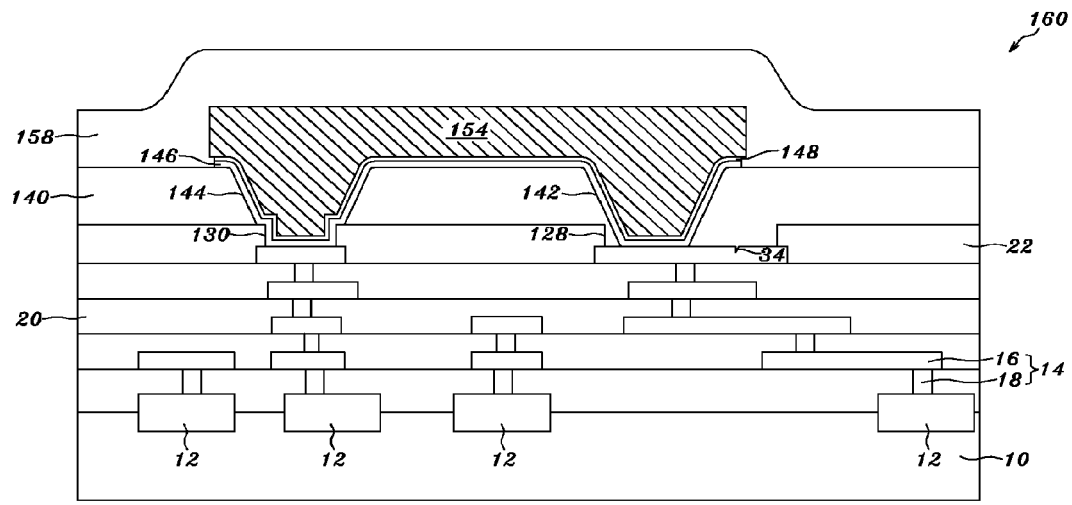

Refer to FIG. 8I. After the metal layer 154 is completed, the photoresist layer 150 is removed. Refer to FIG. 8J. Next, the adhesion/barrier layer 146 and the seed layer 148 are removed except those below the metal layer 154. For the detailed technical description of removing the adhesion/barrier layer 146 and the seed layer 148, refer to that of removing the adhesion/barrier layer 40 and the seed layer 42 of Embodiment III. Refer to FIG. 8K. In this embodiment, after the adhesion/barrier layer 146 and the seed layer 148 are removed except those below the metal layer 154, a polymer layer 158 may be optionally formed over the metal layer 154 and the patterned polymer layer 140. Refer to FIG. 8L. The semiconductor substrate 10 is diced into a plurality of semiconductor chips 160.

In this embodiment, in addition to contacting the pad 26, the testing probe 32 may also contact the metal layer 154 for electrical testing. In this embodiment, it is to be noted: the metal layer 154 may alternatively not connect with an external system but only interconnects internal devices; for example, a signal may be transmitted from a MOS device in or on the substrate 10 to another MOS device in or on the substrate 10 via the metal layer 154, but not to an external system. In such a case, the polymer layer 158 may cover all the upper surface of the metal layer 154.

EMBODIMENT VIII

Figure 9A:
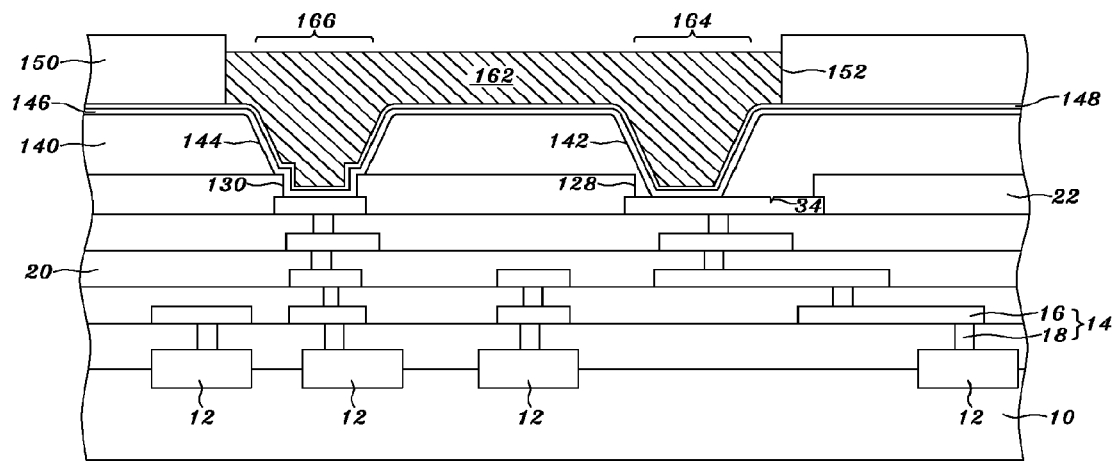
FIG. 9A to FIG. 9I are sectional views schematically showing the fabrication process according to one embodiment of the present invention.

Refer to FIG. 9A. After the process shown in FIG. 8G, a first metal layer 162 having a thickness of between 1 and 30 μm is electroplated over the seed layer 148 exposed by the photoresist-layer opening 152. For further detail of the technical contents of the first metal layer 162, such as the material and preferred thickness thereof, refer to that of the first metal layer 154 of Embodiment VII. The first metal layer 162 has a testing area 164 for electrical testing and a bond area 166 to be electrically connected to an external system.

Figure 9B:
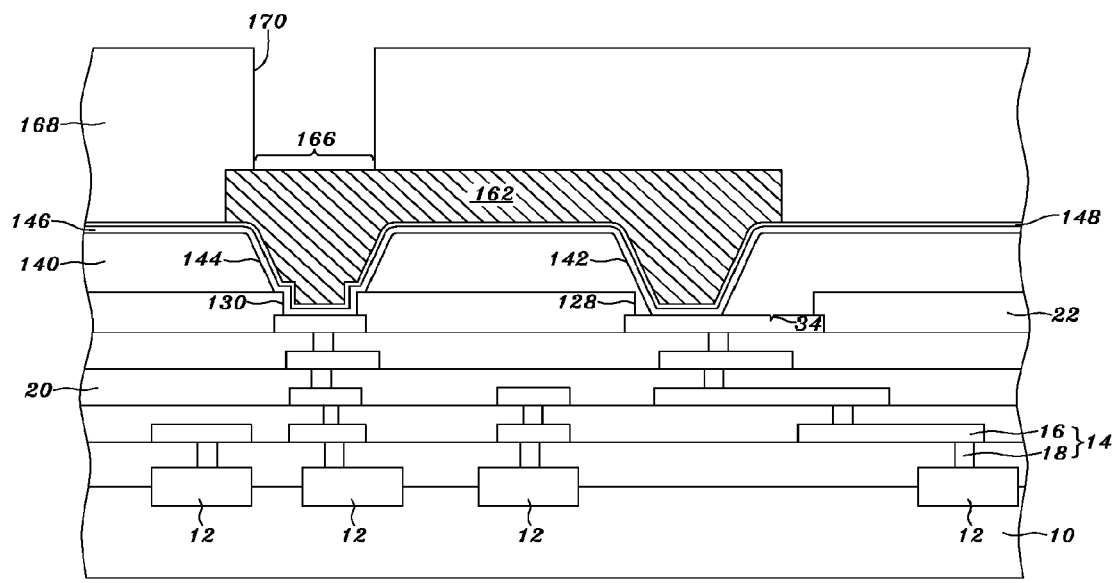

Refer to FIG. 9B. Next, the photoresist layer 150 is removed, and a photoresist layer 168 is formed over the seed layer 148 and the first metal layer 162, and the photoresist layer 168 is patterned to form a photoresist-layer opening 170 to expose the bond area 166 of the first metal layer 162, wherein a 1× stepper or a 1× scanner is used to expose the photoresist layer 168 during forming the photoresist-layer opening 170.

Figure 9C:
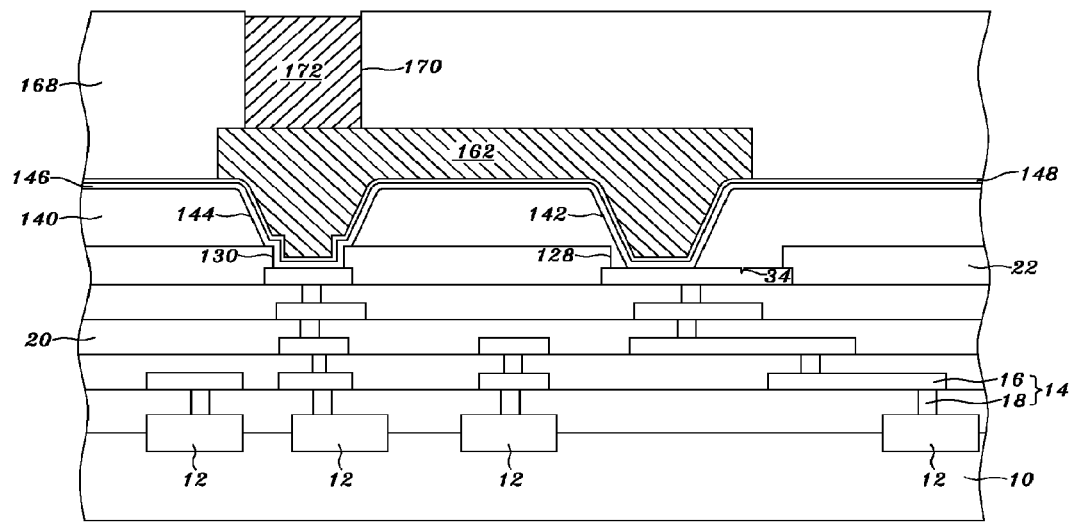

Refer to FIG. 9C. Next, a second metal layer 172 having a thickness of between 1 and 200 μm, e.g. between 20 and 120 μm, is electroplated over the bond area 166 exposed by the photoresist-layer opening 170. For further detail of the technical contents of the second metal layer 172, such as the material and preferred thickness thereof, refer to that of the second metal layer 66 of Embodiment III.

Figure 9D:
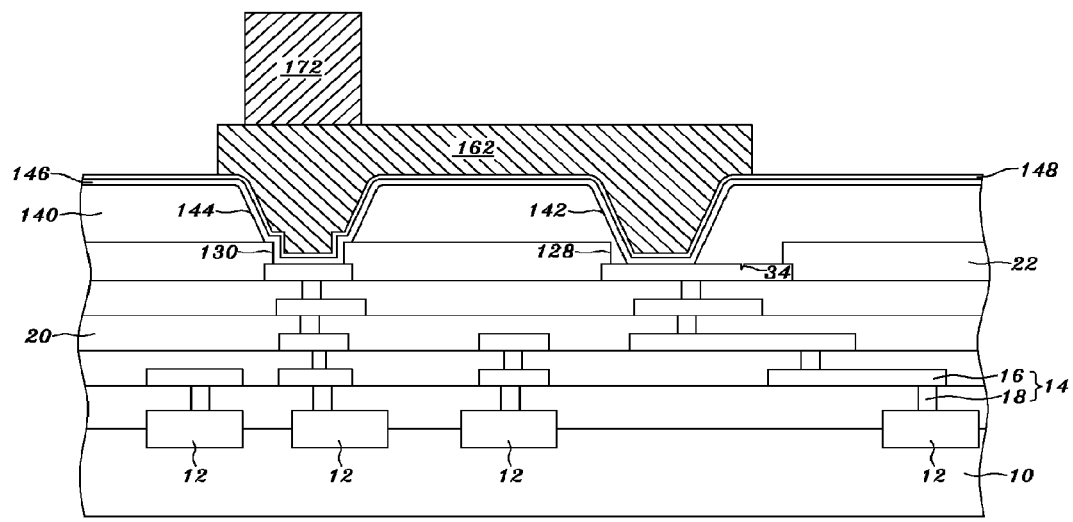
Figure 9E:
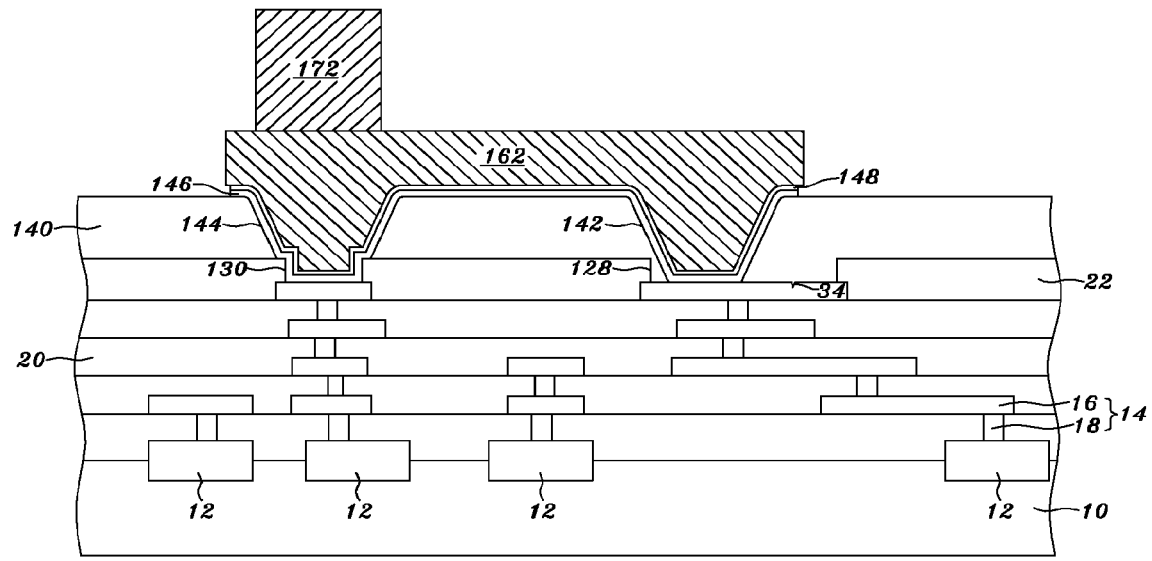
Figure 9F:
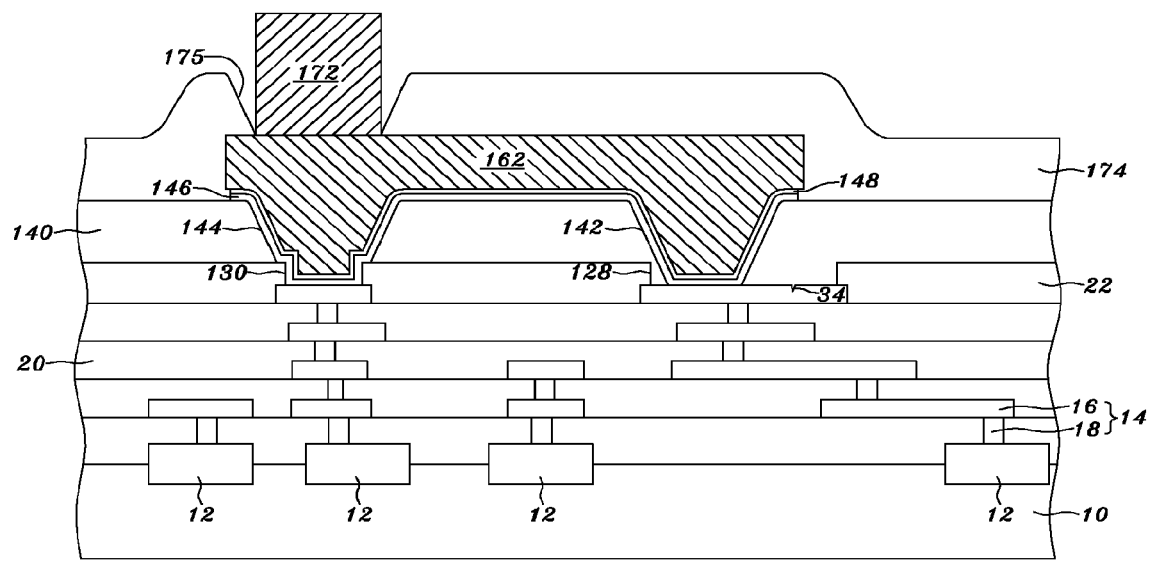

Refer to FIG. 9D. After the second metal layer 172 is completed, the photoresist layer 168 is removed. Refer to FIG. 9E. Next, the adhesion/barrier layer 146 and the seed layer 148 are removed except those below the first metal layer 162. For the detailed technical description of removing the adhesion/barrier layer 146 and the seed layer 148, refer to that of removing the adhesion/barrier layer 40 and the seed layer 42 of Embodiment III. Refer to FIG. 9F. In this embodiment, after the adhesion/barrier layer 146 and the seed layer 148 are removed except those below the first metal layer 162, a patterned polymer layer 174 may be optionally formed over the first metal layer 162 and the patterned polymer layer 140. An opening 175 in the patterned polymer layer 174 exposes the second metal layer 172.

Figure 9G:
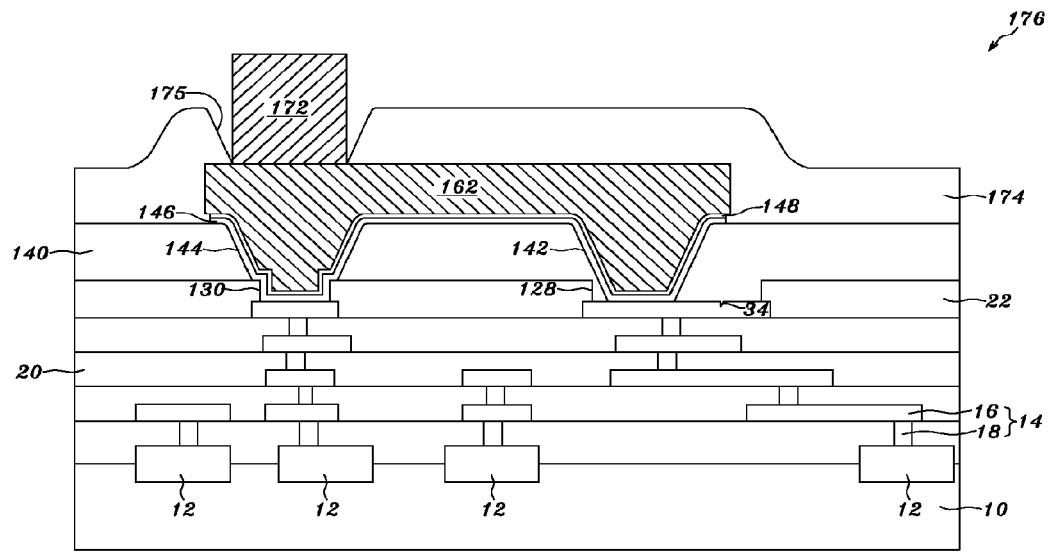
Figure 9H:
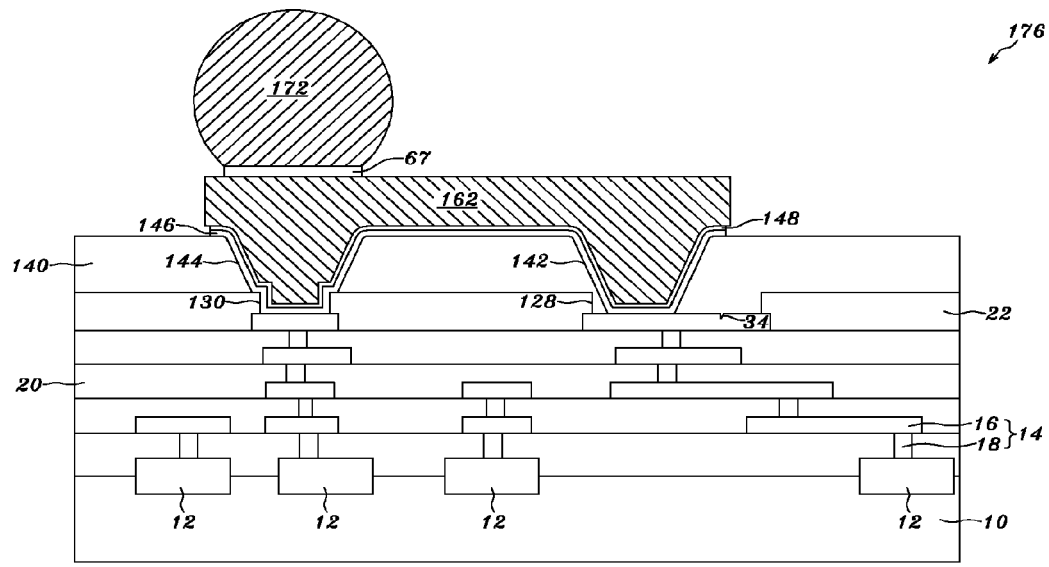

Refer to FIG. 9G. The semiconductor substrate 10 is diced into a plurality of semiconductor chips 176. Refer to FIG. 9H. If the second metal layer 172 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 172 is heated to its melting point; thus, the liquid metal assumes a ball shape and then solidifies. Then, the semiconductor substrate 10 is also diced into a plurality of semiconductor chips 176.

Figure 9I:
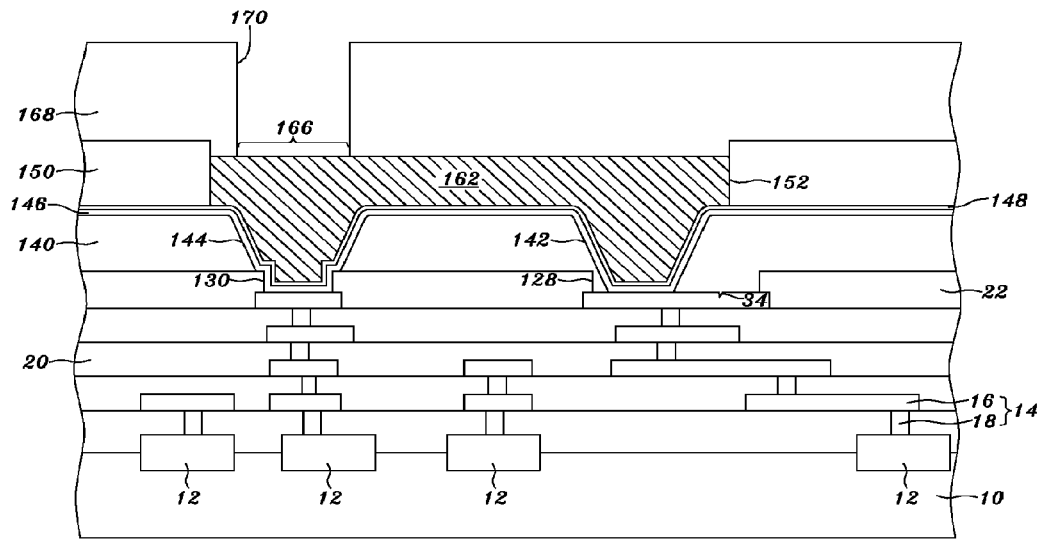

Refer to FIG. 9I. Alternatively, after the first metal layer 162 is completed, the photoresist layer 150 is kept, and the photoresist layer 168 is formed over the photoresist layer 150 and the first metal layer 162, and the photoresist-layer opening 170 in the photoresist layer 168 exposes the bond area 166 of the first metal layer 162. Next, the process shown in FIG. 9C is undertaken. After the second metal layer 172 is completed, the photoresist layer 150 and the photoresist layer 168 are removed to obtain the structure shown in FIG. 9D. Next, the seed layer 148 and the adhesion/barrier layer 146 are removed except those below the first metal layer 162 to obtain the structure shown in FIG. 9E. Then, the semiconductor substrate 10 is also diced into a plurality of semiconductor chips 176 shown in FIG. 9G or FIG. 9H.

In this embodiment, in addition to contacting the pad 26, the testing probe 32 may also contact the first metal layer 162 or the second metal layer 172 for electrical testing.

EMBODIMENT IX

Figure 10A:
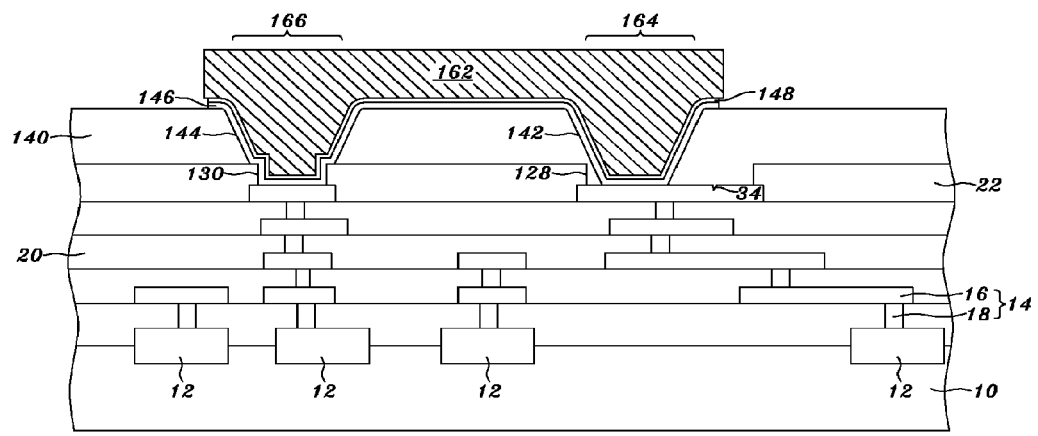
FIG. 10A to FIG. 10I are sectional views schematically showing the fabrication process according to one embodiment of the present invention.

Refer to FIG. 10A. After the process shown in FIG. 9A, the photoresist layer 150 is removed, and the adhesion/barrier layer 146 and the seed layer 148 are also removed except those below the first metal layer 162. For the detailed technical description of removing the adhesion/barrier layer 146 and the seed layer 148, refer to that of removing the adhesion/barrier layer 40 and the seed layer 42 of Embodiment I.

Figure 10B:
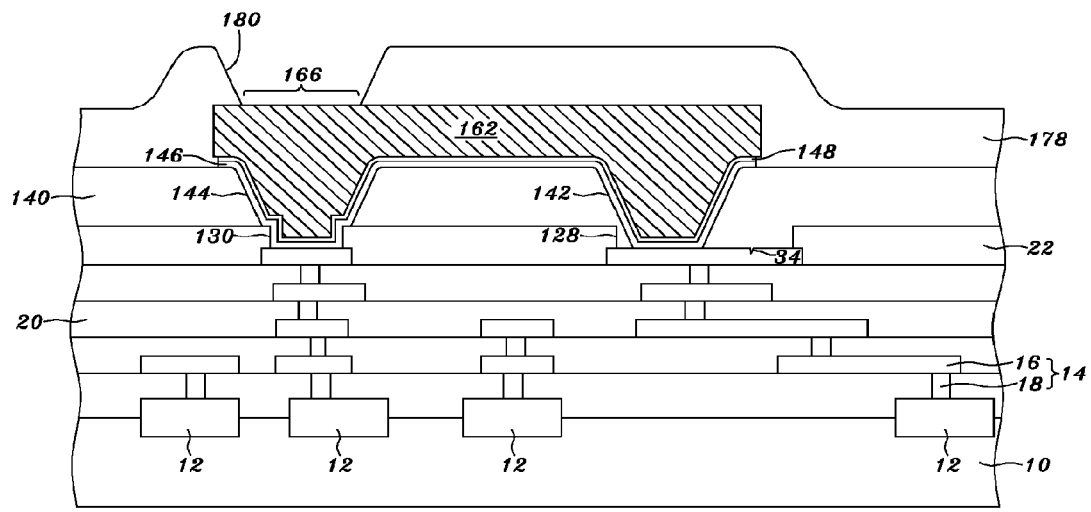

Refer to FIG. 10B. Next, a patterned polymer layer 178 is formed over the patterned polymer layer 140 and the first metal layer 162, and an opening 180 in the patterned polymer layer 178 exposes the bond area 166 of the first metal layer 162. For the detailed technical description of the patterned polymer layer 178, refer to that of the patterned polymer layer 36 of Embodiment I.

Figure 10C:
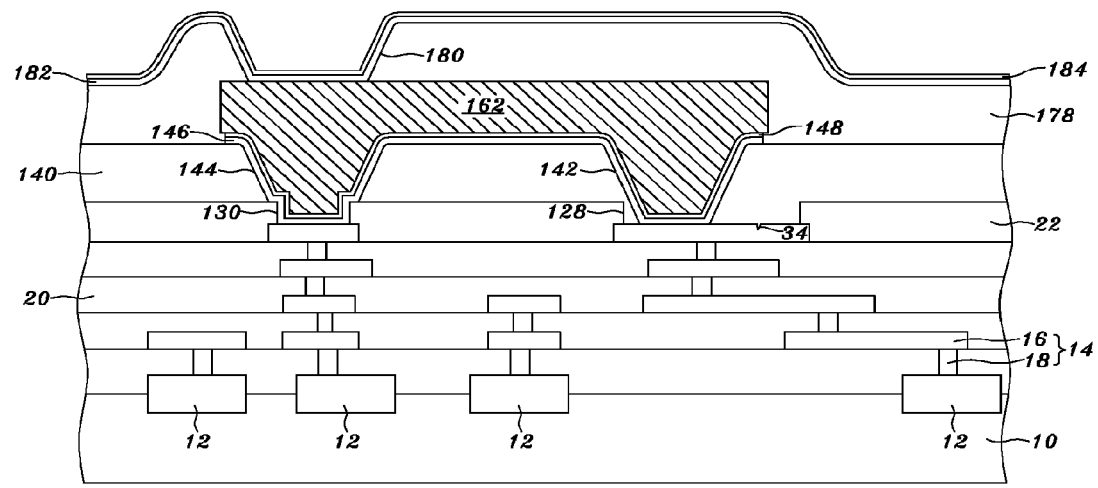

Refer to FIG. 10C. Next, an adhesion/barrier layer 182 having a thickness of between 0.02 and 2 μm is formed over the bond area 166 exposed by the polymer-layer opening 180 in the patterned polymer layer 178. Next, a seed layer 184 is formed over the adhesion/barrier layer 182. For the detailed technical description of the adhesion/barrier layer 182 and the seed layer 184, refer to that of the adhesion/barrier layer 40 and the seed layer 42 of Embodiment I.

Figure 10D:
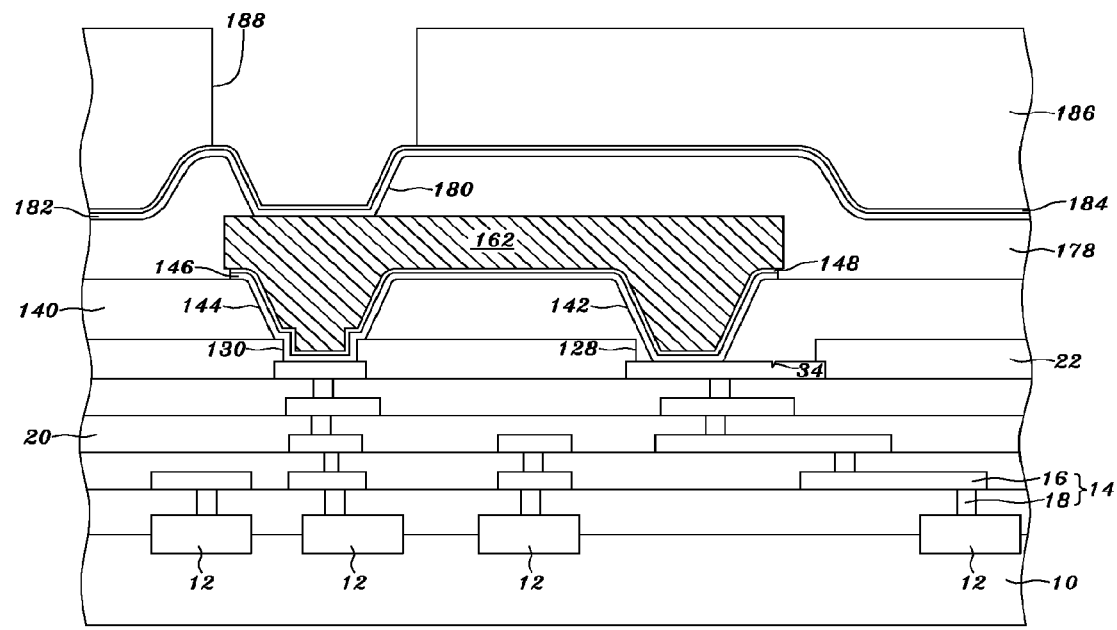
Figure 10E:
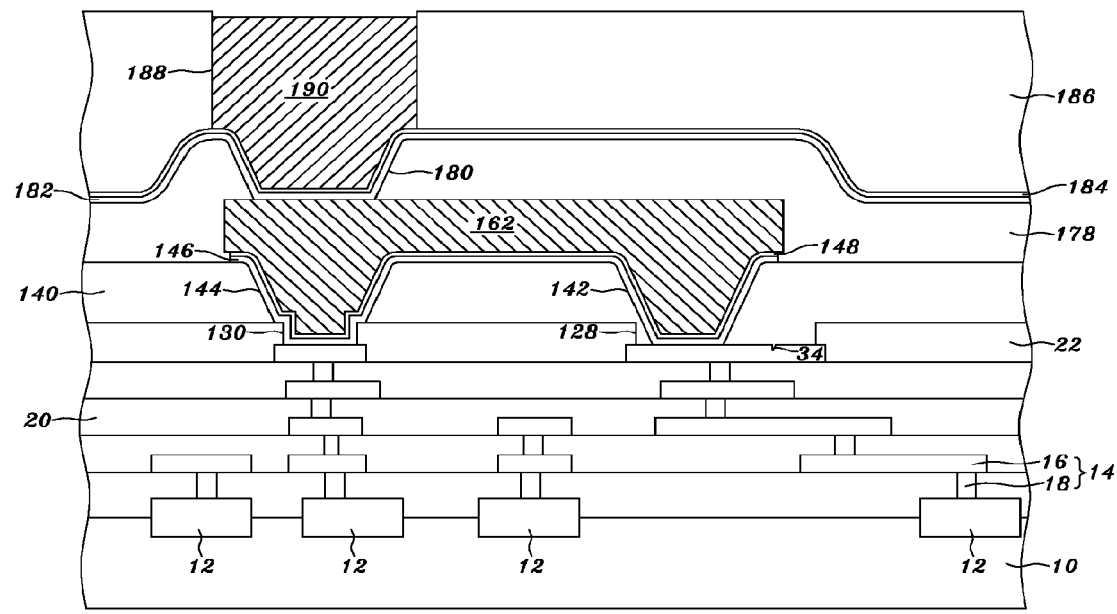

Refer to FIG. 10D. Next, a photoresist layer 186 is formed over the seed layer 184, and the photoresist layer 186 is patterned to form a photoresist-layer opening 188 to expose the bond area 166 of the first metal layer 162, wherein a 1x stepper or a 1× scanner is used to expose the photoresist layer 186 during forming the photoresist-layer opening 188. Refer to FIG. 10E. Next, a second metal layer 190 having a thickness of between 1 and 200 μm, e.g. between 20 and 120 μm, is electroplated over the bond area 166 exposed by the photoresist-layer opening 188. For further detail of the technical contents of the second metal layer 190, such as the material and preferred thickness thereof, refer to that of the second metal layer 66 of Embodiment III.

Figure 10F:
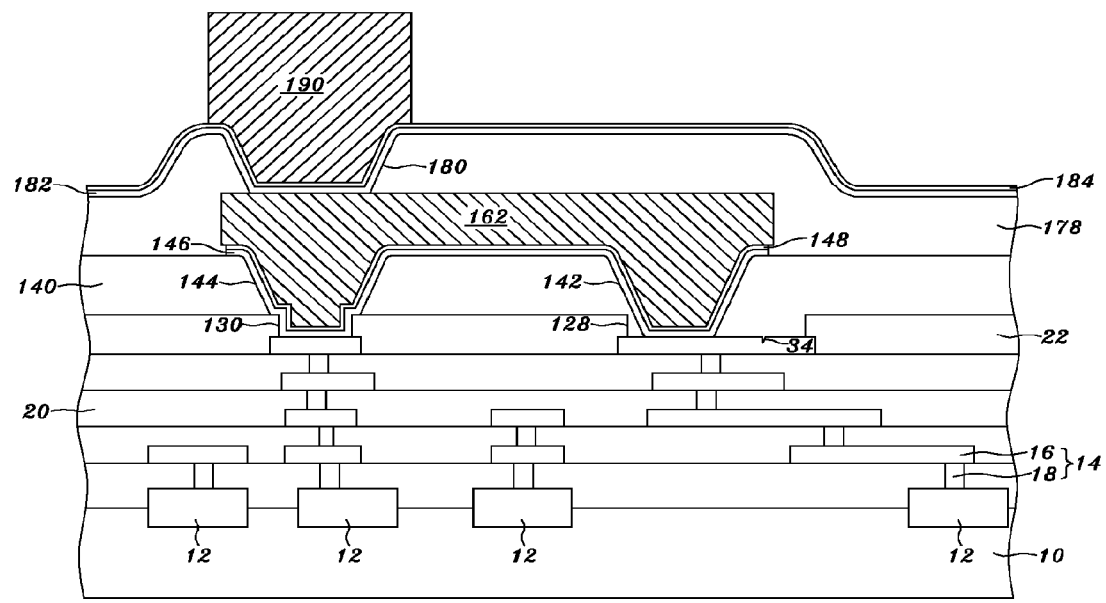
Figure 10G:
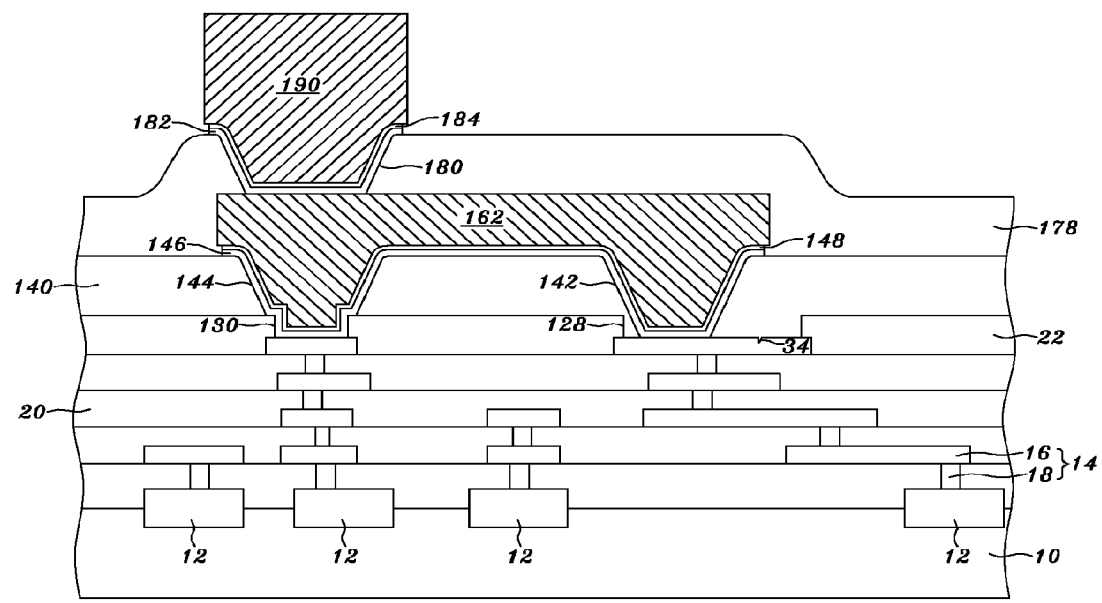

Refer to FIG. 10F. After the second metal layer 190 is completed, the photoresist layer 186 is removed. Refer to FIG. 10G. Next, the seed layer 184 and the adhesion/barrier layer 182 are removed except those below the second metal layer 190. For the detailed technical description of removing the adhesion/barrier layer 182 and the seed layer 184, refer to that of removing the adhesion/barrier layer 40 and the seed layer 42 of Embodiment I.

Figure 10H:
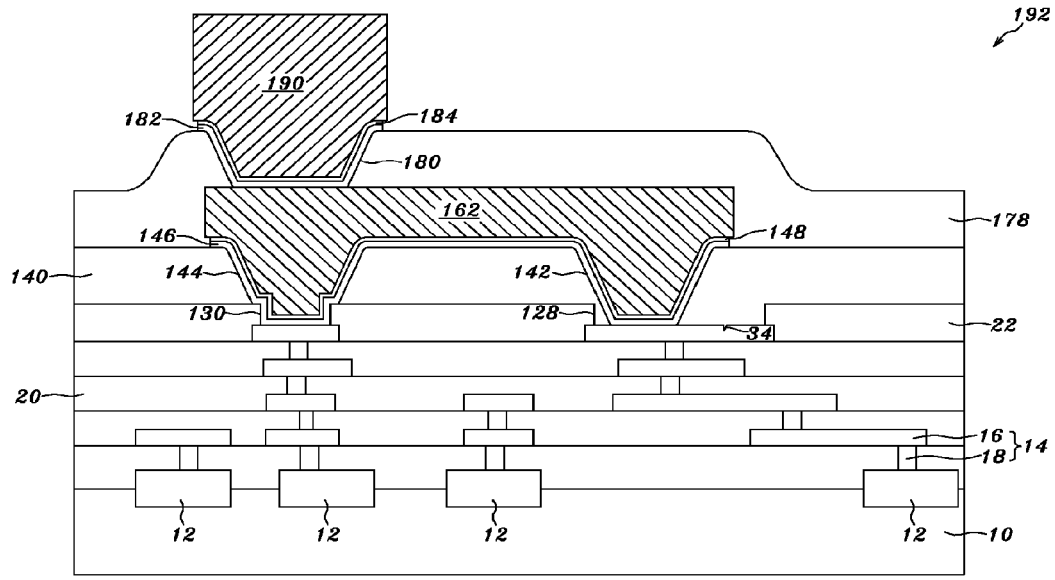
Figure 10I:
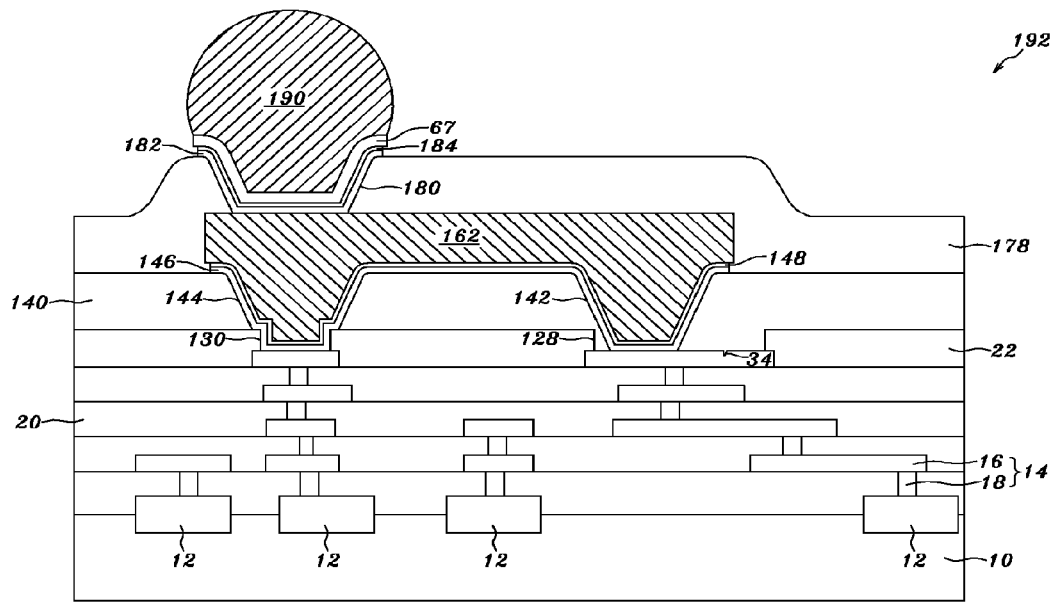

Refer to FIG. 10H. The semiconductor substrate 10 is diced into a plurality of semiconductor chips 192. Refer to FIG. 10I. If the second metal layer 190 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 190 is heated to its melting point; thus, the liquid metal assumes a ball shape and then solidifies. Then, the semiconductor substrate 10 is also diced into a plurality of semiconductor chips 192.

In this embodiment, in addition to contacting the pad 26, the testing probe 32 may also contact the first metal layer 162 or the second metal layer 190 for electrical testing.

EMBODIMENT X

Figure 11A:
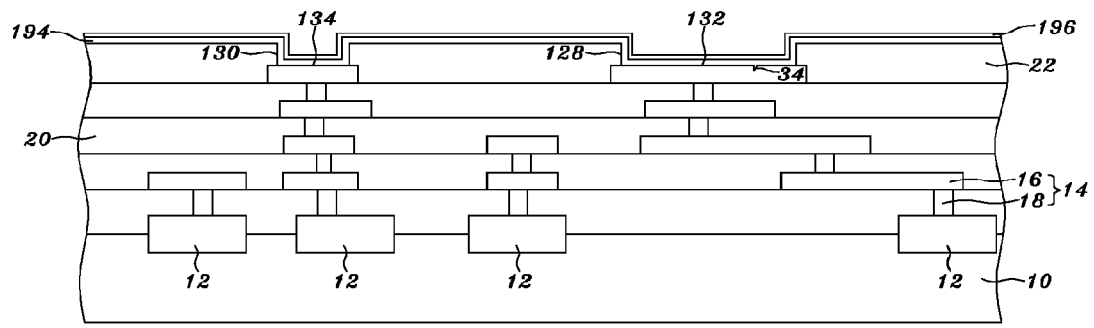
FIG. 11A to FIG. 11G are sectional views schematically showing the fabrication process according to one embodiment of the present invention.

Refer to FIG. 11A. After the process shown in FIG. 8C, an adhesion/barrier layer 194 is formed over the first pad 132, the second pad 134 and the passivation layer 22. Next, a seed layer 196 is formed over the adhesion/barrier layer 194. For the detailed technical description of the adhesion/barrier layer 194 and the seed layer 196, refer to that of the adhesion/barrier layer 40 and the seed layer 42 of Embodiment I.

Figure 11B:
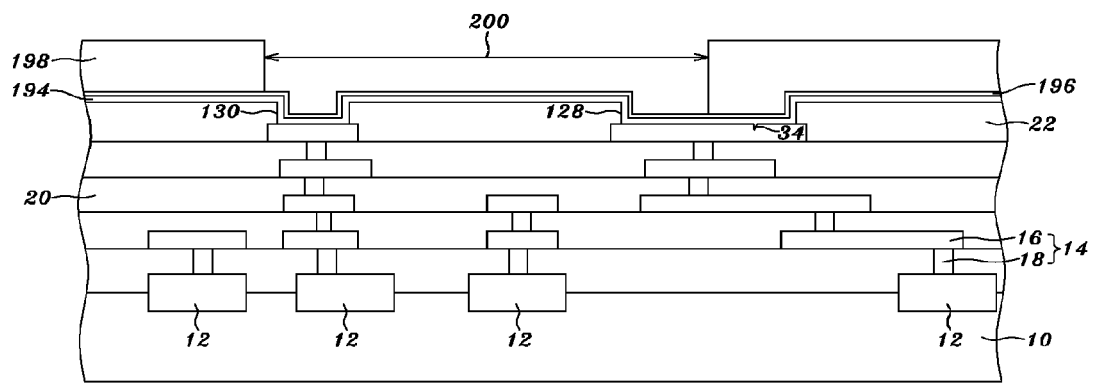
Figure 11C:
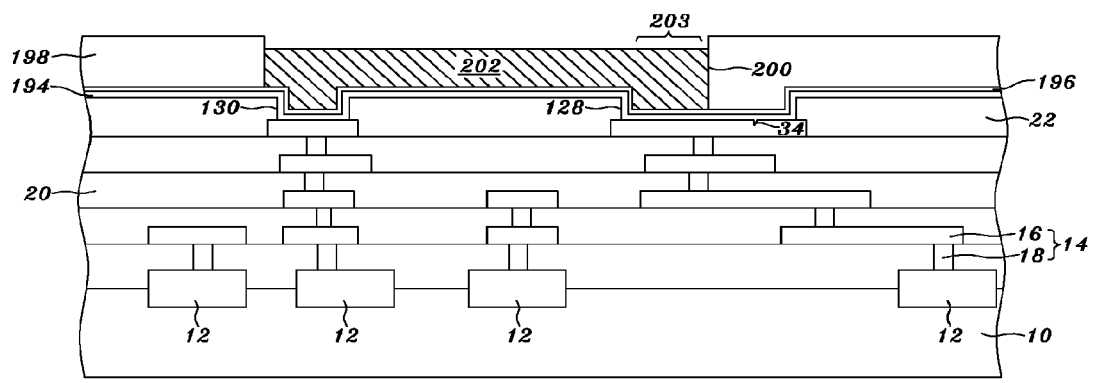

Refer to FIG. 11B. Next, a photoresist layer 198 is formed over the seed layer 196, and the photoresist layer 198 is patterned to form a photoresist-layer opening 200 to expose the seed layer 196 over the bond area 138 of the first pad 132 and the second pad 134, and expose the seed layer 196 over the passivation layer 22 between the first pad 132 and the second pad 134. Refer to FIG. 11C. Next, a metal layer 202 having a thickness of between 1 and 30 μm is electroplated over the seed layer 196 exposed by the photoresist-layer opening 200. For further technical contents of the metal layer 202, such as the material and preferred thickness thereof, refer to those of the metal layer 154 of Embodiment VII. Besides, the metal layer 202 may include a testing area 203 for electrical testing.

Figure 11D:
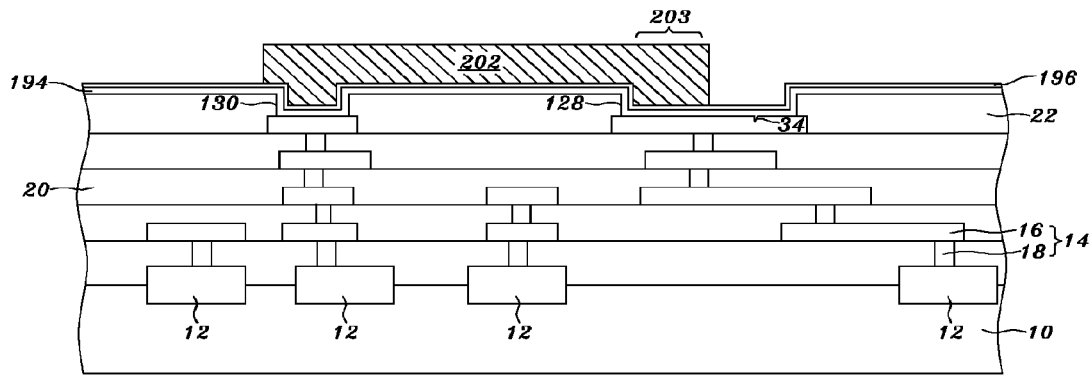
Figure 11E:
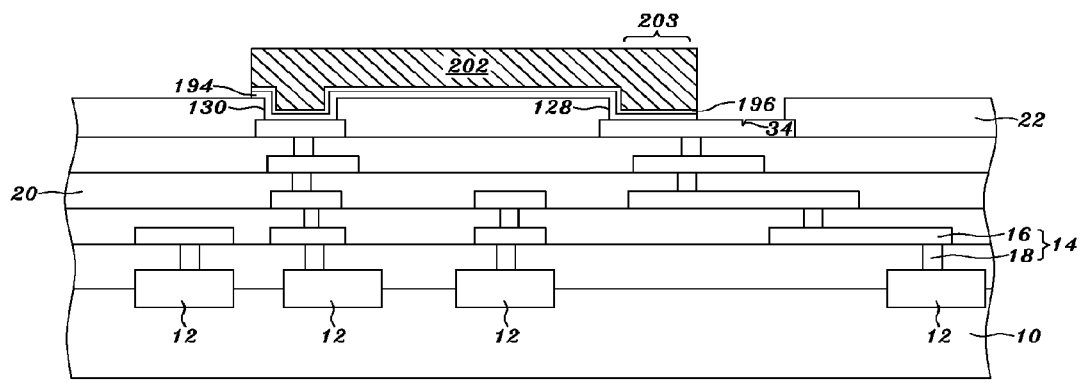

Refer to FIG. 11D. After the metal layer 202 is completed, the photoresist layer 198 is removed. Refer to FIG. 11E. Next, the seed layer 196 and the adhesion/barrier layer 194 are removed with a dry-etching method except those below the metal layer 202, wherein the dry-etching method can be implemented with an argon sputter process.

Figure 11F:
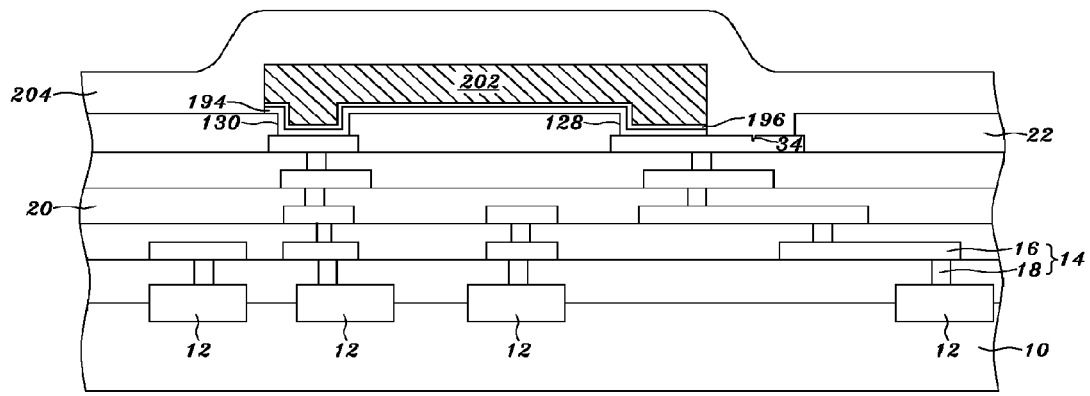
Figure 11G:
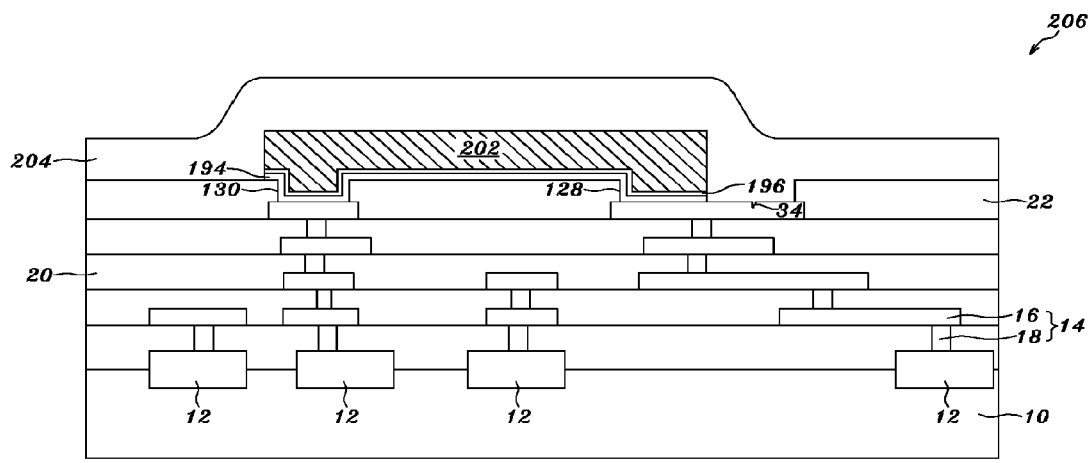

Refer to FIG. 11F. Next, a polymer layer 204 is formed over the passivation 22, the metal layer 202 and the testing area 136 of the first pad 132, and the probe mark 34 is thus covered. Refer to FIG. 11G. The semiconductor substrate 10 is diced into a plurality of semiconductor chips 206.

In this embodiment, in addition to contacting the pad 26, the testing probe 32 may also contact the metal layer 202 for electrical testing. In this embodiment, it is to be noted: the metal layer 202 may alternatively not connect with an external system but only interconnects internal devices; for example, a signal may be transmitted from a MOS device in or on the substrate 10 to another MOS device in or on the substrate 10 via the metal layer 202, but not to an external system. In such a case, the polymer layer 204 may cover all the upper surface of the metal layer 202.

EMBODIMENT XI

Figure 12A:
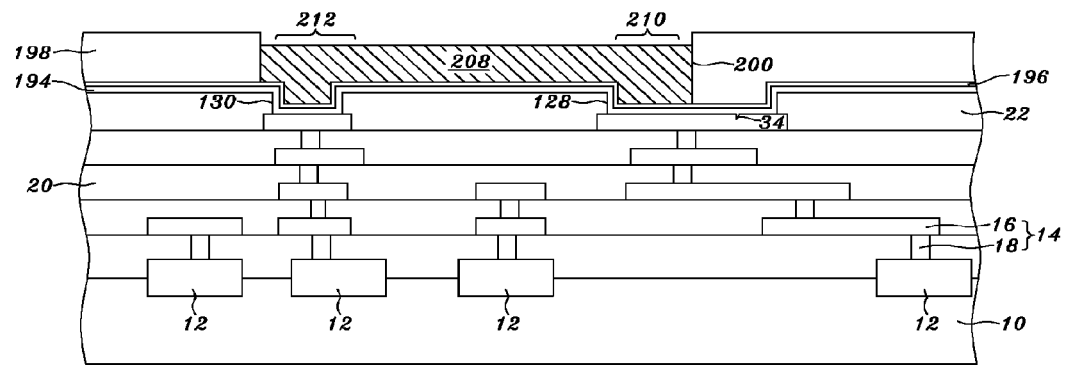
FIG. 12A to FIG. 12I are sectional views schematically showing the fabrication process according to one embodiment of the present invention.

Refer to FIG. 12A. After the process shown in FIG. 11B, a first metal layer 208 having a thickness of between 1 and 30 μm is electroplated over the seed layer 196 exposed by the photoresist-layer opening 200. For further technical contents of the first metal layer 208, such as the material and preferred thickness thereof, refer to those of the metal layer 154 of Embodiment VII. The first metal layer 208 may have a testing area 210 for electrical testing and a bond area 212 to be electrically connected to an external system.

Figure 12B:
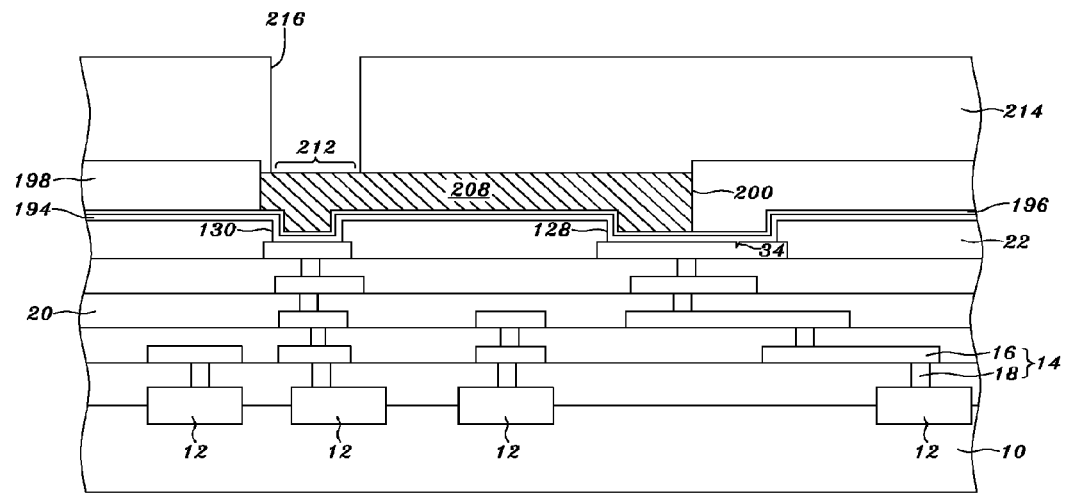
Figure 12C:
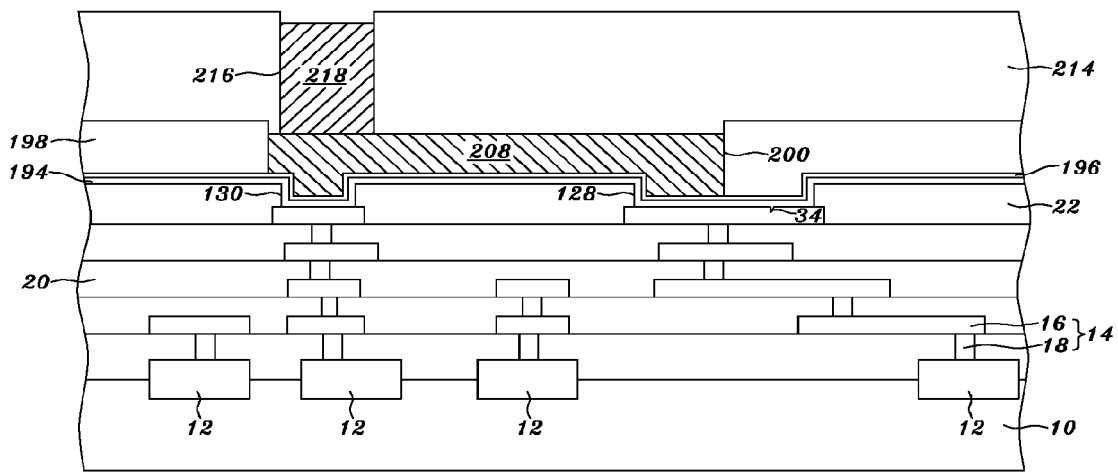

Refer to FIG. 12B. Next, a photoresist layer 214 is formed over the photoresist layer 198 and the first metal layer 208, and the photoresist layer 214 is patterned to form a photoresist-layer opening 216 to expose the bond area 212 of the first metal layer 208. Refer to FIG. 12C. Next, a second metal layer 218 having a thickness of between 1 and 200 μm, e.g. between 20 and 120 μm, is electroplated over the bond area 212 exposed by the photoresist-layer opening 216. For the detailed technical contents of the second metal layer 218, such as the material and preferred thickness thereof, refer to that of the second metal layer 66 of Embodiment III.

Figure 12D:
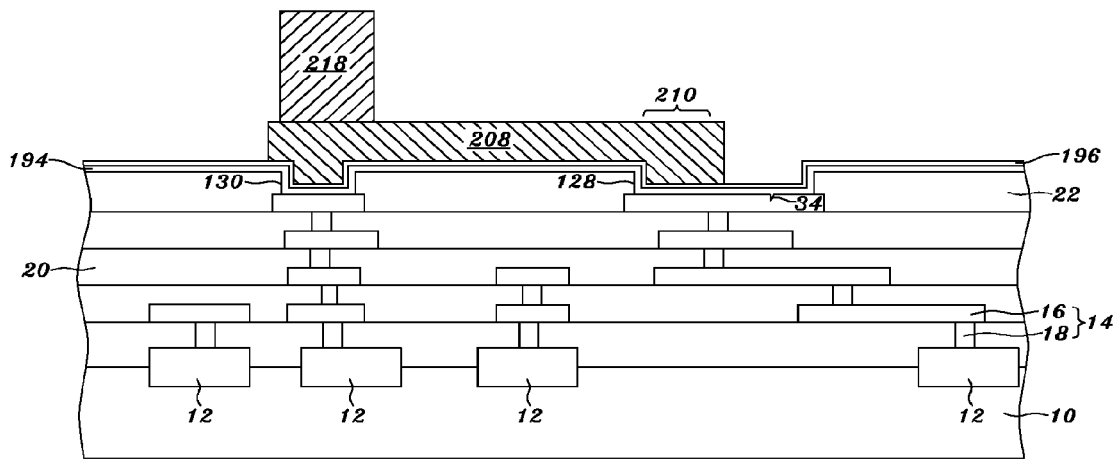
Figure 12E:
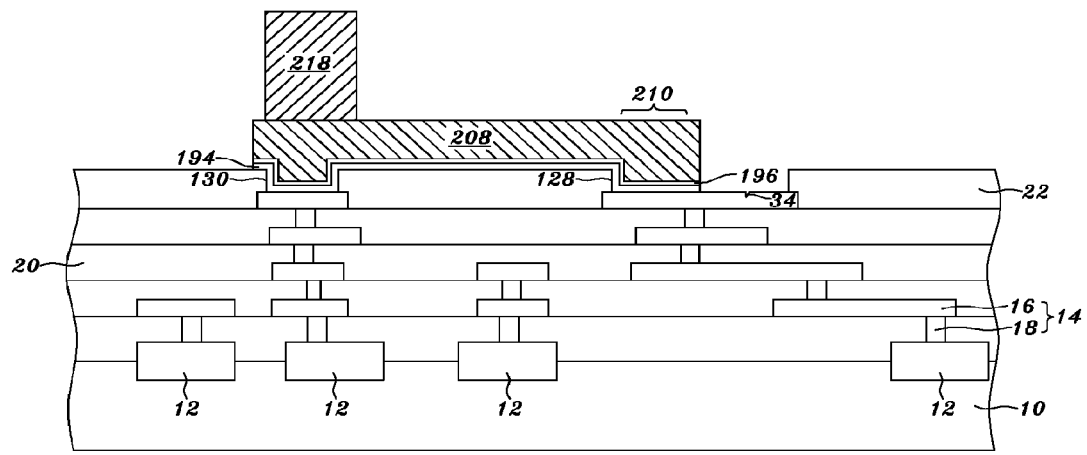

Refer to FIG. 12D. After the second metal layer 218 is completed, the photoresist layer 214 and the photoresist layer 198 are removed. Refer to FIG. 12E. Next, the seed layer 196 and the adhesion/barrier layer 194 are removed with a dry-etching method except those below the first metal layer 208, wherein the dry-etching method can be implemented with an argon sputter process.

Figure 12F:
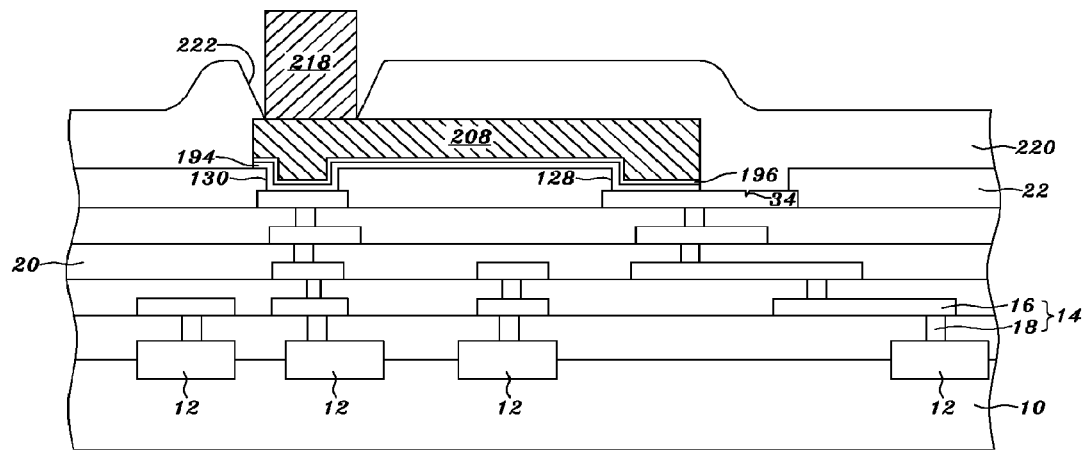
Figure 12G:
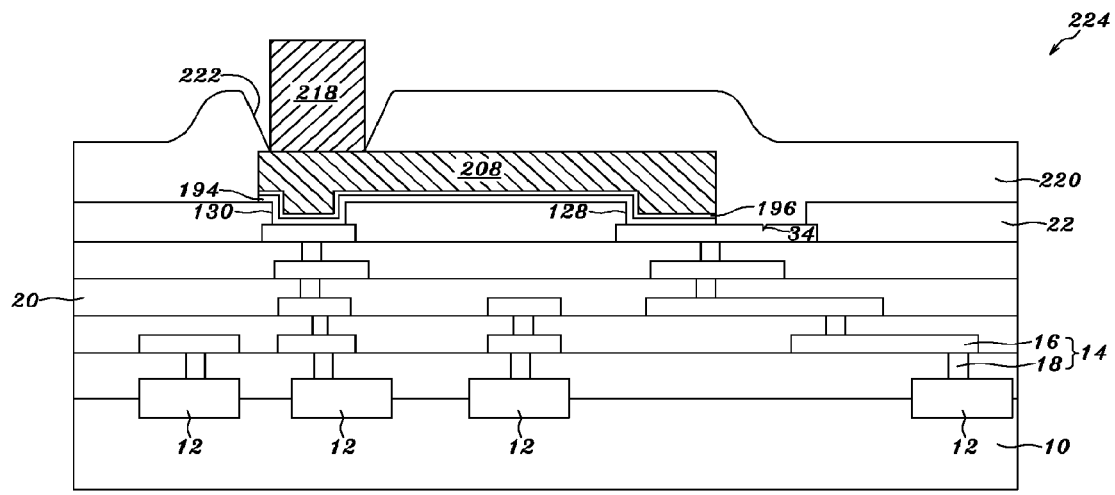
Figure 12H:
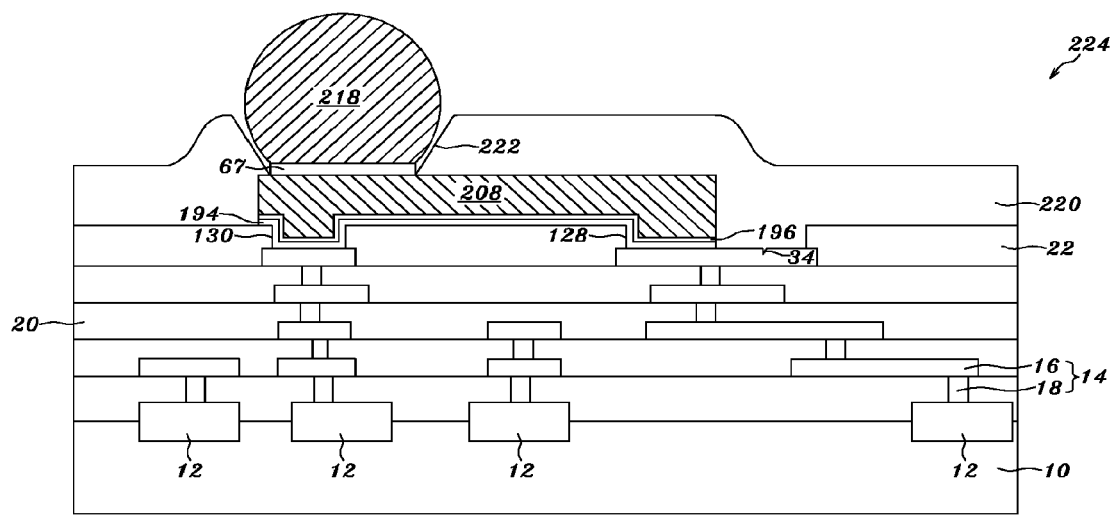

Refer to FIG. 12F. Next, a patterned polymer layer 220 is formed over the passivation layer 22, the first metal layer 208 and the testing area 136 of the first pad 132, and the probe mark 34 is thus covered. An opening 222 in the patterned polymer layer 220 exposes the second metal layer 218. Refer to FIG. 12G. The semiconductor substrate 10 is diced into a plurality of semiconductor chips 224. Refer to FIG. 12H. If the second metal layer 218 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 218 is heated to its melting point; thus, the liquid metal assumes a ball shape and then solidifies. Then, the semiconductor substrate 10 is also diced into a plurality of semiconductor chips 224.

Figure 12I:
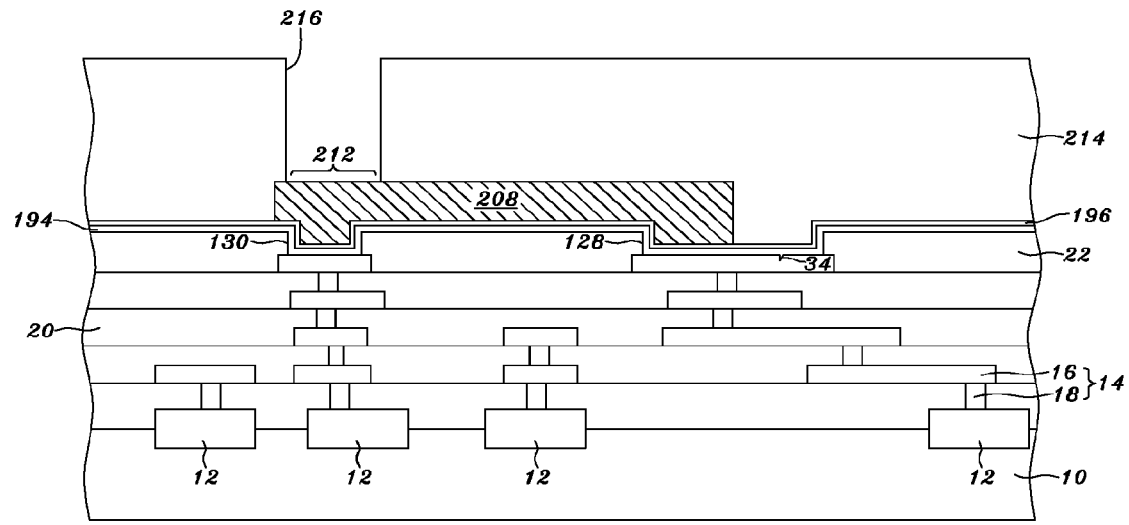

Refer to FIG. 12I. Alternatively, the photoresist layer 198 may be firstly removed, and a photoresist layer 214 is then formed over the seed layer 196 and the first metal layer 208, and the photoresist-layer opening 216 exposes the bond area 212 of the first metal layer 208. Next, the process shown in FIG. 12C is undertaken. After the second metal layer 218 is completed, the photoresist layer 214 is removed to obtain the structure shown in FIG. 12D. Next, the seed layer 196 and the adhesion/barrier layer 194 are removed with a dry-etching method except those below the first metal layer 208 to obtain the structure shown in FIG. 12E. Next, a patterned polymer layer 220 is formed over the passivation layer 22, the first metal layer 208 and the testing area 136 of the first pad 132 to obtain the structure shown in FIG. 12F, and the probe mark 34 is thus covered. Then, the semiconductor substrate 10 is also diced into a plurality of semiconductor chips 224 shown in FIG. 12G or FIG. 12H.

In this embodiment, in addition to contacting the pad 26, the testing probe 32 may also contact the first metal layer 208 or the second metal layer 218 for electrical testing.

EMBODIMENT XII

Figure 13A:
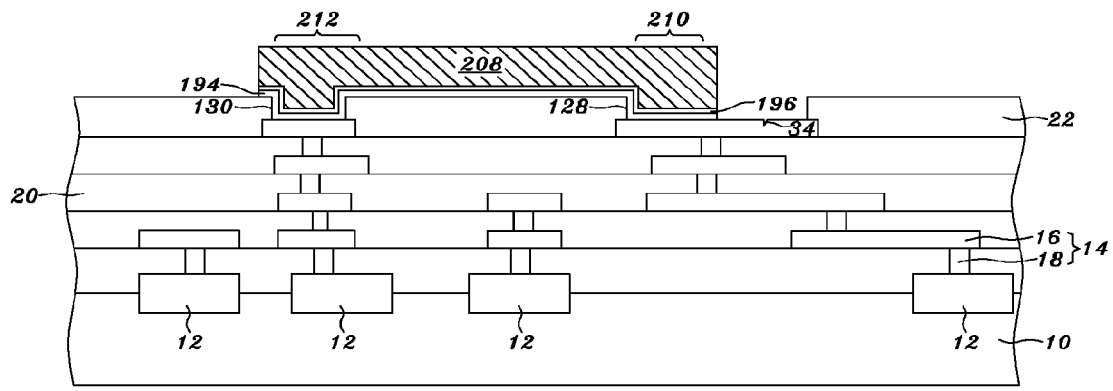
FIG. 13A to FIG. 13I are sectional views schematically showing the fabrication process according to one embodiment of the present invention.

Refer to FIG. 13A. After the process shown in FIG. 12A, the photoresist layer 198 is removed, and the seed layer 196 and the adhesion/barrier layer 194 are removed with a dry-etching method except those below the first metal layer 208, wherein the dry-etching method is implemented with an argon sputter process.

Figure 13B:
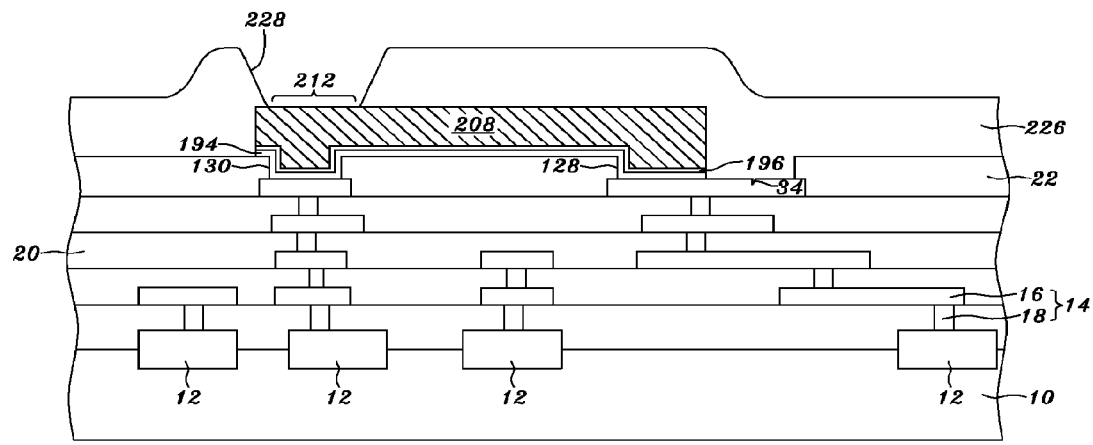
Figure 13C:
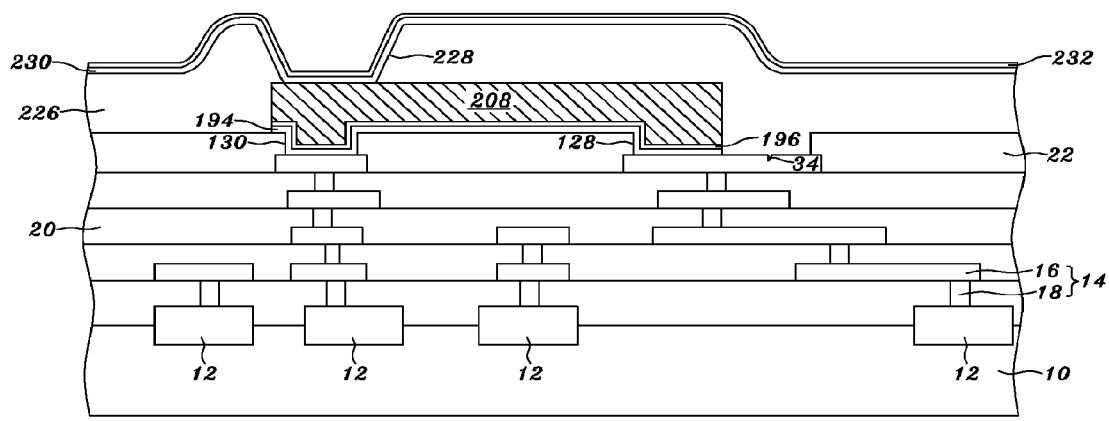

Refer to FIG. 13B. Next, a patterned polymer layer 226 is formed over the passivation layer 22, the first metal layer 208 and the testing area 136 of the first pad 132, and the probe mark 34 is thus covered. An opening 228 in the patterned polymer layer 226 to exposes the bond area 212 of the first metal layer 208. Refer to FIG. 13C. Next, an adhesion/barrier layer 230 is formed over the patterned polymer layer 226 and the bond area 212 exposed by the polymer-layer opening 228. Next, a seed layer 232 is formed over the adhesion/barrier layer 230. For the detailed technical description of the adhesion/barrier layer 230 and the seed layer 232, refer to that of the adhesion/barrier layer 40 and the seed layer 42 of Embodiment I.

Figure 13D:
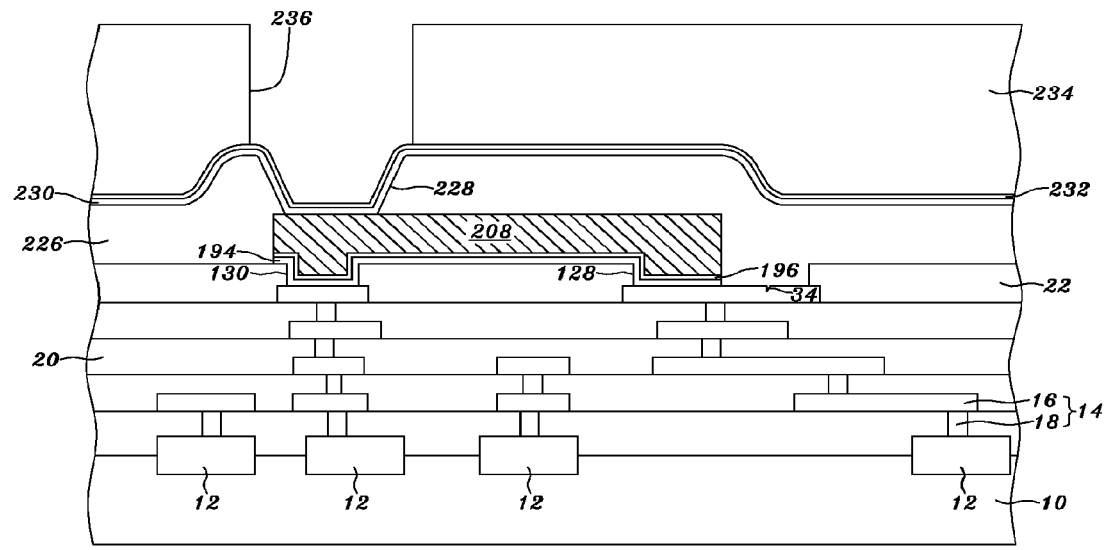
Figure 13E:
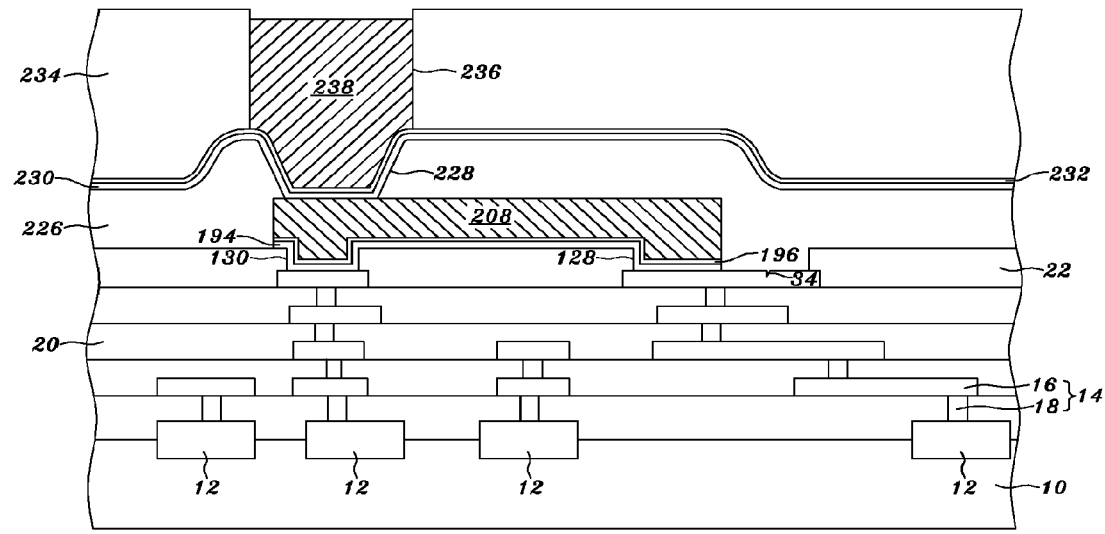

Refer to FIG. 13D. Next, a photoresist layer 234 is formed over the seed layer 232, and the photoresist layer 234 is patterned to form a photoresist-layer opening 236 to expose the seed layer 232 over the bond area 212 of the first metal layer 208. Refer to FIG. 13E. Next, a second metal layer 238 having a thickness of between 1 and 200 μm, e.g. between 20 and 120 μm, is electroplated over the seed layer 232 exposed by the photoresist-layer opening 236. For further detail of the technical contents of the second metal layer 238, such as the material and preferred thickness thereof, refer to that of the second metal layer 66 of Embodiment III.

Figure 13F:
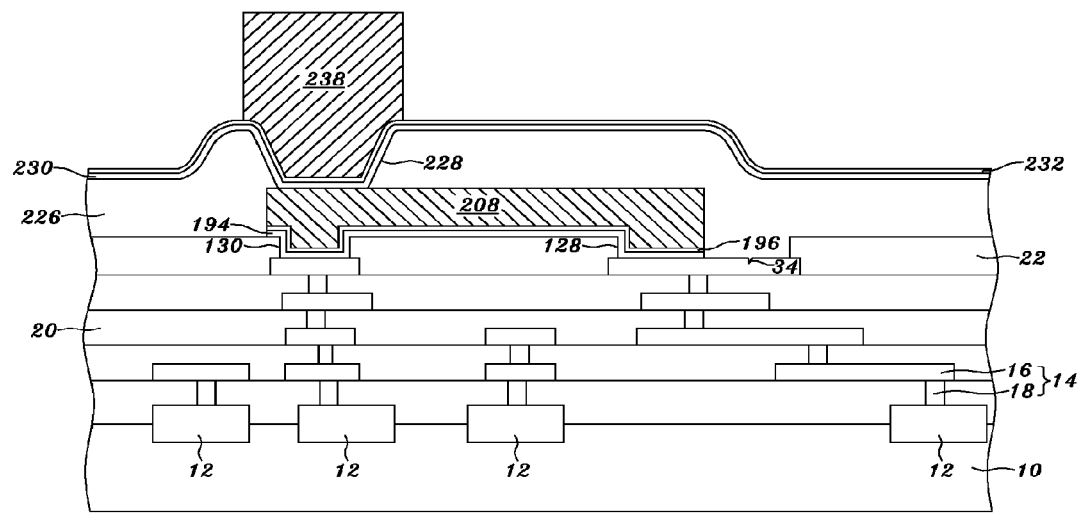
Figure 13G:
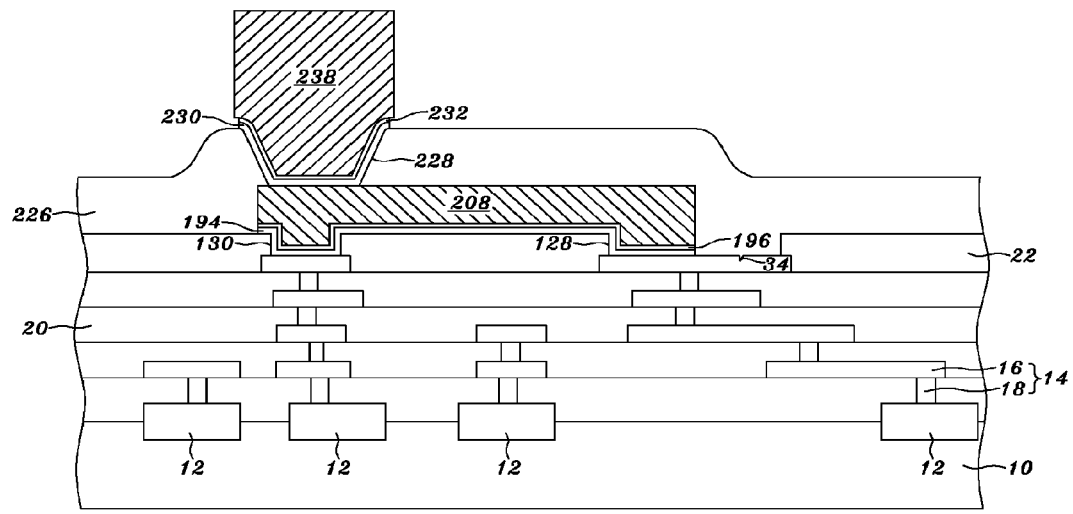

Refer to FIG. 13F. After the second metal layer 238 is completed, the photoresist layer 234 is removed. Refer to FIG. 13G. Next, the seed layer 232 and the adhesion/barrier layer 230 are removed except those below the second metal layer 238. For the detailed technical description of removing the adhesion/barrier layer 230 and the seed layer 232, refer to that of removing the adhesion/barrier layer 40 and the seed layer 42 of Embodiment I.

Figure 13H:
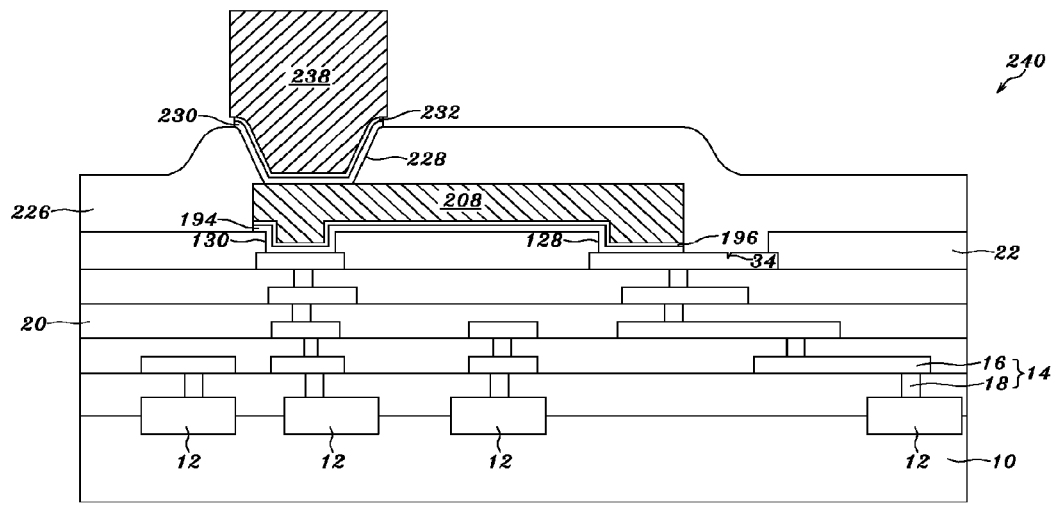
Figure 13I:
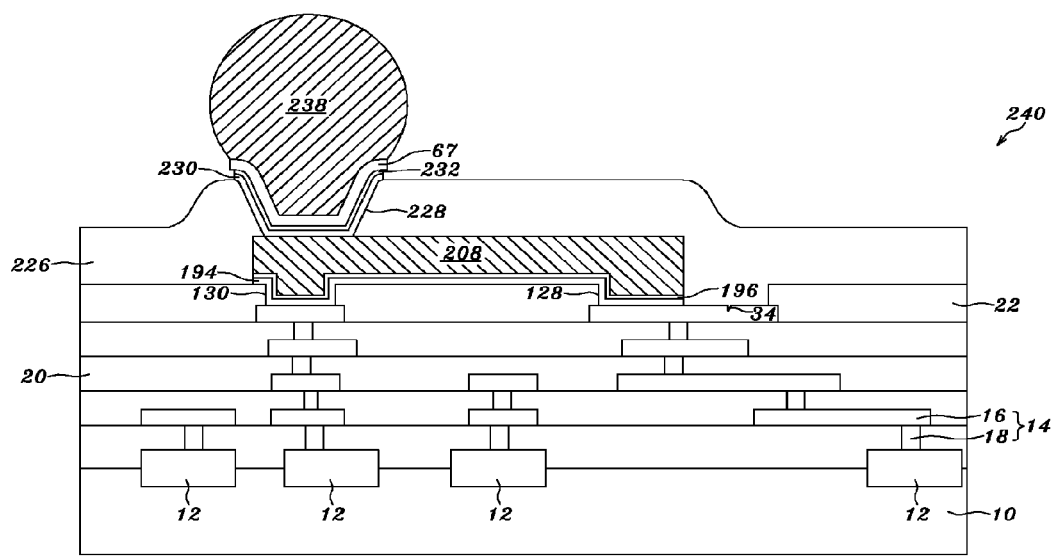

Refer to FIG. 13H. The semiconductor substrate 10 is diced into a plurality of semiconductor chips 240. Refer to FIG. 13I. If the second metal layer 238 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 238 is heated to its melting point; thus, the liquid metal assumes a ball shape and then solidifies. Then, the semiconductor substrate 10 is also diced into a plurality of semiconductor chips 240.

In this embodiment, in addition to contacting the pad 26, the testing probe 32 may also contact the first metal layer 208 or the second metal layer 238 for electrical testing.

Figure 14:
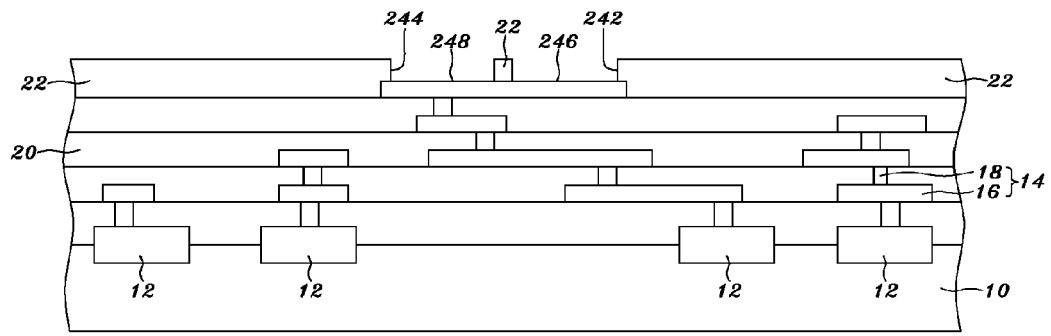
FIG. 14 is a sectional view schematically showing a wafer according to one embodiment of the present invention.

In the present invention, an opening in the passivation layer 22 exposes a pad having a testing area and a bond area. Referring to FIG. 14, a first opening 242 and a second opening 244 in the passivation layer 22 expose a testing pad 246 and a bond pad 248, respectively, wherein the testing pad 246 is connected to the bond pad 248. Besides, the testing pad 246 may be connected to the bond pad 248 via a metal trace below the passivation layer 22; in such a case, the distance between the central points of the testing pad 246 and the bond pad 248 is between 40 and 300 μm. The detailed technical description of the first opening 242 and the second opening 244 can be referred to that of the opening 24 shown in FIG. 1.

Optionally, two metal caps (not shown in the drawing) may be respectively formed on the testing pad 246 exposed by the first opening 242 in the passivation layer 22 and the bond pad 248 exposed by the second opening 244 in the passivation layer 22 to prevent the testing pad 246 and the bond pad 248 from oxidation. The metal caps may be an aluminum layer, a gold layer, a titanium layer, a titanium-tungsten alloy layer, a tantalum layer, a tantalum nitride layer or a nickel layer. For example, when the testing pad 246 and the bond pad 248 are copper pads, the two metal caps are used to protect the two copper pads from oxidation. Alternatively, when the two metal caps are an aluminum layer, a barrier layer is interposed between the aluminum layer and the testing pad 246 and between the aluminum layer and the bond pad 248. The barrier layer may be made of titanium, titanium nitride, a titanium-tungsten alloy, tantalum, tantalum nitride, chromium or nickel. If there is a metal cap over the testing pad 246, a testing probe contacts with the metal cap for electrical testing during a step of testing; after the step of testing, the testing probe is removed, and a probe mark is left on the metal cap. Such a structure with the metal caps may be applied to the following thirteenth through twenty fourth embodiments. Below, only the cases without the metal caps are discussed.

EMBODIMENT XIII

Figure 15A:
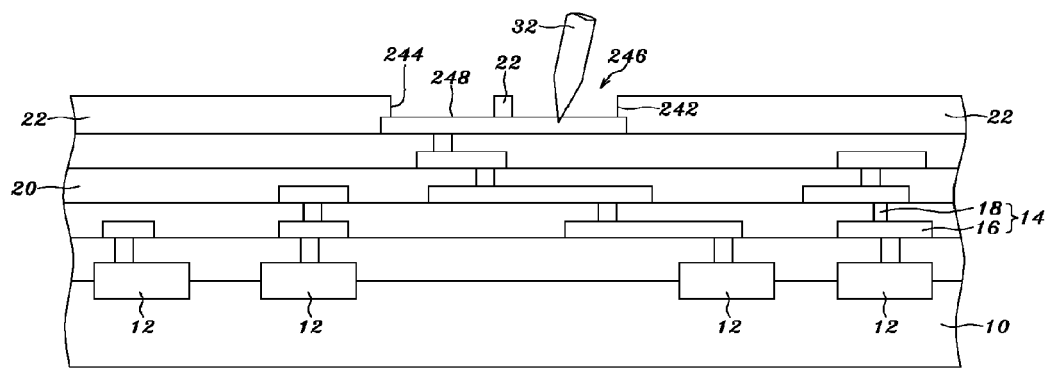
FIG. 15A to FIG. 15L are sectional views schematically showing the fabrication process according to one embodiment of the present invention.
Figure 15B:
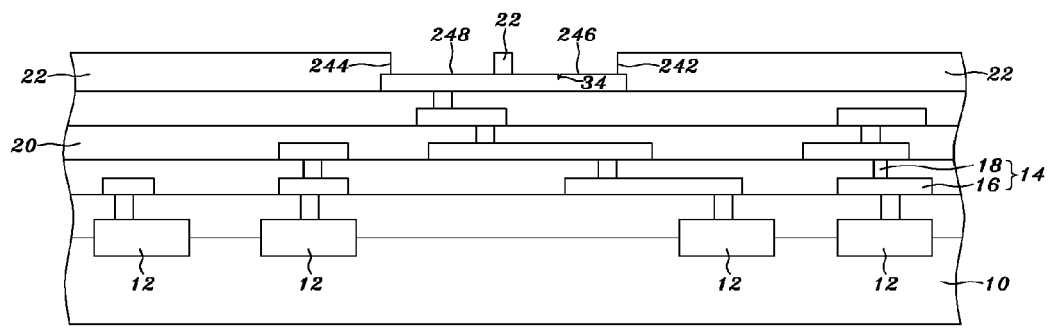
Figure 15C:
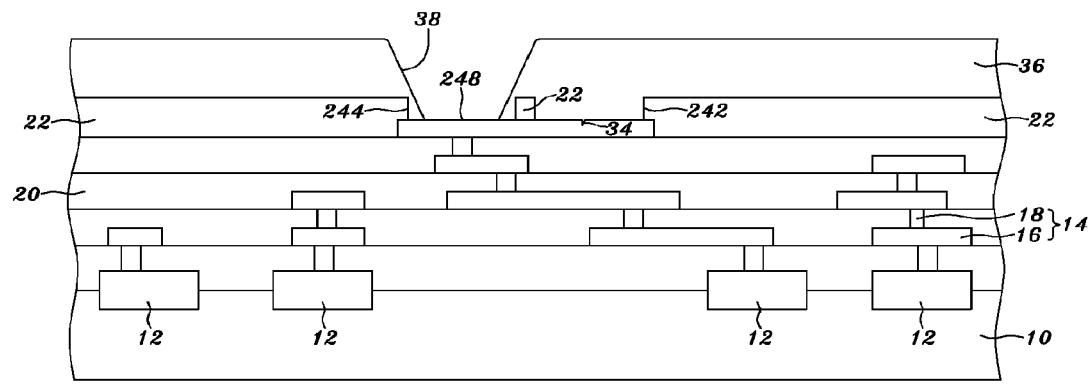

Refer to FIG. 15A. During a step of testing, a testing probe 32 contacts with the testing pad 246 for electrical testing. Refer to FIG. 15B. After the step of testing, the testing probe 32 is removed, and a probe mark 34 is left on the testing pad 246. Refer to FIG. 15C. A patterned polymer layer 36 is formed over the passivation layer 22 and the testing pad 246, and the probe mark 34 is thus covered. An opening 38 in the patterned polymer layer 36 exposes the bond pad 248. The material of the patterned polymer layer 36 may be PI (polyimide), BCB (benzo-cyclo-butene), polyurethane, epoxy, a parylene-based polymer, a solder-mask material, an elastomer, or a porous dielectric material. The patterned polymer layer 36 can be fabricated by spin-coating, heat-pressing a dry film, or screen-printing. Further, the patterned polymer layer 36 has a thickness of between 1 and 30 μm. In a preferred case, the patterned polymer layer 36 has a thickness of between 5 and 20 μm.

Figure 15D:
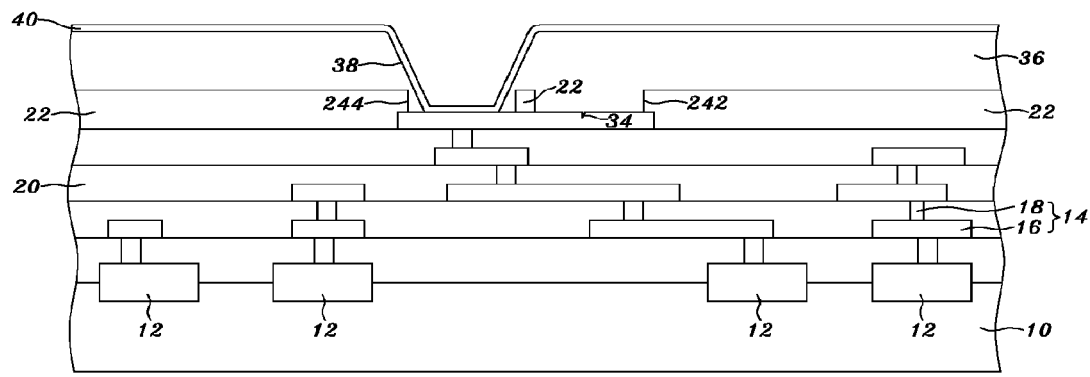

Refer to FIG. 15D. Next, an adhesion/barrier layer 40 having a thickness of 0.02 and 2 µm is formed over the patterned polymer layer 36 and the bond pad 248 exposed by the polymer-layer opening 38. The material of the adhesion/barrier layer 40 may be titanium, tungsten, cobalt, nickel, titanium nitride, a titanium-tungsten alloy, chromium, copper, gold, protactinium, platinum, palladium, ruthenium, rhodium, silver, or a composite of the abovementioned materials. The adhesion/barrier layer 40 may be fabricated with a sputtering method or a vapor deposition method.

Figure 15E:
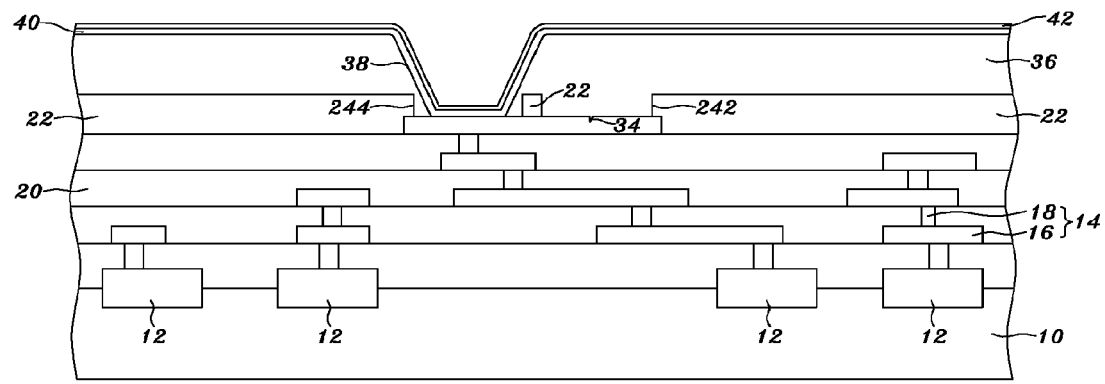

Refer to FIG. 15E. Next, a seed layer 42 is formed over the adhesion/barrier layer 40 with a sputtering method, a vapor deposition method, or a PVD (Physical Vapor Deposition) method. The seed layer 42 is beneficial to electroplating a metal layer thereon. Thus, the material of the seed layer 42 varies with the material of the succeeding metal layer. When a copper metal layer is to be electroplated on the seed layer, copper is a preferable material to the seed layer. When a gold metal layer is to be electroplated on the seed layer, gold is a preferable material to the seed layer. When a palladium metal layer is to be electroplated on the seed layer, palladium is a preferable material to the seed layer. When a platinum metal layer is to be electroplated on the seed layer, platinum is a preferable material to the seed layer. When a rhodium metal layer is to be electroplated on the seed layer, rhodium is a preferable material to the seed layer. When a ruthenium metal layer is to be electroplated on the seed layer, ruthenium is a preferable material to the seed layer. When a rhenium metal layer is to be electroplated on the seed layer, rhenium is a preferable material to the seed layer. When a nickel metal layer is to be electroplated on the seed layer, nickel is a preferable material to the seed layer.

Figure 15F:
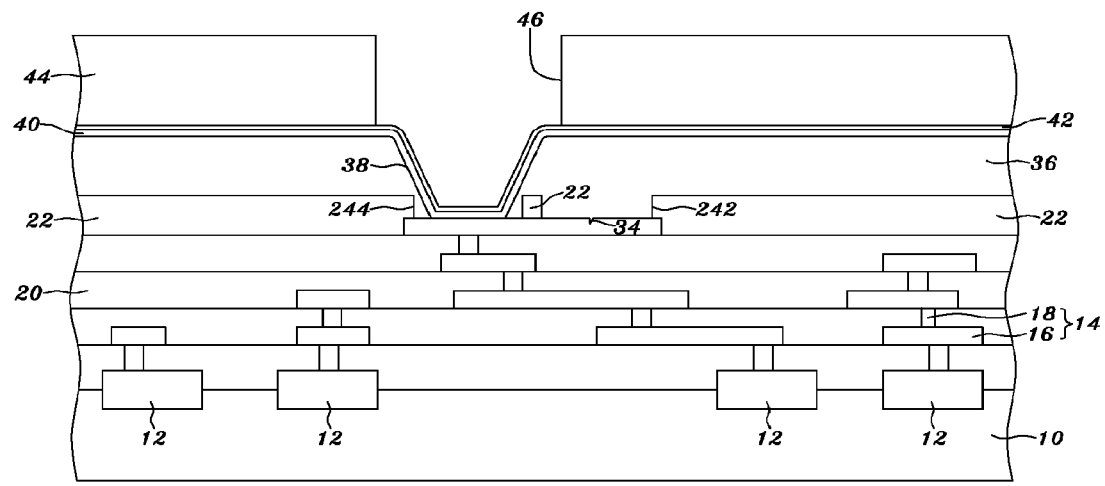
Figure 15G:
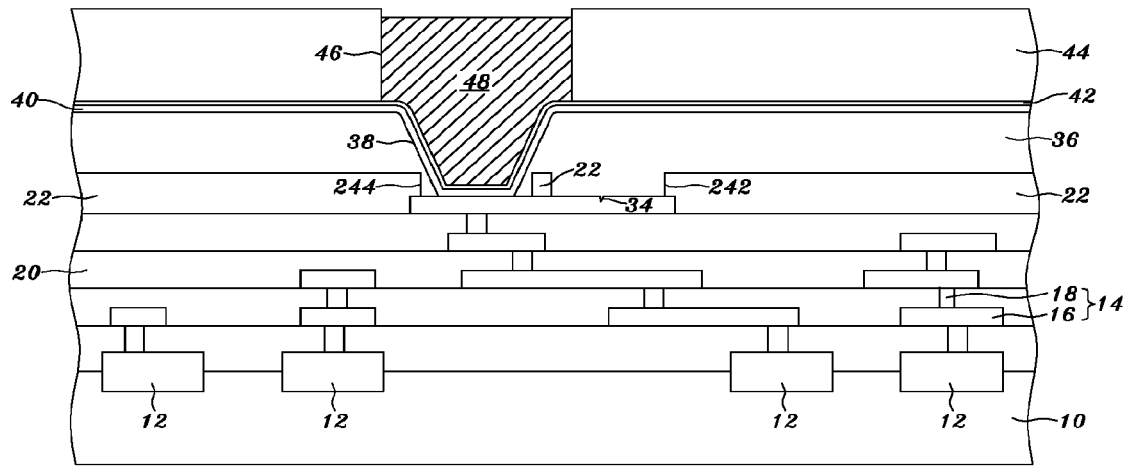

Refer to FIG. 15F. Next, a photoresist layer 44 is formed over the seed layer 42, and the photoresist layer 44 is patterned to form a photoresist-layer opening 46 to expose the seed layer 42 over the bond pad 248. Preferably, a 1× stepper or a 1× scanner is used to expose the photoresist layer 44. Refer to FIG. 15G. Next, a metal layer 48 is electroplated on the seed layer 42 exposed by the photoresist-layer opening 46. The metal layer 48 has a thickness of between 1 and 200 µm, for example, a thickness of between 20 and 120 µm. The metal layer 48 may be a single layer made of gold, copper, silver, palladium, platinum, rhodium, ruthenium, rhenium, or nickel. The metal layer 48 may also be a composite layer made of the abovementioned metals. The thickness of the metal layer 48 is preferred to be between 2 and 30 µm. For example, the metal layer 48 may include a gold layer with a thickness of between 10 and 30 µm, for forming a metal bump, or between 1 and 10 µm, for forming a metal trace. For example, the metal layer 48 may include a copper layer with a thickness of between 2 and 30 µm.

Figure 15H:
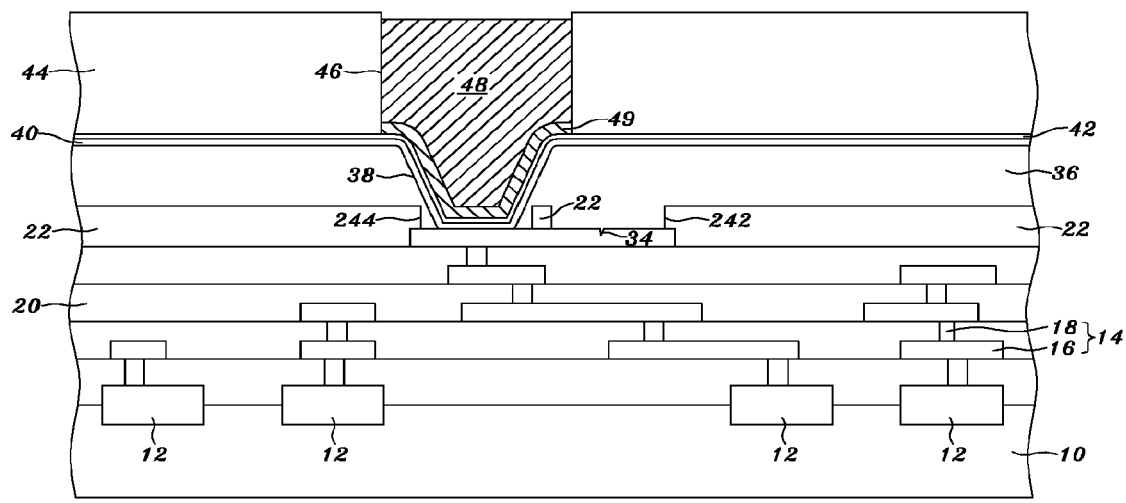

The metal layer 48 may also be made of a tin-containing material. The tin-containing material may be a tin-lead alloy, a tin-silver alloy, a tin-silver-copper alloy or a lead-free alloy. The tin-containing layer 48 has a thickness of between 3 and 150 µm. Refer to FIG. 15H. Before the tin-containing layer 48 is to be formed, a metal layer 49 may be firstly formed on the seed layer 42 exposed by the photoresist-layer opening 46. The metal layer 49 may be a copper layer having a thickness of between 1 and 10 µm. Alternatively, the metal layer 49 may be a composite layer of a nickel layer having a thickness of between 0.5 and 5 µm and a copper layer having a thickness of between 1 and 10 µm, and the nickel layer is on the copper layer.

Figure 15I:
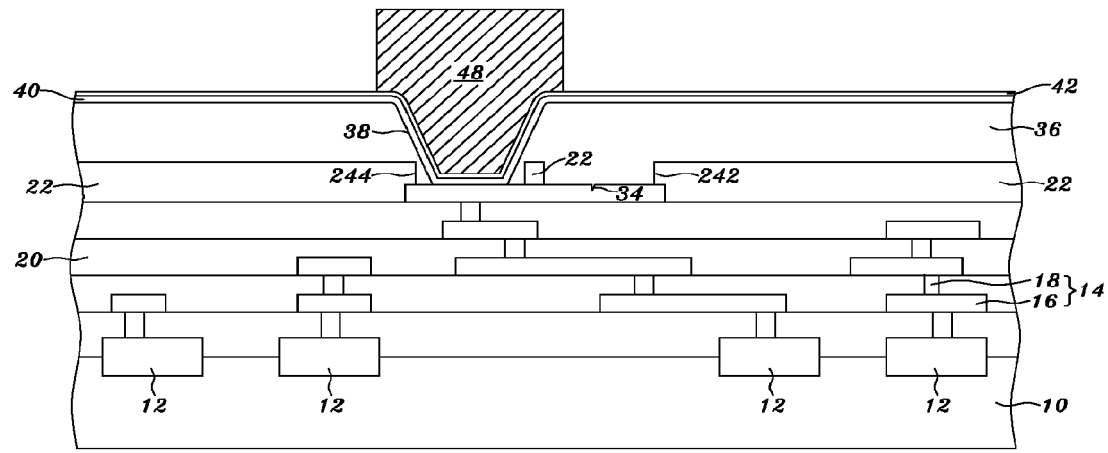
Figure 15J:
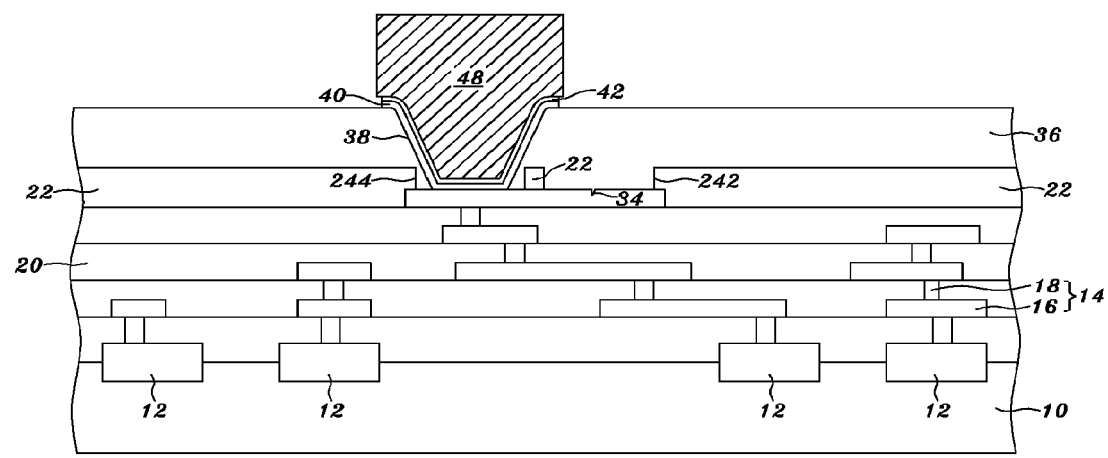

Refer to FIG. 15I. After the metal layer 48 is completed, the photoresist layer 44 is removed. Refer to FIG. 15J. Next, the seed layer 42 and the adhesion/barrier layer 40 are removed except those below the metal layer 48. The adhesion/barrier layer 40 can be removed with a dry-etching method or a wet-etching method. The dry-etching method may be implemented with an argon sputter process. When the adhesion/barrier layer 40 is made of a titanium-tungsten alloy, it can be removed with hydrogen peroxide. If the seed layer 42 is made of gold, it can be removed with an iodine-containing etchant, such as a potassium iodine solution.

Figure 15K:
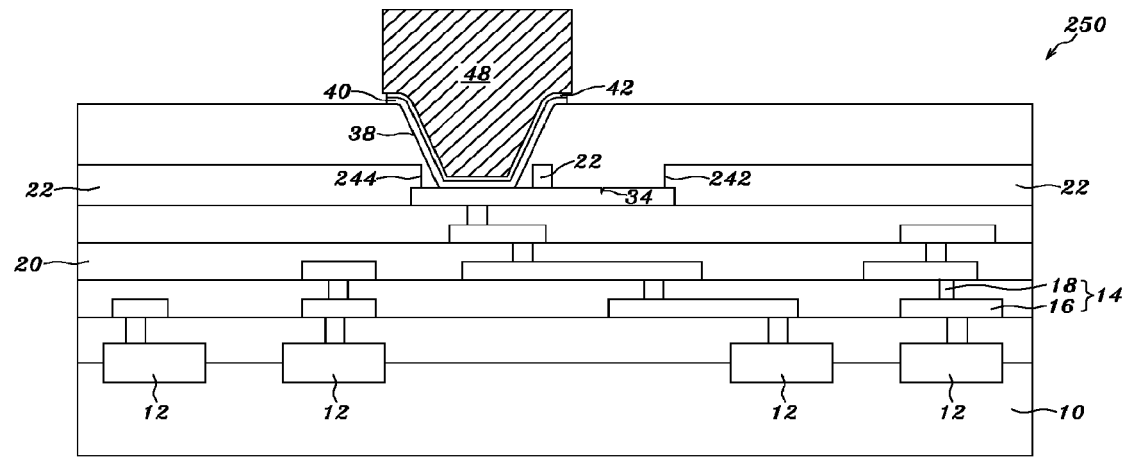
Figure 15L:
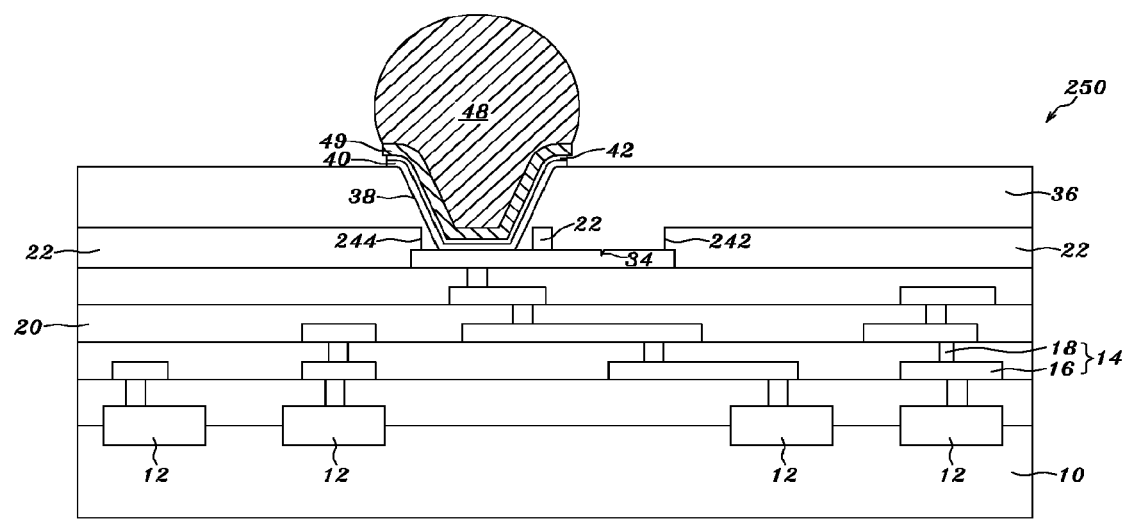

Refer to FIG. 15K. The semiconductor substrate 10 is diced into a plurality of semiconductor chips 250. Refer to FIG. 15L. If the metal layer 48 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 48 is heated to its melting point; thus, the liquid metal assumes a ball shape and then solidifies. Then, the semiconductor substrate 10 is also diced into a plurality of semiconductor chips 250.

In this embodiment, after the electrical testing is completed, the testing pad 246 is covered with a patterned polymer layer 36. In this embodiment, in addition to contacting the testing pad 246, the testing probe 32 may also contact the metal layer 48 for electrical testing.

EMBODIMENT XIV

Figure 16A:
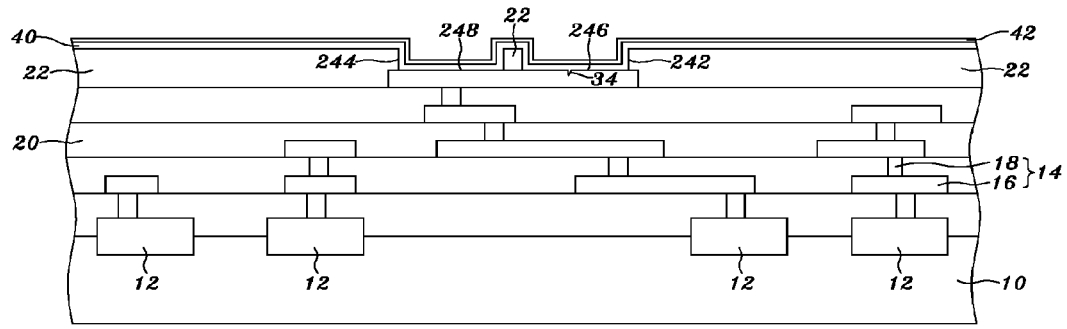
FIG. 16A to FIG. 16H are sectional views schematically showing the fabrication process according to one embodiment of the present invention.

Refer to FIG. 16A. After the progress shown in FIG. 15B, an adhesion/barrier layer 40 having a thickness of between 0.02 and 2 µm is formed on the testing pad 246, the bond pad 248 and the passivation layer 22. Next, a seed layer 42 is formed over the adhesion/barrier layer 40. Refer to EMBODIMENT XIII for the detailed technical description of the adhesion/barrier layer 40 and the seed layer 42.

Figure 16B:
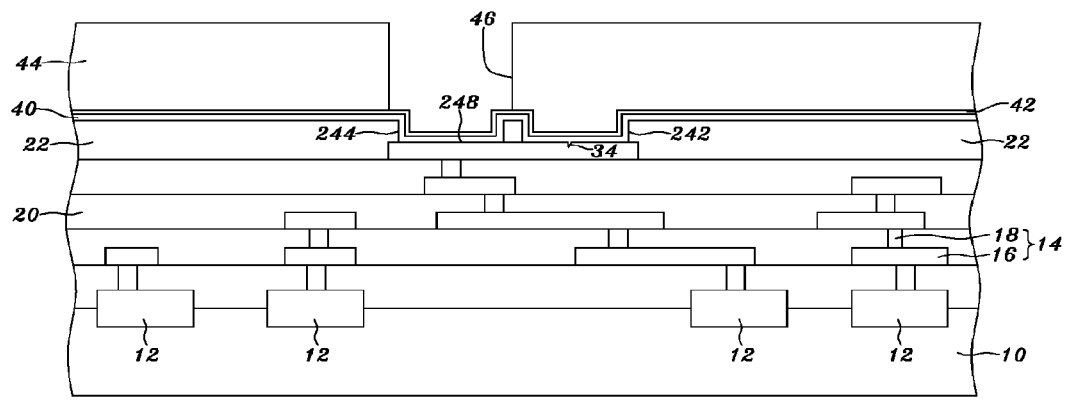
Figure 16C:
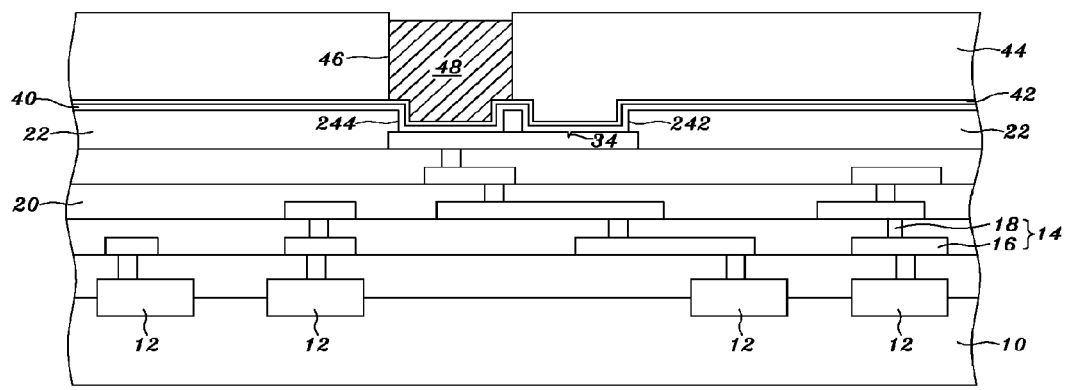

Refer to FIG. 16B. Next, a photoresist layer 44 is formed over the seed layer 42, and the photoresist layer 44 is patterned to form a photoresist-layer opening 46 to expose the seed layer 42 over the bond pad 248, wherein a 1× stepper or a 1x scanner is used to expose the photoresist layer 44 during forming the photoresist-layer opening 46. Refer to FIG. 16C. Next, a metal layer 48 having a thickness of between 1 and 200 µm (e.g. a thickness of between 20 and 120 µm) is formed over the seed layer 42 exposed by the photoresist-layer opening 46. Refer to EMBODIMENT XIII for the detailed technical description of the metal layer 48.

Figure 16D:
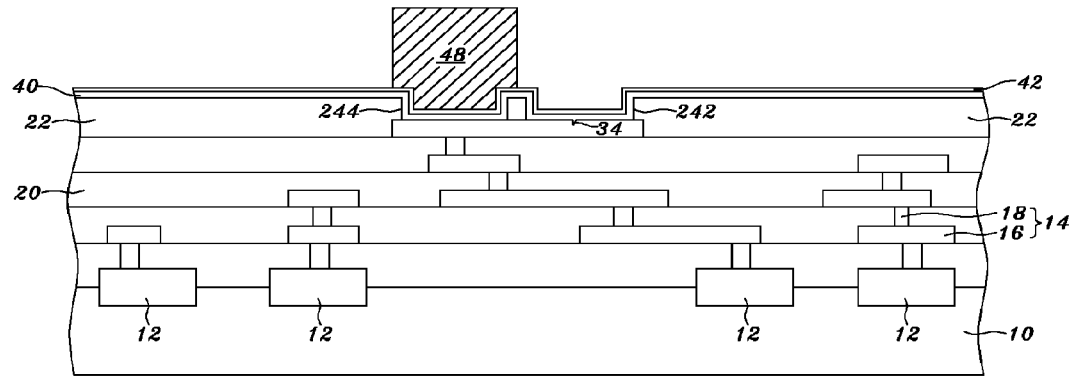
Figure 16E:
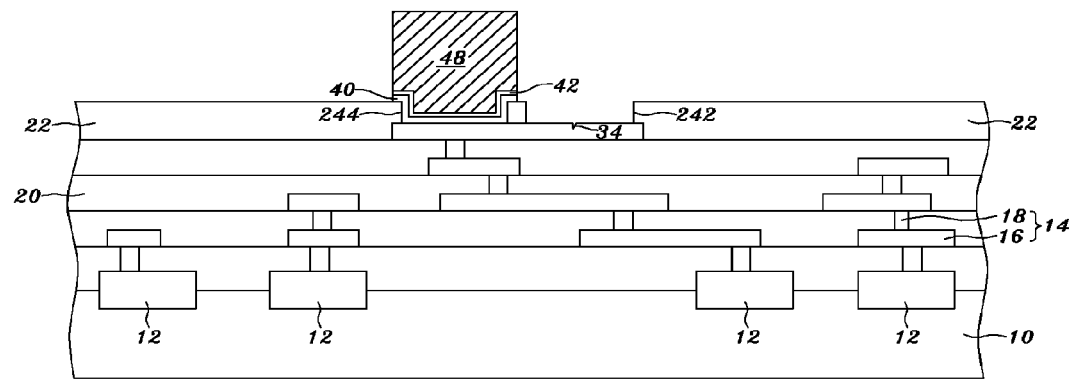
Figure 16F:
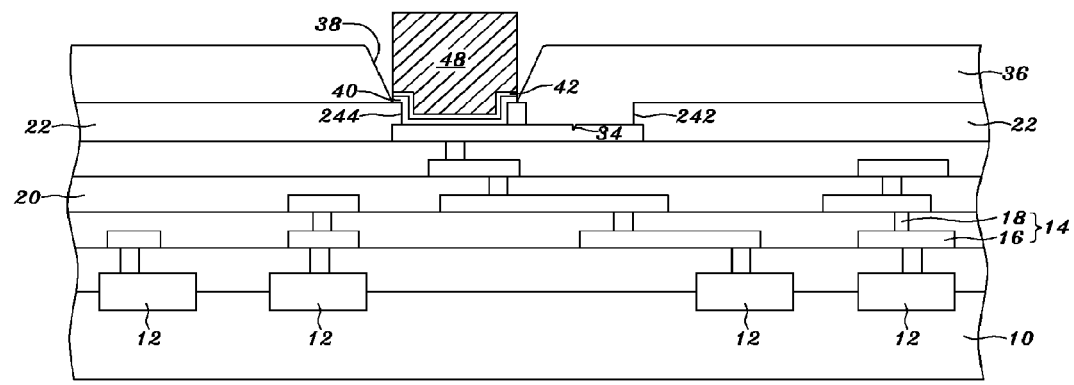

Refer to FIG. 16D. After the metal layer 48 is completed, the photoresist layer 44 is removed. Refer to FIG. 16E. Next, the seed layer 42 and the adhesion/barrier layer 40 are removed except those below the metal layer 48 with a dry-etching method, such as an argon sputter process. Refer to FIG. 16F. Next, a patterned polymer layer 36 is formed over the passivation layer 22 and the testing pad 246, and the probe mark 34 is thus covered. An opening 38 in the patterned polymer layer 36 exposes the metal layer 48. Refer to EMBODIMENT XIII for the detailed technical description of the patterned polymer layer 36.

Figure 16G:
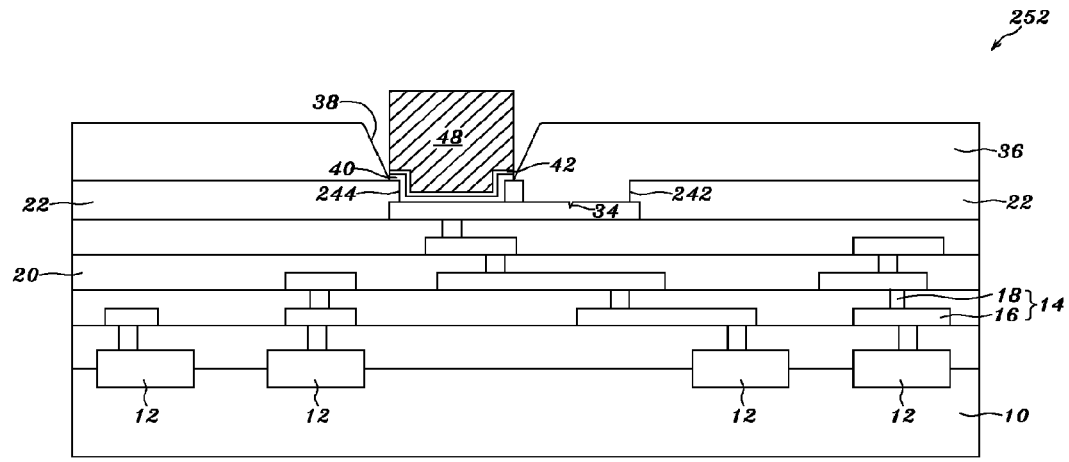
Figure 16H:
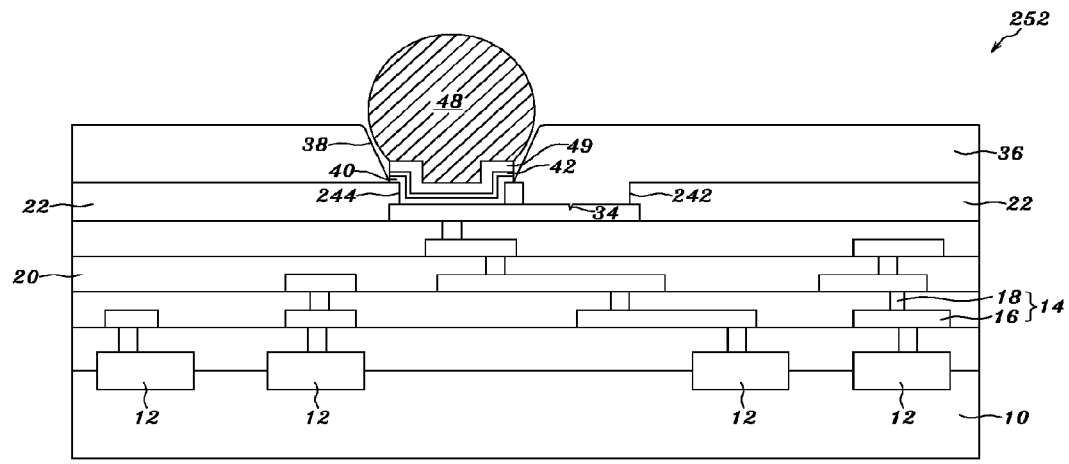

Refer to FIG. 16G. Then, the semiconductor substrate 10 is diced into a plurality of semiconductor chips 252. Refer to FIG. 16H. If the metal layer 48 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 48 is heated to its melting point; thus, the liquid metal assumes a ball shape and then solidifies. Then, the semiconductor substrate 10 is also diced into a plurality of semiconductor chips 252.

In this embodiment, in addition to contacting the testing pad 246, the testing probe 32 may also contact the metal layer 48 for electrical testing.

EMBODIMENT XV

Figure 17A:
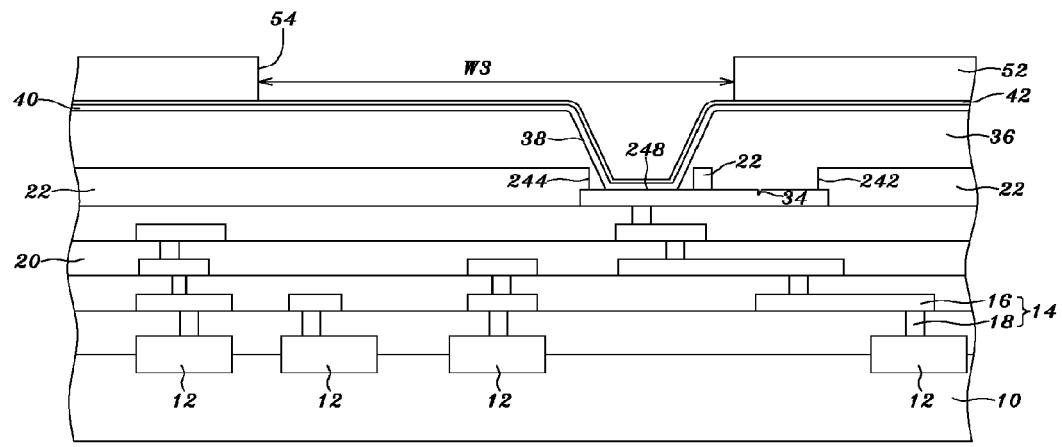
FIG. 17A, FIG. 17B and FIG. 17E to FIG. 17N are sectional views schematically showing the fabrication process according to one embodiment of the present invention.

This embodiment exemplifies the application of the present invention to a redistribution layer (RDL). Refer to FIG. 17A. After the progress shown in FIG. 15E, a first photoresist layer 52 is formed over the seed layer 42, and the first photoresist layer 52 is patterned to form a first-photoresist-layer opening 54 to expose the seed layer 42 over the bond pad 248 and expose the seed layer 42 over a portion of the patterned polymer layer 36 extending from the bond pad 248, wherein a 1× stepper or a 1× scanner is used to expose the first photoresist layer 52 during forming the first-photoresist-layer opening 54. The first-photoresist-layer opening 54 has a dimension W3 of between 60 μm and 10 mm.

Figure 17B:
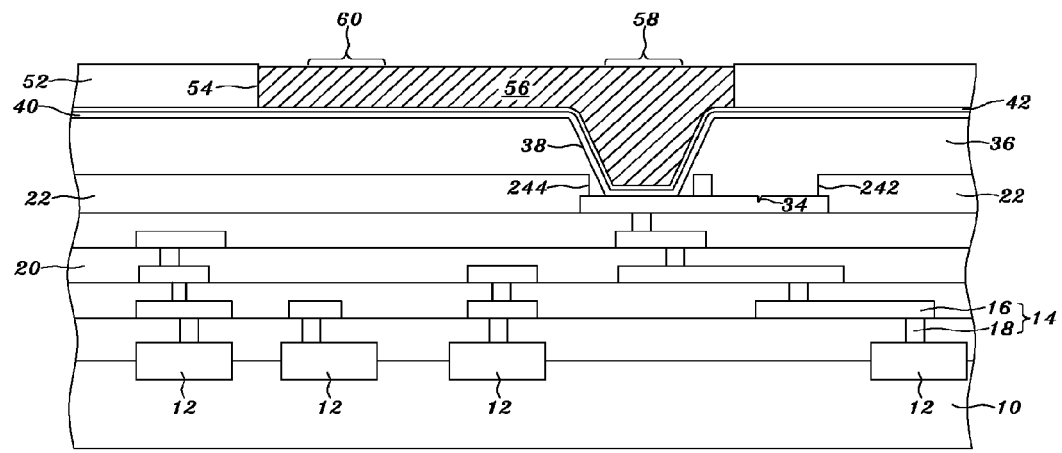
Figure 17C:
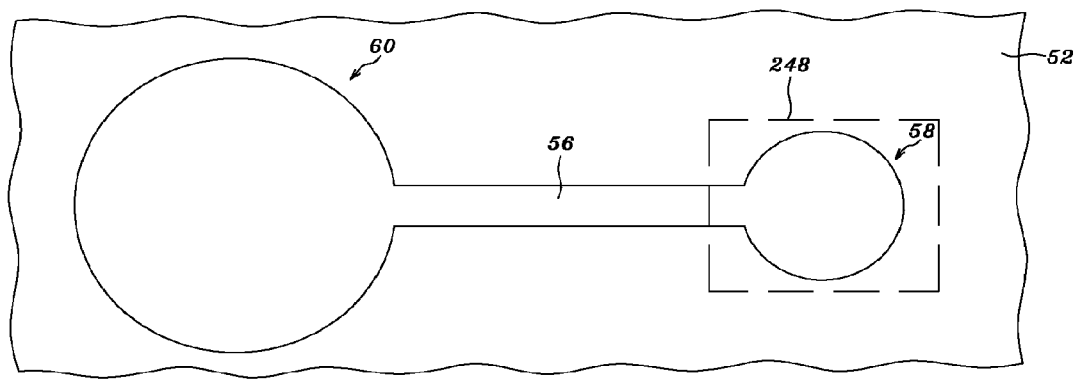
FIG. 17C is a partial top view schematically showing a wafer according to one embodiment of the present invention.
Figure 17D:
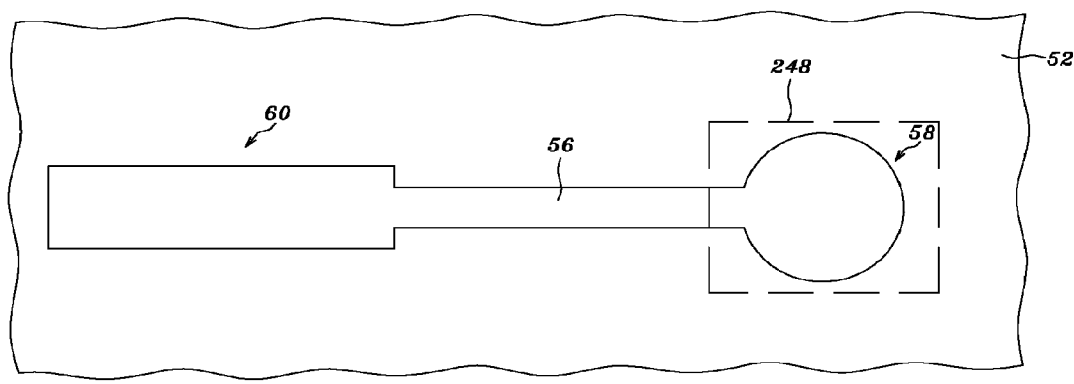
FIG. 17D is a partial top view schematically showing a wafer according to one embodiment of the present invention.

Refer to FIG. 17B. Next, a first metal layer 56 having a thickness of between 1 and 30 μm is electroplated on the seed layer 42 exposed by the first-photoresist-layer opening 54. The first metal layer 56 may be a single layer made of gold, copper, nickel, aluminum, silver, palladium, platinum, rhodium, ruthenium, a tin-lead alloy, or a tin-silver alloy. The first metal layer 56 may also be a composite layer made of the abovementioned metals, such as copper/nickel metallization or copper/nickel/gold metallization, in a bottom-up sequence. The thickness of the first metal layer 56 is preferred to be between 2 and 15 μm or between 4 and 15 μm. The first metal layer 56 also has a testing area 58 for electrical testing and a bond area 60 to be electrically connected to an external system. Refer to FIG. 17C and FIG. 17D. From a top view, the location of the bond area 60 is different from that of the bond pad 248.

Figure 17E:
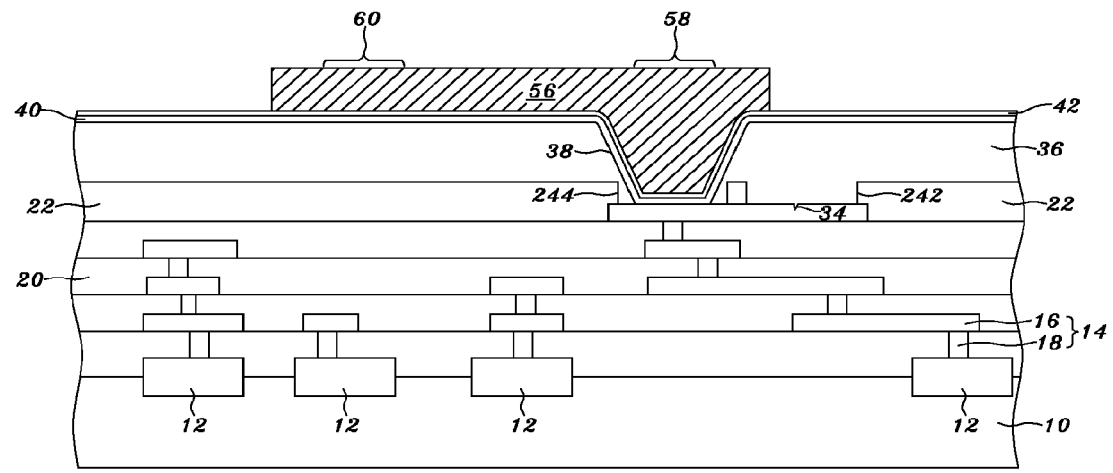
Figure 17F:
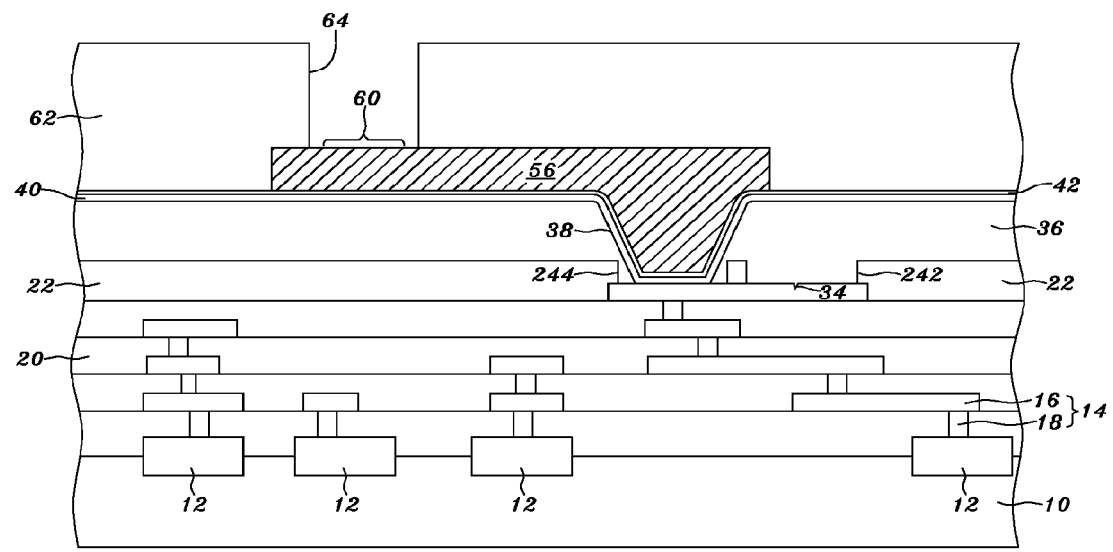

Refer to FIG. 17E. After the first metal layer 56 is completed, the first photoresist layer 52 is removed. Refer to FIG. 17F. Next, a second photoresist layer 62 is formed over the seed layer 42 and the first metal layer 56, and the second photoresist layer 62 is patterned to form a second-photoresist-layer opening 64 to expose the bond area 60 of the first metal layer 56, wherein a 1× stepper or a 1× scanner is used to expose the second photoresist layer 62 during forming the second-photoresist-layer opening 64.

Figure 17G:
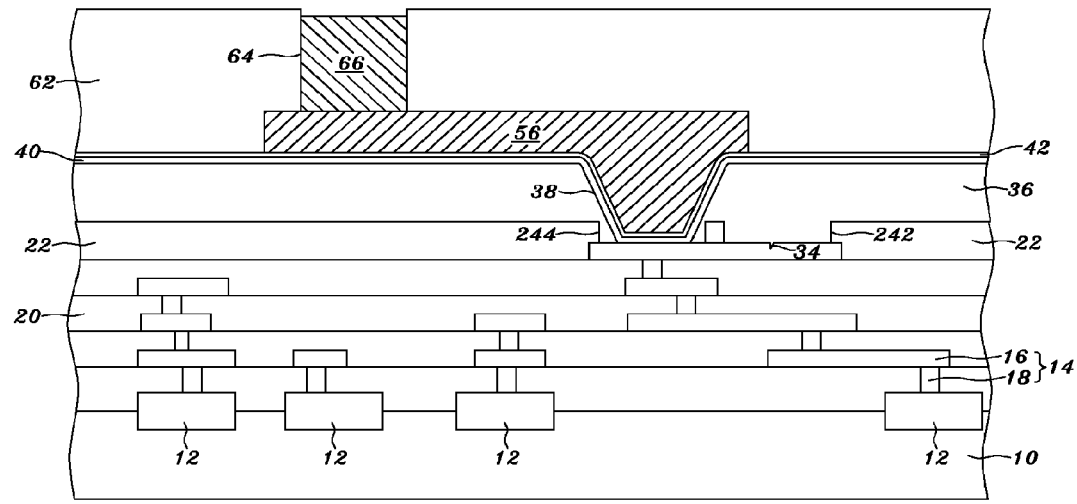

Refer to FIG. 17G. Next, a second metal layer 66 having a thickness of between 1 and 200 μm, e.g. between 20 and 120 μm, is electroplated on the bond area 60 exposed by the second-photoresist-layer opening 64. The second metal layer 66 may be a single layer made of gold, copper, silver, palladium, platinum, rhodium, ruthenium, rhenium, or nickel. The second metal layer 66 may also be a composite layer made of the abovementioned metals. The thickness of the second metal layer 66 is preferred to be between 2 and 30 μm. For example, the metal layer 48 may include a gold layer with a thickness of between 10 and 30 μm, for forming a metal bump, or between 1 and 10 μm, for forming a metal trace. For example, the metal layer 48 may include a copper layer with a thickness of between 2 and 30 μm.

Figure 17H:
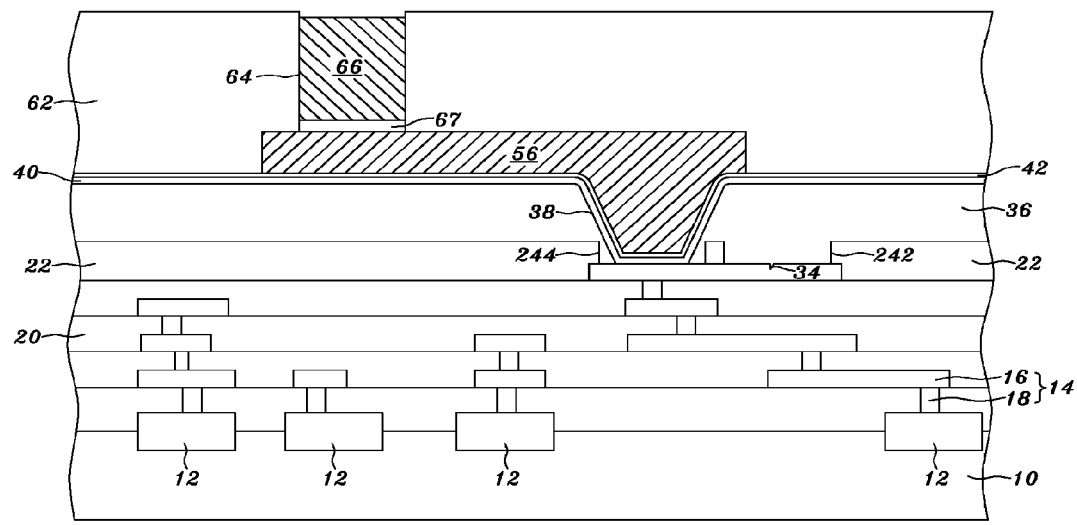

The second metal layer 66 may also be made of a tin-containing material. The tin-containing material may be a tin-lead alloy, a tin-silver alloy, a tin-silver-copper alloy or a lead-free alloy. The tin-containing layer 66 has a thickness of between 3 and 150 μm. Refer to FIG. 17H. Before the tin-containing layer 66 is to be formed, a metal layer 67 may be firstly formed on the bond area 60 exposed by the second-photoresist-layer opening 64. Next, the tin-containing layer 66 is formed over the metal layer 67. The metal layer 67 may be a copper layer having a thickness of between 1 and 10 μm. Alternatively, the metal layer 67 may be a composite layer of a nickel layer having a thickness of between 0.5 and 5 μm and a copper layer having a thickness of between 1 and 10 μm, and the nickel layer is on the copper layer.

Figure 17I:
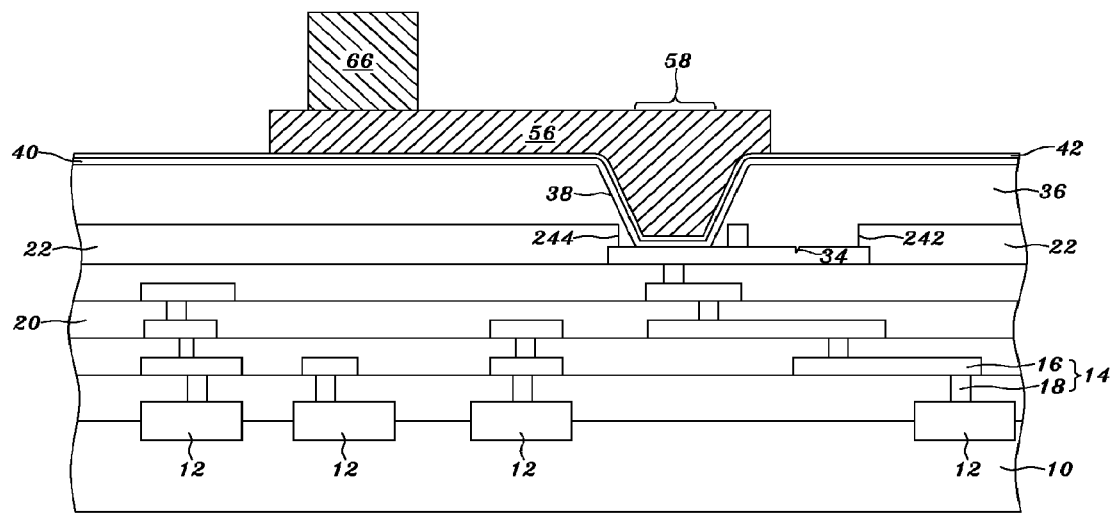
Figure 17J:
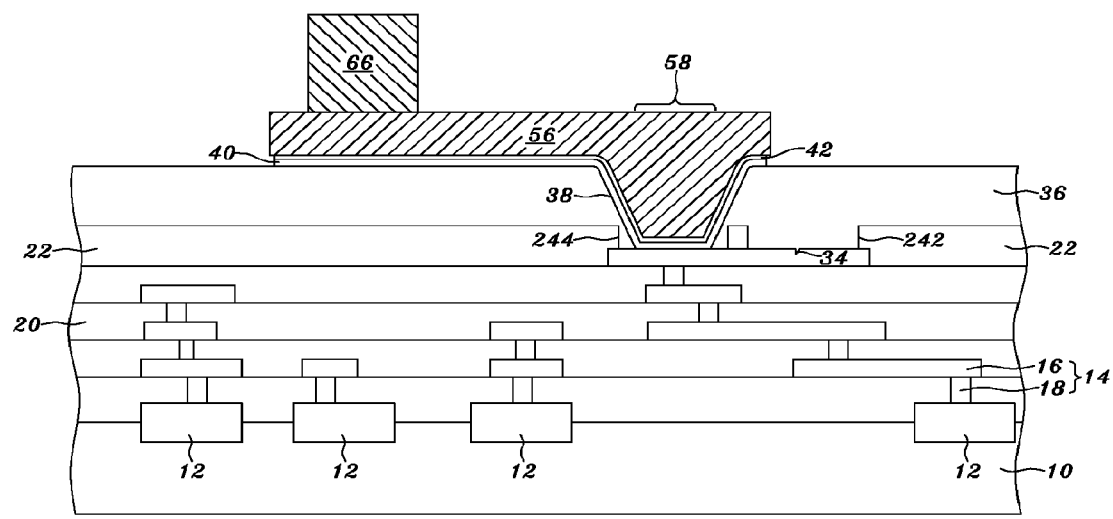

Refer to FIG. 17I. After the second metal layer 66 is completed, the second photoresist layer 62 is removed. Refer to FIG. 17J. Next, the seed layer 42 and the adhesion/barrier layer 40 are removed except those below the first metal layer 56. The adhesion/barrier layer 40 can be removed with a dry-etching method or a wet-etching method. The dry-etching method may be implemented with an argon sputter process. When the adhesion/barrier layer 40 is made of a titanium-tungsten alloy, it can be removed with hydrogen peroxide. If the seed layer 42 is made of gold, it can be removed with an iodine-containing etchant, such as a potassium iodine solution.

Figure 17K:
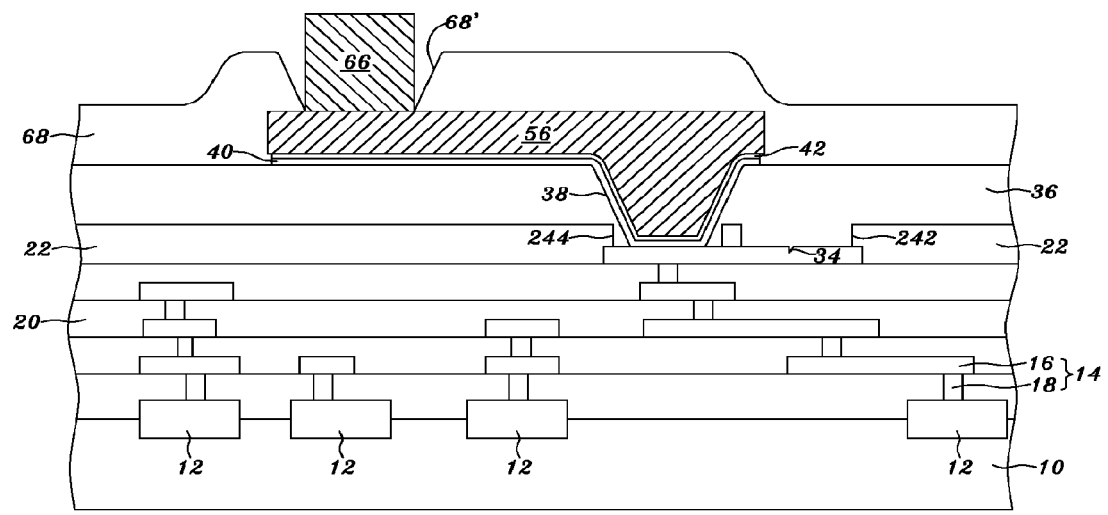

Refer to FIG. 17K. After the seed layer 42 and the adhesion/barrier layer 40 are removed except those below the first metal layer 56, a patterned polymer layer 68 may be optionally formed over the first metal layer 66 and the patterned polymer layer 36, and an opening 68' in the patterned polymer layer 68 exposes the second metal layer 66.

Figure 17L:
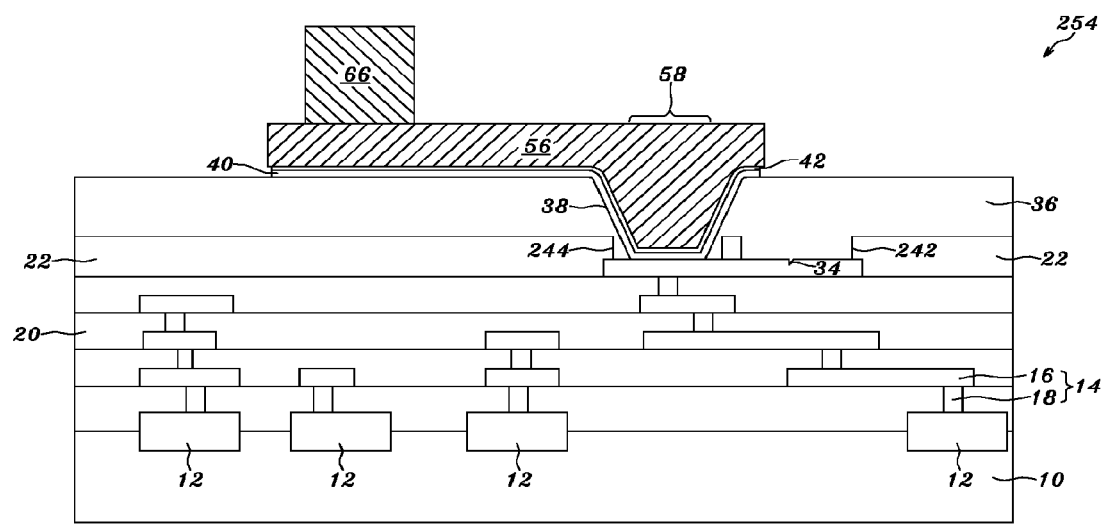
Figure 17M:
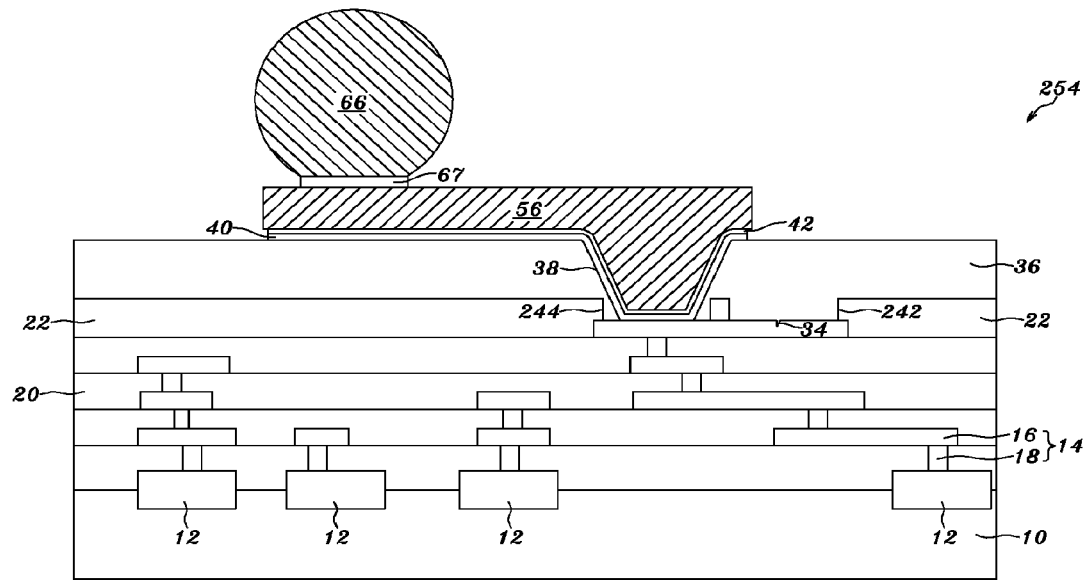

Refer to FIG. 17L. The semiconductor substrate 10 is diced into a plurality of semiconductor chips 254. Refer to FIG. 17M. If the second metal layer 66 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 66 is heated to its melting point; thus, the liquid metal assumes a ball shape and then solidifies. Then, the semiconductor substrate 10 is also diced into a plurality of semiconductor chips 254.

Figure 17N:
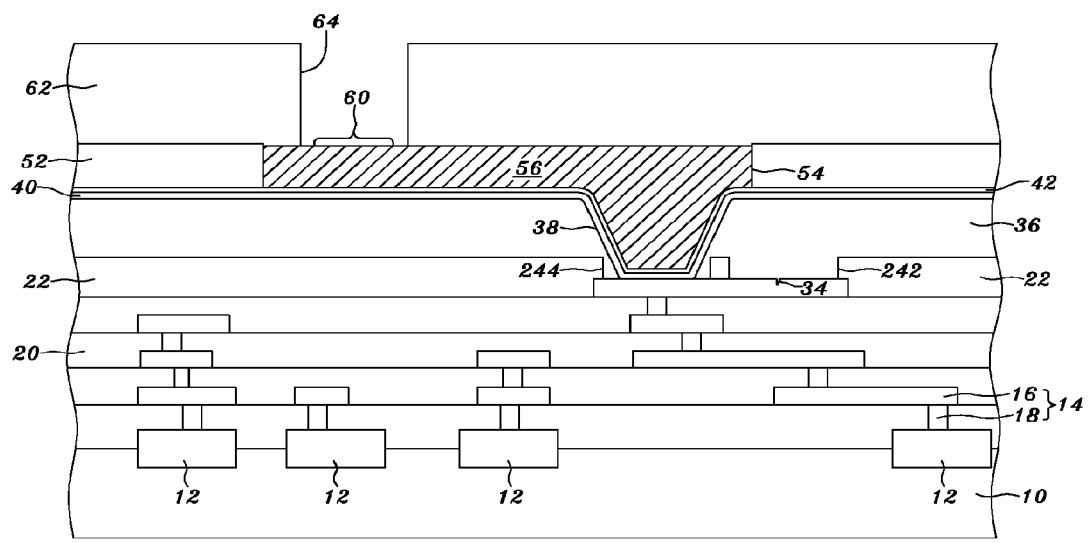

Refer to FIG. 17N. Alternatively, after the first metal layer 56 is completed, the first photoresist layer 56 is kept, and the second photoresist layer 62 is formed over the first photoresist layer 52 and the first metal layer 56, and the second-photoresist-layer opening 64 exposes the bond area 60 of the first metal layer 56. Next, the process shown in FIG. 17G is undertaken. After the second metal layer 66 is completed, the second photoresist layer 62 and the first photoresist layer 52 are removed to obtain the structure shown in FIG. 17I. Next, the seed layer 42 and the adhesion/barrier layer 40 are removed except those below the first metal layer 56 to obtain the structure shown in FIG. 17J. Then, the semiconductor substrate 10 is also diced into a plurality of semiconductor chips 254 shown in FIG. 17L or FIG. 17M.

In this embodiment, the combination of the remaining first metal layer 56, the seed layer 42 and the adhesion/barrier layer 40 forms a redistribution layer (RDL). The redistribution layer is not only formed over the polymer-layer opening 38 but also extends to over a portion of the patterned polymer layer 36. The redistribution layer will benefit the construction of the succeeding circuit structure. Further, in addition to contacting the testing pad 246, the testing probe 32 may also contact the first metal layer 56 or the second metal layer 66 for electrical testing.

EMBODIMENT XVI

This embodiment also exemplifies the application of the present invention to a redistribution layer (RDL).

Figure 18A:
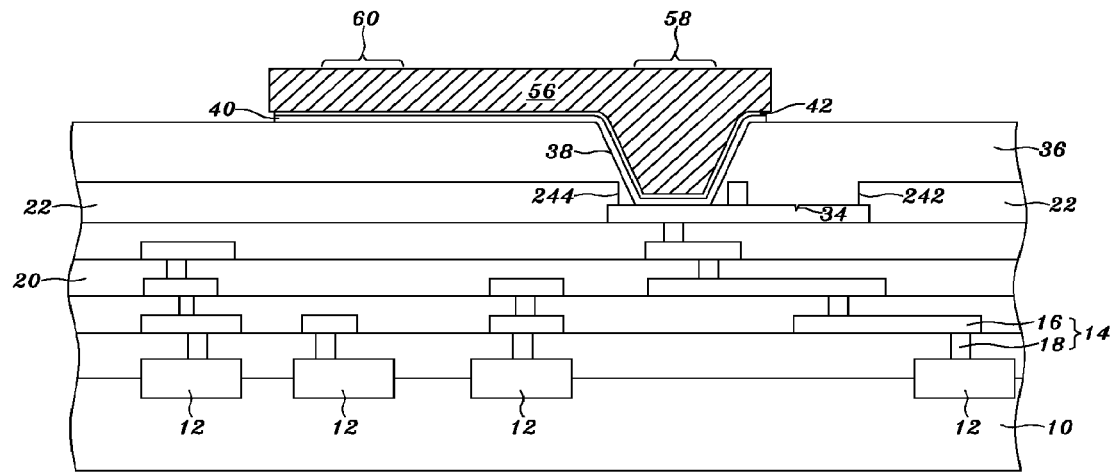
FIG. 18A to FIG. 18I are sectional views schematically showing the fabrication process according to one embodiment of the present invention.

Refer to FIG. 18A. After the progress shown in FIG. 17E, the seed layer 42 and the adhesion/barrier layer 40 are removed except those below the first metal layer 56. Refer to EMBODIMENT XV for the detailed technical description of removing the adhesion/barrier layer 40 and the seed layer 42.

Figure 18B:
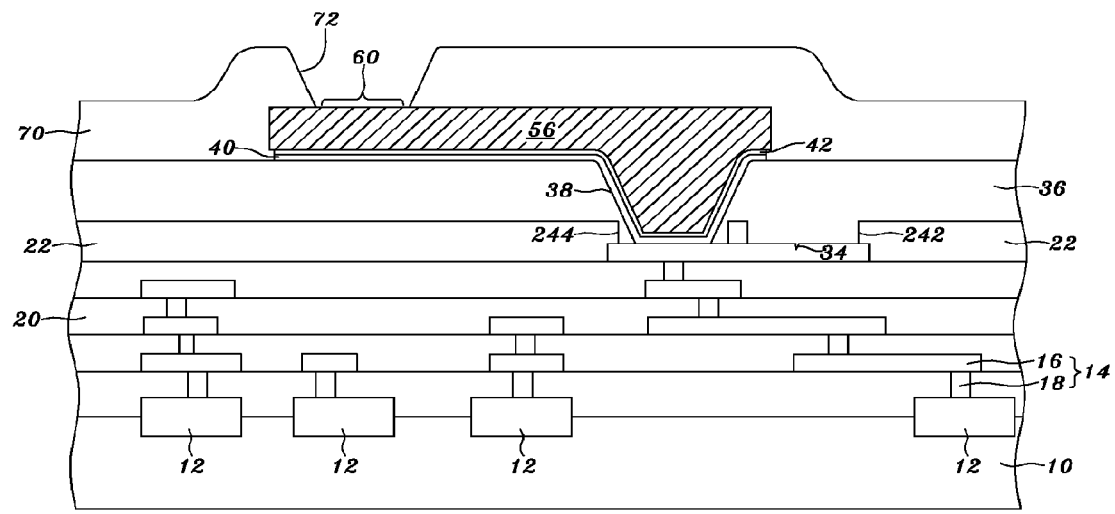

Refer to FIG. 18B. Next, a patterned polymer layer 70 is formed over the patterned polymer layer 36 and the first metal layer 56, and an opening 72 in the patterned polymer layer 70 exposes the bond area 60 of the first metal layer 56. For the detailed technical contents of the patterned polymer layer 70, such as the material, thickness and fabrication method thereof, refer to those of the patterned polymer layer 36 of EMBODIMENT XIII.

Figure 18C:
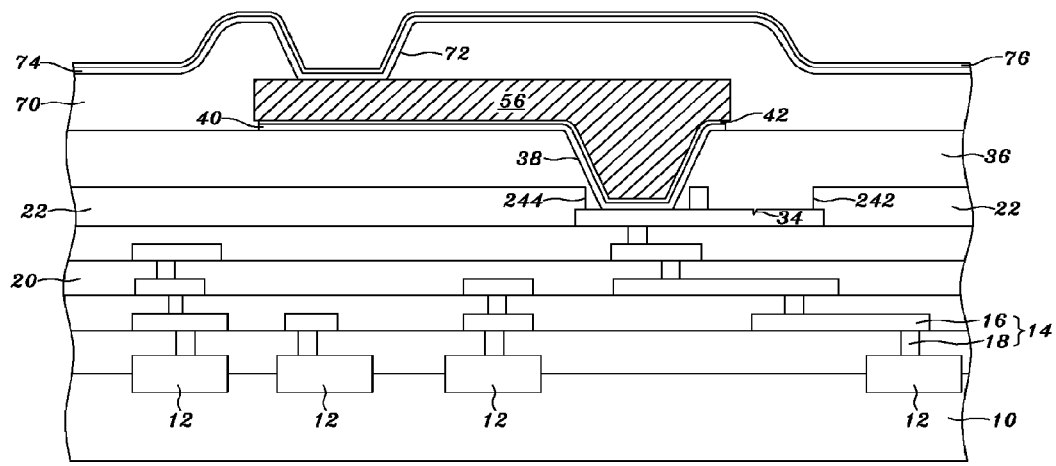

Refer to FIG. 18C. Next, an adhesion/barrier layer 74 having a thickness of 0.02 and 2 μm is formed over the patterned polymer layer 70 and the bond area 60 exposed by the polymer-layer opening 72. The material of the adhesion/barrier layer 74 may be titanium, tungsten, cobalt, nickel, titanium nitride, a titanium-tungsten alloy, chromium, copper, gold, protactinium, platinum, palladium, ruthenium, rhodium, silver, or a composite of the abovementioned materials. The adhesion/barrier layer 74 may be fabricated with a sputtering method or a vapor deposition method.

Next, a seed layer 76 is formed over the adhesion/barrier layer 74. The seed layer 76 is beneficial to electroplating a metal layer thereon. Thus, the material of the seed layer 76 varies with the material of the succeeding metal layer. For the detailed technical description of the seed layer 76, refer to that of the seed layer 42 of EMBODIMENT XIII.

Figure 18D:
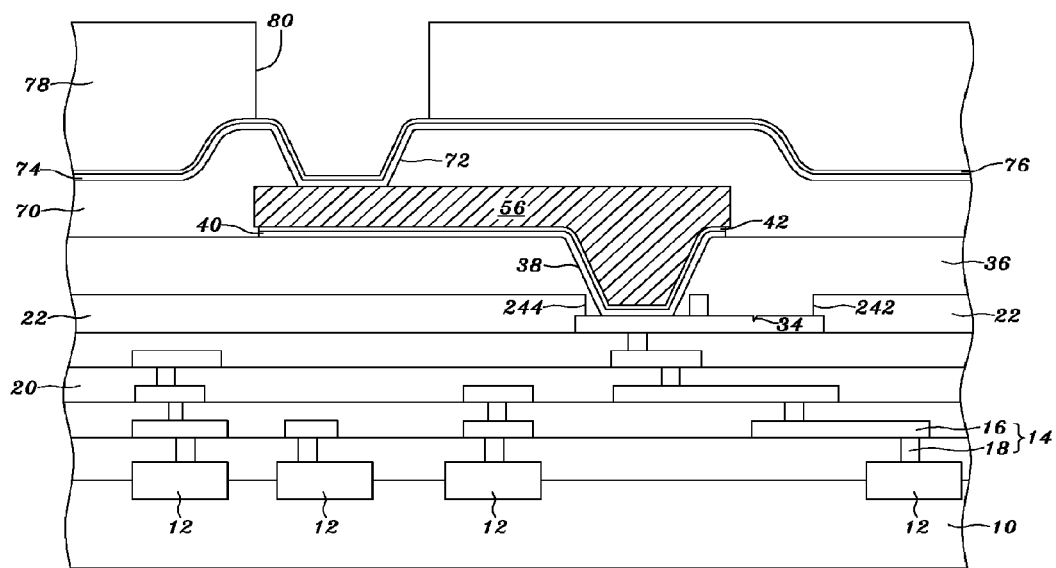
Figure 18E:
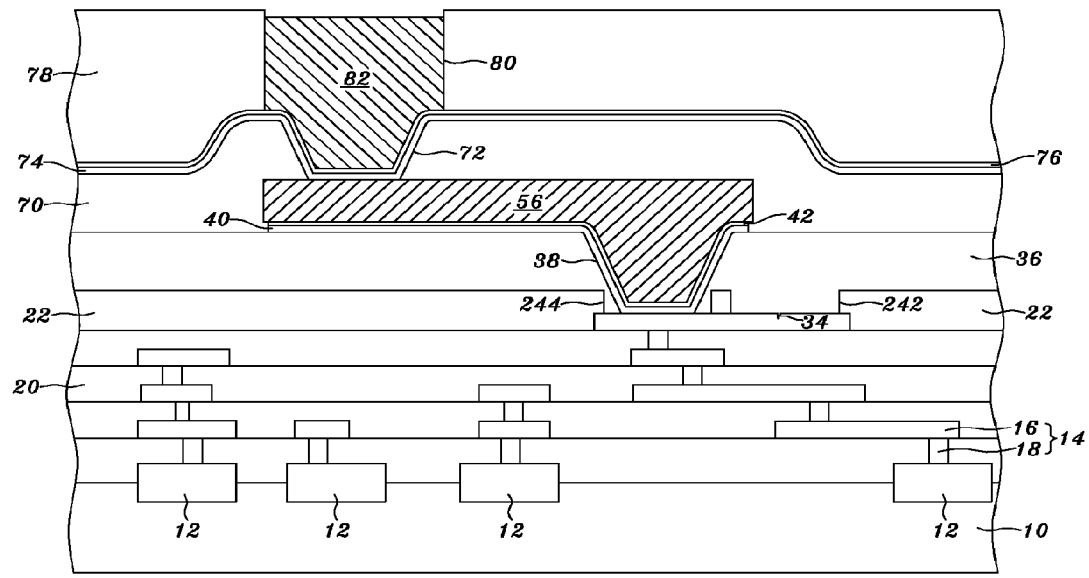

Refer to FIG. 18D. Next, a second photoresist layer 78 is formed over the seed layer 76, and the second photoresist layer 78 is patterned to form a second-photoresist-layer opening 80 to expose the seed layer 76 over the bond area 60 of the first metal layer 56, wherein a 1× stepper or a 1× scanner is used to expose the second photoresist layer 78 during forming the second-photoresist-layer opening 80. Refer to FIG. 18E. Next, a second metal layer 82 having a thickness of between 1 and 200 μm, e.g. between 20 and 120 μm, is electroplated on the seed layer 76 exposed by the second-photoresist-layer opening 80. For the detailed technical contents of the second metal layer 82, such as the material and preferred thickness thereof, refer to those of the second metal layer 66 of EMBODIMENT XV.

Figure 18F:
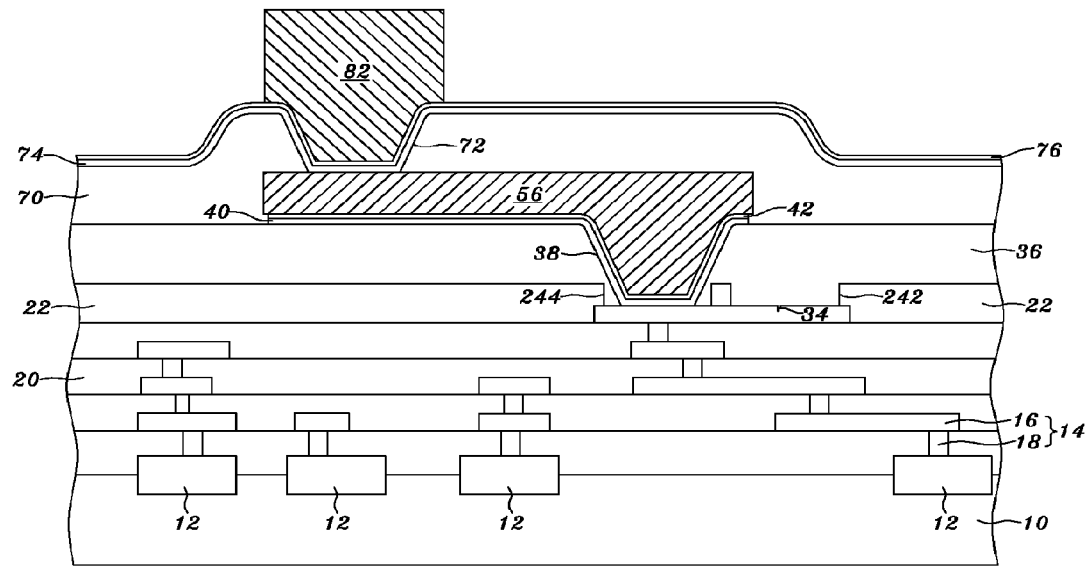
Figure 18G:
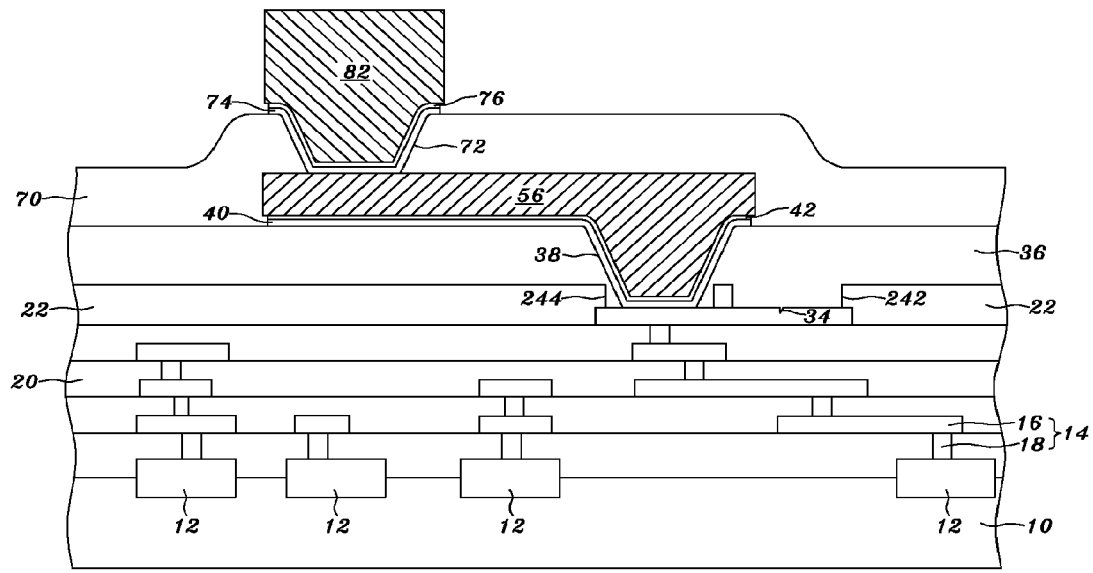

Refer to FIG. 18F. After the second metal layer 82 is completed, the second photoresist layer 78 is removed. Refer to FIG. 18G. Next, the seed layer 76 and the adhesion/barrier layer 74 are removed except those below the second metal layer 82. For the detailed technical description of removing the adhesion/barrier layer 74 and the seed layer 76, refer to that of removing the adhesion/barrier layer 40 and the seed layer 42 in the abovementioned embodiments.

Figure 18H:
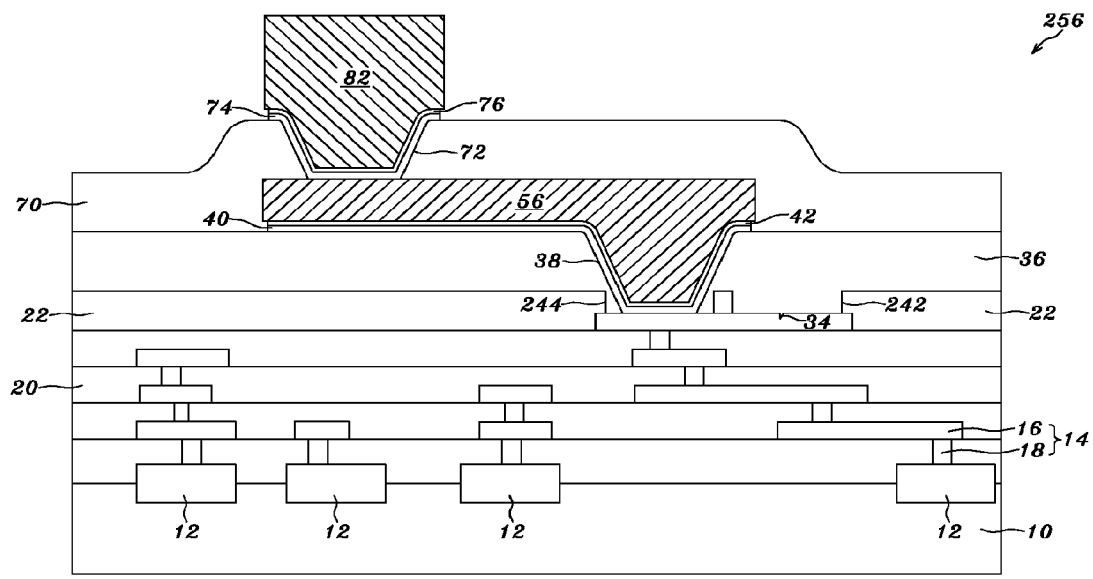
Figure 18I:
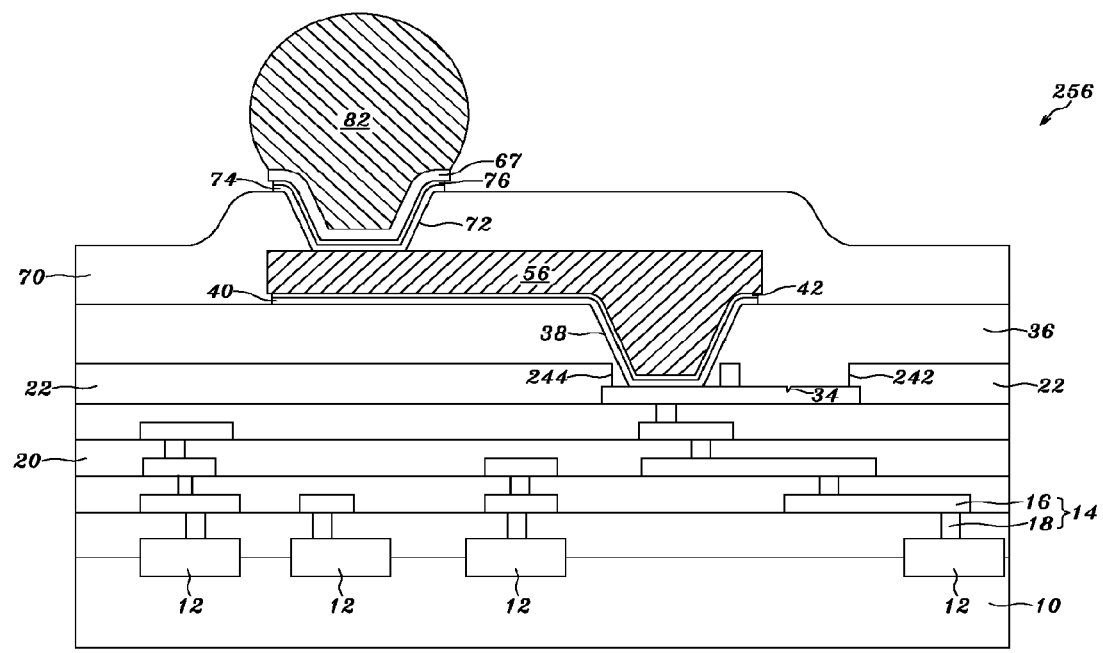

Refer to FIG. 18H. The semiconductor substrate 10 is diced into a plurality of semiconductor chips 256. Refer to FIG. 18I. If the second metal layer 82 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 82 is heated to its melting point; thus, the liquid metal assumes a ball shape and then solidifies. Then, the semiconductor substrate 10 is also diced into a plurality of semiconductor chips 256.

Further, in addition to contacting the testing pad 246, the testing probe 32 may also contact the first metal layer 56 or the second metal layer 82 for electrical testing.

EMBODIMENT XVII

This embodiment also exemplifies the application of the present invention to a redistribution layer (RDL).

Figure 19A:
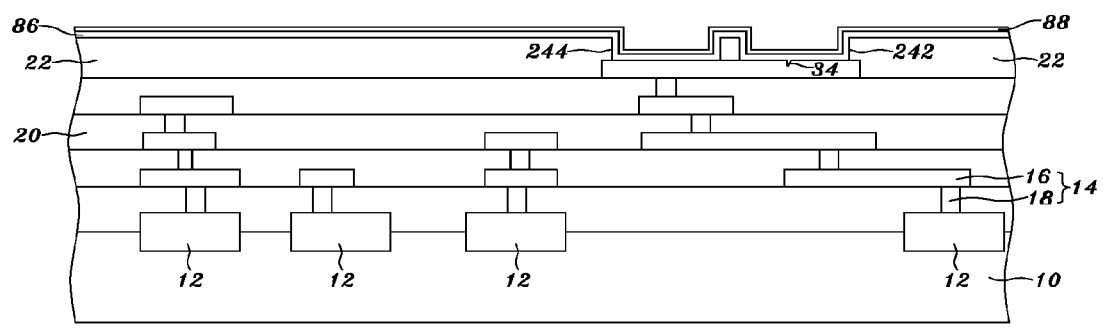
FIG. 19A to FIG. 19L are sectional views schematically showing the fabrication process according to one embodiment of the present invention.

Refer to FIG. 19A. After the progress shown in FIG. 15B, an adhesion/barrier layer 86 is formed on the testing pad 246, the bond pad 248 and the passivation layer 22. Next, a seed layer 88 is formed over the adhesion/barrier layer 86. For the detailed technical description of the adhesion/barrier layer 86 and the seed layer 88, refer to that of the adhesion/barrier layer 40 and the seed layer 42 of EMBODIMENT XIII.

Figure 19B:
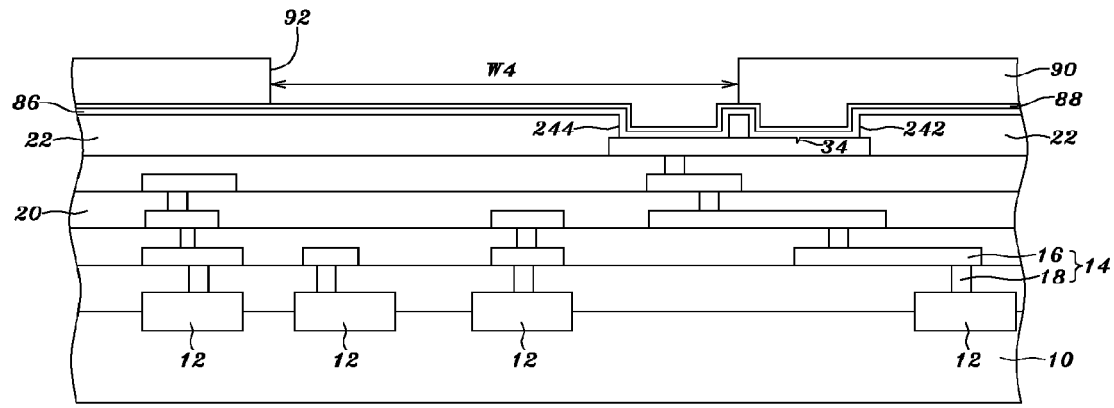

Refer to FIG. 19B. Next, a first photoresist layer 90 is formed over the seed layer 88, and the first photoresist layer 90 is patterned to form a first-photoresist-layer opening 92 to expose the seed layer 88 over the bond pad 248 and to expose the seed layer 88 over a portion of the passivation layer 22 extending from the bond pad 248, wherein a 1× stepper or a 1× scanner is used to expose the first photoresist layer 90 during forming the first-photoresist-layer opening 92. The first-photoresist-layer opening 92 has a dimension W4 of between 60 μm and 10 mm.

Figure 19C:
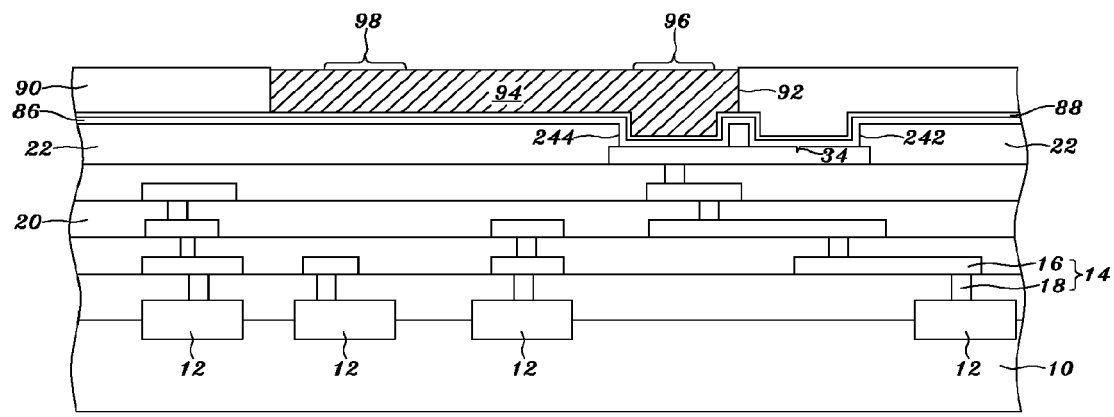

Refer to FIG. 19C. Next, a first metal layer 94 having a thickness of between 1 and 30 μm is electroplated on the seed layer 88 exposed by the first-photoresist-layer opening 92. For the detailed technical contents of the first metal layer 94, such as the material and preferred thickness thereof, refer to those of the first metal layer 56 of EMBODIMENT XV. The first metal layer 94 includes a testing area 96 for electrical testing and a bond area 98 to be electrically connected to an external system. Similar to that shown in FIG. 17C and FIG. 17D, the location of the bond area 98 is different from that of the bond pad 248 from a top view.

Figure 19D:
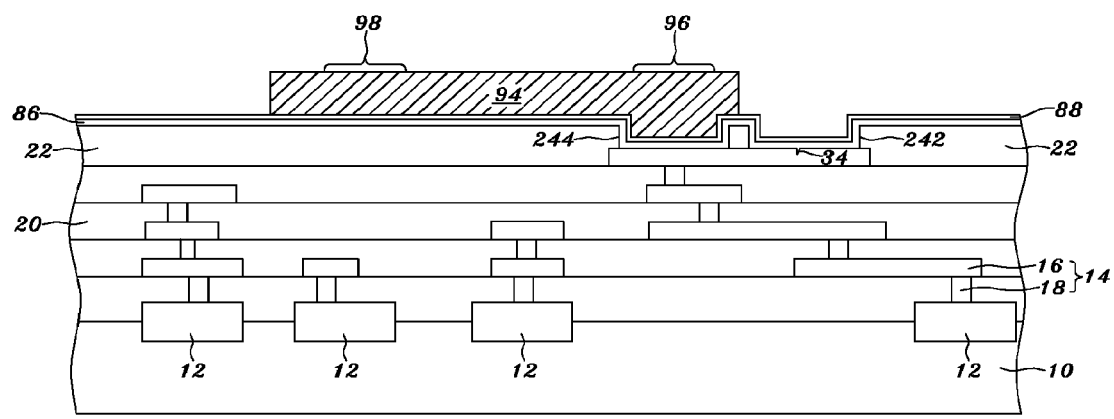
Figure 19E:
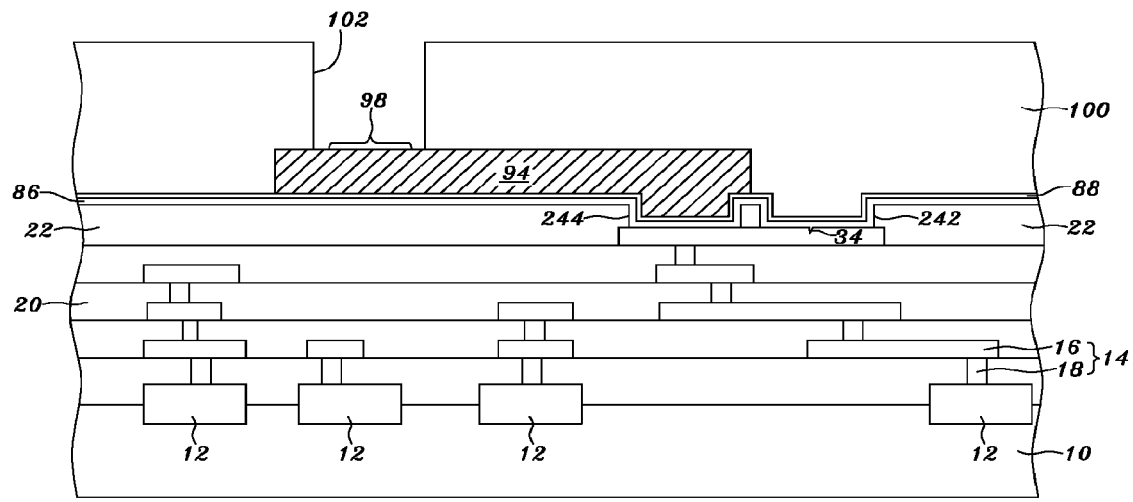

Refer to FIG. 19D. After the first metal layer 94 is completed, the first photoresist layer 90 is removed. Refer to FIG. 19E. Next, a second photoresist layer 100 is formed over the seed layer 88 and the first metal layer 94, and the second photoresist layer 100 is patterned to form a second-photoresist-layer opening 102 to expose the bond area 98 of the first metal layer 94, wherein a 1× stepper or a 1× scanner is used to expose the second photoresist layer 100 during forming the second-photoresist-layer opening 102.

Figure 19F:
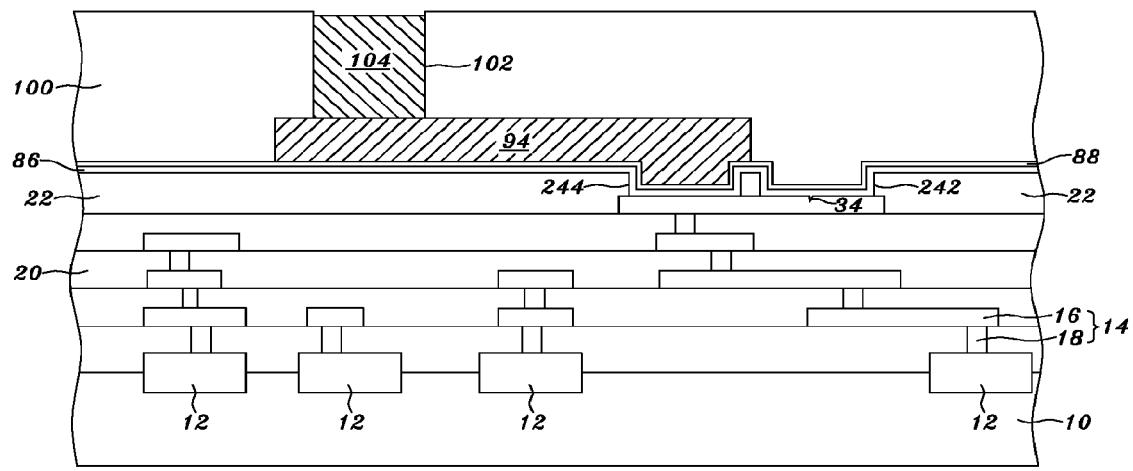

Refer to FIG. 19F. Next, a second metal layer 104 having a thickness of between 1 and 200 μm, e.g. between 20 and 120 μm, is electroplated on the bond area 98 exposed by the second-photoresist-layer opening 102. For the detailed technical contents of the second metal layer 104, such as the material and preferred thickness thereof, refer to those of the second metal layer 66 of EMBODIMENT XV.

Figure 19G:
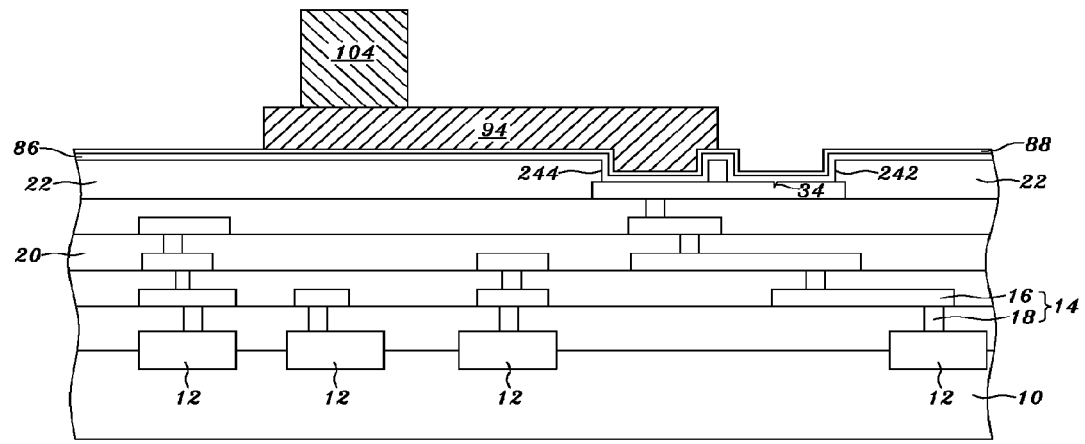
Figure 19H:
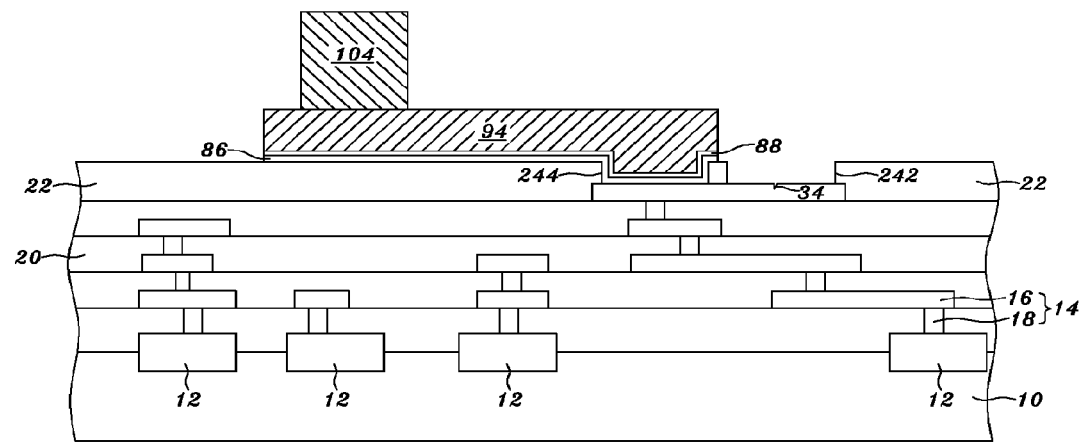

Refer to FIG. 19G. After the second metal layer 104 is completed, the second photoresist layer 100 is removed. Refer to FIG. 19H. Next, the seed layer 88 and the adhesion/barrier layer 86 are removed with a dry-etching method except those below the first metal layer 94, and the dry-etching method can be implemented with an argon sputter process.

Figure 19I:
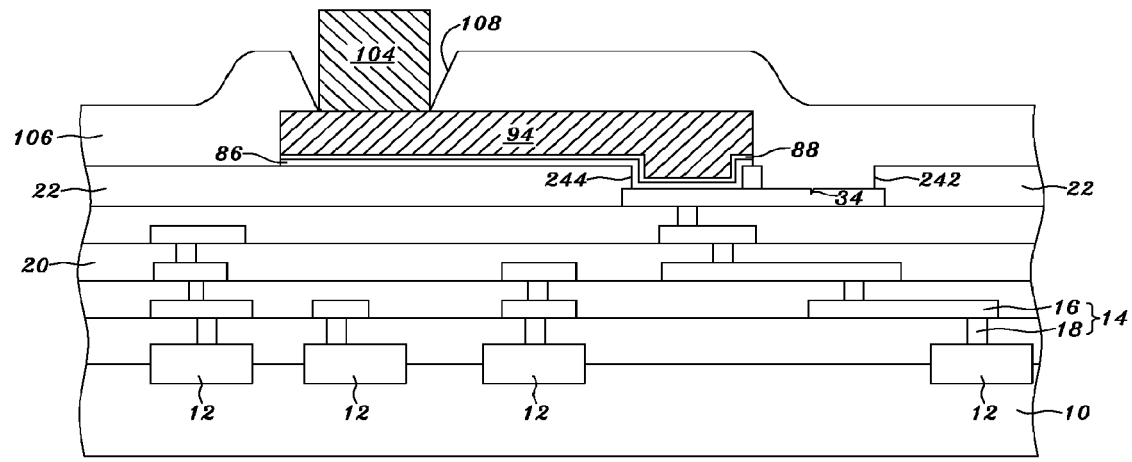

Refer to FIG. 19I. Next, a patterned polymer layer 106 is formed over the first metal layer 94, the passivation layer 22 and the testing pad 246, and the probe mark 34 is thus covered. An opening 108 in the patterned polymer layer 106 exposes the second metal layer 104.

Figure 19J:
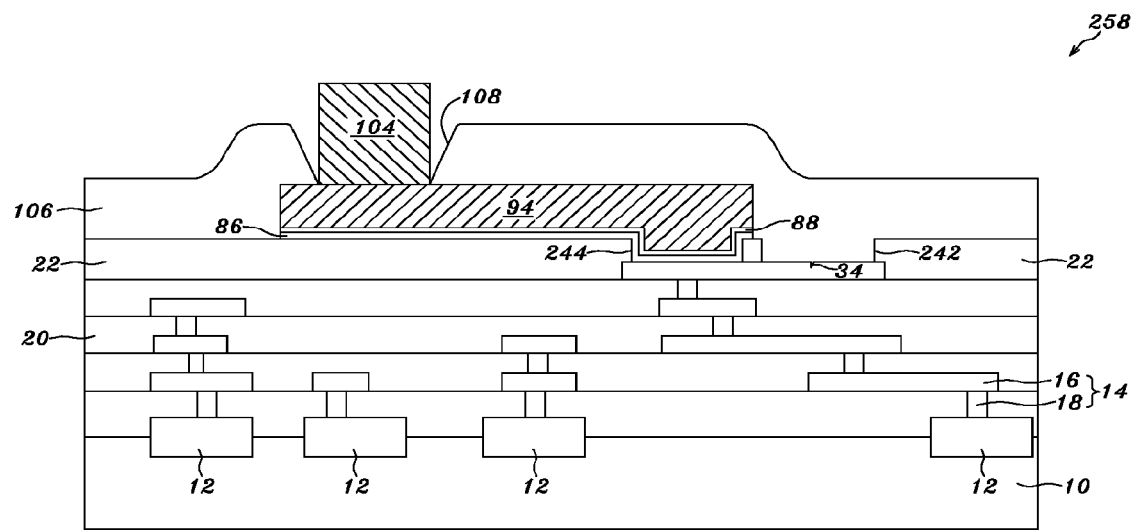
Figure 19K:
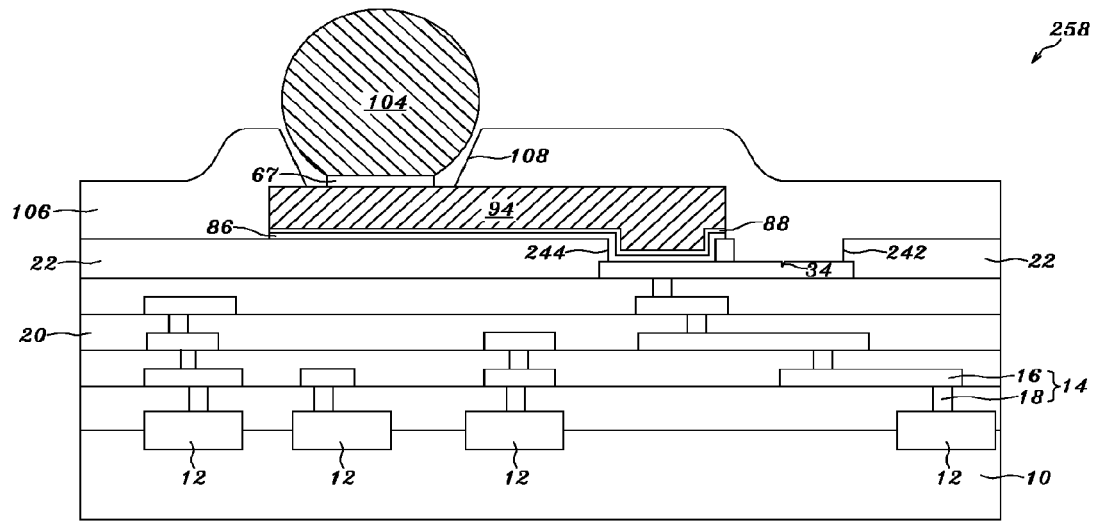

Refer to FIG. 19J. The semiconductor substrate 10 is diced into a plurality of semiconductor chips 258. Refer to FIG. 19K. If the second metal layer 104 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 104 is heated to its melting point; thus, the liquid metal assumes a ball shape and then solidifies. Then, the semiconductor substrate 10 is also diced into a plurality of semiconductor chips 258.

Figure 19L:
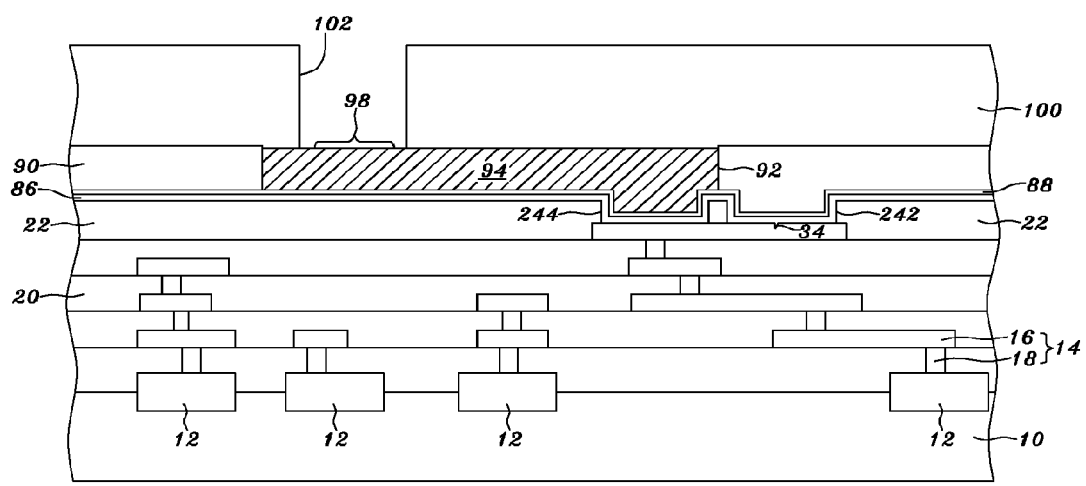

Refer to FIG. 19L. Alternatively, after the first metal layer 94 is completed, the first photoresist layer 90 is kept, and the second photoresist layer 100 is formed over the first photoresist layer 90 and the first metal layer 94, and the second-photoresist-layer opening 102 exposes the bond area 98 of the first metal layer 94. Next, the process shown in FIG. 19F is undertaken. After the second metal layer 104 is completed, the second photoresist layer 100 and the first photoresist layer 90 are removed to obtain the structure shown in FIG. 19G. Next, the seed layer 88 and the adhesion/barrier layer 86 are removed with a dry-etching method except those below the first metal layer 94 to obtain the structure shown in FIG. 19H. Next, as shown in FIG. 19I, a patterned polymer layer 106 is formed over the first metal layer 94, the passivation layer 22 and the testing pad 246, and an opening 108 in the patterned polymer layer 106 exposes the second metal layer 104. Then, the semiconductor substrate 10 is also diced into a plurality of semiconductor chips 258 shown in FIG. 19J or FIG. 19K.

Further, in addition to contacting the testing pad 246, the testing probe 32 may also contact the first metal layer 94 or the second metal layer 104 for electrical testing.

EMBODIMENT XVIII

This embodiment also exemplifies the application of the present invention to a redistribution layer (RDL).

Figure 20A:
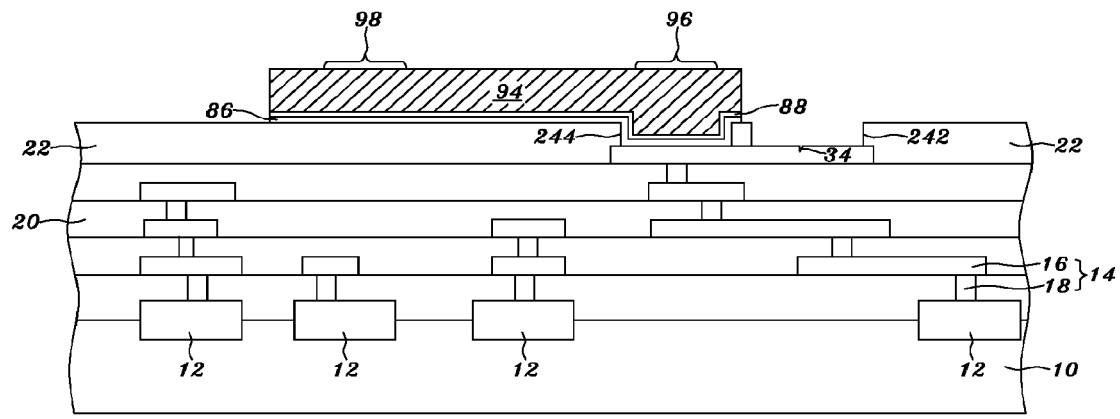
FIG. 20A to FIG. 20I are sectional views schematically showing the fabrication process according to one embodiment of the present invention.

Refer to FIG. 20A. After the process shown in FIG. 19D, the seed layer 88 and the adhesion/barrier layer 86 are removed with a dry-etching method except those below the first metal layer 94, wherein the dry-etching method can be implemented with an argon sputter process.

Figure 20B:
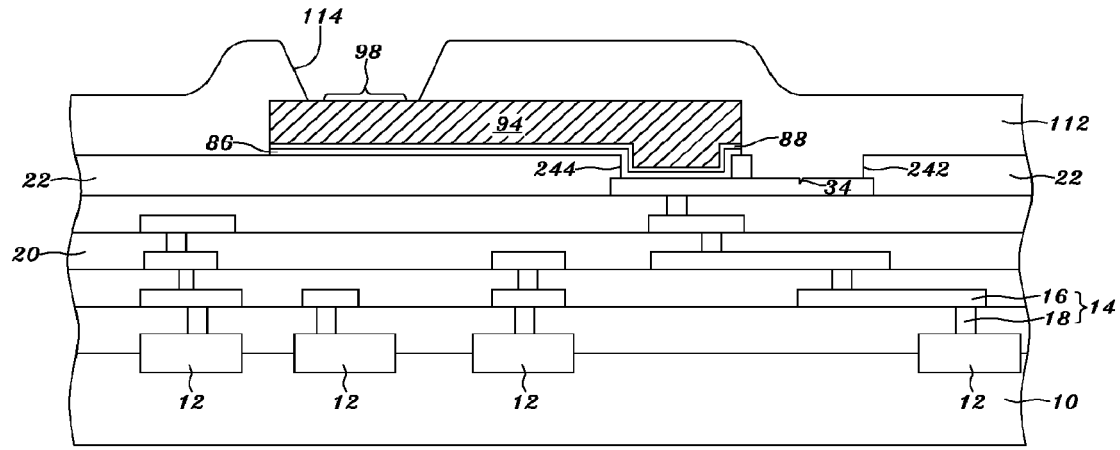

Refer to FIG. 20B. Next, a patterned polymer layer 112 is formed over the first metal layer 94, the passivation layer 22 and the testing pad 246, and the probe mark 34 is thus covered. An opening 114 in the patterned polymer layer 112 exposes the bond area 98 of the first metal layer 94.

Figure 20C:
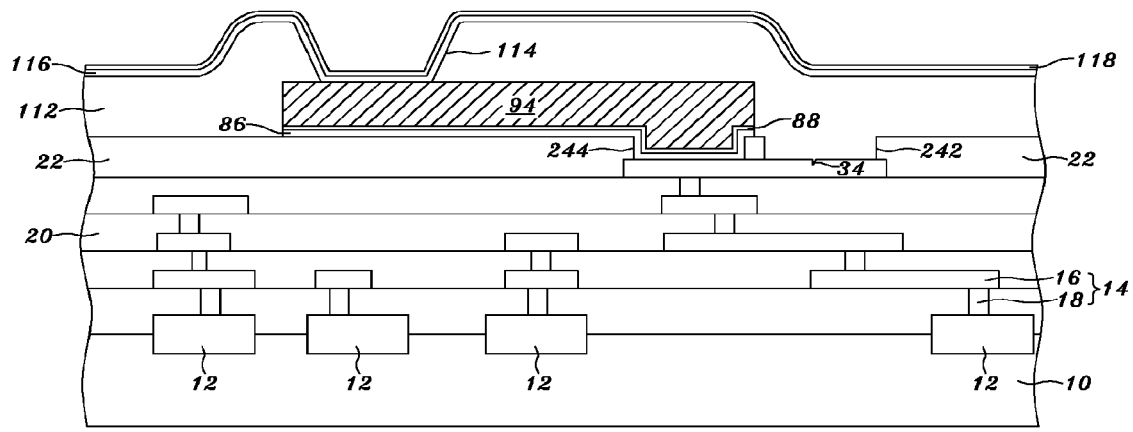

Refer to FIG. 20C. Next, an adhesion/barrier layer 116 is formed over the patterned polymer layer 112 and the bond area 98 exposed by the polymer-layer opening 114. Next, a seed layer 118 is formed over the adhesion/barrier layer 116. For the detailed technical description of the adhesion/barrier layer 116 and the seed layer 118, refer to that of the adhesion/barrier layer 40 and the seed layer 42 of EMBODIMENT XIII.

Figure 20D:
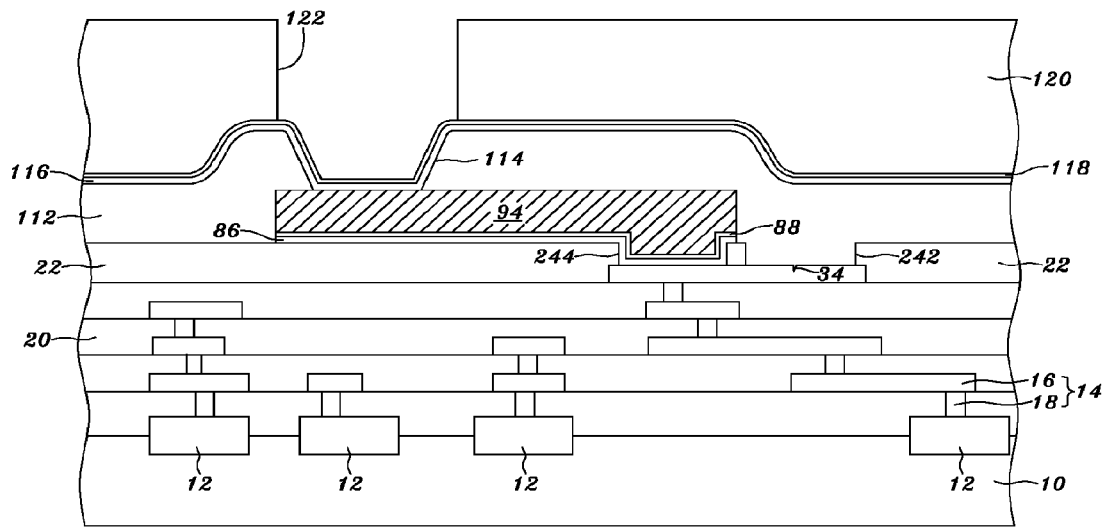

Refer to FIG. 20D. Next, a second photoresist layer 120 is formed over the seed layer 118, and the second photoresist layer 120 is patterned to form a second-photoresist-layer opening 122 to expose the seed layer 118 over the bond area 98 of the first metal layer 94, wherein a 1× stepper or a 1× scanner is used to expose the second photoresist layer 120 during forming the second-photoresist-layer opening 122.

Figure 20E:
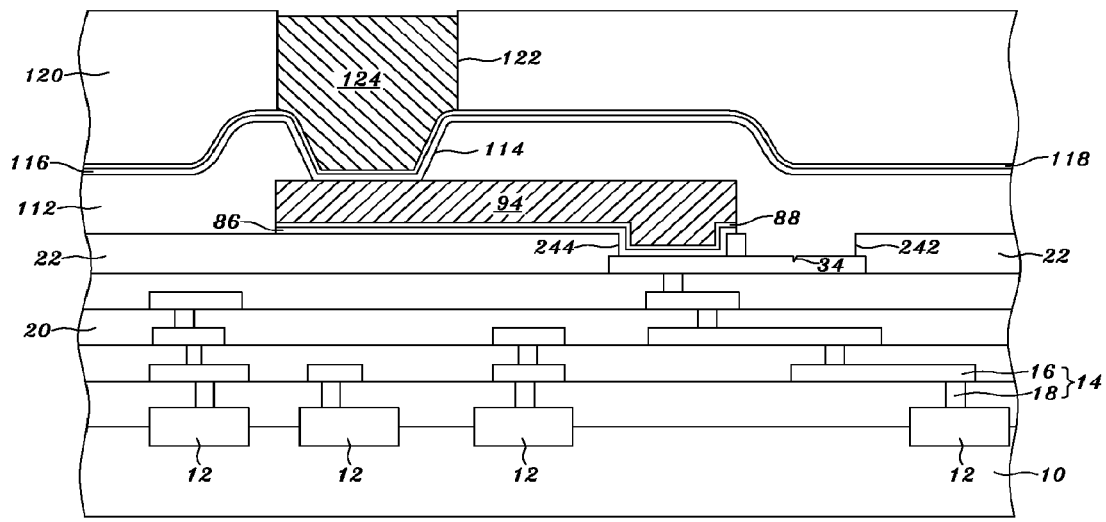

Refer to FIG. 20E. Next, a second metal layer 124 having a thickness of between 1 and 200 μm, e.g. between 20 and 120 μm, is electroplated on the seed layer 118 exposed by the second-photoresist-layer opening 122. For the detailed technical description of the second metal layer 124, refer to that of the second metal layer 66 of EMBODIMENT XV.

Figure 20F:
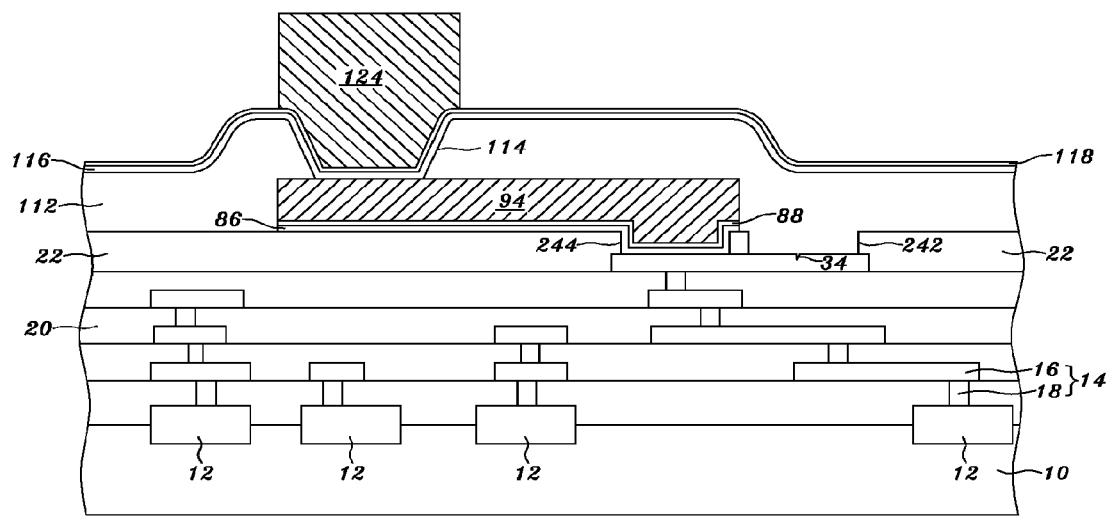
Figure 20G:
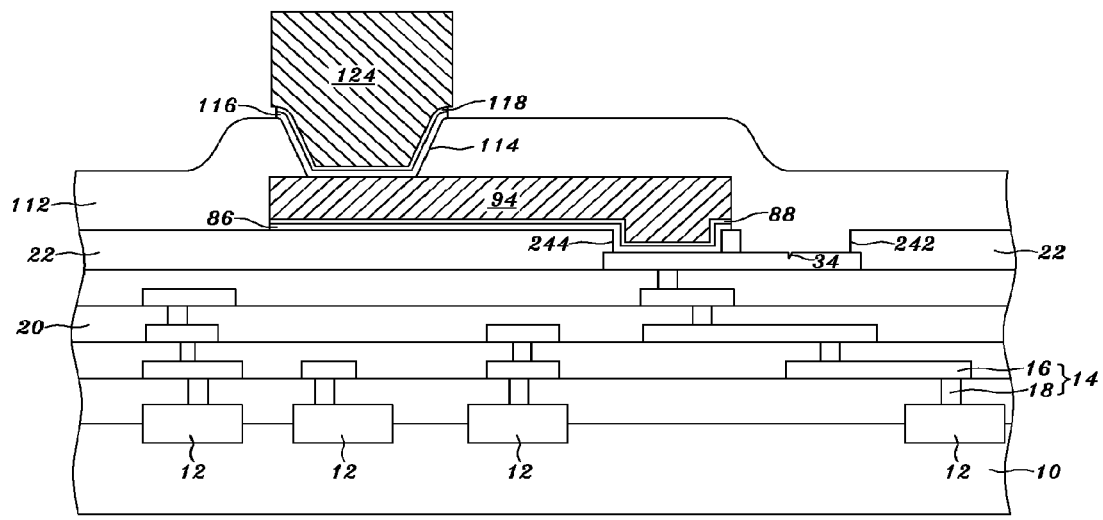

Refer to FIG. 20F. After the second metal layer 124 is completed, the second photoresist layer 120 is removed. Refer to FIG. 20G. Next, the seed layer 118 and the adhesion/barrier layer 116 are removed except those below the second metal layer 124. For the detailed technical description of removing the adhesion/barrier layer 116 and the seed layer 118, refer to that of removing the adhesion/barrier layer 40 and the seed layer 42 of EMBODIMENT XV.

Figure 20H:
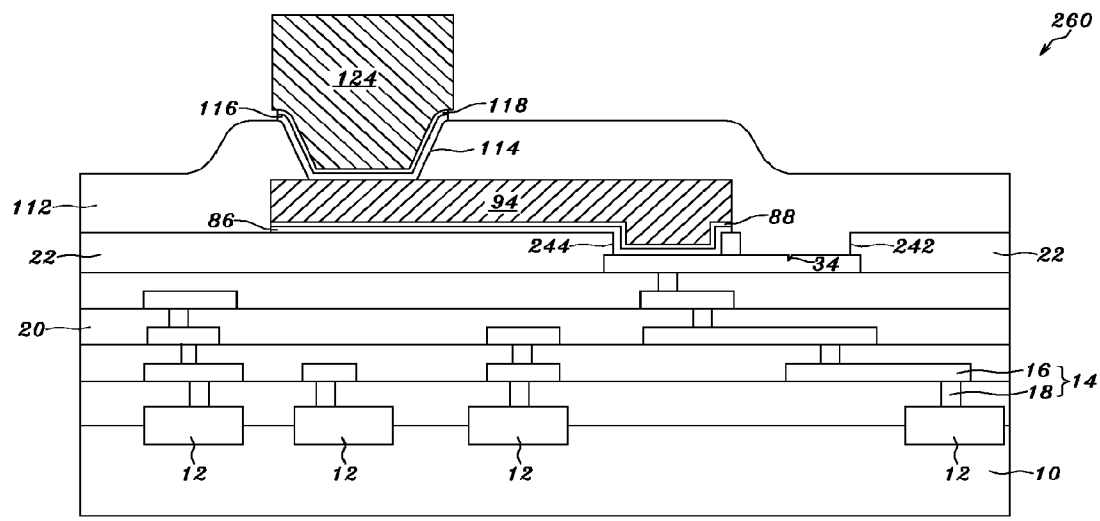
Figure 20I:
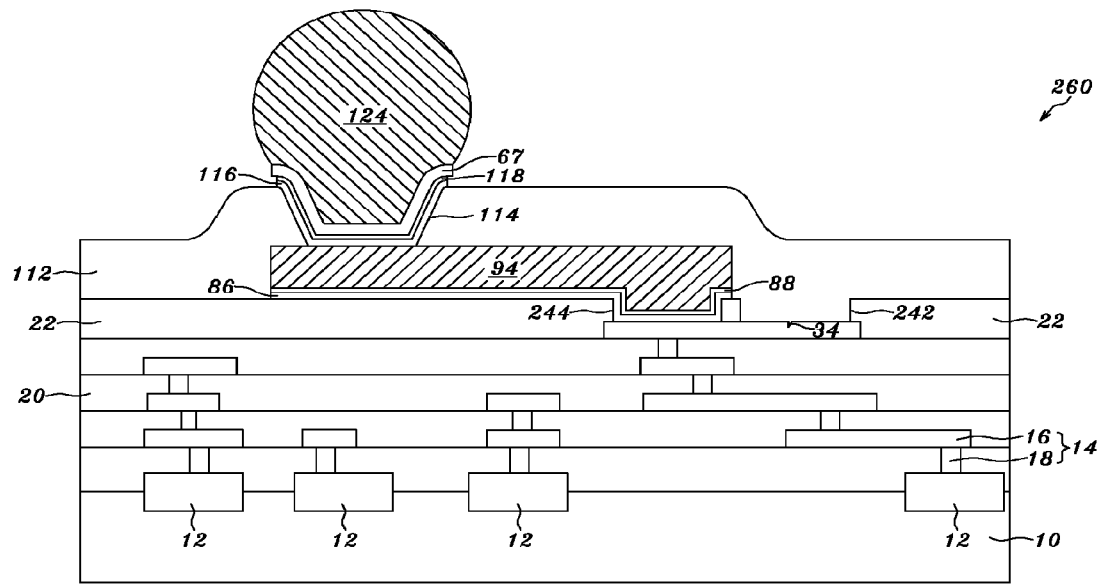

Refer to FIG. 20H. The semiconductor substrate 10 is diced into a plurality of semiconductor chips 260. Refer to FIG. 20I. If the second metal layer 124 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 124 is heated to its melting point; thus, the liquid metal assumes a ball shape and then solidifies. Then, the semiconductor substrate 10 is also diced into a plurality of semiconductor chips 260.

Further, in addition to contacting the testing pad 246, the testing probe 32 may also contact the first metal layer 94 or the second metal layer 124 for electrical testing.

EMBODIMENT XIX

This embodiment exemplifies the application of the present invention to the connection between the pads respectively exposed by two openings of the passivation layer.

Figure 21A:
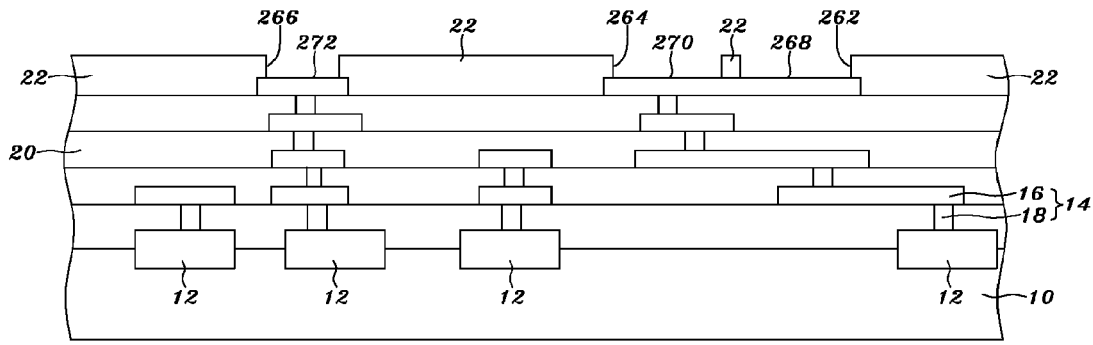
FIG. 21A to FIG. 21L are sectional views schematically showing the fabrication process according to one embodiment of the present invention.

Referring to FIG. 21A, a first opening 262, a second opening 264 and a third opening 266 in the passivation layer 22 expose a testing pad 268, a first pad 270 and a second pad 272, respectively, wherein the testing pad 268 is connected to the first pad 270. The first pad 270 is used for electrical testing, and the first pad 270 and the second pad 272 are used to be electrically connected to an external system. Besides, the testing pad 268 may be connected to the first pad 270 via a metal trace below the passivation layer 22; in such a case, the distance between the central points of the testing pad 268 and the first pad 270 is between 40 and 300 μm. The first pad 270 and the second pad 272 respectively connect with different semiconductor devices 12. The further description of the first opening 262, the second opening 264 and the third opening 266 can be referred to that of the opening 24 shown in FIG. 1.

Figure 21B:
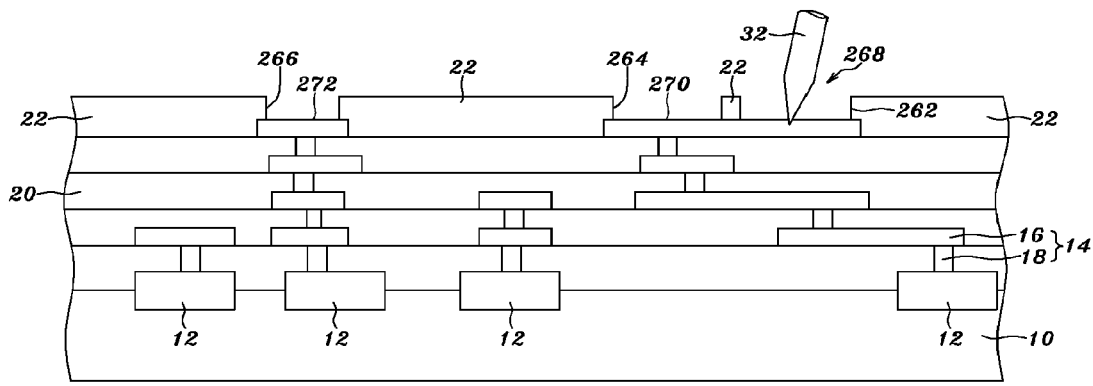
Figure 21C:
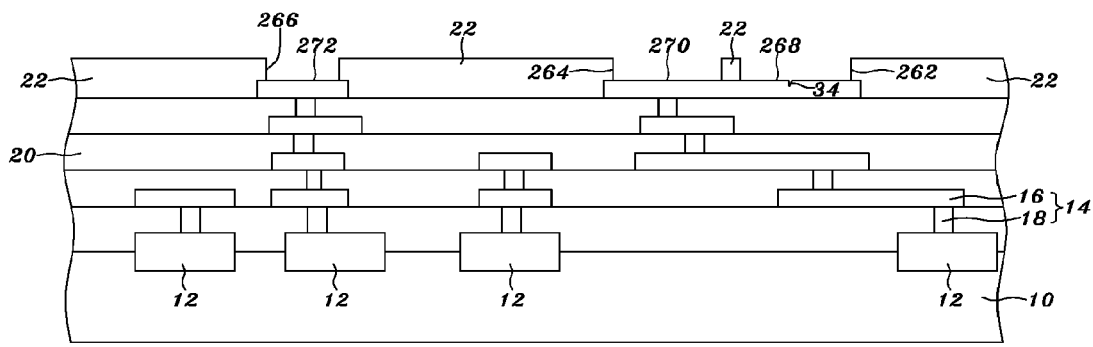

Refer to FIG. 21B. During a step of testing, a testing probe 32 contacts with the testing pad 268 for electrical testing. Refer to FIG. 21C. After the step of testing, the testing probe 32 is removed, and a probe mark 34 is left on the testing pad 268.

Figure 21D:
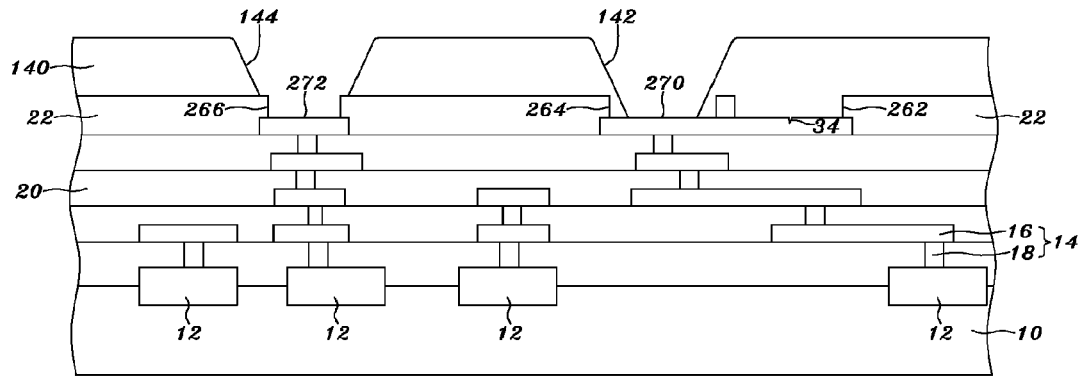

Refer to FIG. 21D. A patterned polymer layer 140 is formed over the passivation layer 22 and the testing pad 268, and the probe mark 34 is thus covered. A first polymer-layer opening 142 and a second polymer-layer opening 144 in the patterned polymer layer 140 expose the first pad 270 and the second pad 272, respectively. For the detailed technical description of the patterned polymer layer 140, refer to that of the patterned polymer layer 36 of EMBODIMENT XIII.

Figure 21E:
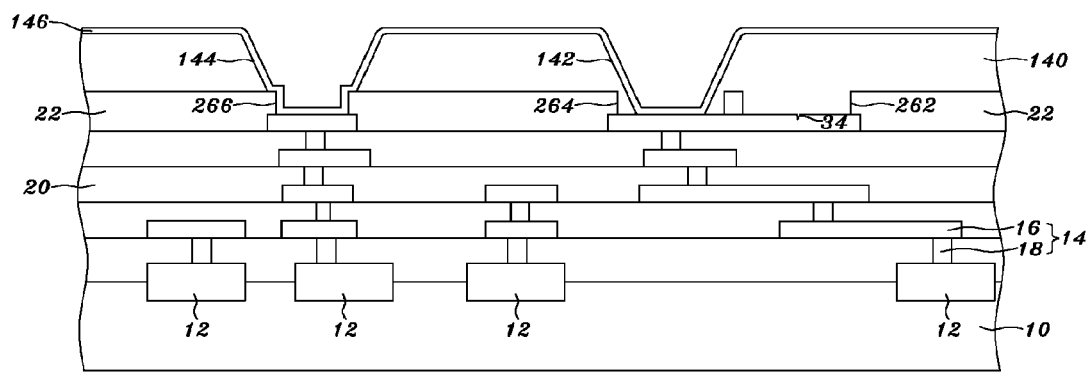
Figure 21F:
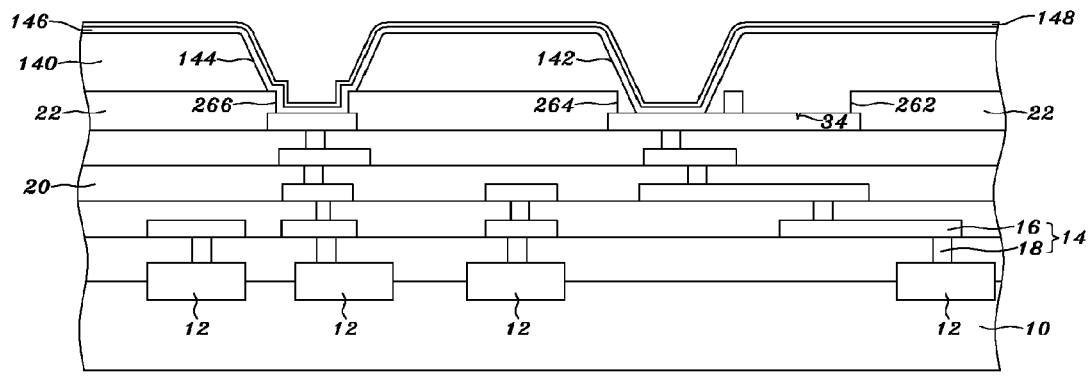

Refer to FIG. 21E. Next, an adhesion/barrier layer 146 having a thickness of between 0.02 and 2 μm is formed over the patterned polymer layer 140, the first pad 270 exposed by the first polymer-layer opening 142 and the second pad 272 exposed by the second polymer-layer opening 144. Refer to FIG. 21F. Next, a seed layer 148 is formed over the adhesion/barrier layer 146. For the detailed technical description of the adhesion/barrier layer 146 and the seed layer 148, refer to that of the adhesion/barrier layer 40 and the seed layer 42 of EMBODIMENT XIII.

Figure 21G:
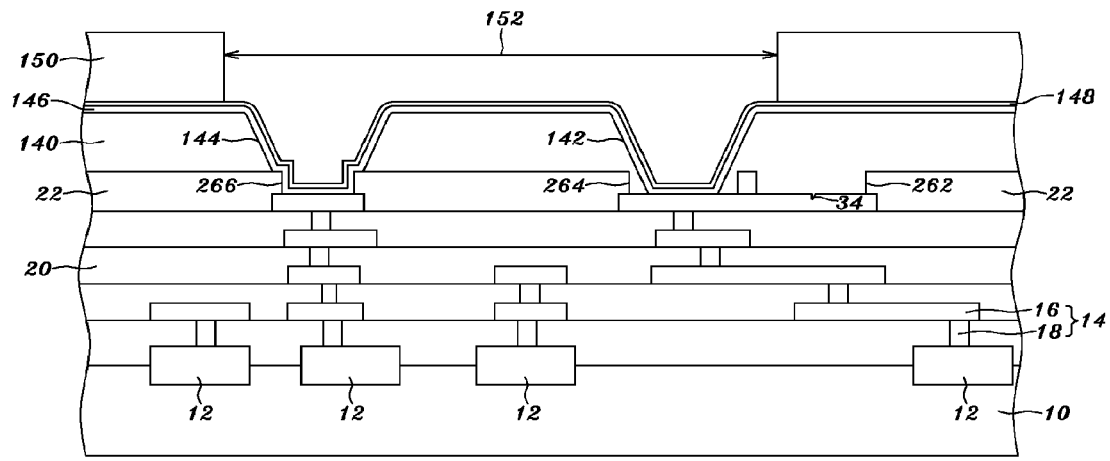
Figure 21H:
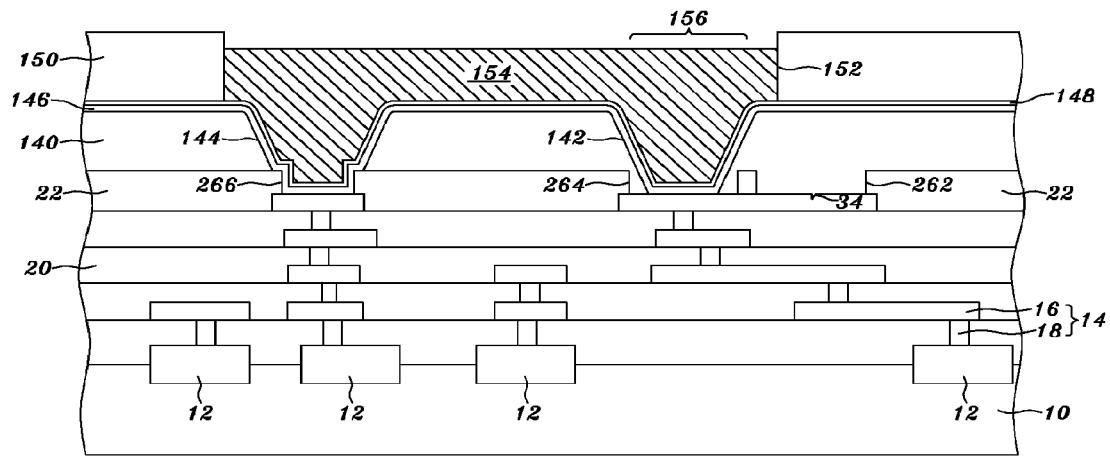

Refer to FIG. 21G. Next, a photoresist layer 150 is formed over the seed layer 148, and the photoresist layer 150 is patterned to form a photoresist-layer opening 152 to expose the seed layer 148 over the first pad 270, the second pad 272, and the polymer patterned layer 140 between the first pad 270 and the second pad 272. Refer to FIG. 21H. Next, a metal layer 154 is electroplated over the seed layer 148 exposed by the photoresist-layer opening 152. The metal layer 154 may be a single layer made of gold, copper, nickel, aluminum, silver, palladium, platinum, rhodium, ruthenium, a tin-lead alloy, or a tin-silver alloy. The metal layer 154 may also be a composite layer made of the abovementioned metals, such as copper/nickel metallization or copper/nickel/gold metallization, in a bottom-up sequence. The thickness of the metal layer 154 is preferred to be between 2 and 15 µm or between 4 and 15 µm. The metal layer 154 also has a testing area 156 for electrical testing.

Figure 21I:
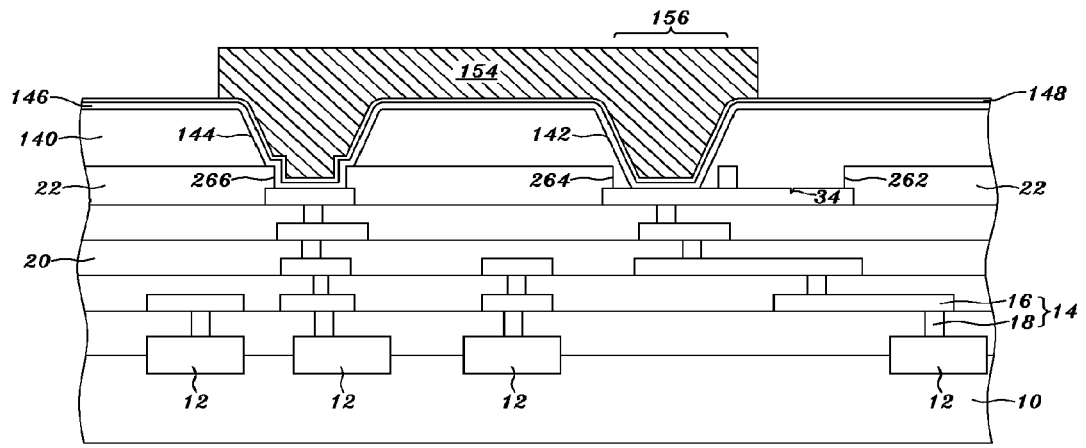
Figure 21J:
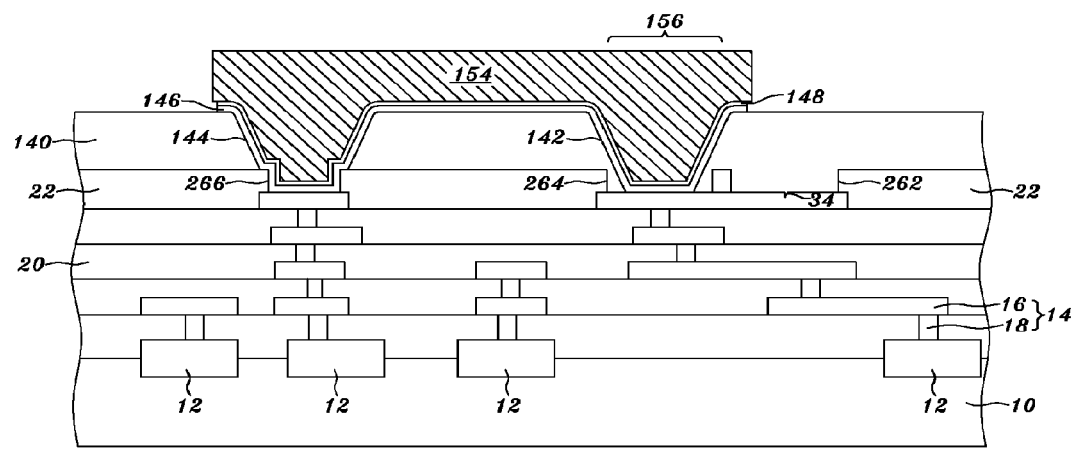
Figure 21K:
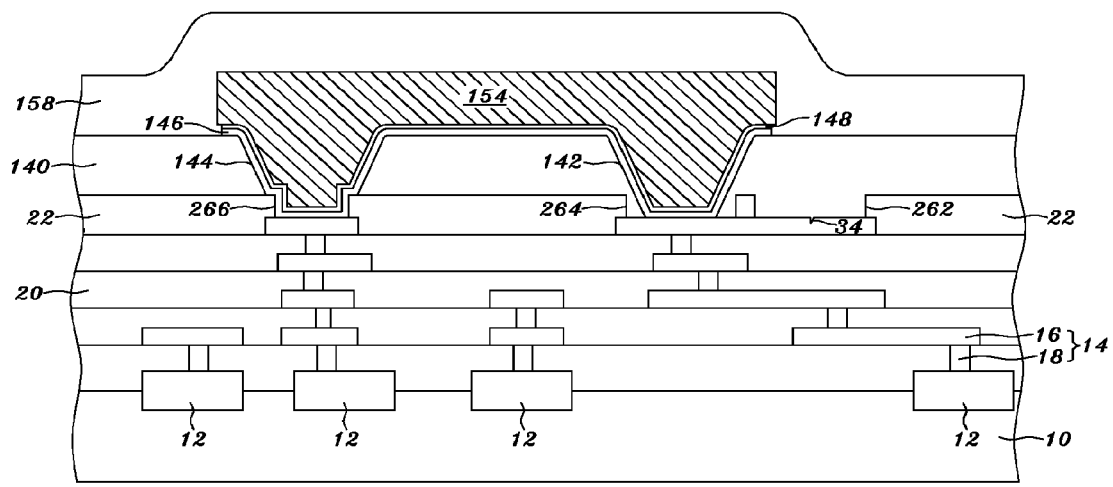
Figure 21L:
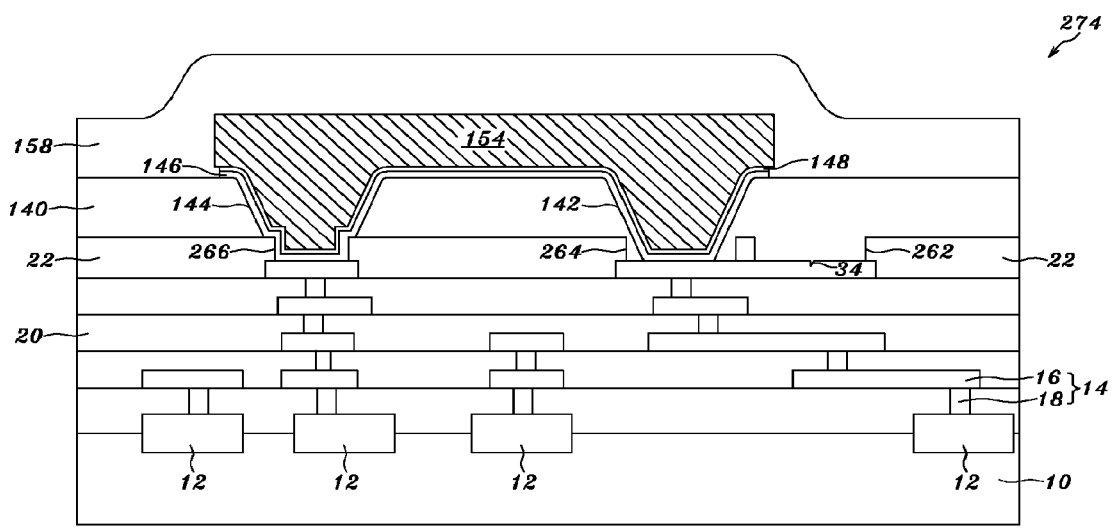

Refer to FIG. 21I. After the metal layer 154 is completed, the photoresist layer 150 is removed. Refer to FIG. 21J. Next, the adhesion/barrier layer 146 and the seed layer 148 are removed except those below the metal layer 154. For the detailed technical description of removing the adhesion/barrier layer 146 and the seed layer 148, refer to that of removing the adhesion/barrier layer 40 and the seed layer 42 of EMBODIMENT XV. Refer to FIG. 21K. In this embodiment, after the adhesion/barrier layer 146 and the seed layer 148 are removed except those below the metal layer 154, a polymer layer 158 may be optionally formed over the metal layer 154 and the patterned polymer layer 140. Refer to FIG. 21L. The semiconductor substrate 10 is diced into a plurality of semiconductor chips 274.

In this embodiment, in addition to contacting the testing pad 268, the testing probe 32 may also contact the metal layer 154 for electrical testing. In this embodiment, it is to be noted: the metal layer 154 may alternatively not connect with an external system but only interconnects internal devices; for example, a signal may be transmitted from a MOS device in or on the substrate 10 to another MOS device in or on the substrate 10 via the metal layer 154, but not to an external system. In such a case, the polymer layer 158 may cover all the upper surface of the metal layer 154.

EMBODIMENT XX

Figure 22A:
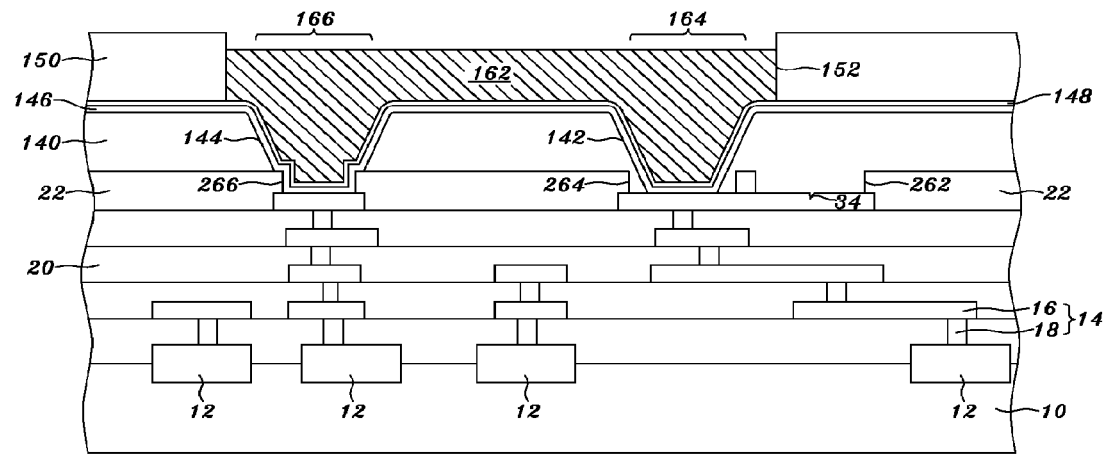
FIG. 22A to FIG. 22I are sectional views schematically showing the fabrication process according to one embodiment of the present invention.

Refer to FIG. 22A. After the process shown in FIG. 21G, a first metal layer 162 having a thickness of between 1 and 30 µm is electroplated over the seed layer 148 exposed by the photoresist-layer opening 152. For further detail of the technical contents of the first metal layer 162, such as the material and preferred thickness thereof, refer to that of the first metal layer 154 of EMBODIMENT XIX. The first metal layer 162 has a testing area 164 for electrical testing and a bond area 166 to be electrically connected to an external system.

Figure 22B:
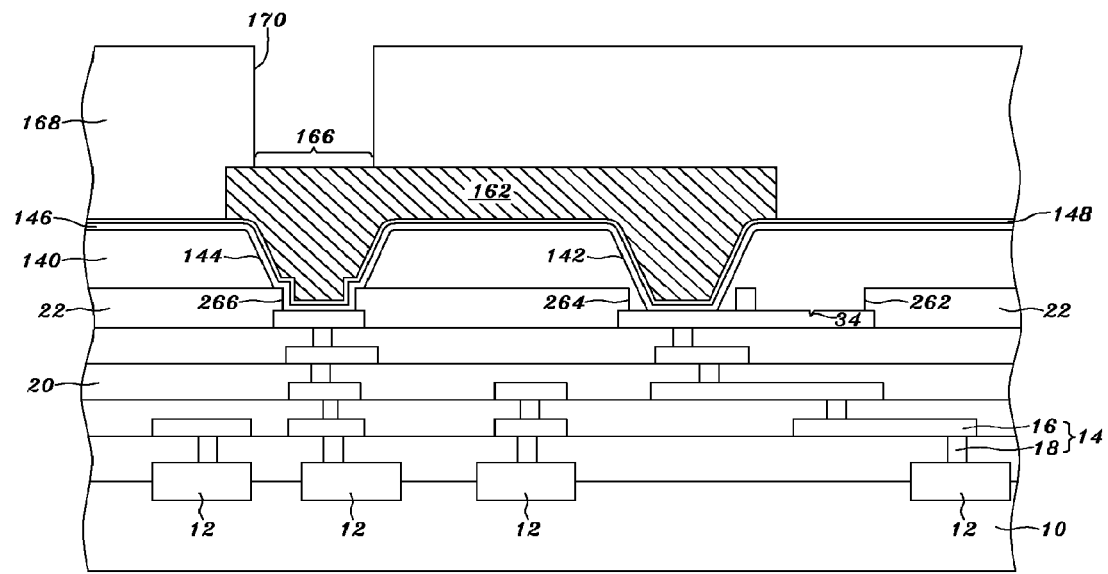

Refer to FIG. 22B. Next, the photoresist layer 150 is removed, and a photoresist layer 168 is formed over the seed layer 148 and the first metal layer 162, and the photoresist layer 168 is patterned to form a photoresist-layer opening 170 to expose the bond area 166 of the first metal layer 162, wherein a 1× stepper or a 1× scanner is used to expose the photoresist layer 168 during forming the photoresist-layer opening 170.

Figure 22C:
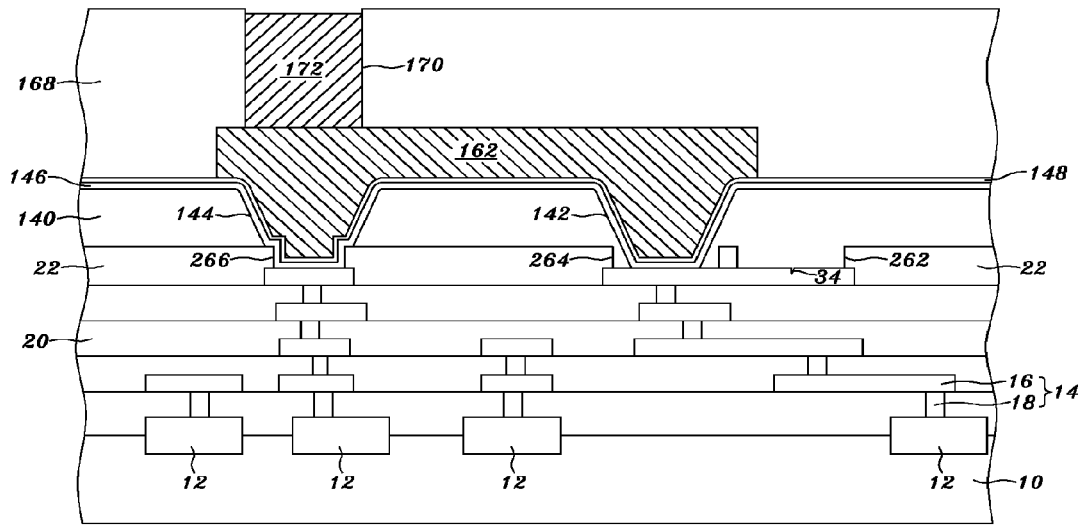

Refer to FIG. 22C. Next, a second metal layer 172 having a thickness of between 1 and 200 µm, e.g. between 20 and 120 µm, is electroplated over the bond area 166 exposed by the photoresist-layer opening 170. For further detail of the technical contents of the second metal layer 172, such as the material and preferred thickness thereof, refer to that of the second metal layer 66 of EMBODIMENT XV.

Figure 22D:
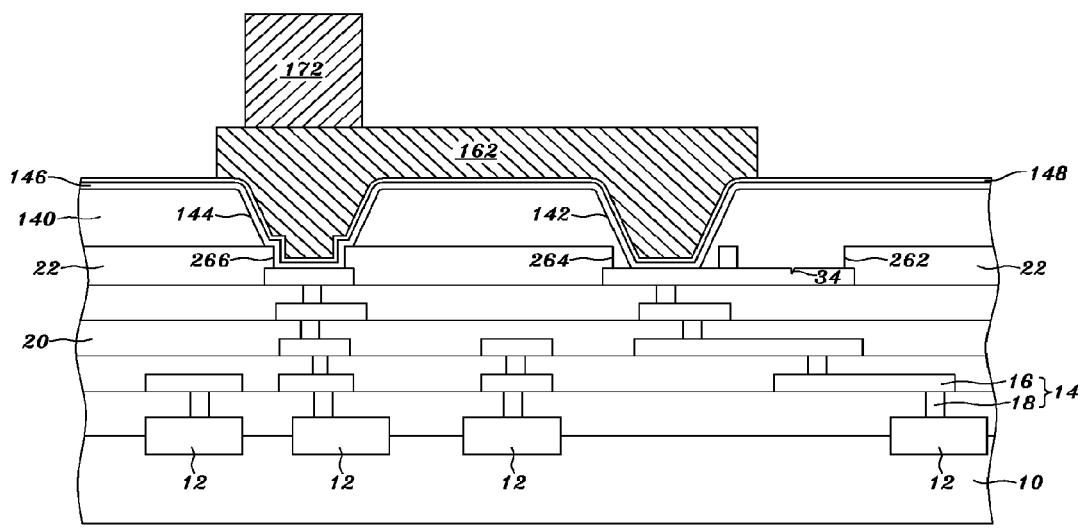
Figure 22E:
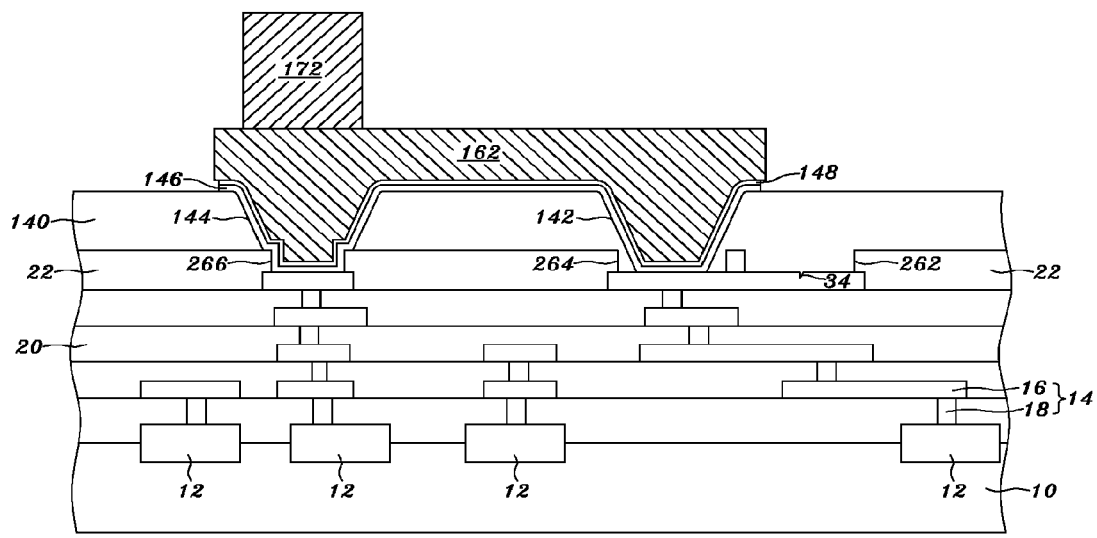
Figure 22F:
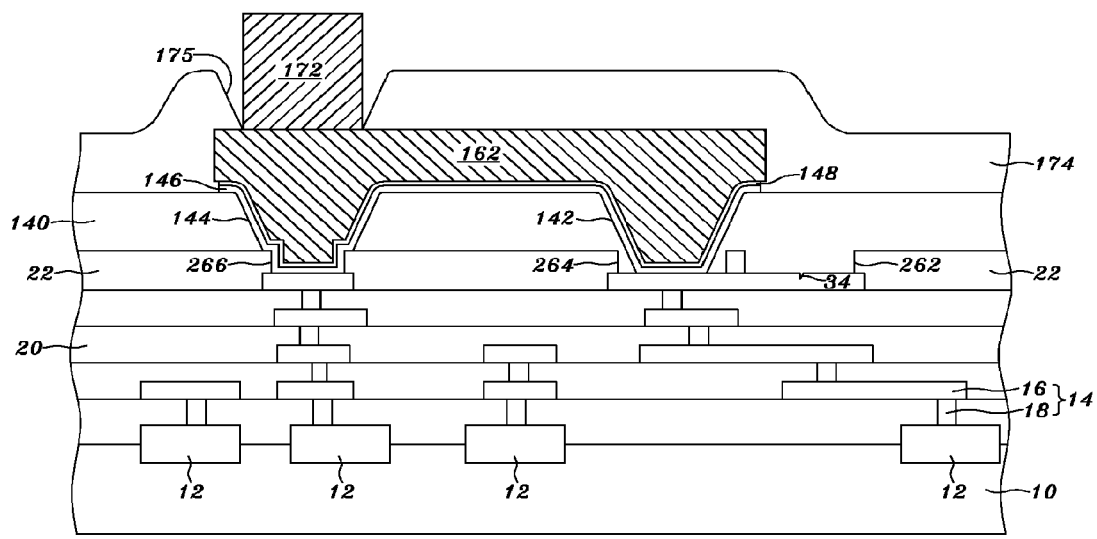

Refer to FIG. 22D. After the second metal layer 172 is completed, the photoresist layer 168 is removed. Refer to FIG. 22E. Next, the adhesion/barrier layer 146 and the seed layer 148 are removed except those below the first metal layer 162. For the detailed technical description of removing the adhesion/barrier layer 146 and the seed layer 148, refer to that of removing the adhesion/barrier layer 40 and the seed layer 42 of EMBODIMENT XV. Refer to FIG. 22F. In this embodiment, after the adhesion/barrier layer 146 and the seed layer 148 are removed except those below the first metal layer 162, a patterned polymer layer 174 may be optionally formed over the first metal layer 162 and the patterned polymer layer 140. An opening 175 in the patterned polymer layer 174 exposes the second metal layer 172.

Figure 22G:
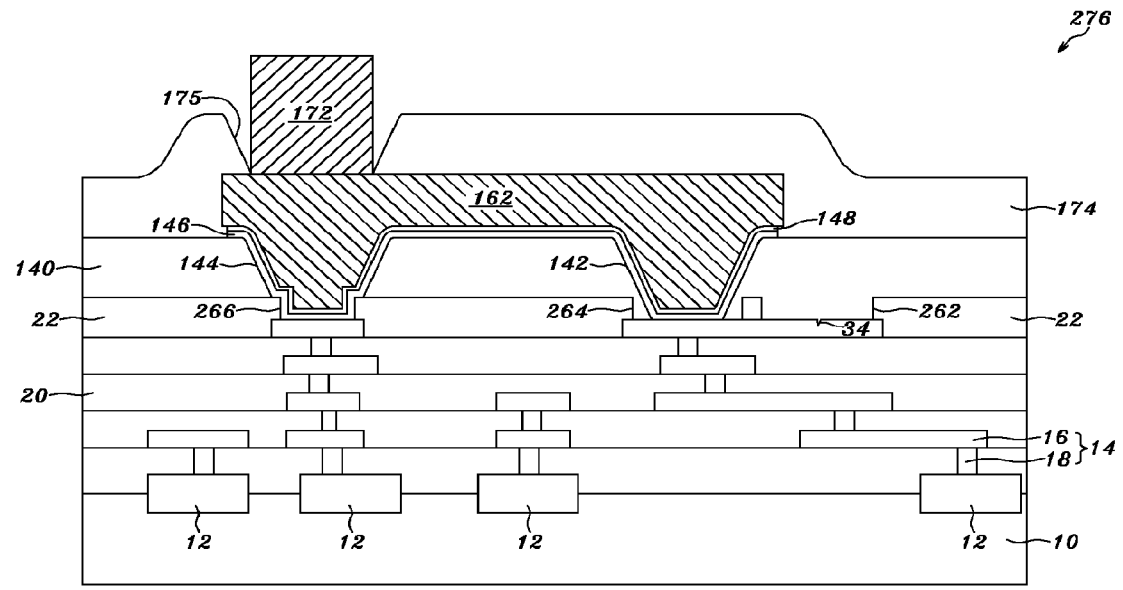
Figure 22H:
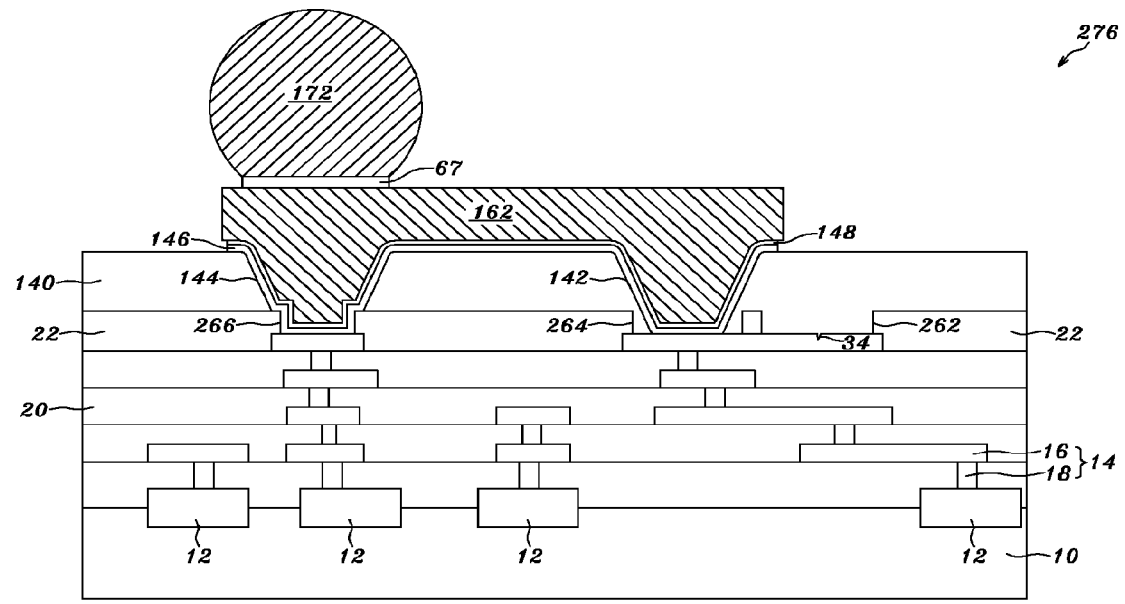

Refer to FIG. 22G. The semiconductor substrate 10 is diced into a plurality of semiconductor chips 276. Refer to FIG. 22H. If the second metal layer 172 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 172 is heated to its melting point; thus, the liquid metal assumes a ball shape and then solidifies. Then, the semiconductor substrate 10 is also diced into a plurality of semiconductor chips 276.

Figure 22I:
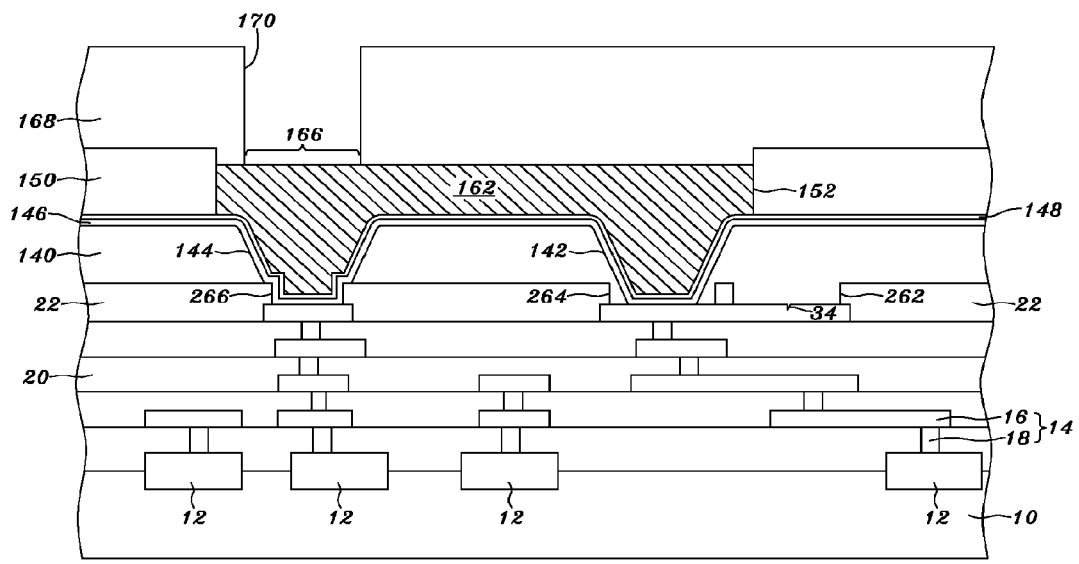

Refer to FIG. 22I. Alternatively, after the first metal layer 162 is completed, the photoresist layer 150 is kept, and the photoresist layer 168 is formed over the photoresist layer 150 and the first metal layer 162, and the photoresist-layer opening 170 in the photoresist layer 168 exposes the bond area 166 of the first metal layer 162. Next, the process shown in FIG. 22C is undertaken. After the second metal layer 172 is completed, the photoresist layer 150 and the photoresist layer 168 are removed to obtain the structure shown in FIG. 22D. Next, the seed layer 148 and the adhesion/barrier layer 146 are removed except those below the first metal layer 162 to obtain the structure shown in FIG. 22E. Then, the semiconductor substrate 10 is also diced into a plurality of semiconductor chips 276 shown in FIG. 22G or FIG. 22H.

In this embodiment, in addition to contacting the testing pad 268, the testing probe 32 may also contact the first metal layer 162 or the second metal layer 172 for electrical testing.

EMBODIMENT XXI

Figure 23A:
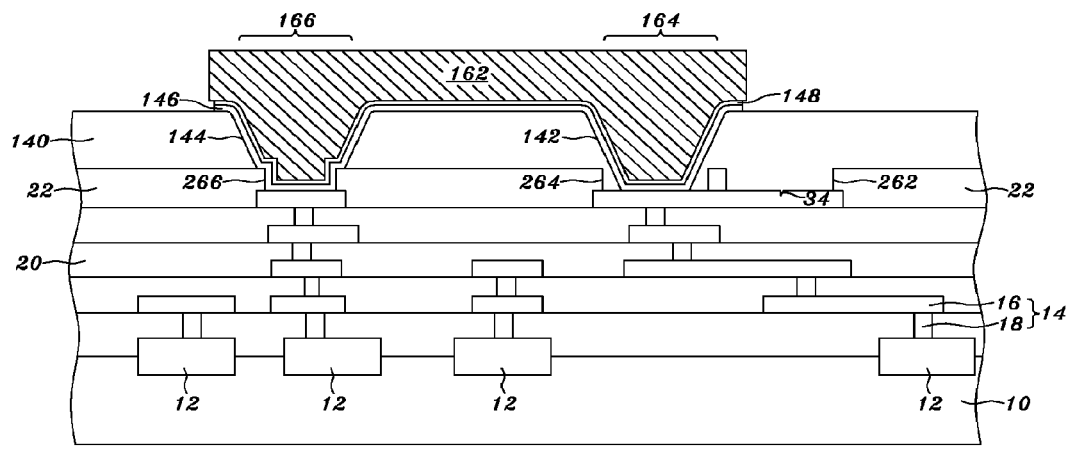
FIG. 23A to FIG. 23I are sectional views schematically showing the fabrication process according to one embodiment of the present invention.

Refer to FIG. 23A. After the process shown in FIG. 22A, the photoresist layer 150 is removed, and the adhesion/barrier layer 146 and the seed layer 148 are also removed except those below the first metal layer 162. For the detailed technical description of removing the adhesion/barrier layer 146 and the seed layer 148, refer to that of removing the adhesion/barrier layer 40 and the seed layer 42 of EMBODIMENT XIII.

Figure 23B:
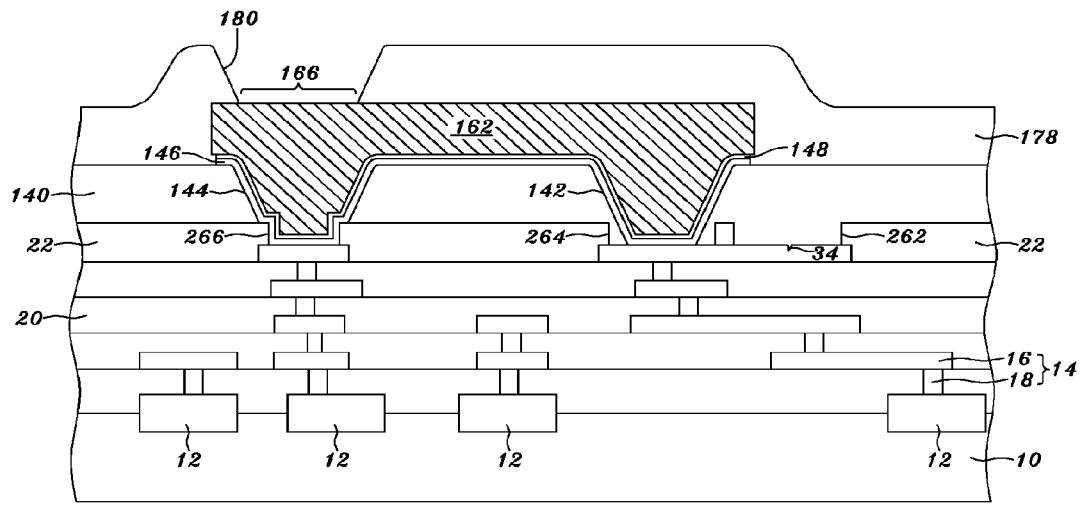

Refer to FIG. 23B. Next, a patterned polymer layer 178 is formed over the patterned polymer layer 140 and the first metal layer 162, and an opening 180 in the patterned polymer layer 178 exposes the bond area 166 of the first metal layer 162. For the detailed technical description of the patterned polymer layer 178, refer to that of the patterned polymer layer 36 of EMBODIMENT XIII.

Figure 23C:
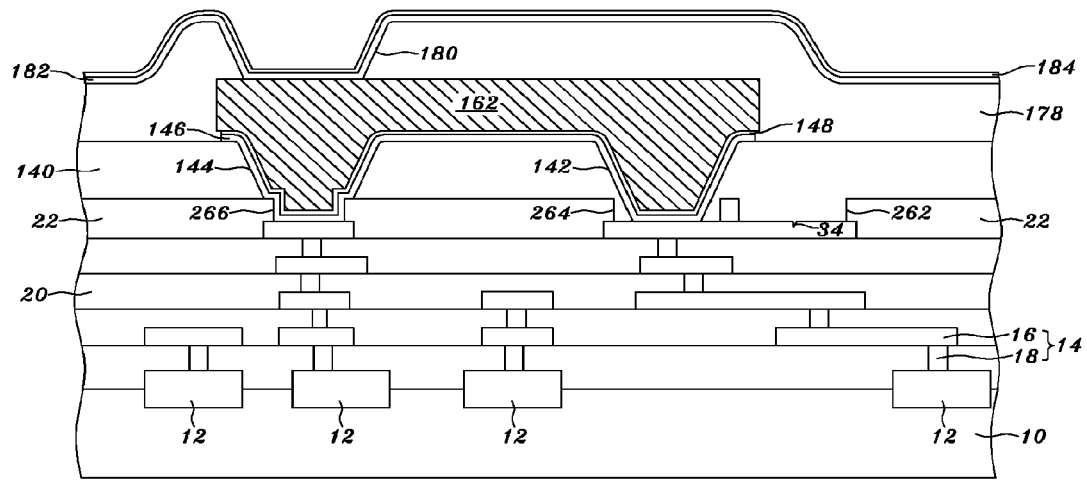

Refer to FIG. 23C. Next, an adhesion/barrier layer 182 having a thickness of between 0.02 and 24 µm is formed over the bond area 166 exposed by the polymer-layer opening 180 in the patterned polymer layer 178. Next, a seed layer 184 is formed over the adhesion/barrier layer 182. For the detailed technical description of the adhesion/barrier layer 182 and the seed layer 184, refer to that of the adhesion/barrier layer 40 and the seed layer 42 of EMBODIMENT XIII.

Figure 23D:
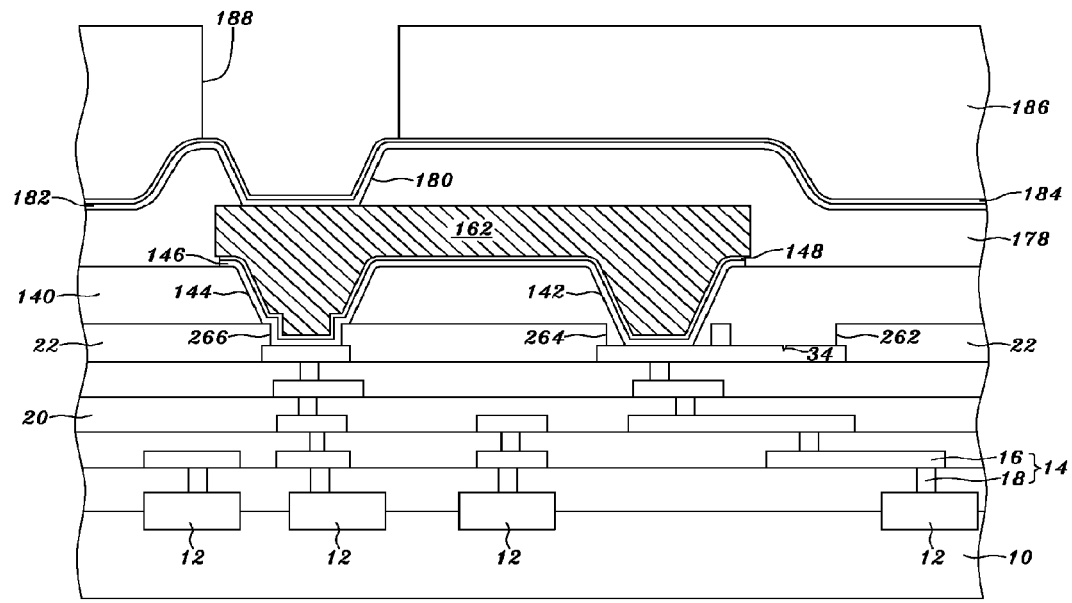
Figure 23E:
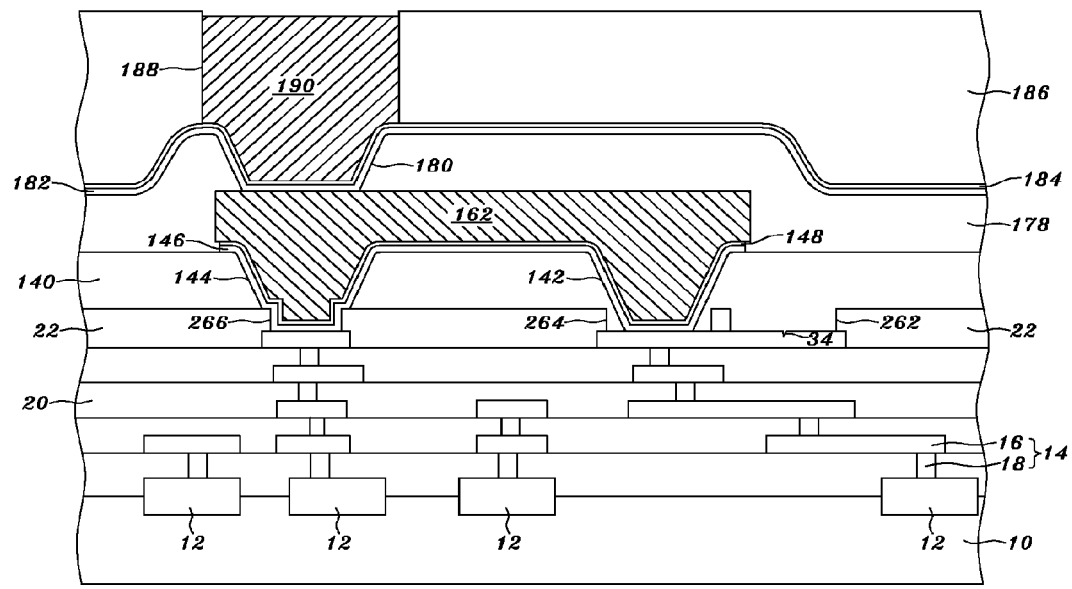

Refer to FIG. 23D. Next, a photoresist layer 186 is formed over the seed layer 184, and the photoresist layer 186 is patterned to form a photoresist-layer opening 188 to expose the bond area 166 of the first metal layer 162, wherein a 1× stepper or a 1× scanner is used to expose the photoresist layer 186 during forming the photoresist-layer opening 188. Refer to FIG. 23E. Next, a second metal layer 190 having a thickness of between 1 and 200 µm, e.g. between 20 and 120 µm, is electroplated over the bond area 166 exposed by the photoresist-layer opening 188. For further detail of the technical contents of the second metal layer 190, such as the material and preferred thickness thereof, refer to that of the second metal layer 66 of EMBODIMENT XV.

Figure 23F:
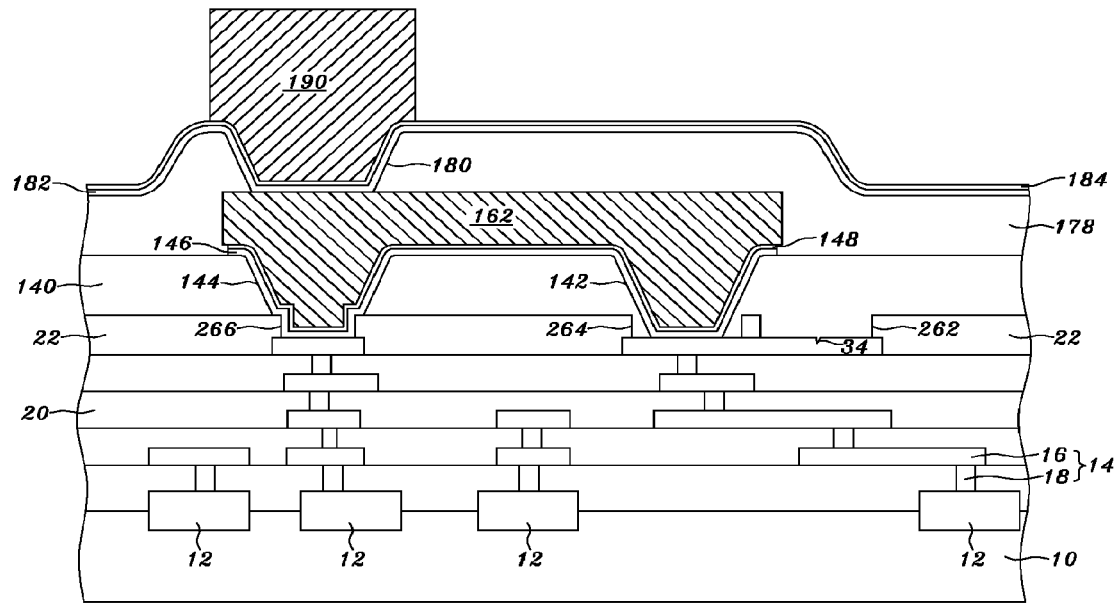
Figure 23G:
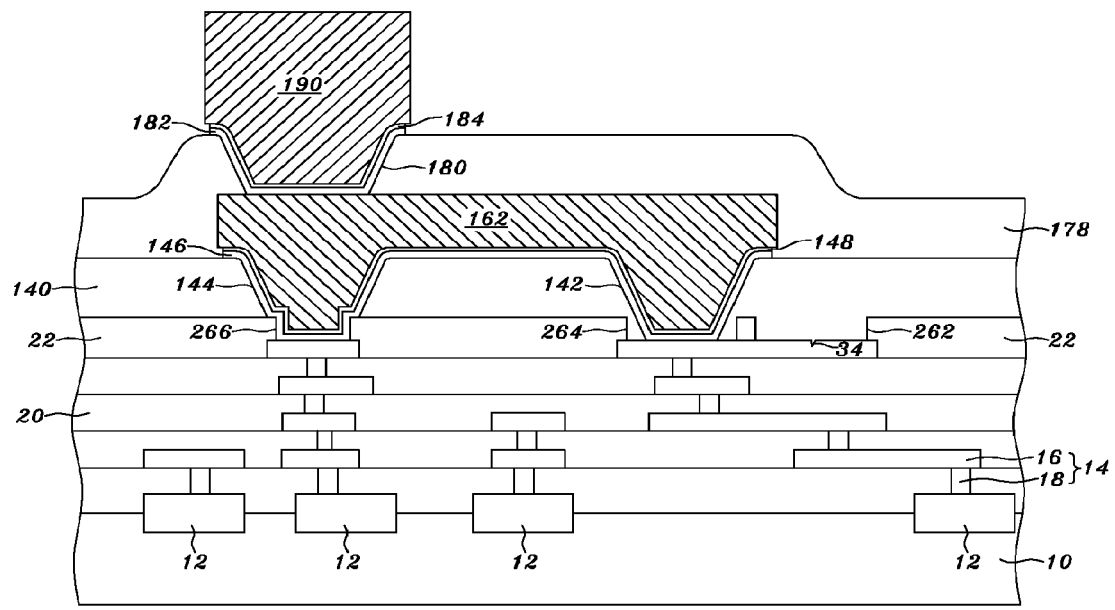

Refer to FIG. 23F. After the second metal layer 190 is completed, the photoresist layer 186 is removed. Refer to FIG. 23G. Next, the seed layer 184 and the adhesion/barrier layer 182 are removed except those below the second metal layer 190. For the detailed technical description of removing the adhesion/barrier layer 182 and the seed layer 184, refer to that of removing the adhesion/barrier layer 40 and the seed layer 42 of EMBODIMENT XIII.

Figure 23H:
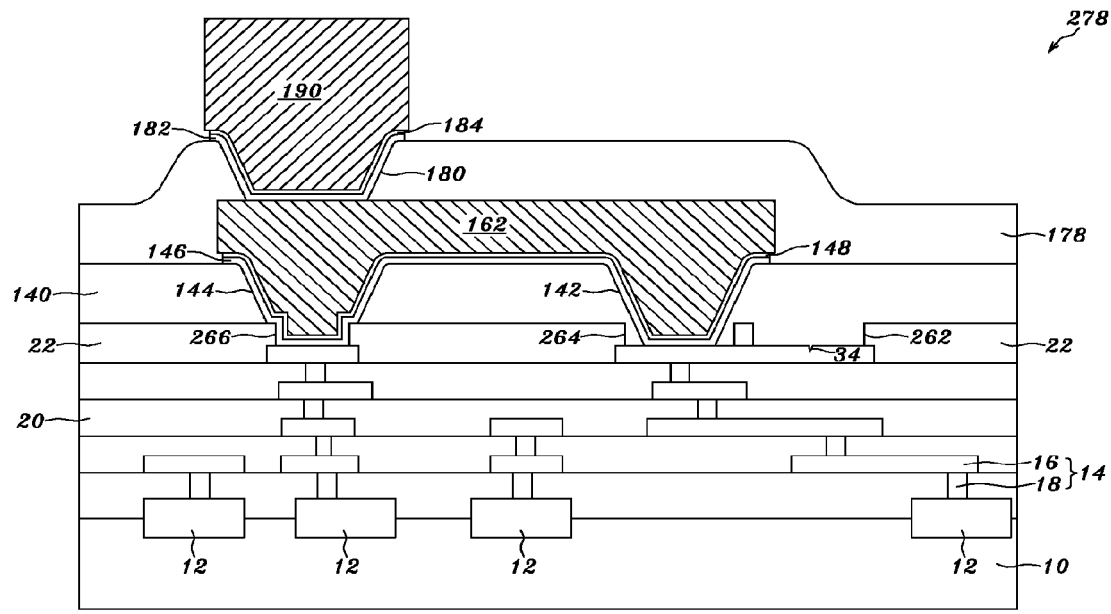
Figure 23I:
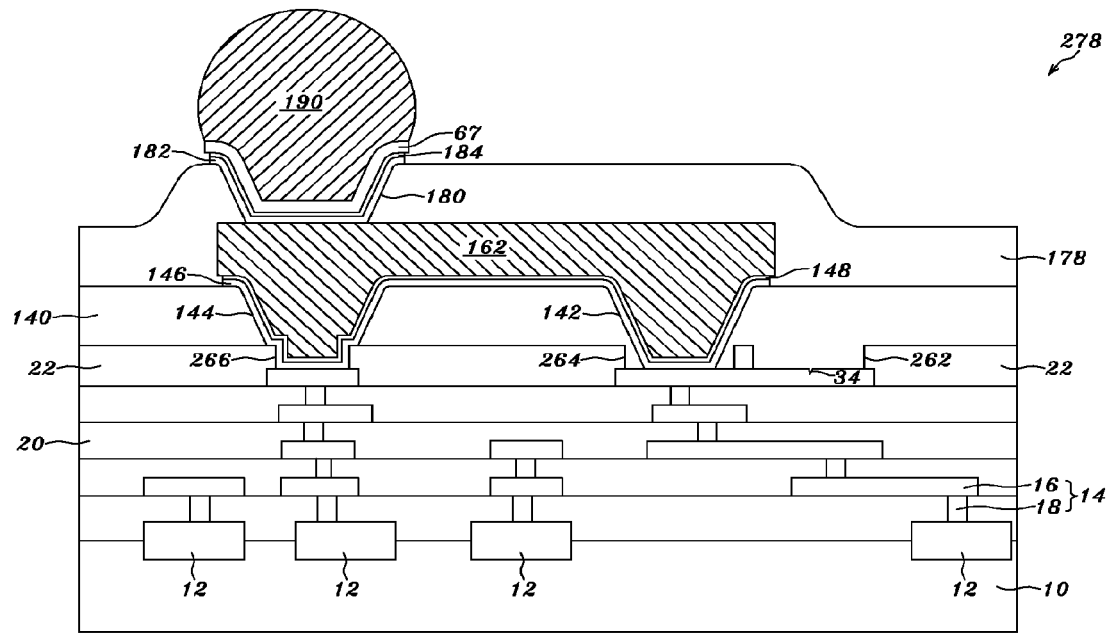

Refer to FIG. 23H. The semiconductor substrate 10 is diced into a plurality of semiconductor chips 278. Refer to FIG. 23I. If the second metal layer 190 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 190 is heated to its melting point; thus, the liquid metal assumes a ball shape and then solidifies. Then, the semiconductor substrate 10 is also diced into a plurality of semiconductor chips 278.

In this embodiment, in addition to contacting the testing pad 268, the testing probe 32 may also contact the first metal layer 162 or the second metal layer 190 for electrical testing.

EMBODIMENT XXII

Figure 24A:
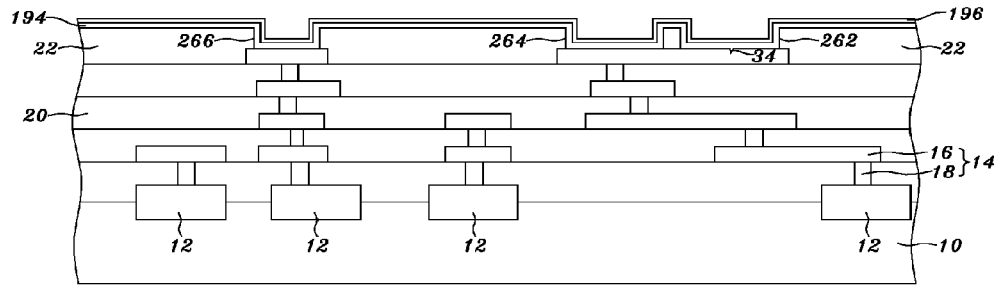
FIG. 24A to FIG. 24G are sectional views schematically showing the fabrication process according to one embodiment of the present invention.

Refer to FIG. 24A. After the process shown in FIG. 21C, an adhesion/barrier layer 194 is formed on the testing pad 268, the first pad 270, the second pad 272 and the passivation layer 22. Next, a seed layer 196 is formed over the adhesion/barrier layer 194. For the detailed technical description of the adhesion/barrier layer 194 and the seed layer 196, refer to that of the adhesion/barrier layer 40 and the seed layer 42 of EMBODIMENT XIII.

Figure 24B:
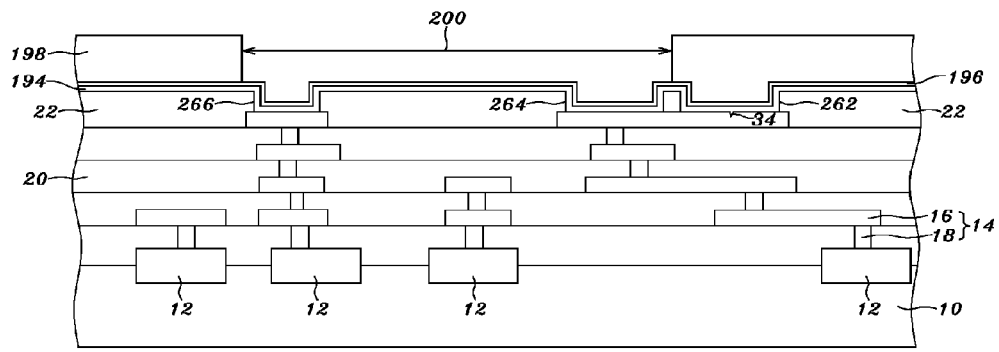
Figure 24C:
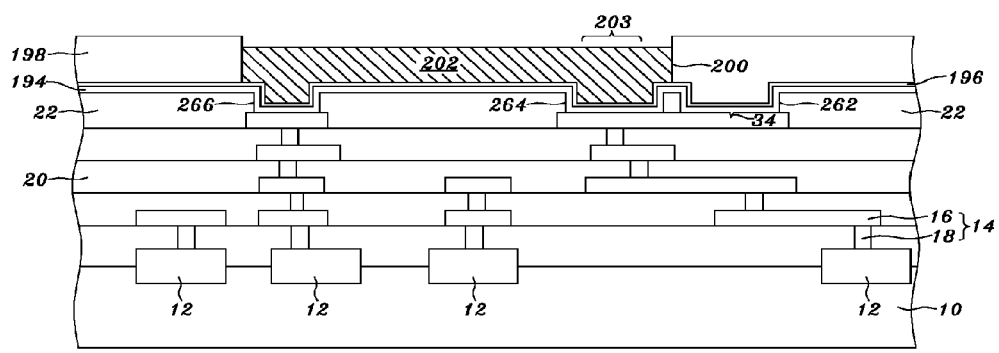

Refer to FIG. 24B. Next, a photoresist layer 198 is formed over the seed layer 196, and the photoresist layer 198 is patterned to form a photoresist-layer opening 200 to expose the seed layer 196 over the first pad 270 and the second pad 272, and expose the seed layer 196 over the passivation layer 22 between the first pad 270 and the second pad 272. Refer to FIG. 24C. Next, a metal layer 202 having a thickness of between 1 and 30 μm is electroplated over the seed layer 196 exposed by the photoresist-layer opening 200. For further technical contents of the metal layer 202, such as the material and preferred thickness thereof, refer to those of the metal layer 154 of EMBODIMENT XIX. Besides, the metal layer 202 may include a testing area 203 for electrical testing.

Figure 24D:
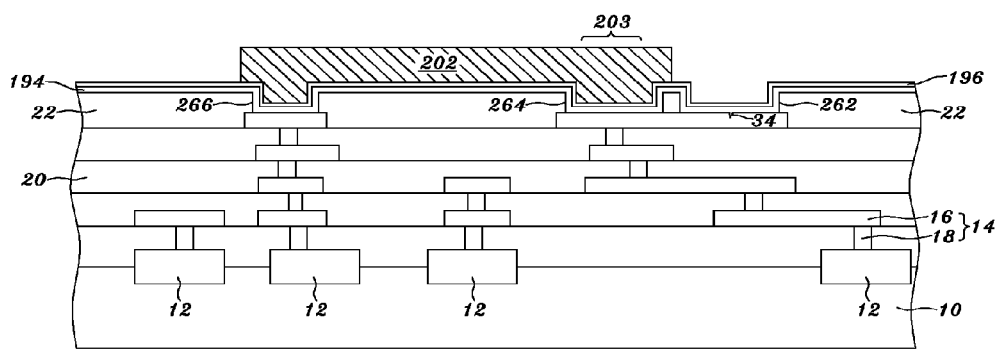
Figure 24E:
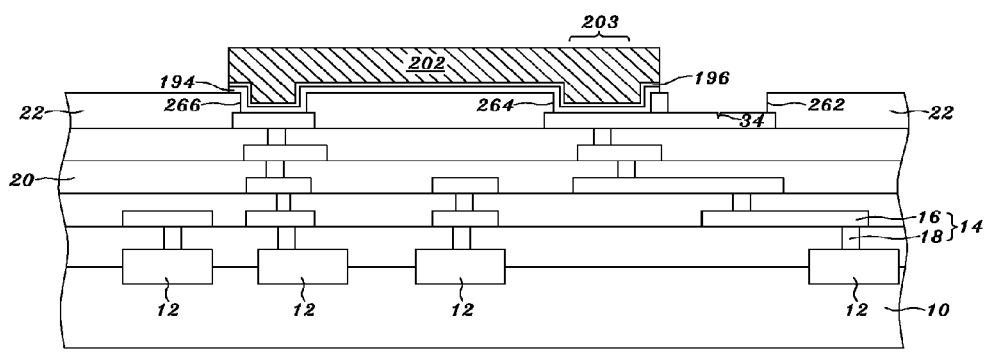

Refer to FIG. 24D. After the metal layer 202 is completed, the photoresist layer 198 is removed. Refer to FIG. 24E. Next, the seed layer 196 and the adhesion/barrier layer 194 are removed with a dry-etching method except those below the metal layer 202, wherein the dry-etching method can be implemented with an argon sputter process.

Figure 24F:
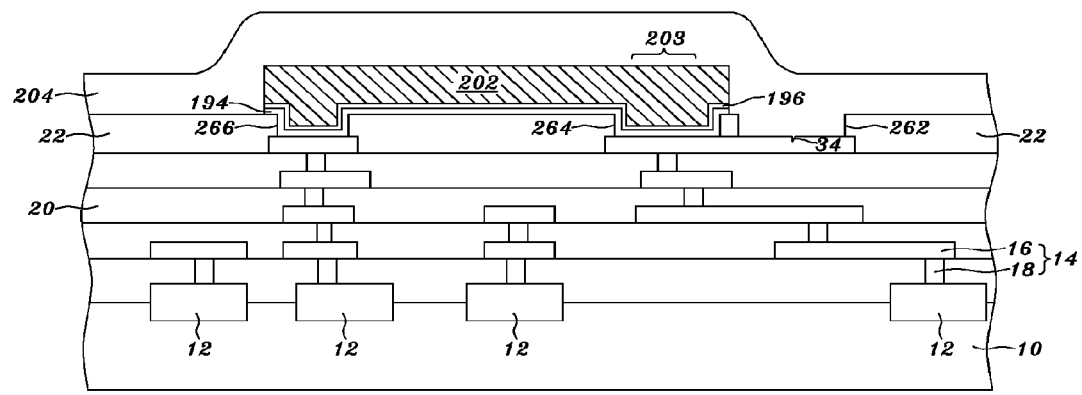
Figure 24G:
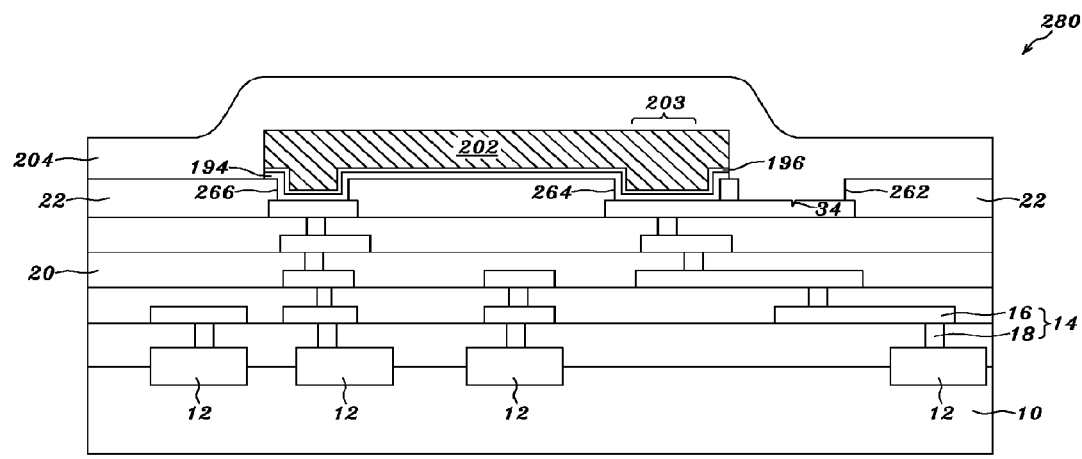

Refer to FIG. 24F. Next, a polymer layer 204 is formed over the passivation 22, the metal layer 202 and the testing pad 268, and the probe mark 34 is thus covered. Refer to FIG. 24G. The semiconductor substrate 10 is diced into a plurality of semiconductor chips 280.

In this embodiment, in addition to contacting the testing pad 268, the testing probe 32 may also contact the metal layer 202 for electrical testing. In this embodiment, it is to be noted: the metal layer 202 may alternatively not connect with an external system but only interconnects internal devices; for example, a signal may be transmitted from a MOS device in or on the substrate 10 to another MOS device in or on the substrate 10 via the metal layer 202, but not to an external system. In such a case, the polymer layer 204 may cover all the upper surface of the metal layer 202.

EMBODIMENT XXIII

Figure 25A:
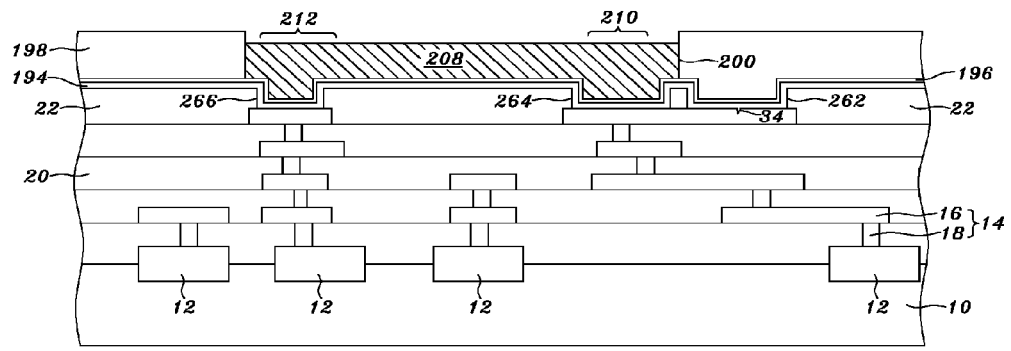
FIG. 25A to FIG. 25I are sectional views schematically showing the fabrication process according to one embodiment of the present invention.

Refer to FIG. 25A. After the process shown in FIG. 24B, a first metal layer 208 having a thickness of between 1 and 30 μm is electroplated over the seed layer 196 exposed by the photoresist-layer opening 200. For further technical contents of the first metal layer 208, such as the material and preferred thickness thereof, refer to those of the metal layer 154 of EMBODIMENT XIX. The first metal layer 208 may have a testing area 210 for electrical testing and a bond area 212 to be electrically connected to an external system.

Figure 25B:
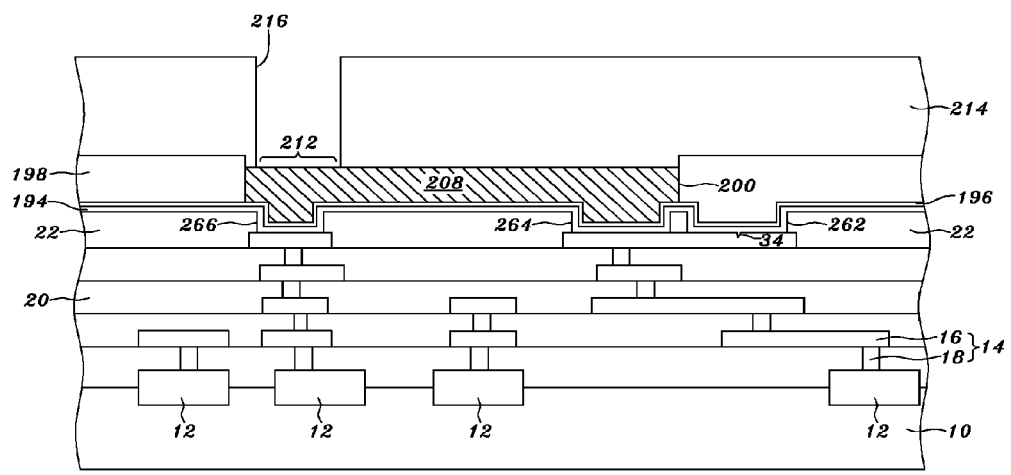
Figure 25C:
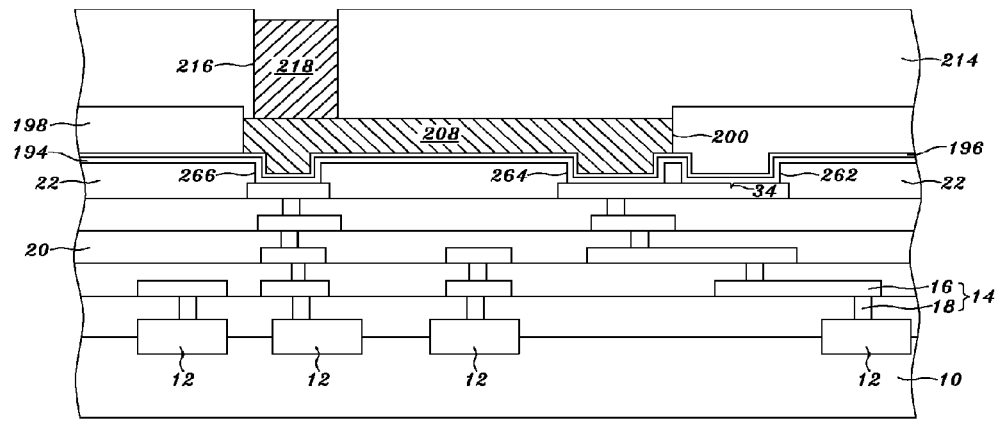

Refer to FIG. 25B. Next, a photoresist layer 214 is formed over the photoresist layer 198 and the first metal layer 208, and the photoresist layer 214 is patterned to form a photoresist-layer opening 216 to expose the bond area 212 of the first metal layer 208. Refer to FIG. 25C. Next, a second metal layer 218 having a thickness of between 1 and 200 μm, e.g. between 20 and 120 μm, is electroplated over the bond area 212 exposed by the photoresist-layer opening 216. For the detailed technical contents of the second metal layer 218, such as the material and preferred thickness thereof, refer to that of the second metal layer 66 of EMBODIMENT XV.

Figure 25D:
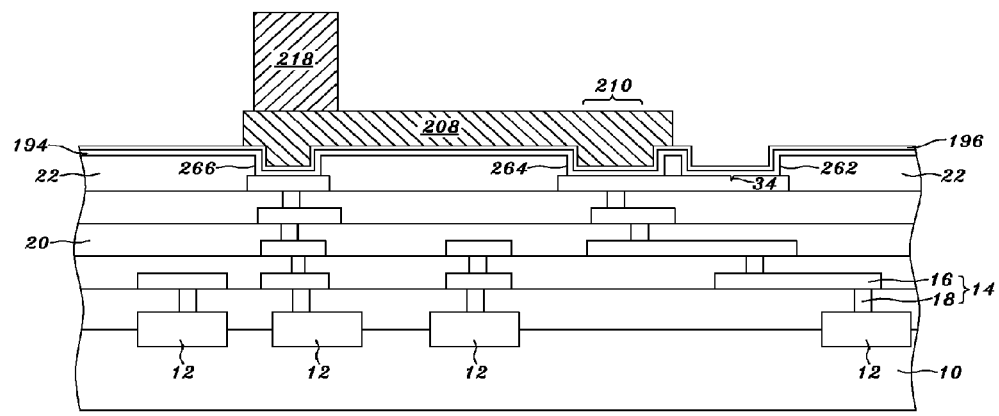
Figure 25E:
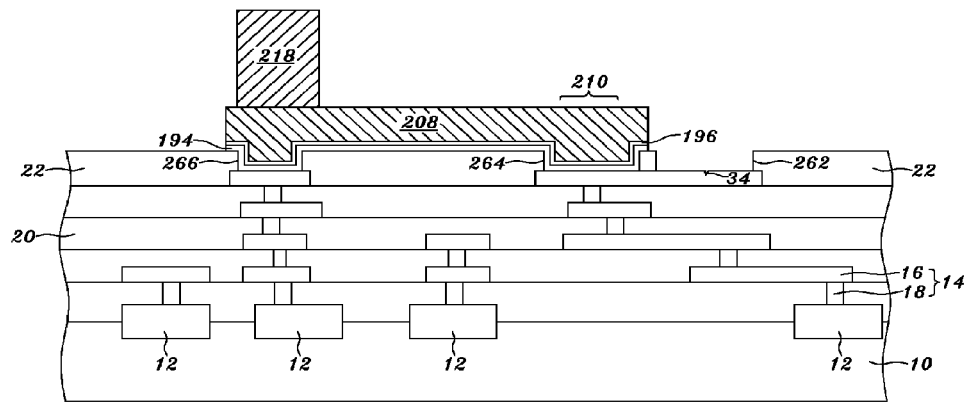

Refer to FIG. 25D. After the second metal layer 218 is completed, the photoresist layer 214 and the photoresist layer 198 are removed. Refer to FIG. 25E. Next, the seed layer 196 and the adhesion/barrier layer 194 are removed with a dry-etching method except those below the first metal layer 208, wherein the dry-etching method can be implemented with an argon sputter process.

Figure 25F:
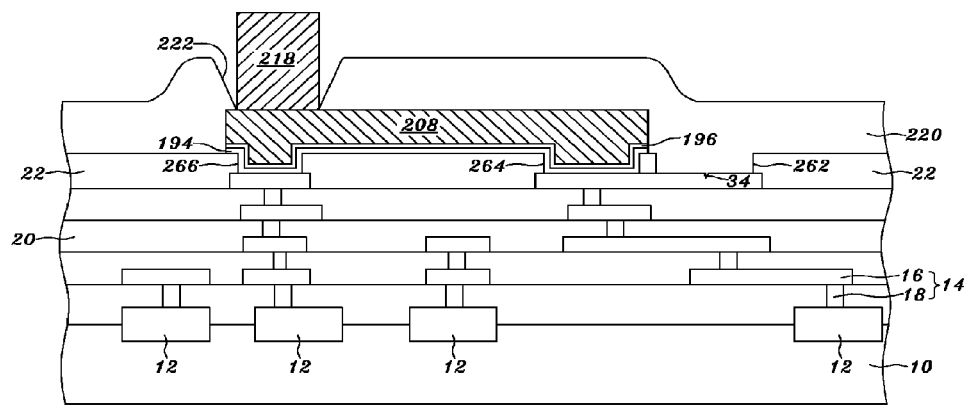
Figure 25G:
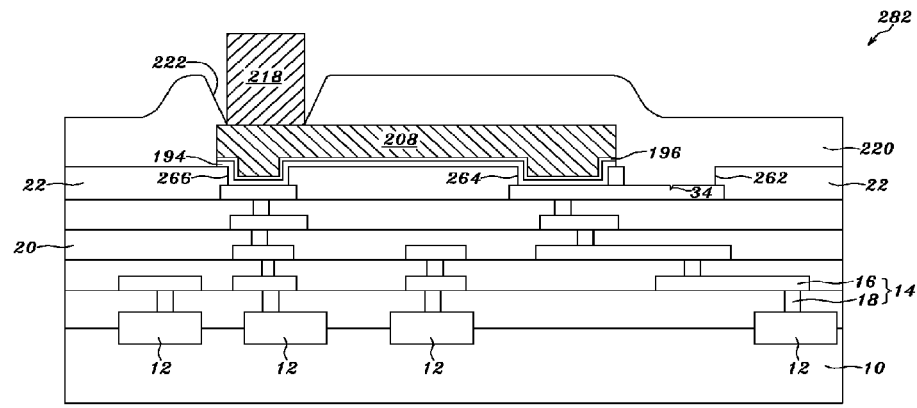
Figure 25H:
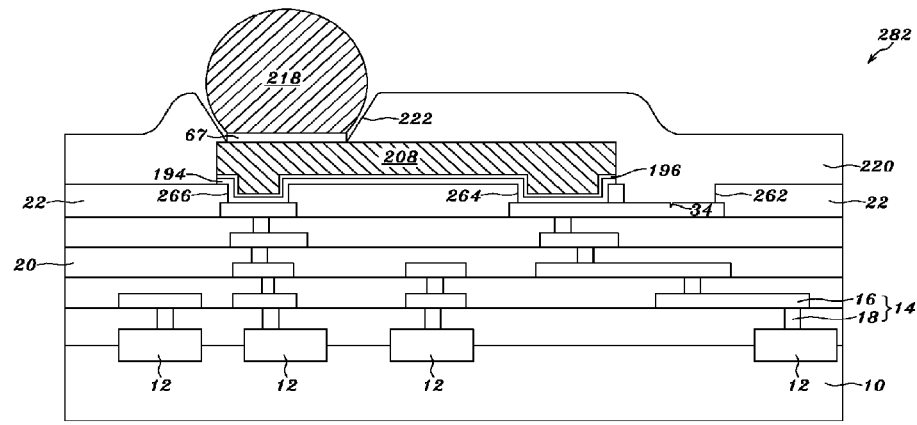

Refer to FIG. 25F. Next, a patterned polymer layer 220 is formed over the passivation layer 22, the first metal layer 208 and the testing pad 268, and the probe mark 34 is thus covered. An opening 222 in the patterned polymer layer 220 exposes the second metal layer 218. Refer to FIG. 25G. The semiconductor substrate 10 is diced into a plurality of semiconductor chips 282. Refer to FIG. 25H. If the second metal layer 218 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 218 is heated to its melting point; thus, the liquid metal assumes a ball shape and then solidifies. Then, the semiconductor substrate 10 is also diced into a plurality of semiconductor chips 282.

Figure 25I:
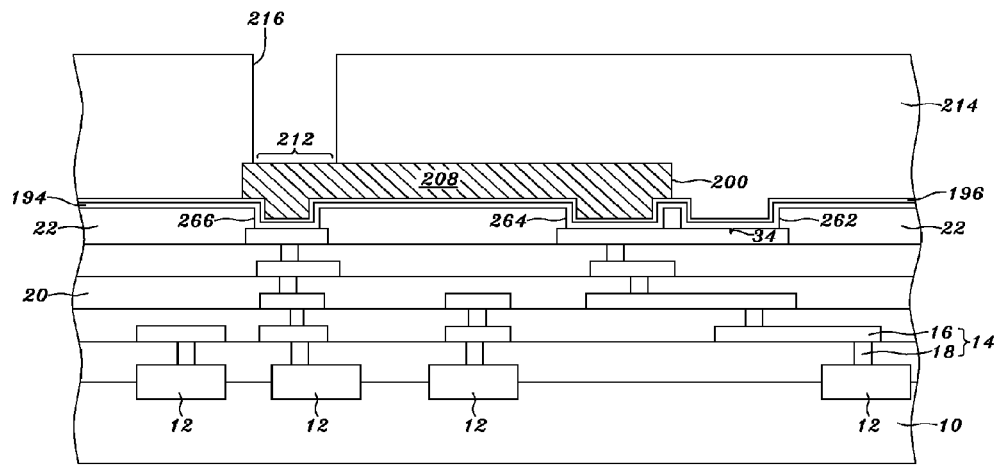

Refer to FIG. 25I. Alternatively, the photoresist layer 198 may be firstly removed, and a photoresist layer 214 is then formed over the seed layer 196 and the first metal layer 208, and the photoresist-layer opening 216 exposes the bond area 212 of the first metal layer 208. Next, the process shown in FIG. 25C is undertaken. After the second metal layer 218 is completed, the photoresist layer 214 is removed to obtain the structure shown in FIG. 25D. Next, the seed layer 196 and the adhesion/barrier layer 194 are removed with a dry-etching method except those below the first metal layer 208 to obtain the structure shown in FIG. 25E. Next, a patterned polymer layer 220 is formed over the passivation layer 22, the first metal layer 208 and the testing pad 268 to obtain the structure shown in FIG. 25F, and the probe mark 34 is thus covered. Then, the semiconductor substrate 10 is also diced into a plurality of semiconductor chips 282 shown in FIG. 25G or FIG. 25H.

In this embodiment, in addition to contacting the testing pad 268, the testing probe 32 may also contact the first metal layer 208 or the second metal layer 218 for electrical testing.

EMBODIMENT XXIV

Figure 26A:
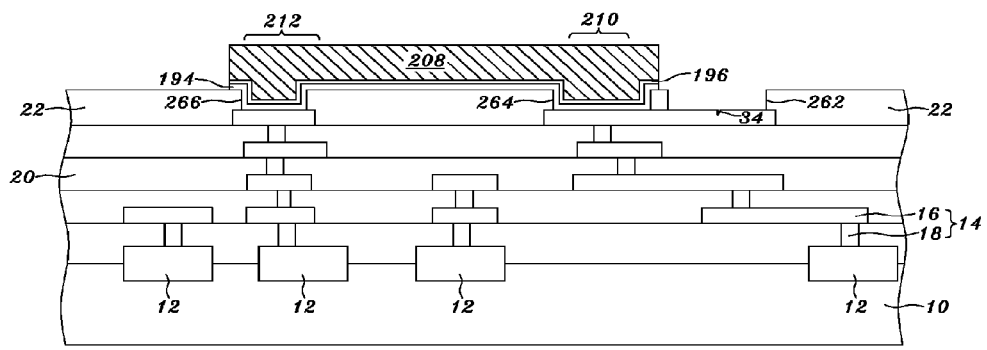
FIG. 26A to FIG. 26I are sectional views schematically showing the fabrication process according to one embodiment of the present invention.

Refer to FIG. 26A. After the process shown in FIG. 25A, the photoresist layer 198 is removed, and the seed layer 196 and the adhesion/barrier layer 194 are removed with a dry-etching method except those below the first metal layer 208, wherein the dry-etching method is implemented with an argon sputter process.

Figure 26B:
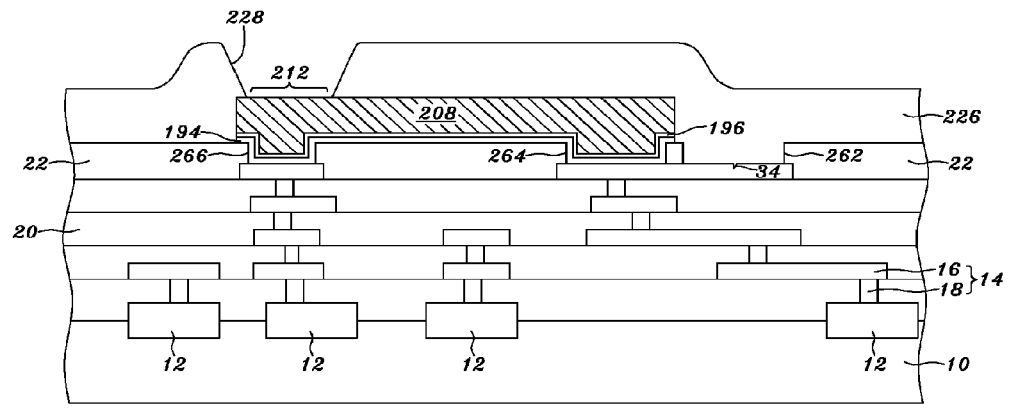
Figure 26C:
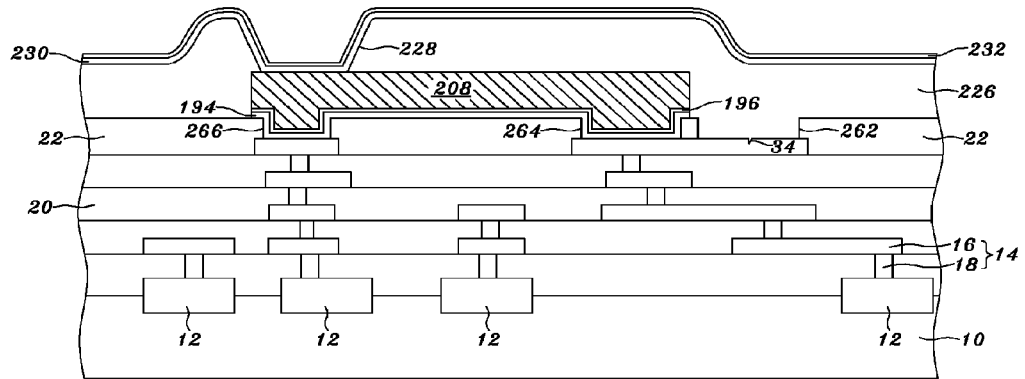

Refer to FIG. 26B. Next, a patterned polymer layer 226 is formed over the passivation layer 22, the first metal layer 208 and the testing pad 268, and the probe mark 34 is thus covered. An opening 228 in the patterned polymer layer 226 exposes the bond area 212 of the first metal layer 208. Refer to FIG. 26C. Next, an adhesion/barrier layer 230 is formed over the patterned polymer layer 226 and the bond area 212 exposed by the polymer-layer opening 228. Next, a seed layer 232 is formed over the adhesion/barrier layer 230. For the detailed technical description of the adhesion/barrier layer 230 and the seed layer 232, refer to that of the adhesion/barrier layer 40 and the seed layer 42 of EMBODIMENT XIII.

Figure 26D:
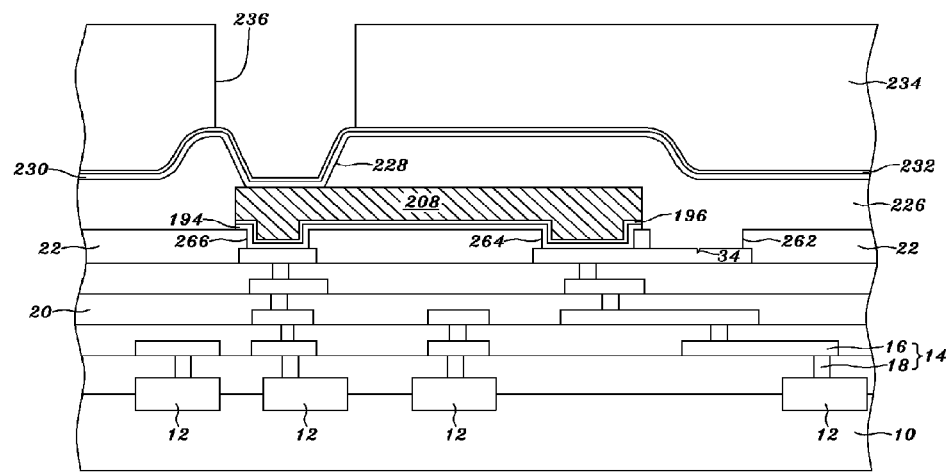
Figure 26E:
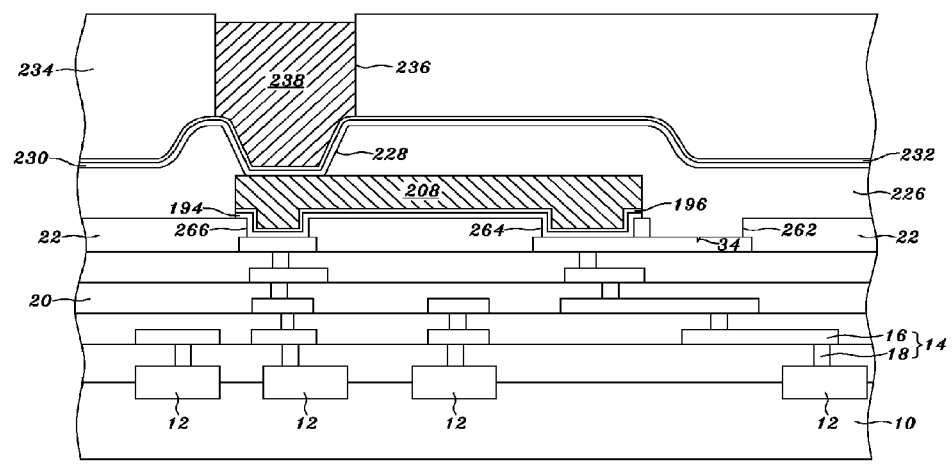

Refer to FIG. 26D. Next, a photoresist layer 234 is formed over the seed layer 232, and the photoresist layer 234 is patterned to form a photoresist-layer opening 236 to expose the seed layer 232 over the bond area 212 of the first metal layer 208. Refer to FIG. 26E. Next, a second metal layer 238 having a thickness of between 1 and 200 μm, e.g. between 20 and 120 μm, is electroplated over the seed layer 232 exposed by the photoresist-layer opening 236. For further detail of the technical contents of the second metal layer 238, such as the material and preferred thickness thereof, refer to that of the second metal layer 66 of EMBODIMENT XV.

Figure 26F:
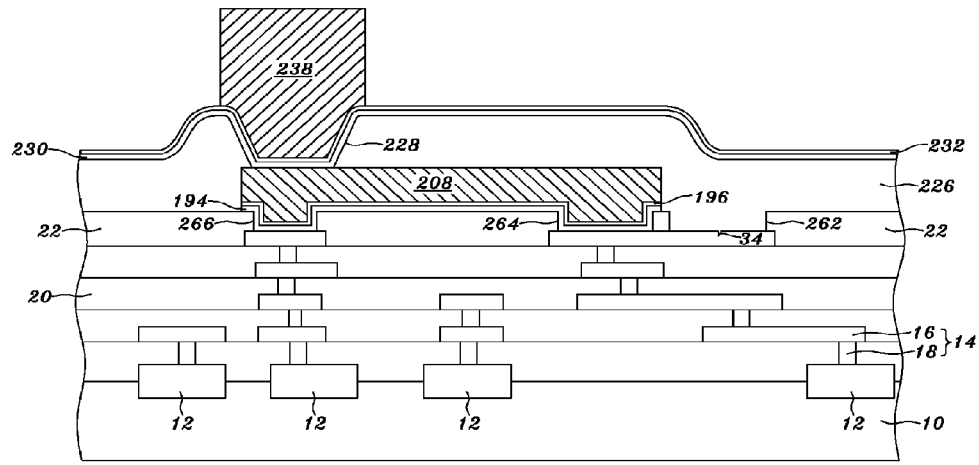
Figure 26G:
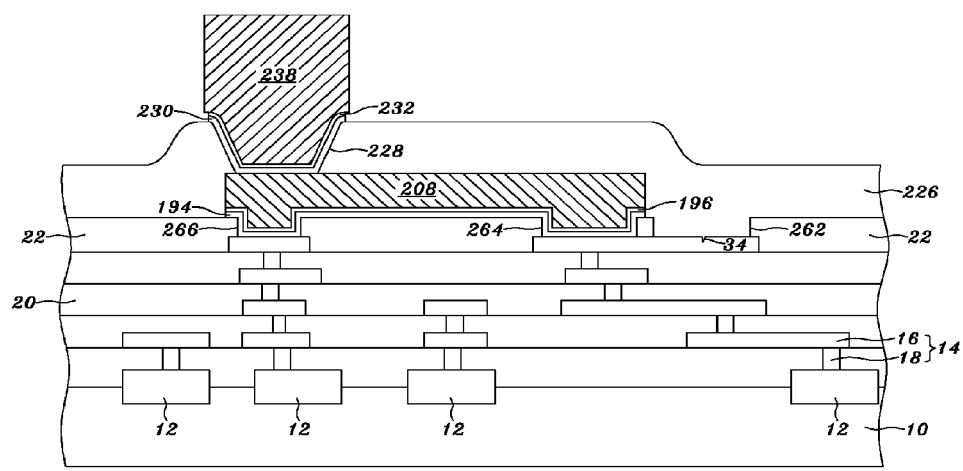

Refer to FIG. 26F. After the second metal layer 238 is completed, the photoresist layer 234 is removed. Refer to FIG. 26G. Next, the seed layer 232 and the adhesion/barrier layer 230 are removed except those below the second metal layer 238. For the detailed technical description of removing the adhesion/barrier layer 230 and the seed layer 232, refer to that of removing the adhesion/barrier layer 40 and the seed layer 42 of EMBODIMENT XIII.

Figure 26H:
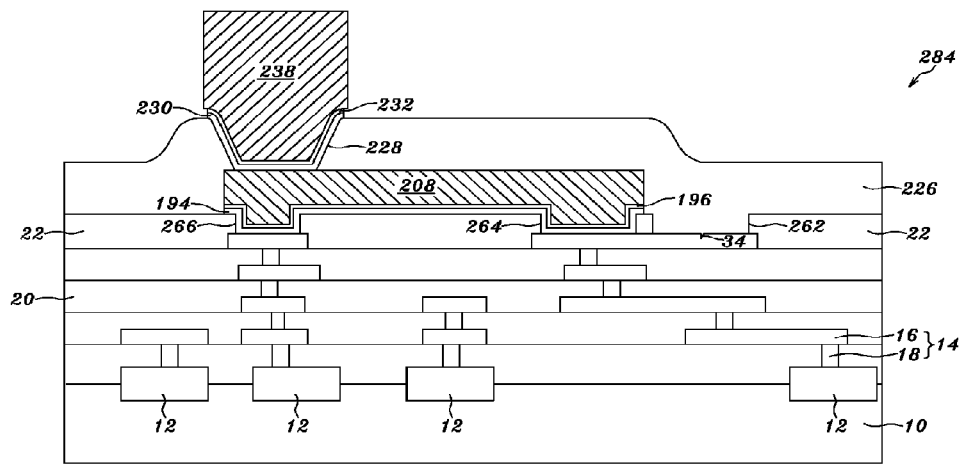
Figure 26I:
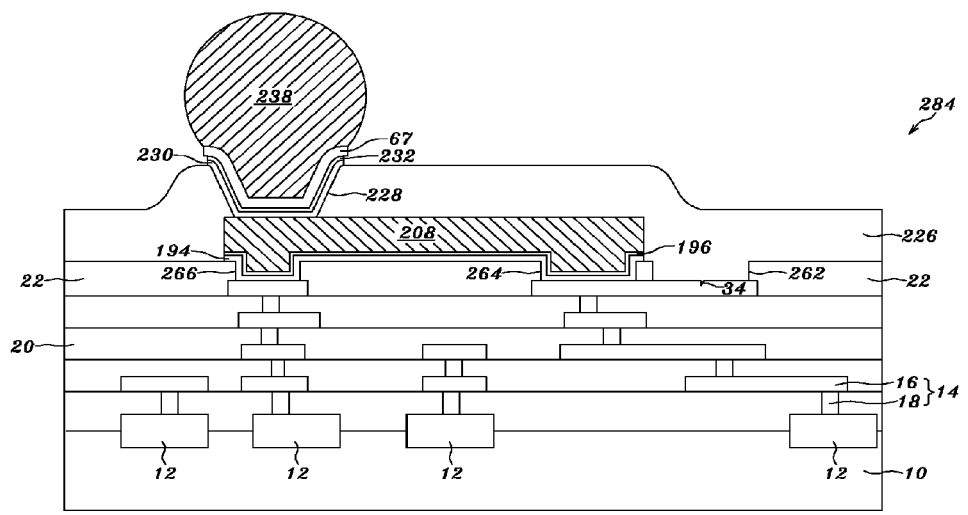

Refer to FIG. 26H. The semiconductor substrate 10 is diced into a plurality of semiconductor chips 284. Refer to FIG. 26I. If the second metal layer 238 is a tin-containing layer, such as a tin-lead alloy layer, a tin-silver alloy layer, a tin-silver-copper alloy layer or a lead-free alloy layer, a reflow process is performed before dicing the semiconductor substrate 10. During the reflow process, the tin-containing layer 238 is heated to its melting point; thus, the liquid metal assumes a ball shape and then solidifies. Then, the semiconductor substrate 10 is also diced into a plurality of semiconductor chips 284.

In this embodiment, in addition to contacting the testing pad 268, the testing probe 32 may also contact the first metal layer 208 or the second metal layer 238 for electrical testing.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A semiconductor chip comprising:
a semiconductor substrate;
a first metal layer over said semiconductor substrate, wherein said first metal layer has a top surface with a contact area and a testing area with a probe mark, wherein said testing area is connected to said contact area;
a dielectric layer over said semiconductor substrate and directly on said testing area and covering said probe mark, wherein an opening in said dielectric layer is over said contact area; and
a second metal layer directly on said contact area and over said semiconductor substrate.

2. The semiconductor chip of claim 1 further comprising a metal oxide semiconductor (MOS) device in or on said semiconductor substrate, wherein said semiconductor substrate comprises a silicon substrate.

3. The semiconductor chip of claim 1, wherein said dielectric layer comprises a polymer.

4. The semiconductor chip of claim 1, wherein said dielectric layer has a thickness between 5 and 20 micrometers.

5. The semiconductor chip of claim 1, wherein said second metal layer comprises a gold layer having a thickness between 10 and 30 micrometers.

6. The semiconductor chip of claim 1, wherein said second metal layer comprises a gold layer having a thickness between 1 and 10 micrometers.

7. The semiconductor chip of claim 1, wherein said second metal layer comprises a copper layer having a thickness between 2 and 30 micrometers.

8. The semiconductor chip of claim 1, wherein said second metal layer comprises a copper layer and a nickel-containing layer over said copper layer.

9. The semiconductor chip of claim 1, wherein said second metal layer comprises a tin-containing layer having a thickness between 3 and 150 micrometers.

10. The semiconductor chip of claim 9 further comprising a third metal layer between said tin-containing layer and said contact area, wherein said third metal layer comprises a copper layer having a thickness between 1 and 10 micrometers and a nickel-containing layer having a thickness between 0.5 and 5 micrometers on said copper layer.

11. The semiconductor chip of claim 1, wherein said second metal layer comprises a titanium-containing layer directly on said contact area and over said semiconductor substrate.

12. The semiconductor chip of claim 1, wherein said second metal layer is further on a top surface of said dielectric layer.

13. A semiconductor chip comprising:
a semiconductor substrate;
a first contact pad over said semiconductor substrate;
a second contact pad over said semiconductor substrate;
a third contact pad over said semiconductor substrate;
an insulating layer over said semiconductor substrate, wherein a first opening in said insulating layer is over a first contact point of said first contact pad, and said first contact point is at a bottom of said first opening, wherein a second opening in said insulating layer is over a second contact point of said second contact pad, and said second contact point is at a bottom of said second opening, and wherein a third opening in said insulating layer is over a third contact point of said third contact pad, and said third contact point is at a bottom of said third opening, wherein said insulating layer comprises a nitride layer;

a metal layer on said first and second contact points and over said insulating layer, wherein said first contact point is connected to said second contact point through said metal layer; and a dielectric layer directly on said third contact point and over said insulating layer, wherein no metal interconnect is connected to said third contact point through said third opening.

14. The semiconductor chip of claim 13, wherein said nitride layer has a thickness between 0.2 and 1.2 micrometers.

15. The semiconductor chip of claim 13, wherein said metal layer comprises a gold layer.

16. The semiconductor chip of claim 13, wherein said metal layer comprises a copper layer having a thickness between 2 and 15 micrometers.

17. The semiconductor chip of claim 13, wherein said metal layer comprises a tin-containing layer.

18. The semiconductor chip of claim 13, wherein said metal layer comprises a titanium-containing layer.

19. The semiconductor chip of claim 13, wherein said metal layer is further on a top surface of said dielectric layer.

20. The semiconductor chip of claim 13, wherein said dielectric layer is further on a top surface of said metal layer.

21. The semiconductor chip of claim 13, wherein said dielectric layer comprises a polymer.

* * * * *